(12) United States Patent
Masuoka et al.

(10) Patent No.: US 8,476,132 B2
(45) Date of Patent: Jul. 2, 2013

(54) PRODUCTION METHOD FOR SEMICONDUCTOR DEVICE

(75) Inventors: Fujio Masuoka, Tokyo (JP); Shintaro Arai, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 682 days.

(21) Appl. No.: 12/704,278

(22) Filed: Feb. 11, 2010

(65) Prior Publication Data

US 2010/0210096 A1     Aug. 19, 2010

Related U.S. Application Data

(63) Continuation of application No. PCT/JP2009/051465, filed on Jan. 29, 2009.

(60) Provisional application No. 61/207,637, filed on Feb. 13, 2009.

(30) Foreign Application Priority Data

Jan. 29, 2008   (WO) .................. PCT/JP2008/051305

(51) Int. Cl.
*H01L 21/336*     (2006.01)

(52) U.S. Cl.
USPC .... 438/268; 438/269; 257/329; 257/E29.262; 257/E21.41

(58) Field of Classification Search
None
See application file for complete search history.

(56) References Cited

U.S. PATENT DOCUMENTS 5,382,816 A     1/1995   Mitsui
5,480,838 A     1/1996   Mitsui (Continued)

FOREIGN PATENT DOCUMENTS

DE     19846063 A1    4/2000
EP       614226 A1    9/1994

(Continued)

OTHER PUBLICATIONS

Written Opinion of the International Searching Authority for International Application No. PCT/JP2008/051305, dated Apr. 22, 2008, 5 pages.

(Continued)

*Primary Examiner* — Zandra Smith
*Assistant Examiner* — Pamela E Perkins
(74) *Attorney, Agent, or Firm* — Brinks Hofer Gilson & Lione

(57) ABSTRACT

It is intended to provide a method of producing a semiconductor device, comprising the steps of: providing a substrate on one side of which at least one semiconductor pillar stands; forming a first dielectric film to at least partially cover a surface of the at least one semiconductor pillar; forming a conductive film on the first dielectric film; removing by etching a portion of the conductive film located on a top surface and along an upper portion of a side surface of the semiconductor pillar; forming a protective film on at least a part of the top surface and the upper portion of the side surface of the semiconductor pillar; etching back the protective film to form a protective film-based sidewall on respective top surfaces of the conductive film and the first dielectric film each located along the side surface of the semiconductor pillar; forming a resist pattern for forming a gate line in such a manner that at least a portion of the resist pattern is formed on the top surface of the semiconductor pillar by applying a resist and using lithography; and partially removing by etching the conductive film using the resist pattern as a mask while protecting, by the protective film-based sidewall, the portions of the conductive film and the first dielectric film each located along the side surface of the semiconductor pillar, to form a gate electrode and a gate line extending from the gate electrode.

19 Claims, 175 Drawing Sheets

U.S. PATENT DOCUMENTS

| | | |
|---|---|---|
| 7,115,476 B1 | 10/2006 | Izumida |
| 2002/0096699 A1 | 7/2002 | Krautschneider et al. |
| 2007/0004130 A1* | 1/2007 | Wang .......................... 438/243 |

FOREIGN PATENT DOCUMENTS

| | | |
|---|---|---|
| JP | 02-071556 A | 3/1990 |
| JP | 02-188966 A | 7/1990 |
| JP | 03-154379 A | 7/1991 |
| JP | 06-021467 A | 1/1994 |
| JP | 06-342883 A | 12/1994 |
| JP | 07-099311 A | 4/1995 |
| JP | 2002-057329 A | 2/2002 |
| JP | 2003-503853 A | 1/2003 |
| JP | 2006-310651 A | 11/2006 |

OTHER PUBLICATIONS

Written Opinion of the International Searching Authority for International Application No. PCT/JP2009/051465, dated Feb. 24, 2009, 5 pages.

Extended European Search Report for European Application No. 09705045.4, dated Jul. 20, 2011, 7 pages.

International Search Report for International Application No. PCT/JP2008/051305, dated Apr. 22, 2008, 2 pages.

International Search Report for International Application No. PCT/JP2009/051465, dated Feb. 24, 2009, 2 pages.

Li, Ruigang et al., "50nm Vertical Surround Gate MOSFET with S-factor of 75mV/dec", Abstract, Device Research Conference, 2001, pp. 63-64.

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(b)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(c)

(d)

(e)

(f)

(a)

(b)

(c)

(a)

(b)

(c)

US 8,476,132 B2

PRODUCTION METHOD FOR SEMICONDUCTOR DEVICE

RELATED APPLICATIONS

Pursuant to 35 U.S.C. §119(e), this application claims the benefit of the filing date of Provisional U.S. Patent Application Ser. No. 61/207,637 filed on Feb. 13, 2009. This application is a continuation application of PCT/JP2009/051465 filed on Jan. 29, 2009 which claims priority under 35 U.S.C. §365(a) to PCT/JP2008/051305 filed on Jan. 29, 2008. The entire contents of these applications are hereby incorporated by reference.

TECHNICAL FIELD

The present invention relates to a production method for a semiconductor, and more particularly to a structure and a production method for an SGT (Surrounding Gate Transistor) which is a vertical MOS transistor comprising a pillar-shaped semiconductor layer having a sidewall serving as a channel region, and a gate electrode formed to surround the channel region.

BACKGROUND ART

With a view to achieving higher integration and higher performance of a semiconductor device, a vertical transistor SGT has been proposed which comprises a pillar-shaped semiconductor layer formed on a surface of a semiconductor substrate, and a gate formed to surround a sidewall of the pillar-shaped semiconductor layer (see the following Patent Documents 1 and 2). In the SGT, a source, a gate and a drain are arranged in a vertical direction, so that an occupancy area can be significantly reduced as compared with a conventional planar transistor. In addition, the gate is formed to surround a channel region, so that, as a size of a pillar-shaped semiconductor layer is reduced, channel controllability of the gate can be effectively improved to obtain steep subthreshold characteristics. Furthermore, an improvement in carrier mobility based on electric field relaxation in the channel region can be expected by setting an impurity concentration and a size of the pillar-shaped semiconductor layer to allow the pillar-shaped semiconductor layer to become fully depleted. Therefore, the use of the SGT makes it possible to simultaneously achieve higher integration and higher performance as compared with the conventional planar transistor.

FIG. 177(a) shows a top plan view of a CMOS inverter designed using the SGT disclosed in the Patent Document 1, and FIG. 177(b) is a sectional view taken along the cutting-plane line A-A' in FIG. 177(b).

Referring to FIGS. 177(a) and 177(b), an N-well 1302 and a P-well 1303 are formed in an upper region of a Si substrate 1301. A pillar-shaped silicon layer 1305 forming a PMOS (PMOS-forming pillar-shaped silicon layer 1305) and a pillar-shaped silicon layer 1306 forming an NMOS (NMOS-forming pillar-shaped silicon layer 1306) are formed on a surface of the Si substrate, specifically on respective ones of the N-well region and the P-well region, and a gate 1308 is formed to surround the pillar-shaped silicon layers. Then, each of a P$^+$ drain diffusion layer 1310 formed beneath the PMOS-forming pillar-shaped silicon layer, and a N$^+$ drain diffusion layer 1312 formed beneath the NMOS-forming pillar-shaped silicon layer, is connected to an output terminal Vout 7. A source diffusion layer 1309 formed in an upper portion of the PMOS-forming pillar-shaped silicon layer is connected to a power supply potential Vcc 7, and a source diffusion layer 1311 formed in an upper portion of the NMOS-forming pillar-shaped silicon layer is connected to a ground potential Vss 7. Further, the gate 1308 common to the PMOS and the NMOS is connected to an input terminal Vin 7, and the diffusion layer (1310, 1312) beneath a respective one of the pillar-shaped silicon layers is connected to the output terminal Vout 7. In this manner, the CMOS inverter is formed.

FIGS. 178(a) to 178(f) show a schematic process flow for forming a pillar-shaped silicon layer and a gate electrode in the SGT disclosed in the Patent Document 1. In FIG. 178(a), a pillar-shaped silicon layer 1401 is formed on a silicon substrate by etching. In FIG. 178(b), a gate dielectric film 1402 is formed. In FIG. 178(c), a gate conductive film 1403 is formed. In FIG. 178(d), a resist 1404 for a gate line pattern is formed to be in contact with a portion of a gate conductive film surrounding the pillar-shaped silicon layer. In FIG. 178(e), the gate conductive film 1403 is etched back to form a gate electrode 1403 and a gate line 1405 of an SGT. In FIG. 178(f), the resist is released. In the above process flow, the gate electrode 1403 is formed around the pillar-shaped silicon layer 1401 by a desired film thickness, in a self-alignment manner, so that two pillar-shaped silicon layers each having a gate electrode to be applied with a different potential can be arranged side-by-side with a relatively small distance therebetween.

However, in the above process flow, the resist 1404 must be formed to be accurately in contact with the portion of the gate conductive film around a sidewall of the pillar-shaped silicon layer, in FIG. 178(d). Therefore, a process margin in a lithography step of forming the gate line is small, which causes difficulty in stably fabricating the gate line. The following description will be made in regard to this point.

FIGS. 179(a) to 179(c) illustrate a process flow in case where the resist 1404 is positionally deviated to the right side in FIG. 178(d). FIG. 179(a) shows a state after a resist 1414 for a gate line pattern is positionally deviated to the right side during alignment of a lithographic exposure. In this state, there arises a space between the resist 1414 and a sidewall of a pillar-shaped silicon layer 1411. In FIG. 179(b), a gate etch step is performed. In FIG. 179(c), the resist is released. In this case, a gate electrode 1413 and a gate line 1415 of a resulting SGT are undesirably disconnected from each other.

FIGS. 180(a) to 180(c) illustrate a process flow in case where the gate-line resist 1404 is positionally deviated to the left side in FIG. 178(d). FIG. 180(a) shows a state after a resist 1424 for a gate line pattern is positionally deviated to the left side during alignment of a lithographic exposure. In this state, there arises an overlapped area 1426 between the resist 1424 and a portion of a gate electrode on a top of a pillar-shaped silicon layer 1421. In FIG. 180(b), a gate etch step is performed. In FIG. 180(c), the resist is released. In this case, a gate electrode 1423 of a resulting SGT undesirably has a shape abnormality 1427 on a side where the resist is formed.

A value of the above positional deviation of the resist arising from the alignment varies depending on a position on a wafer and a position in a chip, and thereby it is impossible to keep positional deviations in all patterns on a wafer, within a range free of the occurrence of the above problem. Thus, in the above SGT forming method, a process margin for forming the gate line becomes extremely small, and thereby it is impossible to produce an integrated circuit in high yield.

As one of the measures against the problem in the above SGT gateline forming method, the following Non-Patent Document 1 discloses an SGT gate-line forming method which is improved in process margin. FIGS. 181(a) to 181(g) illustrate a schematic process flow for forming a pillar-shaped silicon layer and a gate electrode of an SGT, which is disclosed in the Non-Patent Document 1. This process flow will be described below. In FIG. 181(a), a silicon substrate is etched to form a pillar-shaped silicon layer 1501. In FIG. 181(b), a gate dielectric film 1502 is formed. In FIG. 181(c), a gate conductive film is formed. In FIG. 181(d), the gate conductive film, and a portion of the gate dielectric film on a top of the pillar-shaped silicon layer, are polished by chemical mechanical polishing (CMP). In FIG. 181(e), the resulting gate conductive film is etched back in such a manner that a portion of the gate conductive film surrounding the pillar-shaped silicon layer is etched to have a desired gate length. In FIG. 181(f), a resist for a gate line pattern is formed by lithography. In FIG. 181(g), the gate conductive film is etched to form a gate electrode and a gate line.

In the above process flow, although a process margin in a lithography step of forming the gate line becomes larger, as compared with the process flow disclosed in the Patent Document 1, the gate electrode to be formed around the pillar-shaped silicon layer is not formed in a self-alignment manner, with respect to the pillar-shaped silicon layer. As a result, the gate electrode will be widely formed around the pillar-shaped silicon layer, and a film thickness of the gate electrode to be formed around the pillar-shaped silicon layer will vary depending on a deviation in alignment of a resist pattern and an error in size of the resist pattern. Thus, if a distance between two pillar-shaped silicon layers each having a gate electrode to be applied with a different potential is reduced, the respective gate electrodes will be short-circuited with each other. Therefore, an occupancy area of an SGT-based circuit is liable to become large.

Patent Document 1: JP 2-188966A
Patent Document 2: JP 7-99311A
Non-Patent Document 1: Ruigang Li, et al., "50 nm Vertical Surrounding Gate MOSFET with S-factor of 75 mv/dec", Device Research Conference, 2001, p. 63

As a prerequisite to achievement of an SGT applicable to a product comprising a highly-integrated and high-performance logic circuit, such as a CPU, it is necessary for a gate forming process to meet the following requirements. A first requirement is that it is capable of forming a gate electrode around a pillar-shaped silicon layer in a self-alignment manner and with a desired film thickness. A second requirement is that it is less vulnerable to a deviation in exposure alignment during gate line formation. A third requirement is that it is capable of accurately controlling a gate length to minimize a variation in gate length and increase a process margin.

In view of above problems, it is an object of the present invention to propose an SGT production method capable of solving the above problems.

SUMMARY OF THE INVENTION

According to a first aspect of the present invention, there is provided a method of producing a semiconductor device. The method comprises: providing a substrate on one side of which at least one semiconductor pillar stands; forming a first dielectric film to at least partially cover a surface of the at least one semiconductor pillar; forming a conductive film on the first dielectric film; removing by etching a portion of the conductive film located on a top surface and along an upper portion of a side surface of the semiconductor pillar; forming a protective film on at least a part of the top surface and the upper portion of the side surface of the semiconductor pillar; etching back the protective film to form a protective film-based sidewall on respective top surfaces of the conductive film and the first dielectric film each located along the side surface of the semiconductor pillar; forming a resist pattern for forming a gate line in such a manner that at least a portion of the resist pattern is formed on the top surface of the semiconductor pillar by applying a resist and using lithography; and partially removing by etching the conductive film using the resist pattern as a mask while protecting, by the protective film-based sidewall, the portions of the conductive film and the first dielectric film each located along the side surface of the semiconductor pillar, to form a gate electrode and a gate line extending from the gate electrode.

For example, the step of removing by etching a portion of the conductive film located on a top surface and along a upper portion of a side surface of the semiconductor pillar includes the sub-steps of: forming a second dielectric film on the conductive film to allow the semiconductor pillar to be buried therein; flattening a top surface of the second dielectric film; and removing by etching a portion of the conductive film and the second dielectric film each located along the side surface of the semiconductor pillar to form the conductive film and the second dielectric film to have substantially the same height.

According to a second aspect of the present invention, there is provided a method of producing a semiconductor device. The method comprises: providing a substrate on one side of which at least one semiconductor pillar stands, the semiconductor pillar having a stopper film formed on a top surface thereof; forming a first dielectric film to at least partially cover a surface of the at least one semiconductor pillar; forming a conductive film on the first dielectric film; forming a second dielectric film on the conductive film to allow the semiconductor pillar to be buried therein; flattening a top surface of the resulting product by chemical mechanical polishing (CMP), using the stopper film as a CMP stopper; removing by etching a portion of the second dielectric film and the conductive film each located along an upper portion of a side surface of the semiconductor pillar to form the conductive film and the second dielectric film to have substantially the same height; forming a protective film on at least a part of the top surface and the upper portion of the side surface of the semiconductor pillar; etching back the protective film to form a protective film-based sidewall on respective top surfaces of the conductive film and the first dielectric film each located along the side surface of the semiconductor pillar; removing the second dielectric film; forming a resist pattern for forming a gate line in such a manner that at least a portion of the resist pattern is formed on the top surface of the semiconductor pillar by applying a resist and using lithography; and partially removing by etching the conductive film using the resist pattern as a mask while protecting, by the protective film-based sidewall, the portions of the conductive film and the first dielectric film each located along the side surface of the semiconductor pillar, to form a gate electrode and a gate line extending from the gate electrode.

According to a third aspect of the present invention, there is provided a method of producing a semiconductor device. The method comprises: providing a substrate on one side of which at least one semiconductor pillar stands; forming a first dielectric film to at least partially cover a surface of the at least one semiconductor pillar; forming a conductive film on the first dielectric film to allow the semiconductor pillar to be buried therein; etching an upper portion of the conductive film to remove a portion of the conductive film located on a top surface and along an upper portion of a side surface of the semiconductor pillar; forming a protective film on at least a part of the top surface and the upper portion of the side surface of the semiconductor pillar; etching back the protective film to form a protective film-based sidewall on respective top surfaces of the conductive film and the first dielectric film each located along the side surface of the semiconductor pillar; forming a resist pattern for forming a gate line in such a manner that at least a portion of the resist pattern is formed on the top surface of the semiconductor pillar by applying a resist and using lithography; and partially removing by etching, using the resist pattern as a mask, the conductive film to form at least a portion of the gate line, and partially removing by etching, using the protective film-based sidewall as a mask, the conductive film and the first dielectric film to form at least a portion of a gate electrode to have the desired film thickness.

For example, the method further comprises, as a preprocessing for the etching an upper portion of the conductive film to remove a portion of the conductive film located on a top surface and along an upper portion of a side surface of the semiconductor pillar, the step of flattening a top surface of the conductive film.

According to a fourth aspect of the present invention, there is provided a method of producing a semiconductor device. The method comprises: providing a substrate on one side of which at least one semiconductor pillar stands, the semiconductor pillar having a stopper film formed on a top surface thereof; forming a first dielectric film to at least partially cover a surface of the at least one semiconductor pillar; forming a conductive film on the first dielectric film to allow the semiconductor pillar to be buried therein; flattening a top surface of the resulting product by chemical mechanical polishing (CMP), using the stopper film as a CMP stopper; etching an upper portion of the conductive film to remove a portion of the conductive film located along an upper portion of a side surface of the semiconductor pillar; forming a protective film on at least a part of the top surface and the upper portion of the side surface of the semiconductor pillar; etching back the protective film to form a protective film-based sidewall on respective top surfaces of the conductive film and the first dielectric film each located along the side surface of the semiconductor pillar; forming a resist pattern for forming a gate line in such a manner that at least a portion of the resist pattern is formed on the top surface of the semiconductor pillar by applying a resist and using lithography; and partially removing by etching, using the resist pattern as a mask, the conductive film to form at least a portion of the gate line, and partially removing by etching, using the protective film-based sidewall as a mask, the conductive film and the first dielectric film to form at least a portion of a gate electrode to have the desired film thickness.

For example, the conductive film is a layered structure film comprising a thin metal film on the side of the first dielectric film, and a polysilicon film.

For example, the protective film is a silicon nitride film.

For example, each of the protective film and the stopper films is a silicon nitride film.

For example, the substrate further has a diffusion region formed in contact with a lower part of the semiconductor pillar.

For example, the method further comprises the step of forming, in an upper portion of the semiconductor pillar, a diffusion region having a same conductivity type as that of the diffusion region formed in contact with a lower part of the semiconductor pillar.

For example, the diffusion region formed beneath the pillar-shaped semiconductor layer is formed in a surface region of the substrate.

The term "on one side" appears in the present specification and claims in the form of "A is on one side of B", which should be interpreted to mean either "A is situated in contact with B on one side of B," or "A is situated away from B on one side of B," whenever the context allows such an interpretation.

As described above, in the production method of the present invention, the step of performing etching to fix a gate length, the step of forming a gate electrode-protecting silicon nitride film-based sidewall, the step of forming a gate line pattern, and the step of performing etching to form a gate line, are sequentially performed. Thus, the method is capable of forming a gate electrode around a pillar-shaped silicon layer in a self-alignment manner and with a desired film thickness, and less vulnerable to a deviation in exposure alignment during gate line formation. This makes it possible to simultaneously solve both the following conventional problems: a disconnection or open of a gate line arising from a lithography step of forming a gate line; and an incapability to form a gate electrode around a pillar-shaped silicon layer in a self-alignment manner.

Further, the step of flattening a top surface of a gate conductive film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. This makes it possible to simultaneously solve both the following conventional problems: a disconnection or open of a gate line and a variation in gate length e arising from a lithography step of forming a gate line; and an incapability to form a gate electrode around a pillar-shaped silicon layer in a self-alignment manner.

Figure 120:
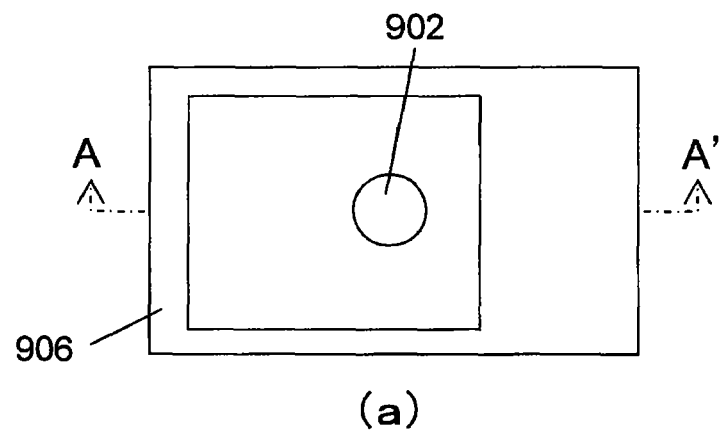
Figure 120:
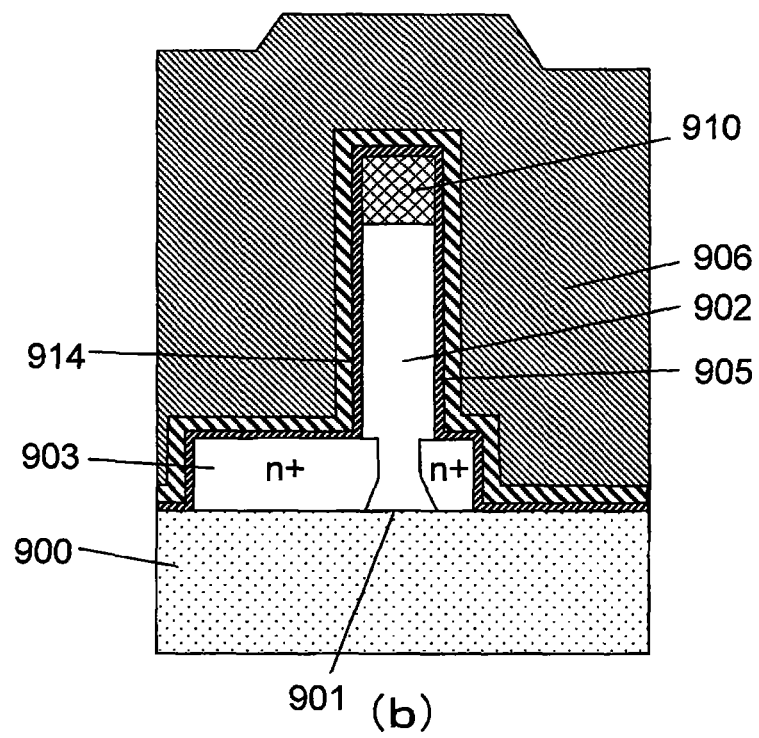

FIGS. 120(*a*) and 120(*b*) illustrate a part of a series of steps of the single-SGT production method according to the ninth embodiment.

Figure 121:
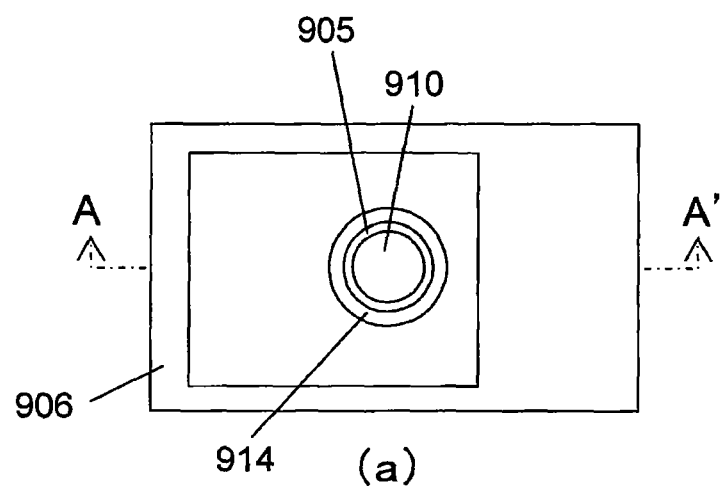
Figure 121:
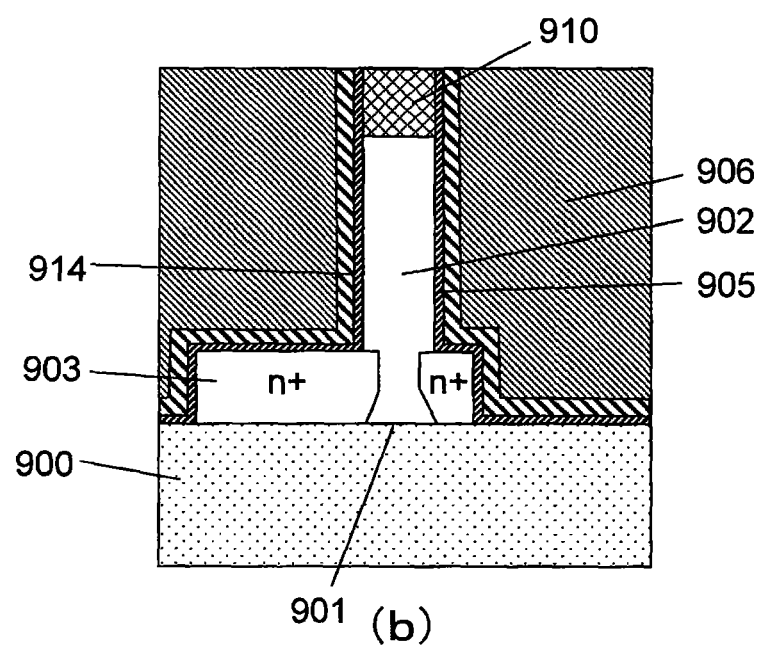

FIGS. 121(*a*) and 121(*b*) illustrate a part of the steps of the single-SGT production method according to the ninth embodiment.

Figure 122:
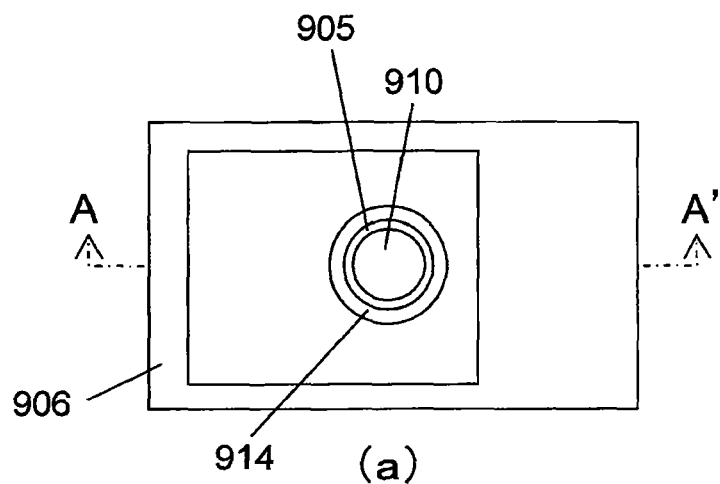
Figure 122:
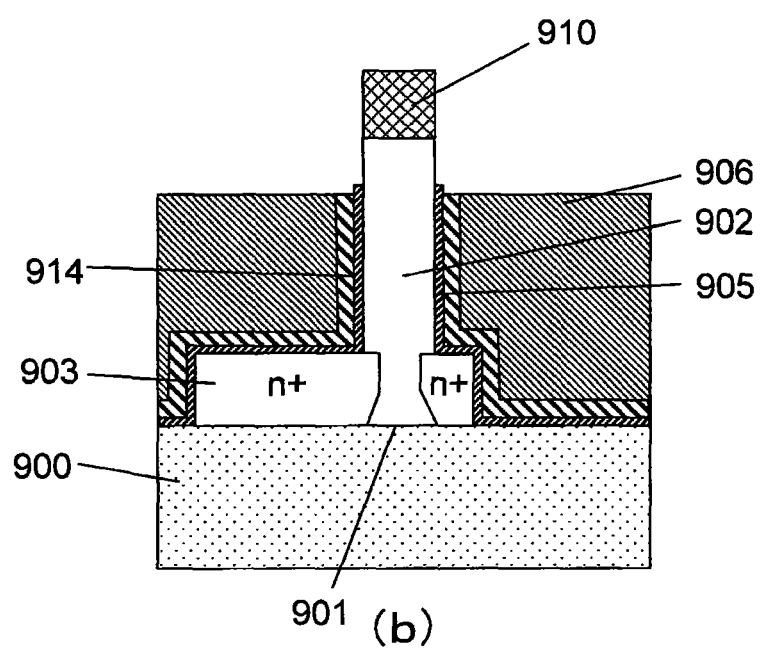

FIGS. 122(*a*) and 122(*b*) illustrate a part of the steps of the single-SGT production method according to the ninth embodiment.

Figure 123:
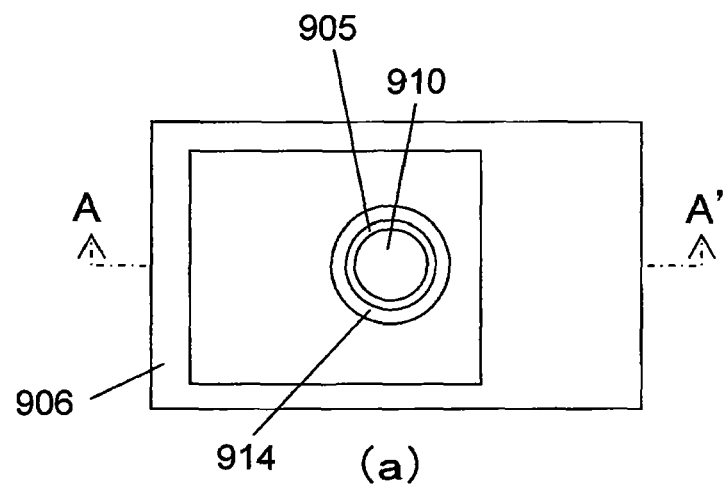
Figure 123:
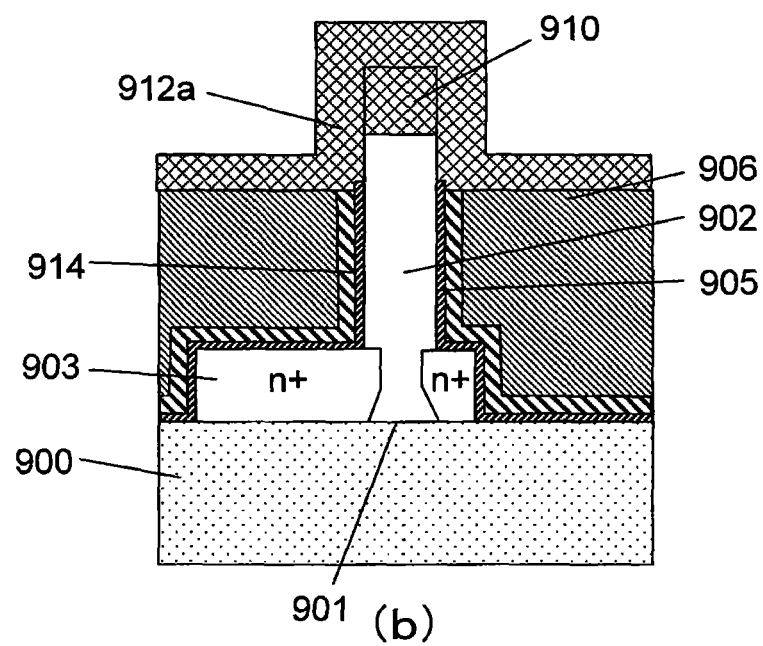

FIGS. 123(*a*) and 123(*b*) illustrate a part of the steps of the single-SGT production method according to the ninth embodiment.

Figure 124:
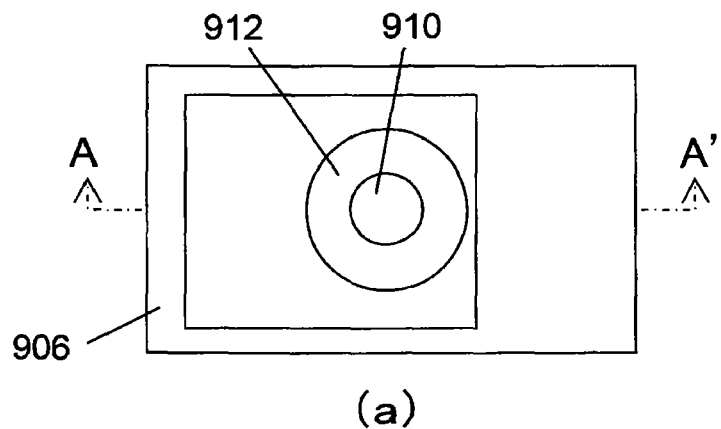
Figure 124:
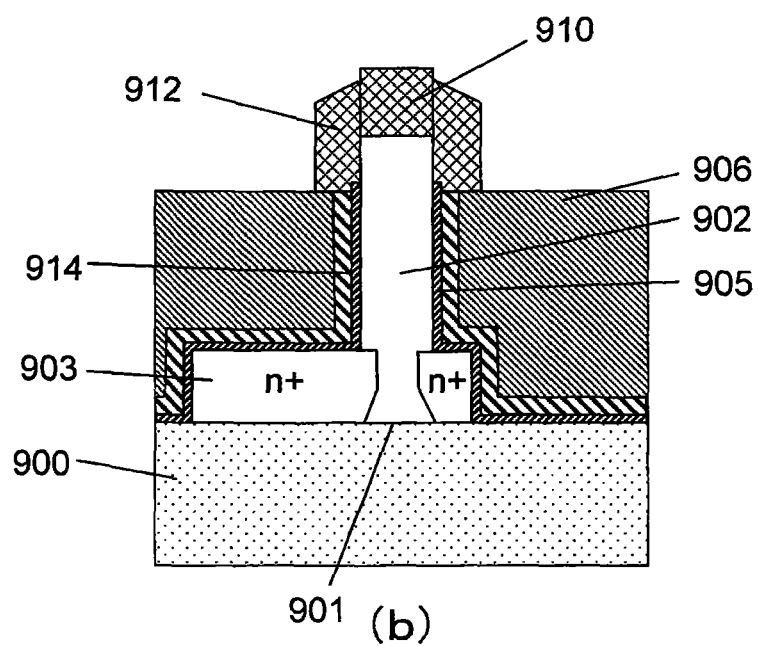

FIGS. 124(*a*) and 124(*b*) illustrate a part of the steps of the single-SGT production method according to the ninth embodiment.

Figure 125:
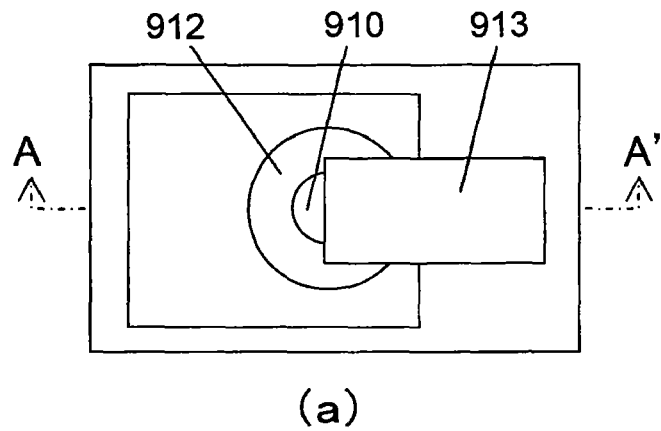
Figure 125:
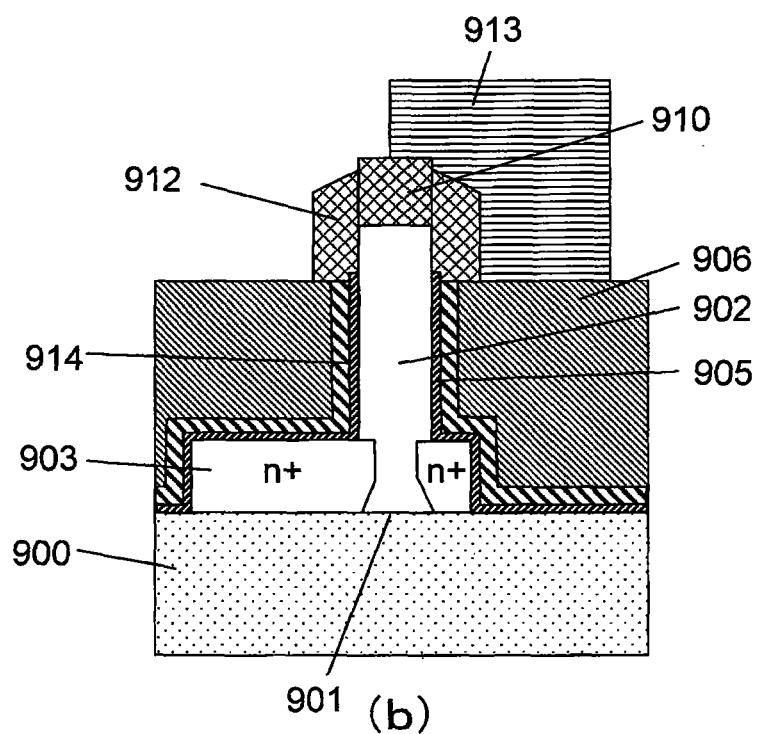

FIGS. 125(*a*) and 125(*b*) illustrate a part of the steps of the single-SGT production method according to the ninth embodiment.

Figure 126:
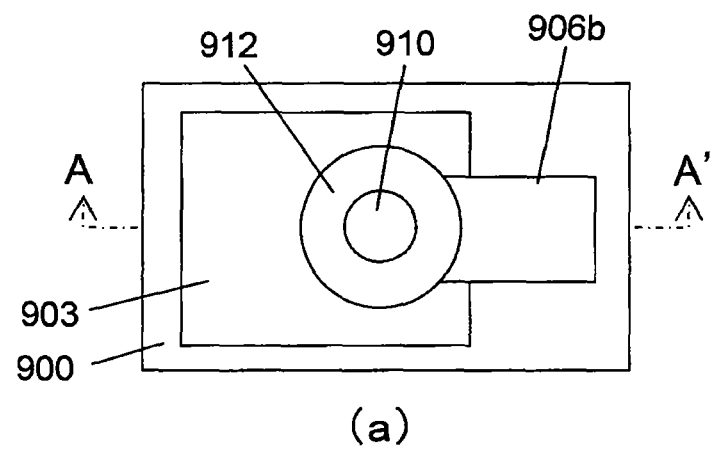
Figure 126:
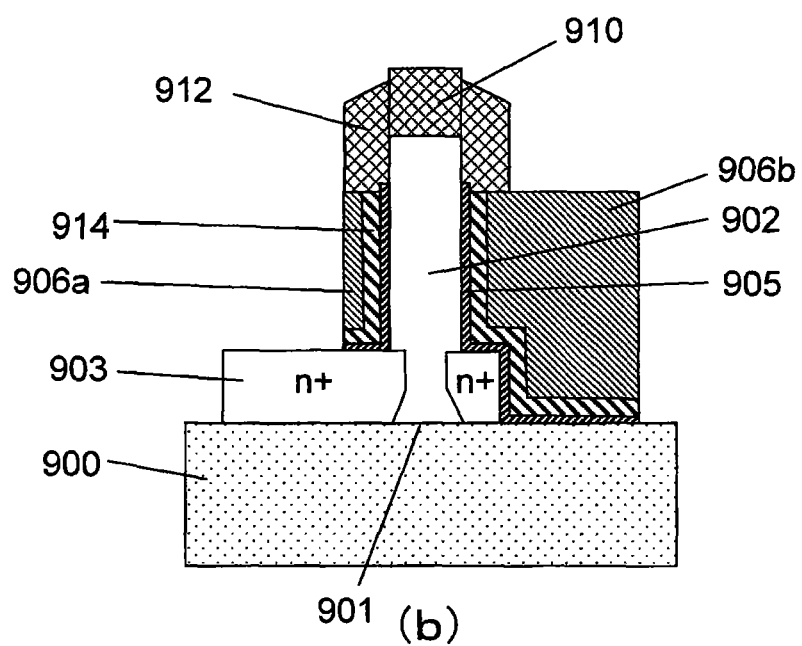

FIGS. 126(*a*) and 126(*b*) illustrate a part of the steps of the single-SGT production method according to the ninth embodiment.

Figure 127:
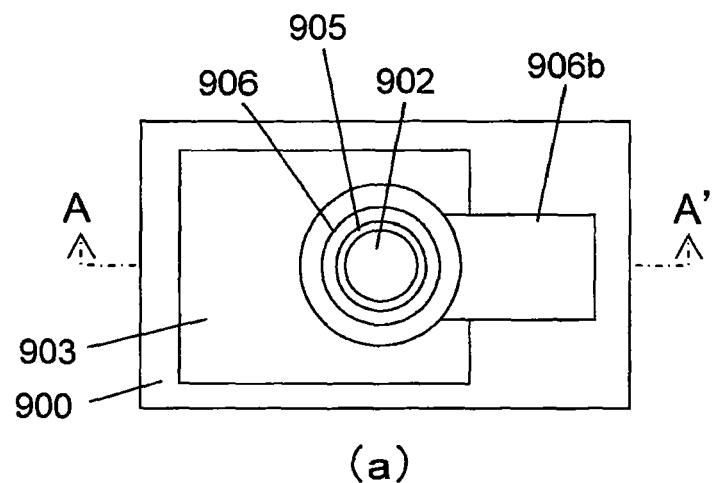
Figure 127:
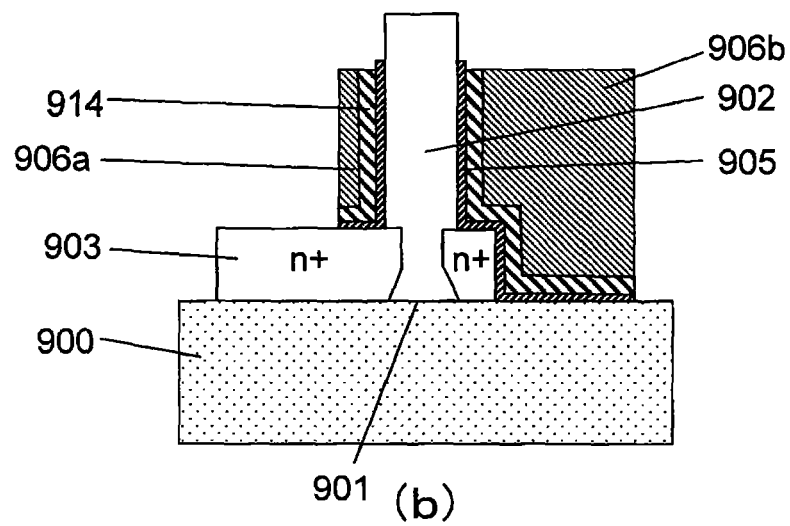

FIGS. 127(*a*) and 127(*b*) illustrate a part of the steps of the single-SGT production method according to the ninth embodiment.

Figure 128:
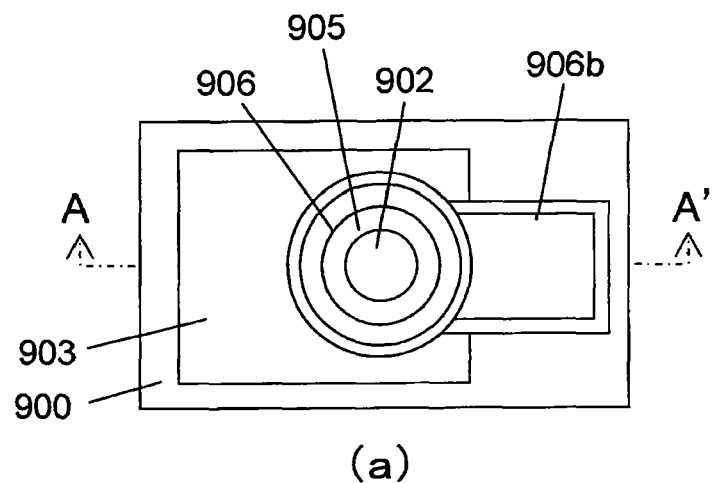
Figure 128:
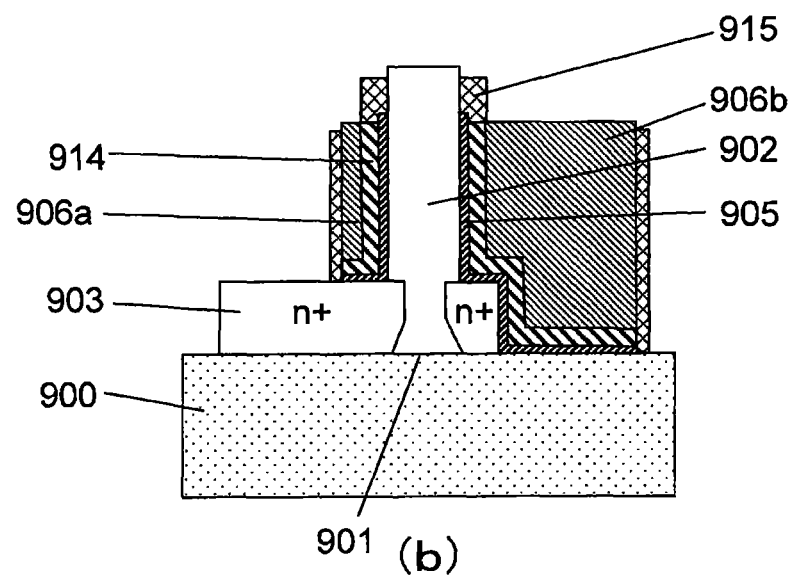

FIGS. 128(*a*) and 128(*b*) illustrate a part of the steps of the single-SGT production method according to the ninth embodiment.

Figure 129:
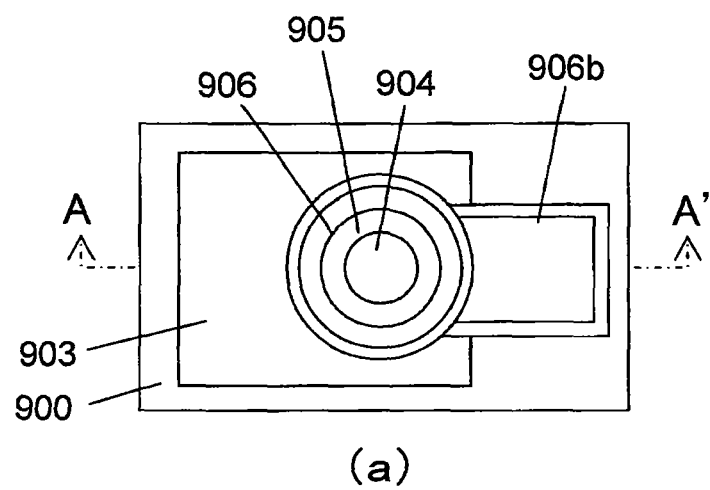
Figure 129:
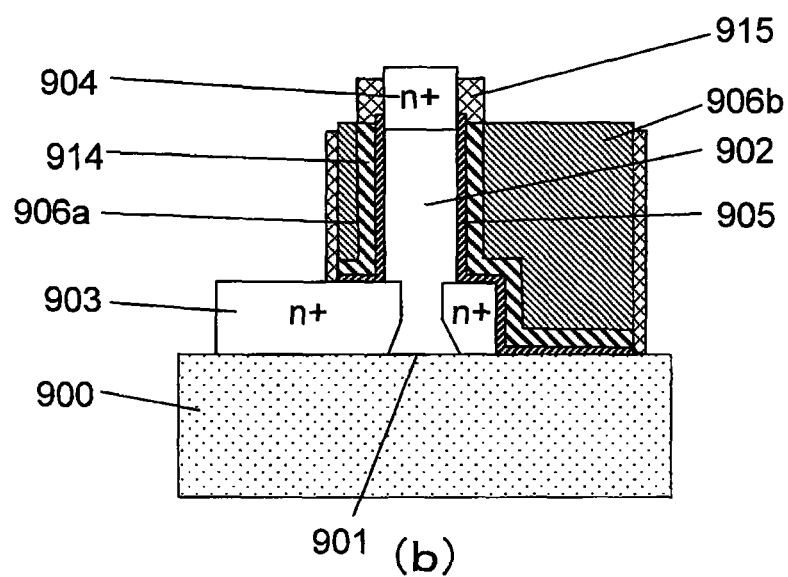

FIGS. 129(*a*) and 129(*b*) illustrate a part of the steps of the single-SGT production method according to the ninth embodiment.

Figure 130:
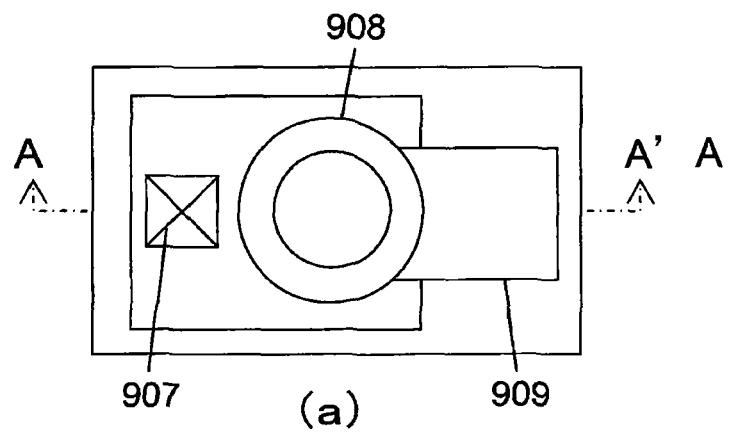
Figure 130:
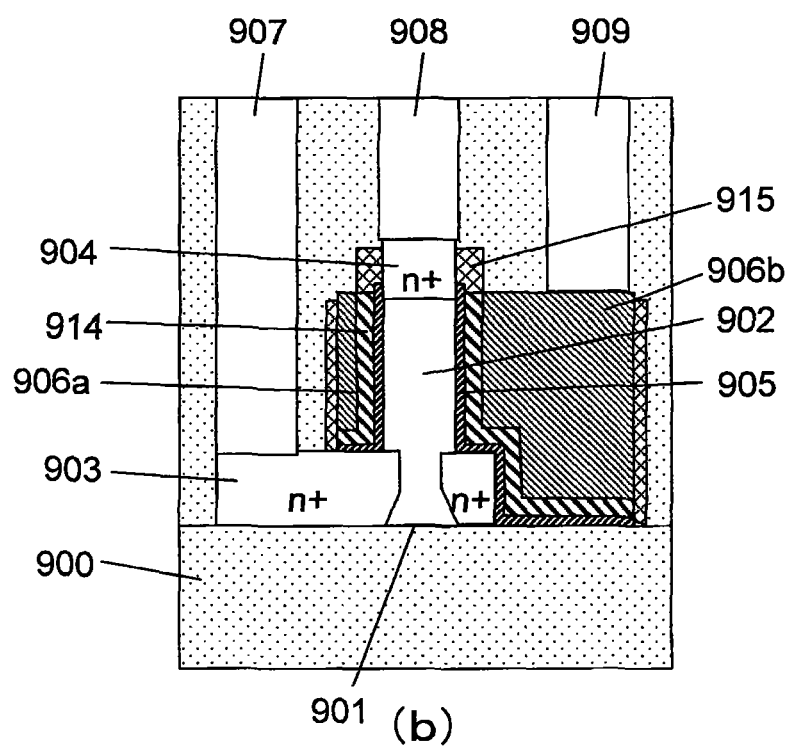

FIGS. 130(*a*) and 130(*b*) illustrate a part of the steps of the single-SGT production method according to the ninth embodiment.

Figure 131:
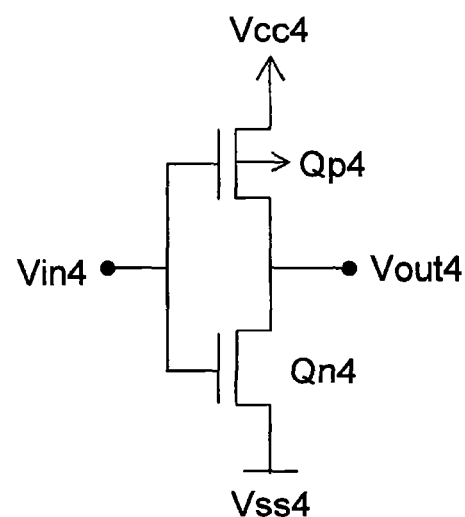

FIG. 131 is an equivalent circuit diagram of a CMOS inverter formed by a production method according to a tenth embodiment of the present invention.

Figure 132:
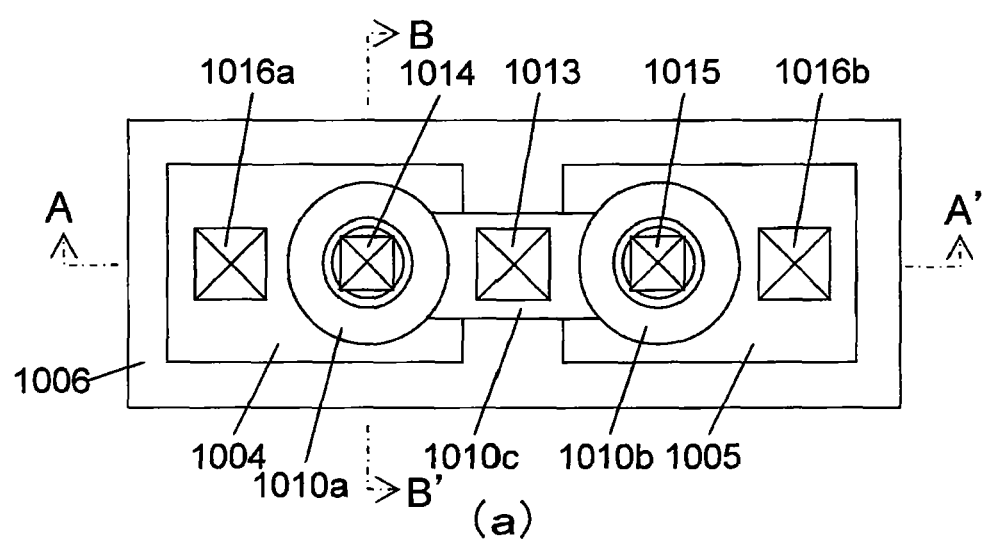

FIG. 132 is a top plan view of the CMOS inverter formed by the production method according to the tenth embodiment.

Figure 133:
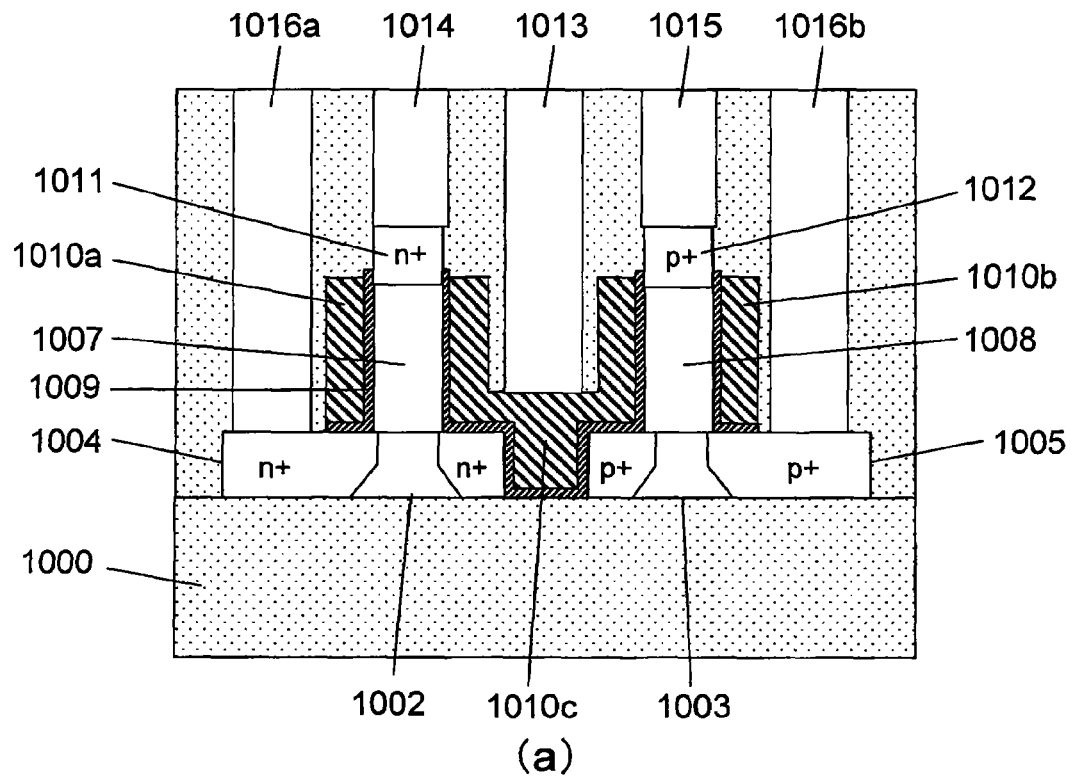
Figure 133:
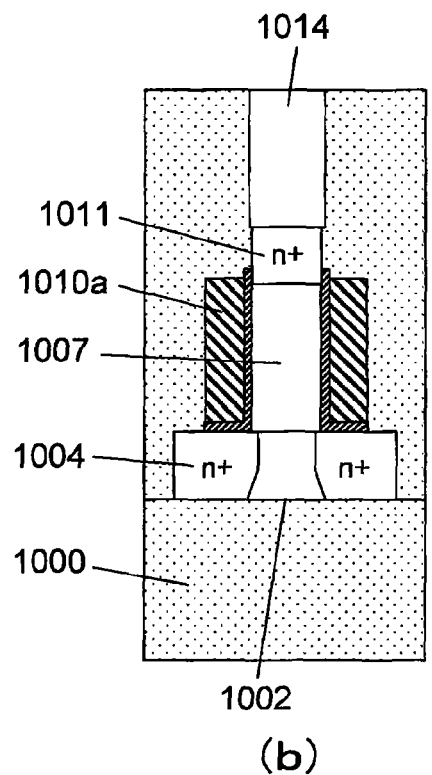

FIGS. 133(*a*) and 133(*b*) are sectional views of the CMOS inverter formed by the production method according to the tenth embodiment.

Figure 134:
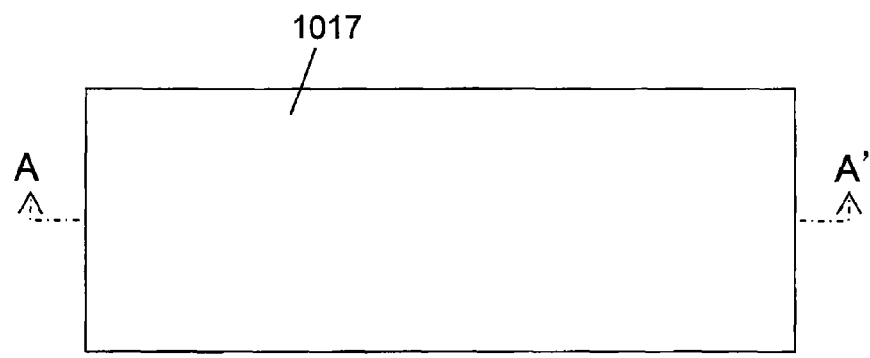
Figure 134:
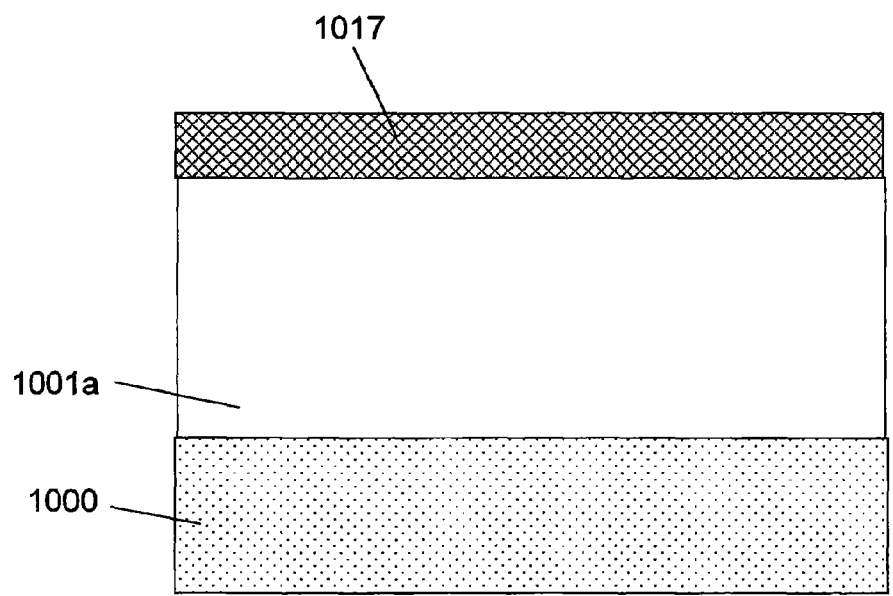

FIGS. 134(*a*) and 134(*b*) illustrate a part of a series of steps of the CMOS inverter production method according to the tenth embodiment.

Figure 135:
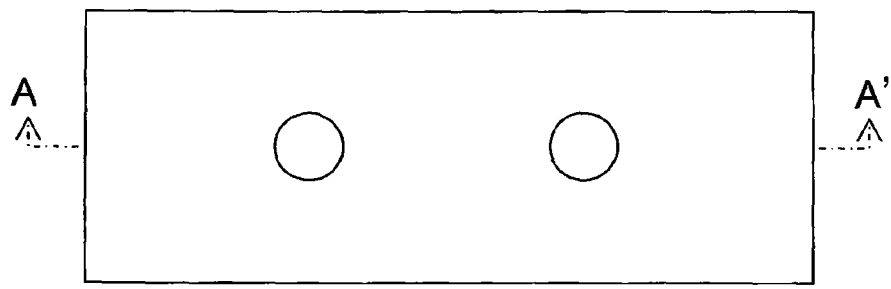
Figure 135:
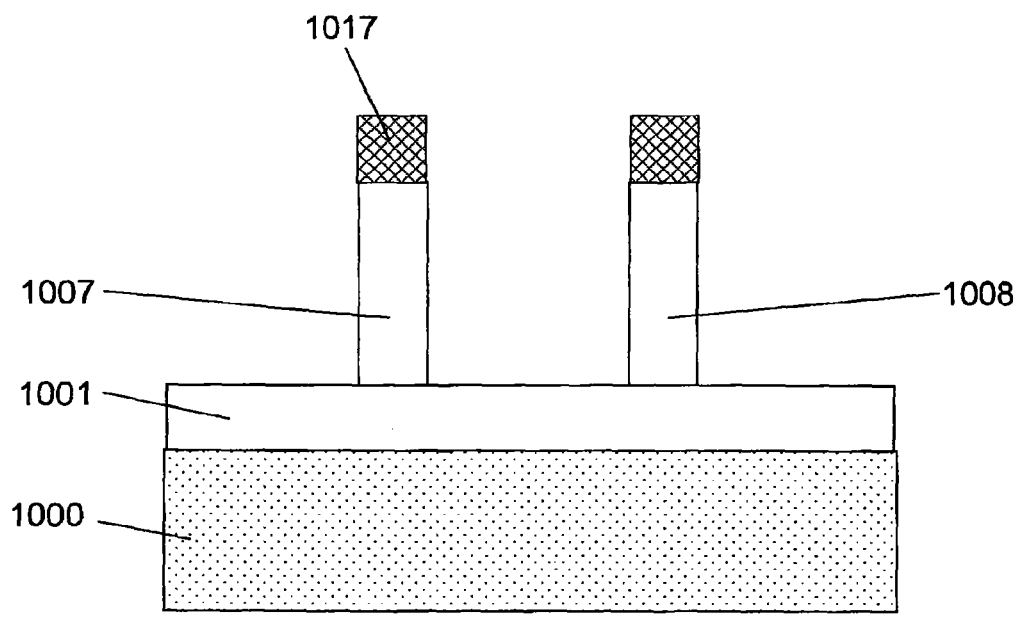

FIGS. 135(*a*) and 135(*b*) illustrate a part of the steps of the CMOS inverter production method according to the tenth embodiment.

Figure 136:
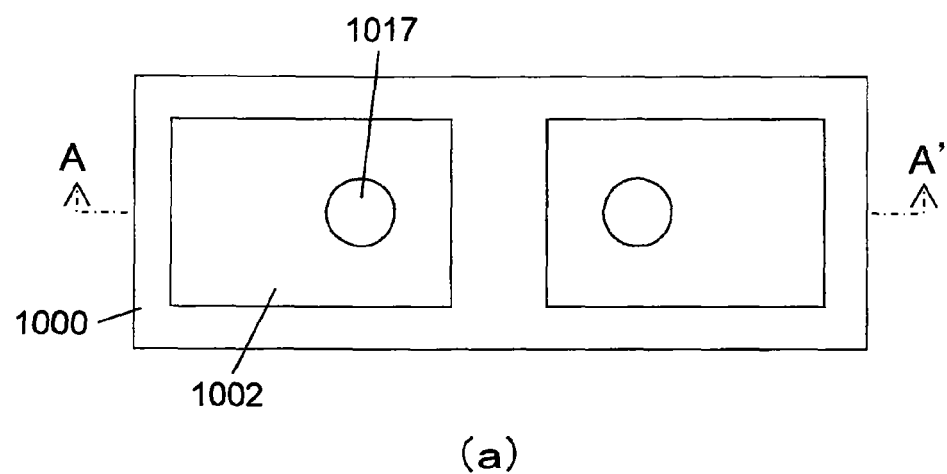
Figure 136:
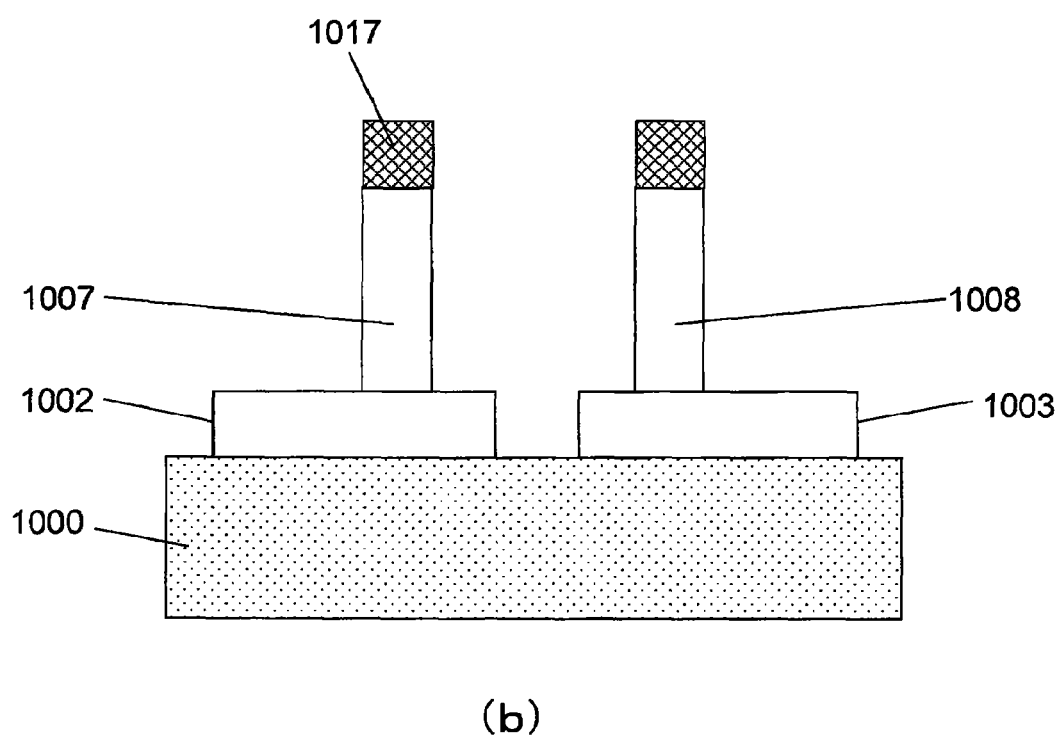

FIGS. 136(*a*) and 136(*b*) illustrate a part of the steps of the CMOS inverter production method according to the tenth embodiment.

Figure 137:
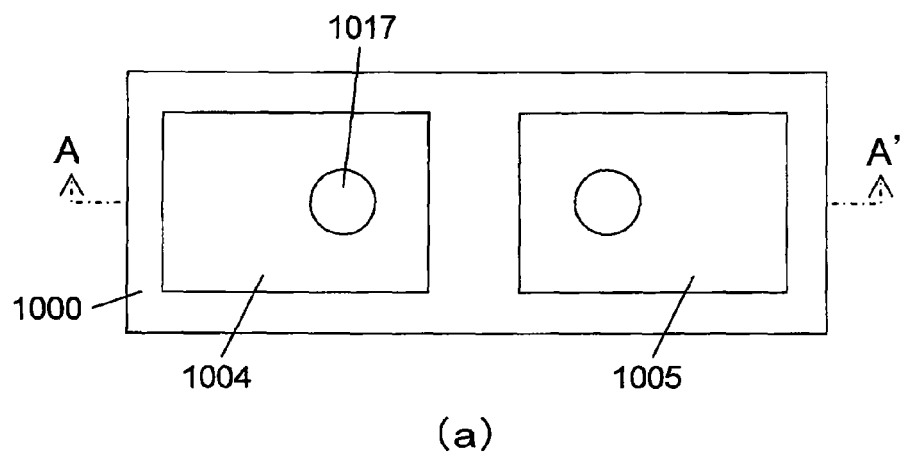
Figure 137:
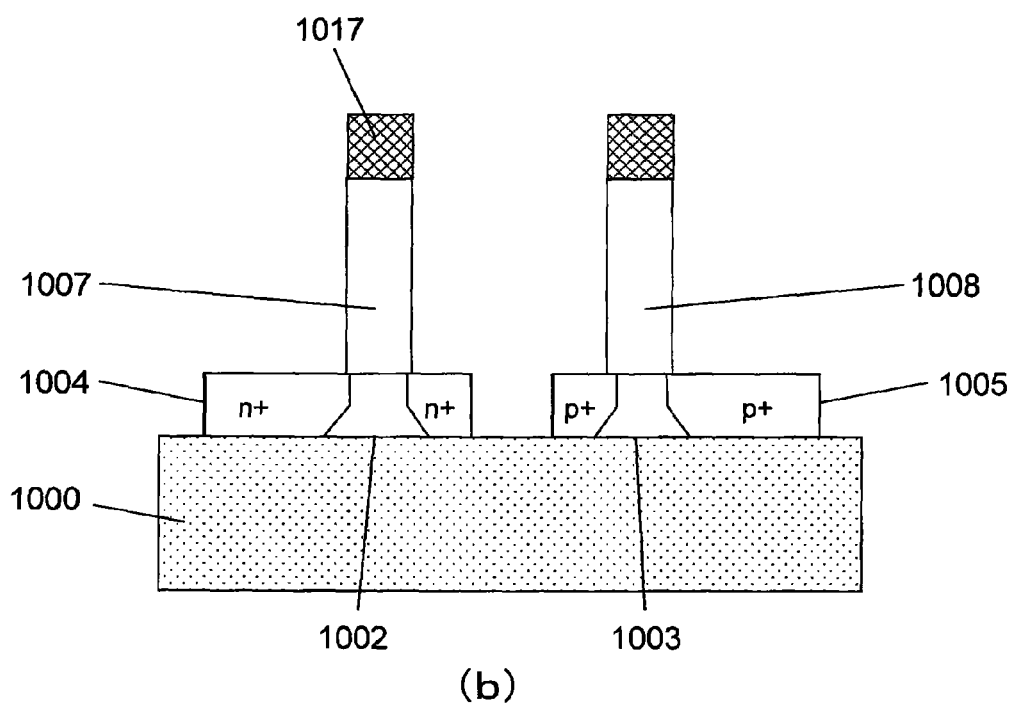

FIGS. 137(*a*) and 137(*b*) illustrate a part of the steps of the CMOS inverter production method according to the tenth embodiment.

Figure 138:
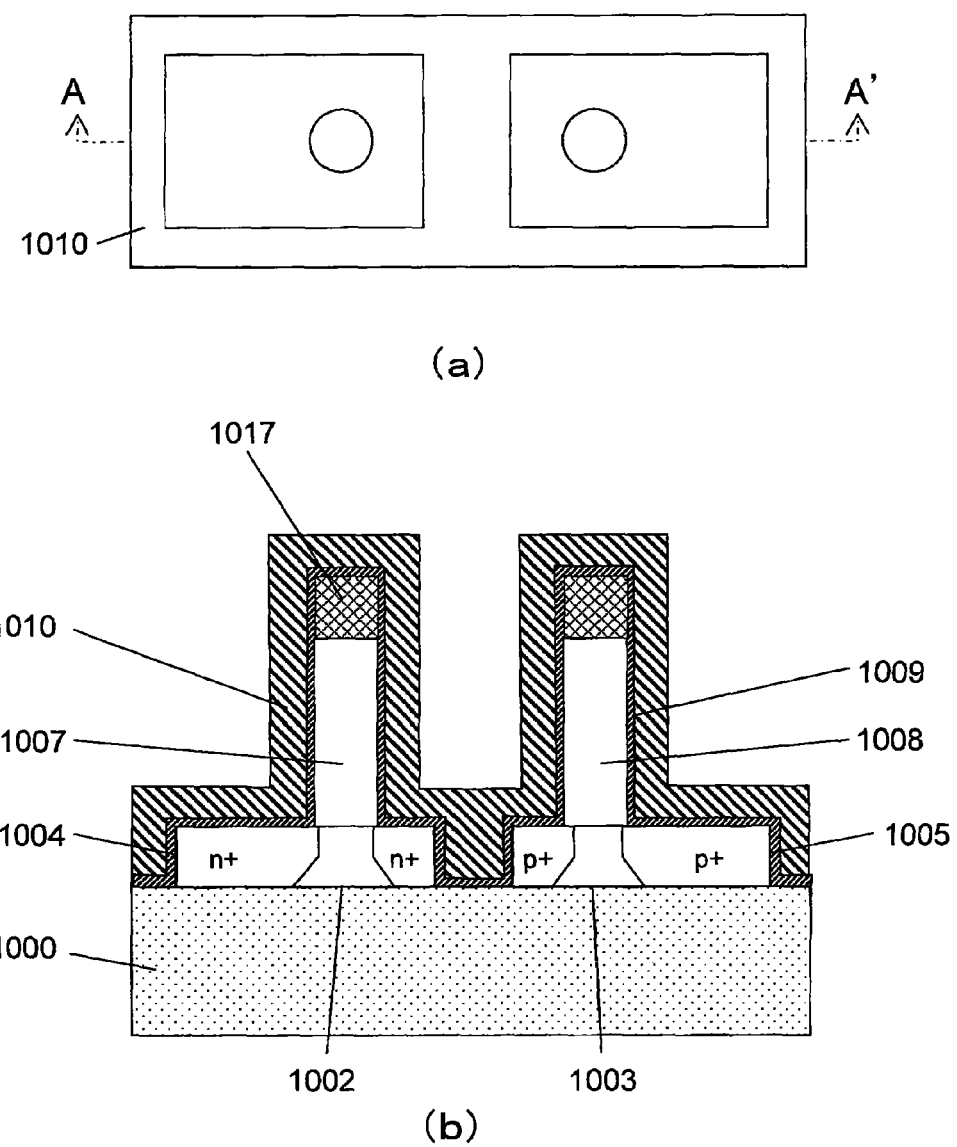

FIGS. 138(*a*) and 138(*b*) illustrate a part of the steps of the CMOS inverter production method according to the tenth embodiment.

Figure 139:
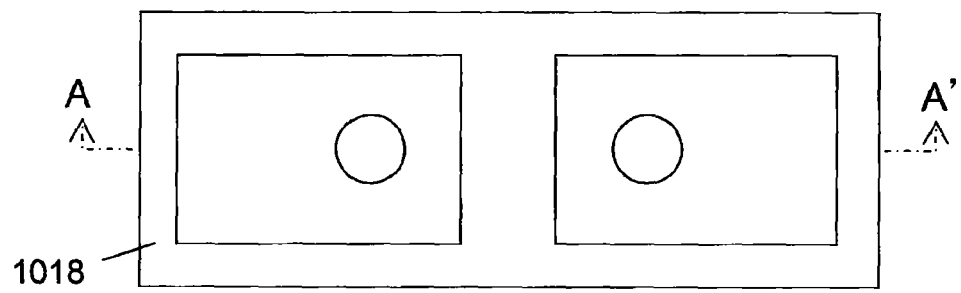
Figure 139:
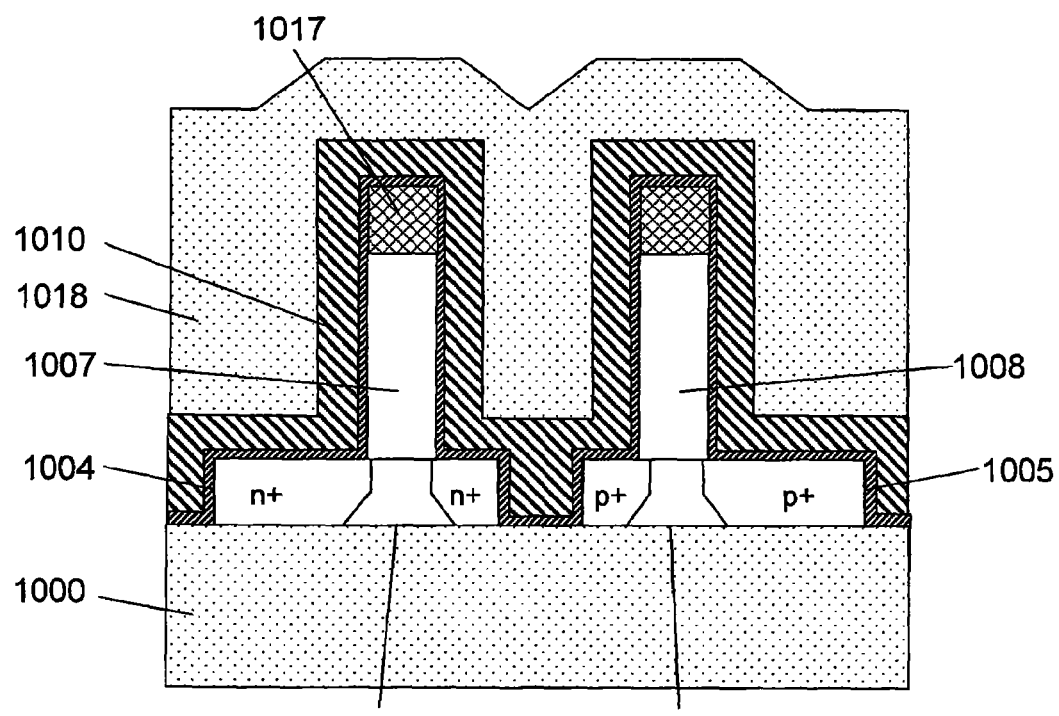

FIGS. 139(*a*) and 139(*b*) illustrate a part of the steps of the CMOS inverter production method according to the tenth embodiment.

Figure 140:
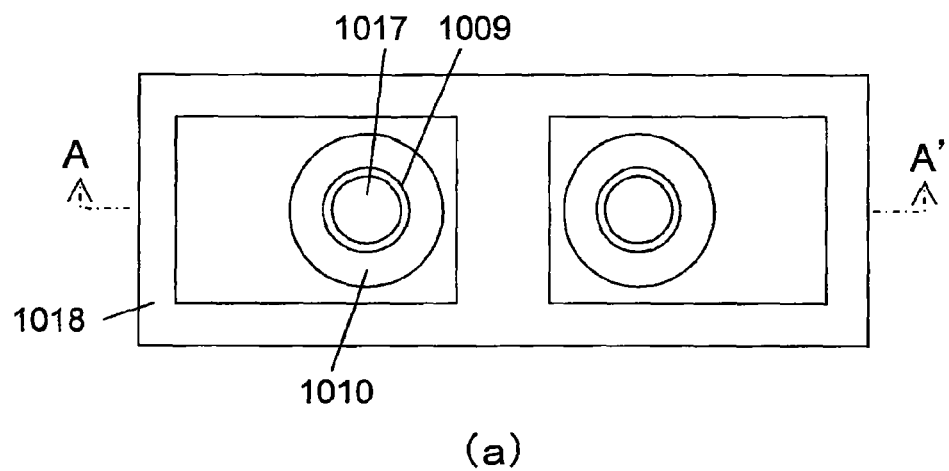
Figure 140:
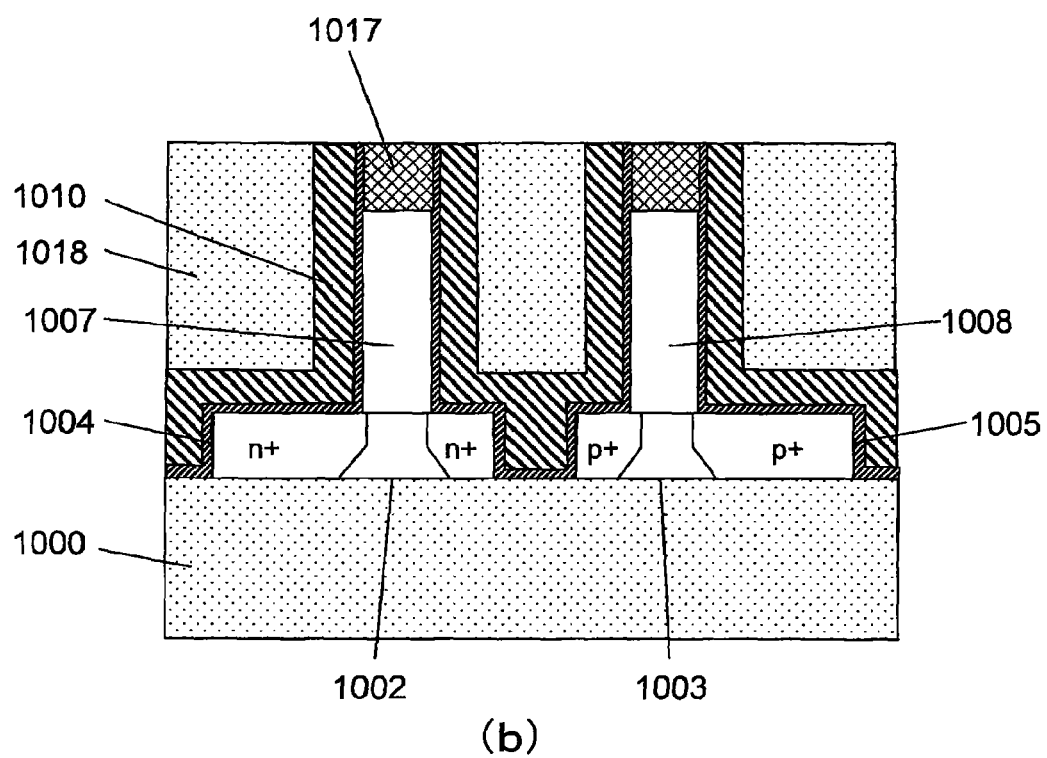

FIGS. 140(*a*) and 140(*b*) illustrate a part of the steps of the CMOS inverter production method according to the tenth embodiment.

Figure 141:
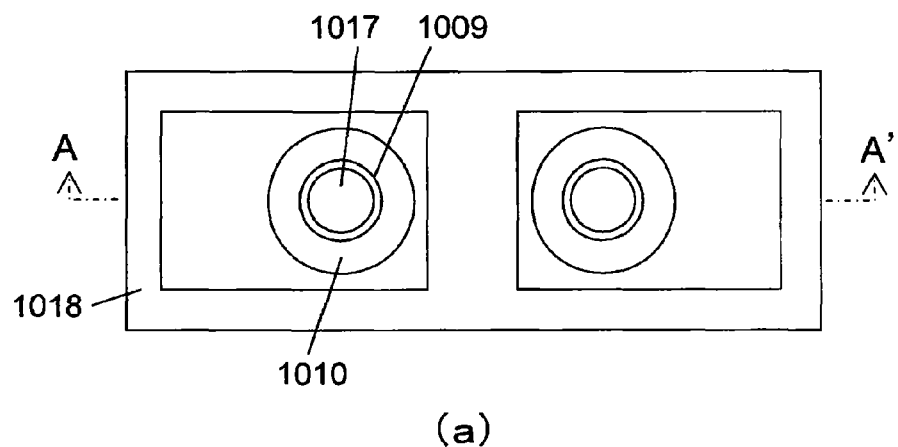
Figure 141:
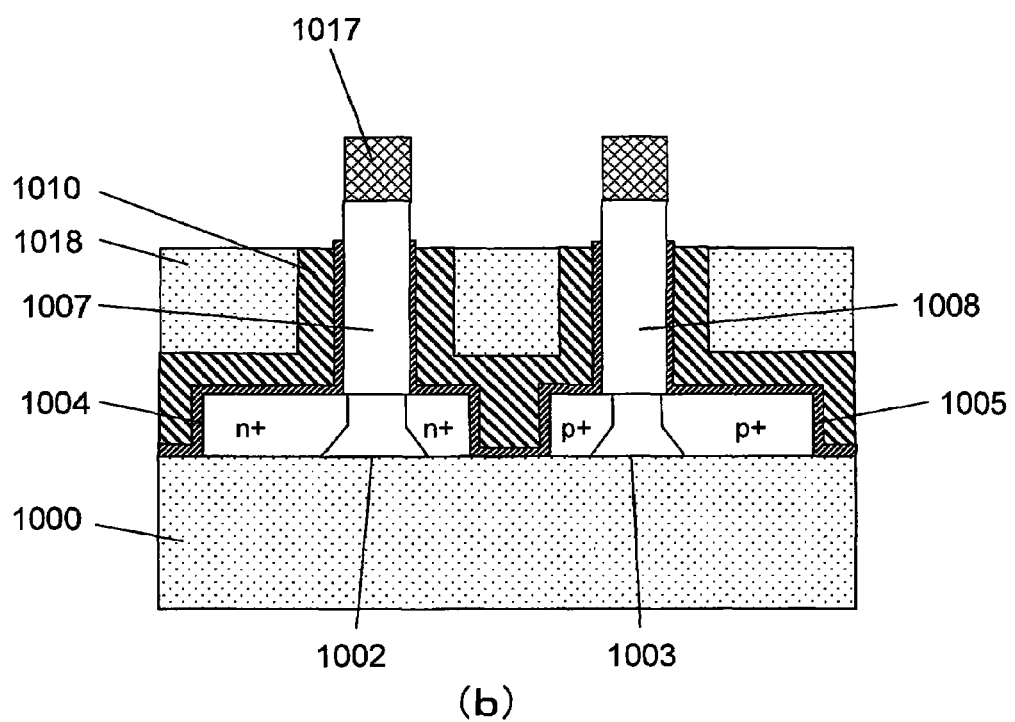

FIGS. 141(*a*) and 141(*b*) illustrate a part of the steps of the CMOS inverter production method according to the tenth embodiment.

Figure 142:
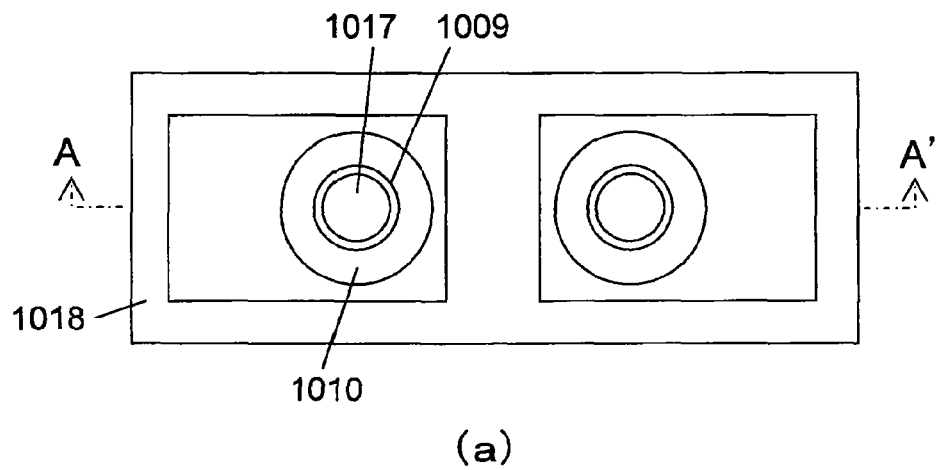
Figure 142:
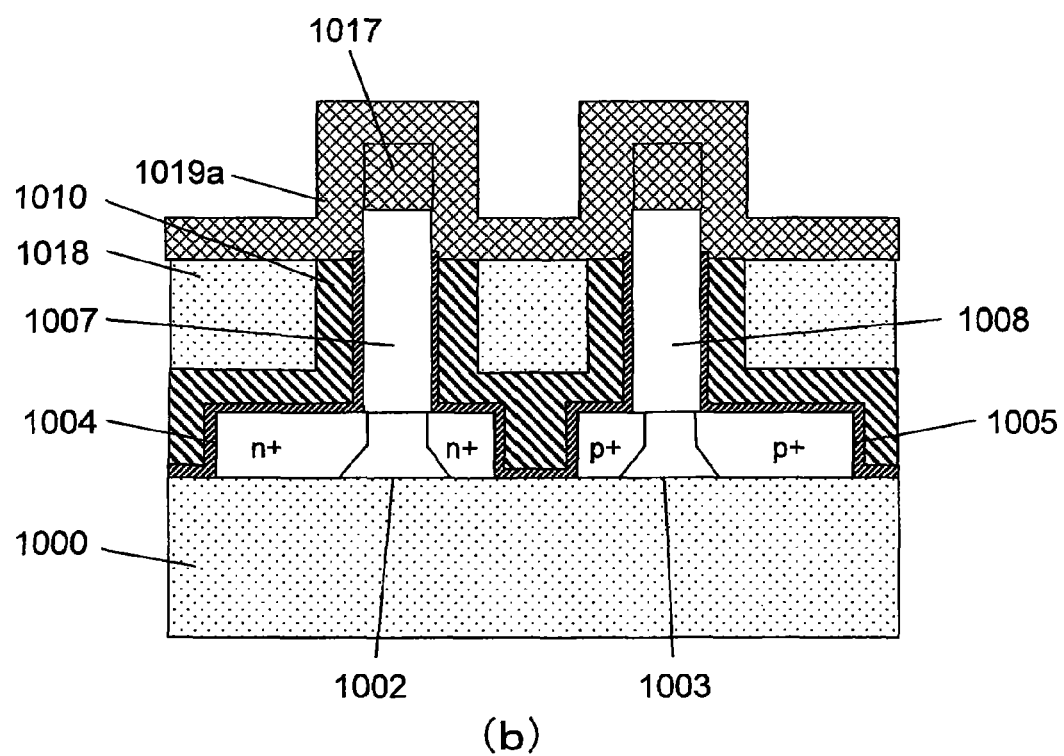

FIGS. 142(*a*) and 142(*b*) illustrate a part of the steps of the CMOS inverter production method according to the tenth embodiment.

Figure 143:
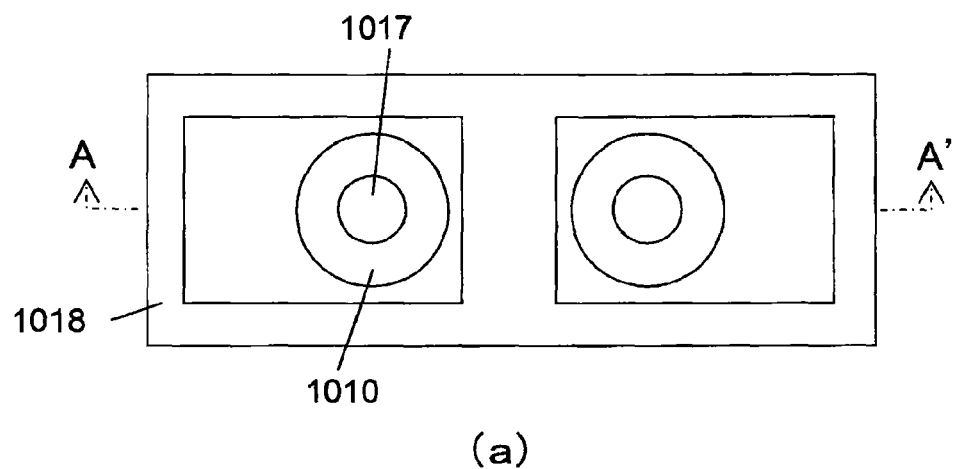
Figure 143:
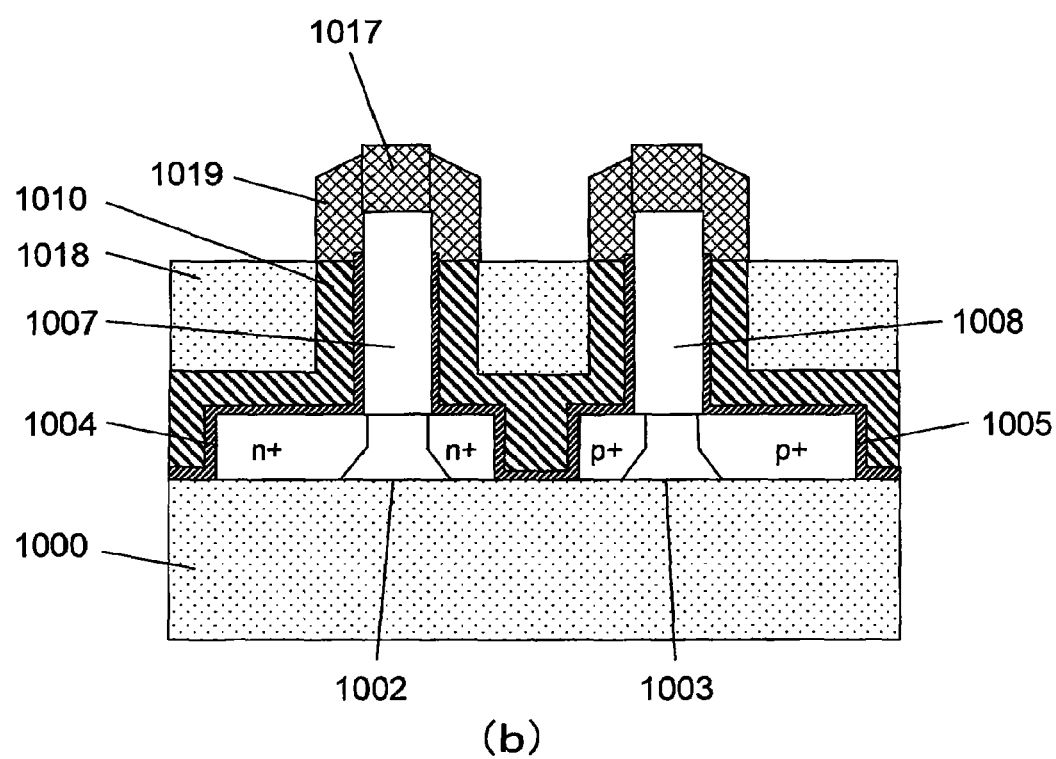

FIGS. 143(*a*) and 143(*b*) illustrate a part of the steps of the CMOS inverter production method according to the tenth embodiment.

Figure 144:
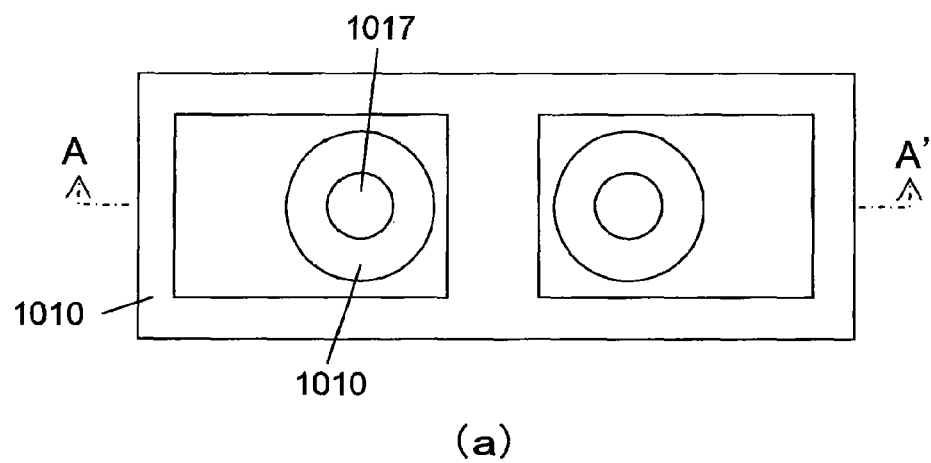
Figure 144:
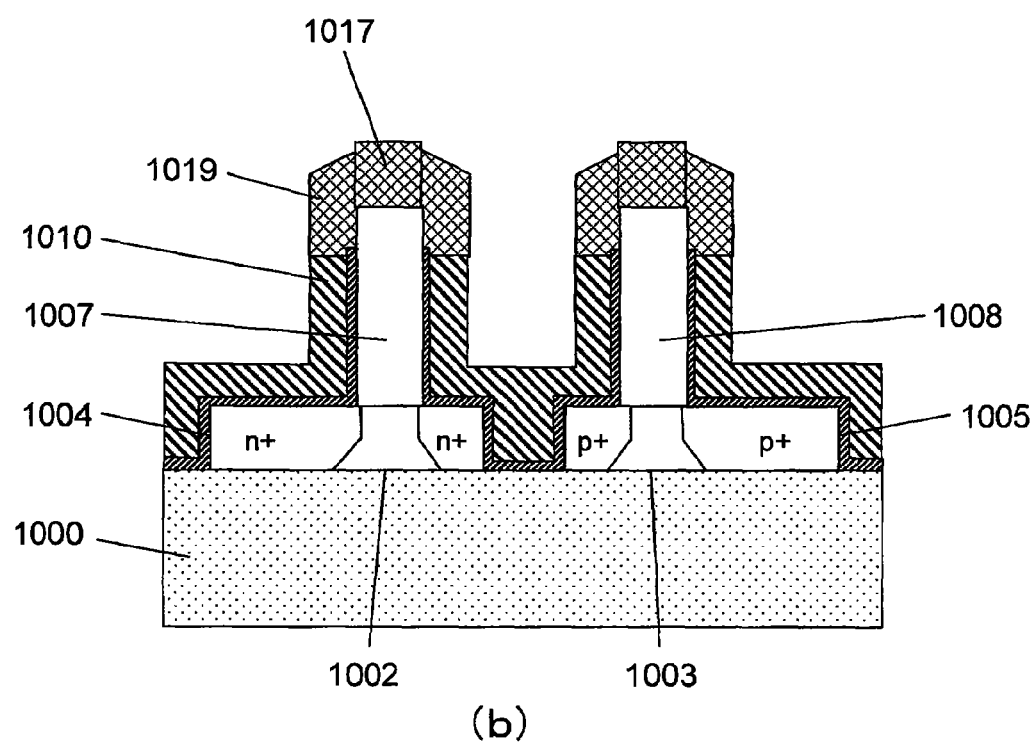

FIGS. 144(*a*) and 144(*b*) illustrate a part of the steps of the CMOS inverter production method according to the tenth embodiment.

Figure 145:
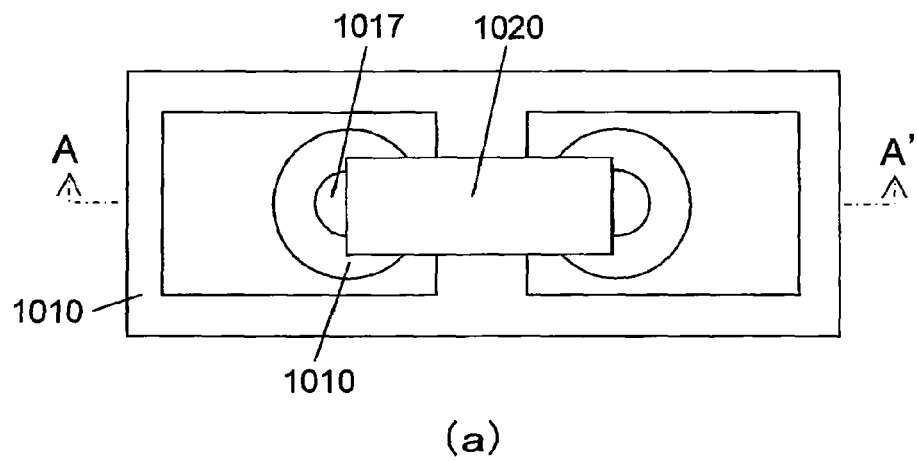
Figure 145:
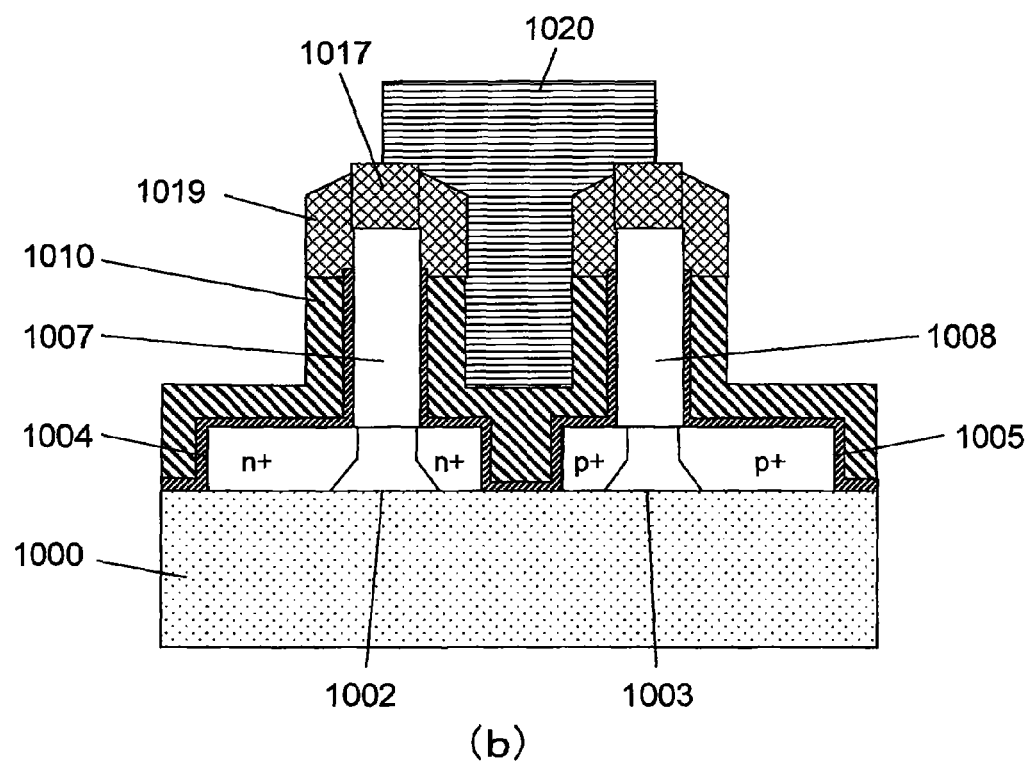

FIGS. 145(*a*) and 145(*b*) illustrate a part of the steps of the CMOS inverter production method according to the tenth embodiment.

Figure 146:
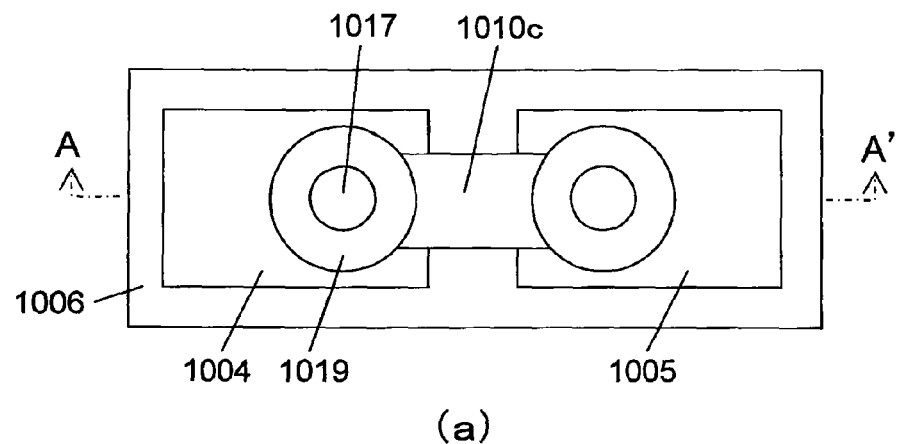
Figure 146:
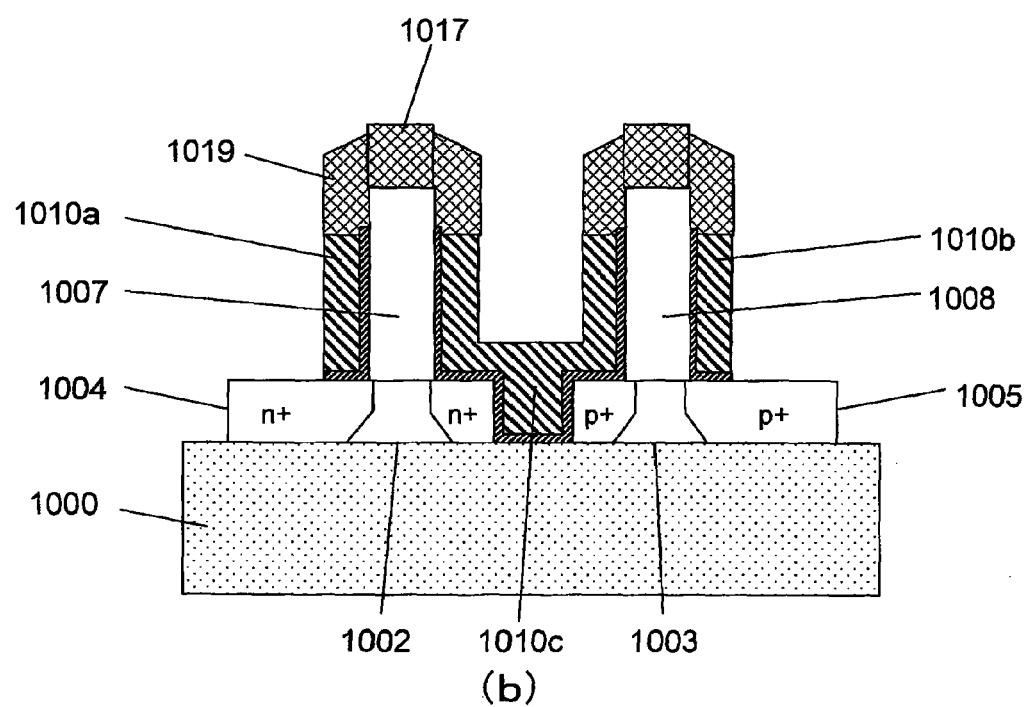

FIGS. 146(*a*) and 146(*b*) illustrate a part of the steps of the CMOS inverter production method according to the tenth embodiment.

Figure 147:
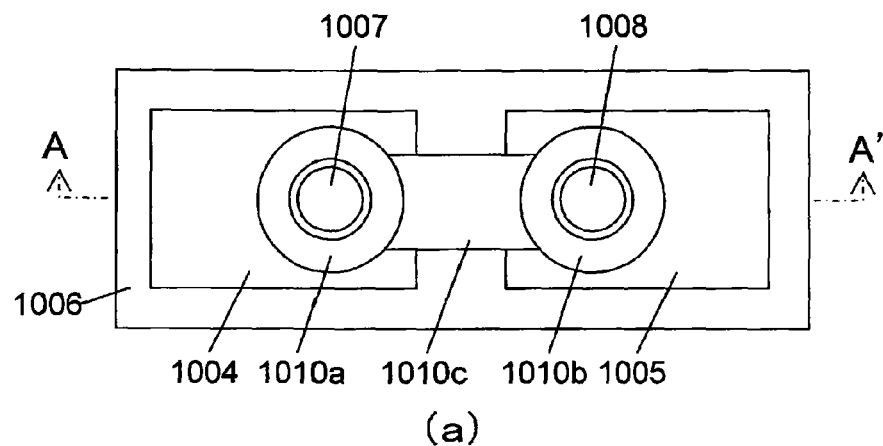
Figure 147:
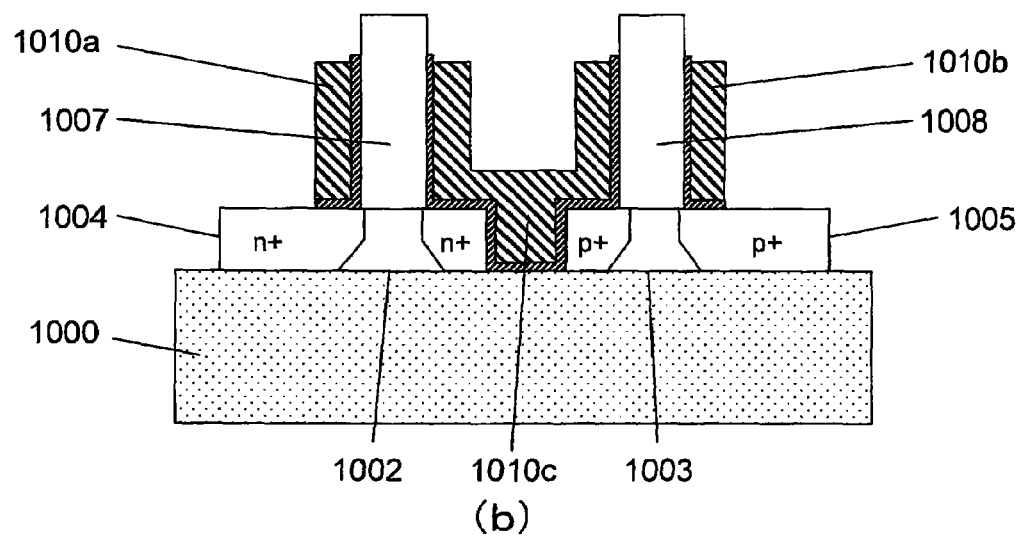

FIGS. 147(*a*) and 147(*b*) illustrate a part of the steps of the CMOS inverter production method according to the tenth embodiment.

Figure 148:
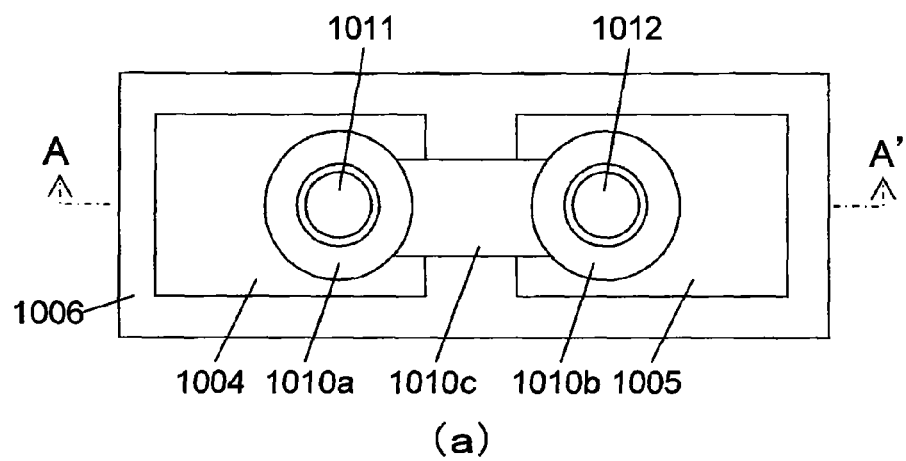
Figure 148:
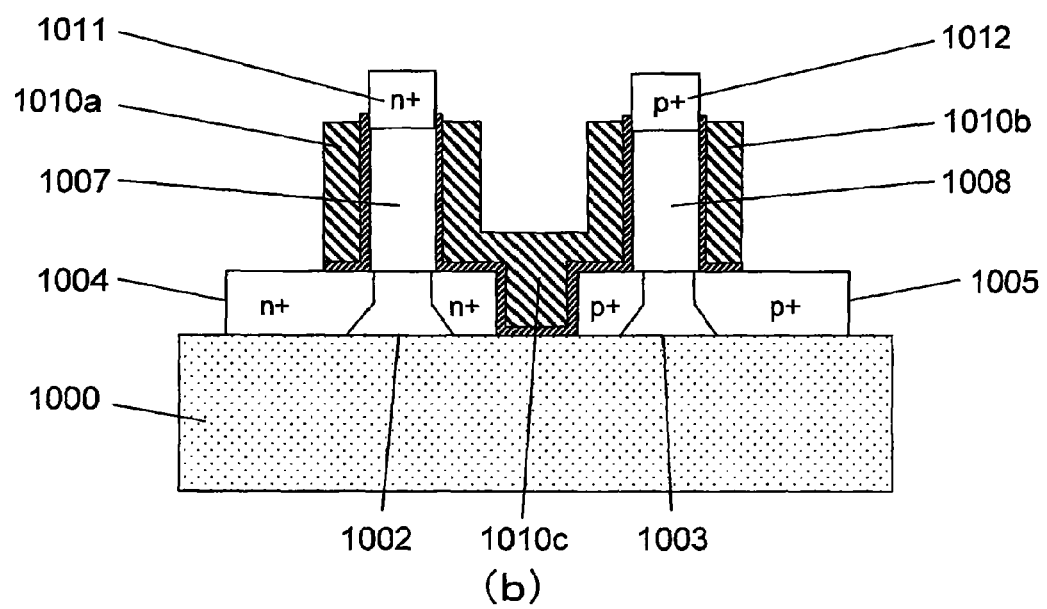

FIGS. 148(*a*) and 148(*b*) illustrate a part of the steps of the CMOS inverter production method according to the tenth embodiment.

Figure 149:
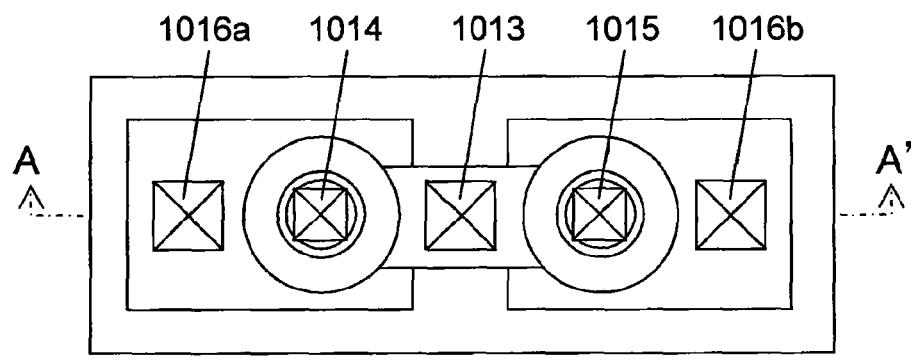
Figure 149:
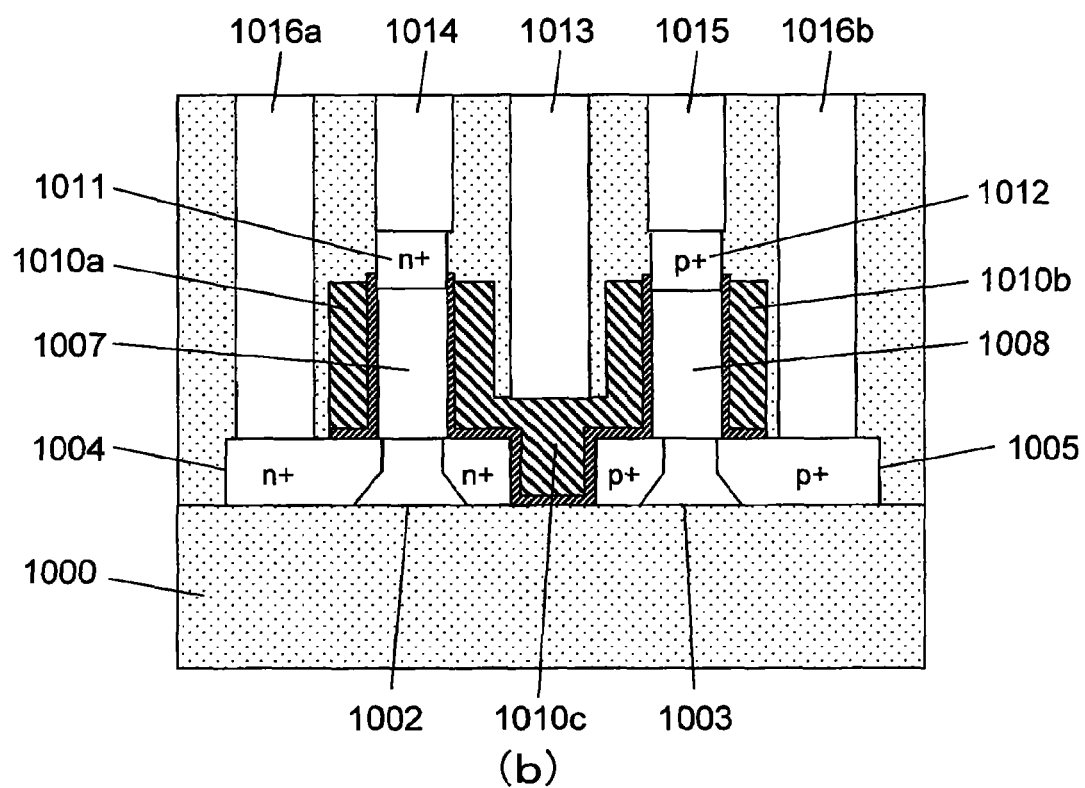

FIGS. 149(*a*) and 149(*b*) illustrate a part of the steps of the CMOS inverter production method according to the tenth embodiment.

Figure 150:
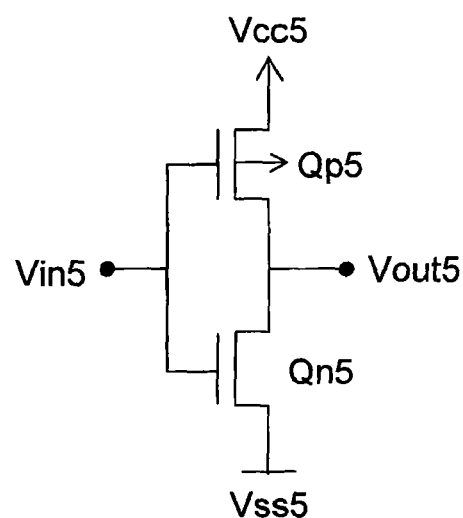

FIG. 150 is an equivalent circuit diagram of a CMOS inverter formed by a production method according to an eleventh embodiment of the present invention.

Figure 151:
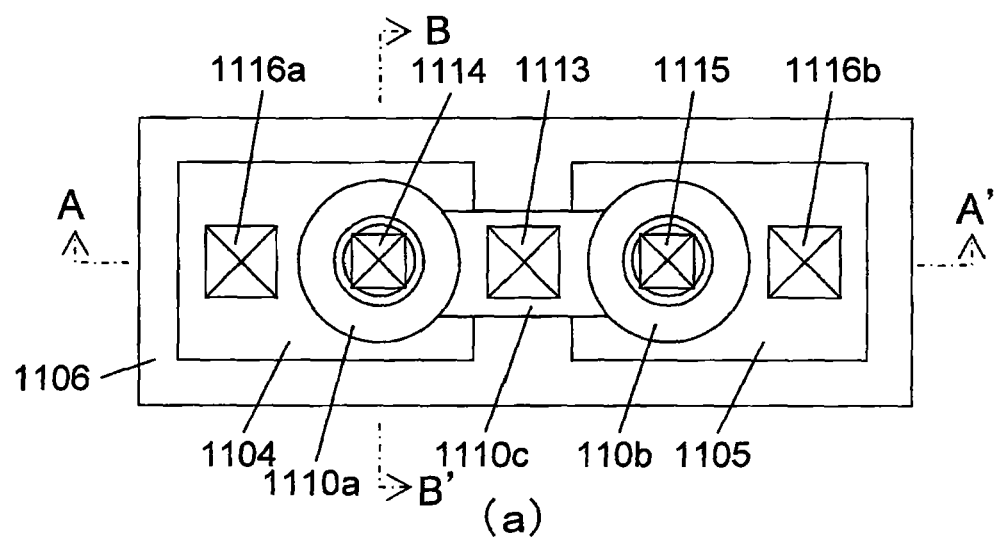

FIG. 151 is a top plan view of the CMOS inverter formed by the production method according to the eleventh embodiment.

Figure 152:
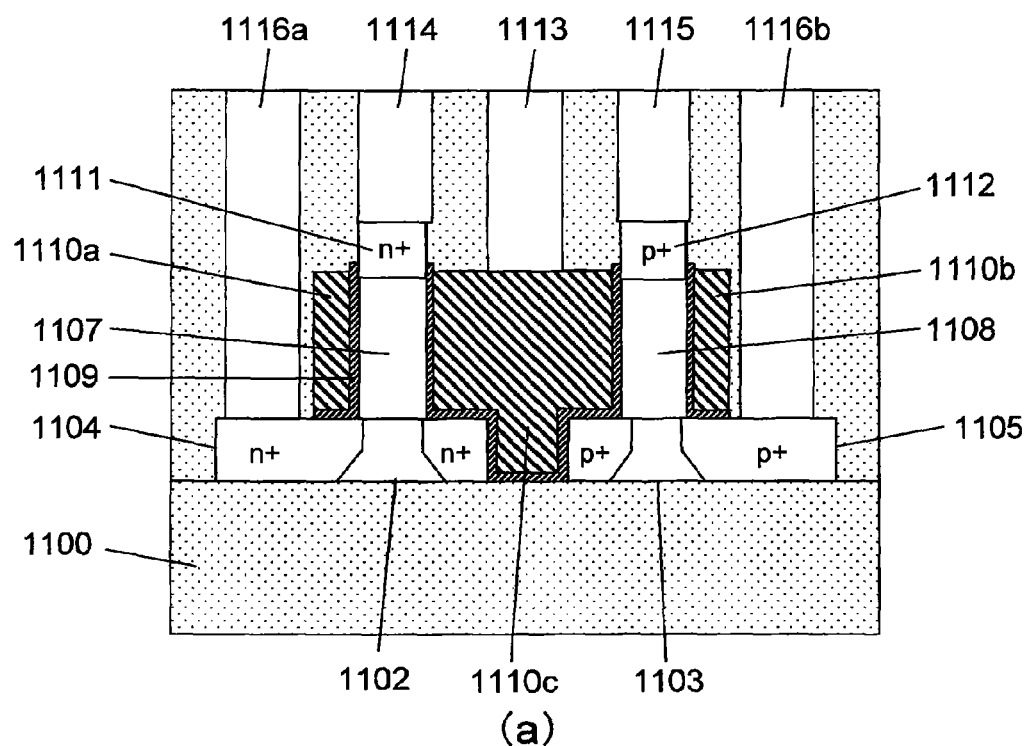
Figure 152:
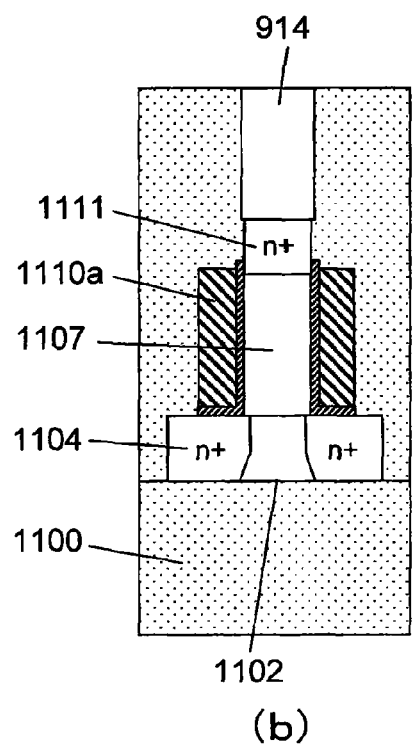

FIGS. 152(*a*) and 152(*b*) are sectional views of the CMOS inverter formed by the production method according to the eleventh embodiment.

Figure 153:
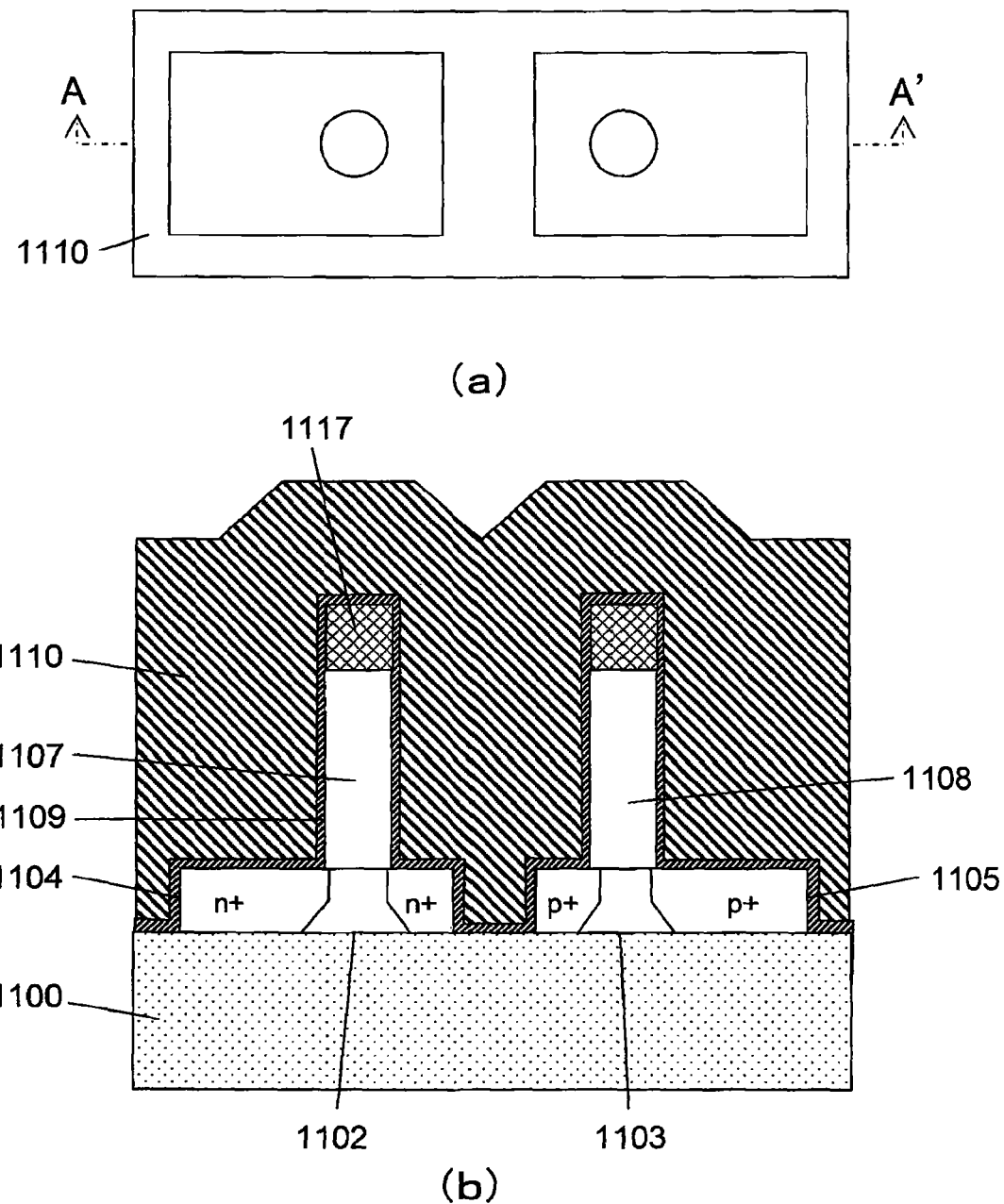

FIGS. 153(*a*) and 153(*b*) illustrate a part of a series of steps of the CMOS inverter production method according to the eleventh embodiment.

Figure 154:
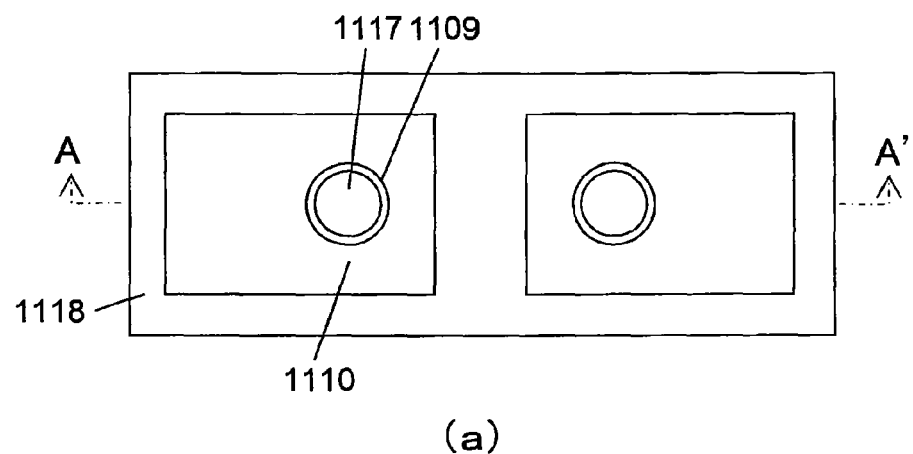
Figure 154:
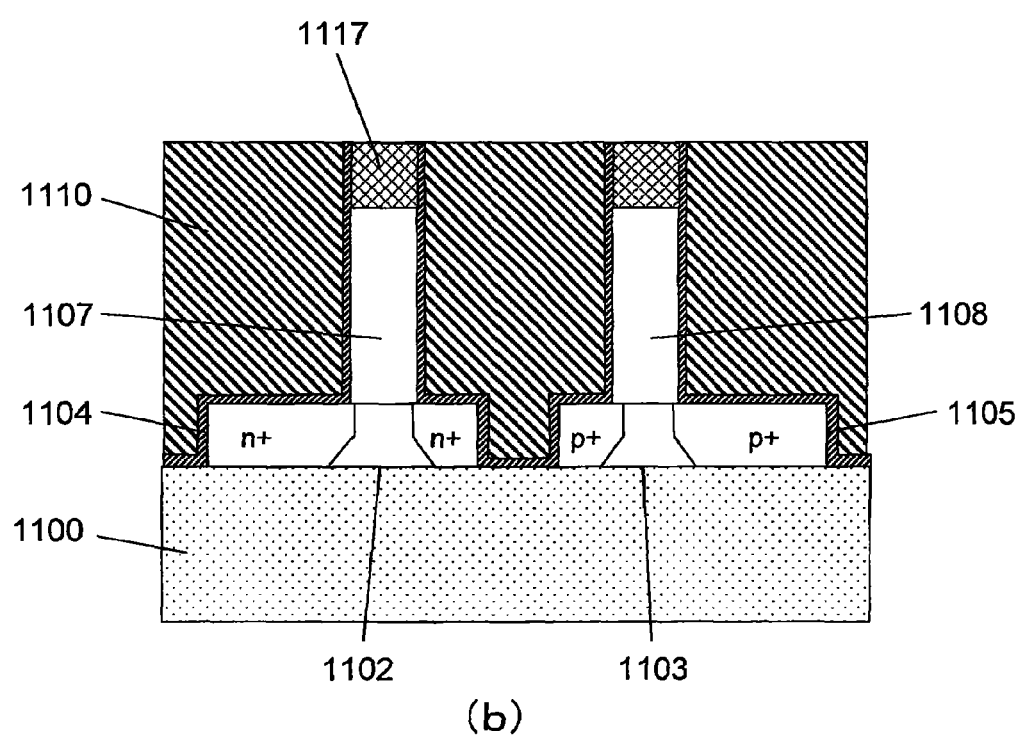

FIGS. 154(*a*) and 154(*b*) illustrate a part of the steps of the CMOS inverter production method according to the eleventh embodiment.

Figure 155:
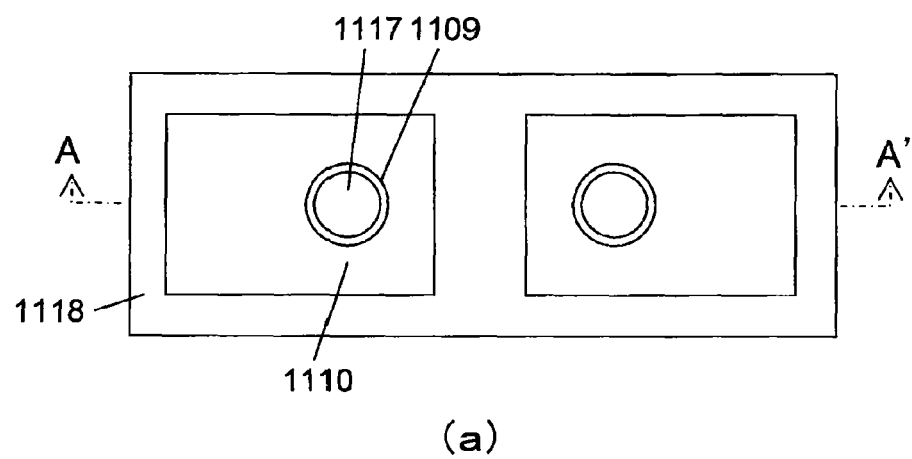
Figure 155:
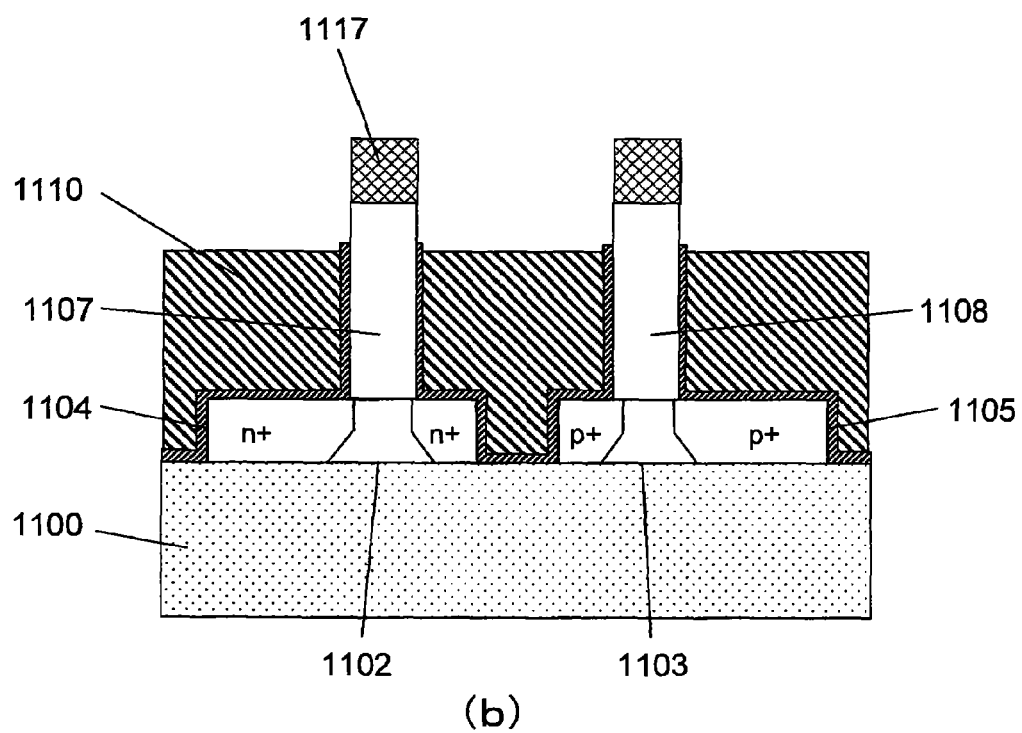

FIGS. 155(*a*) and 155(*b*) illustrate a part of the steps of the CMOS inverter production method according to the eleventh embodiment.

Figure 156:
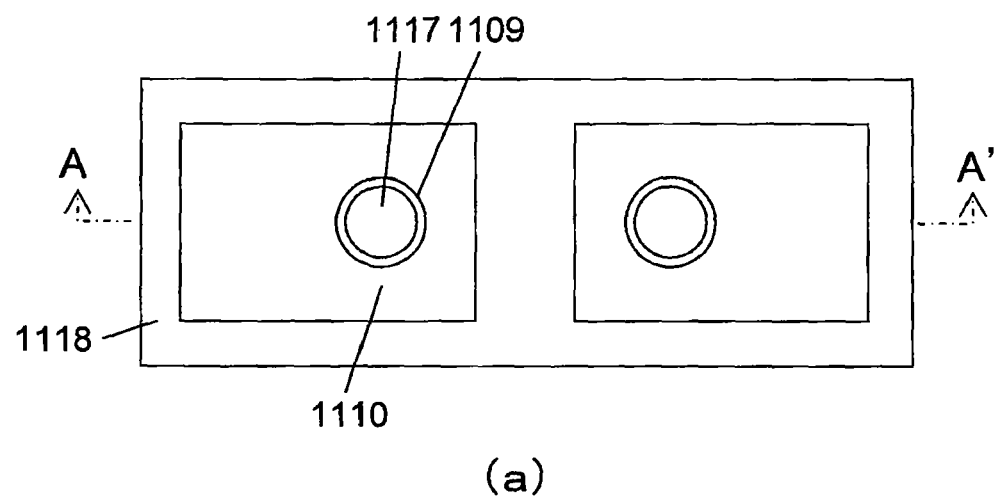
Figure 156:
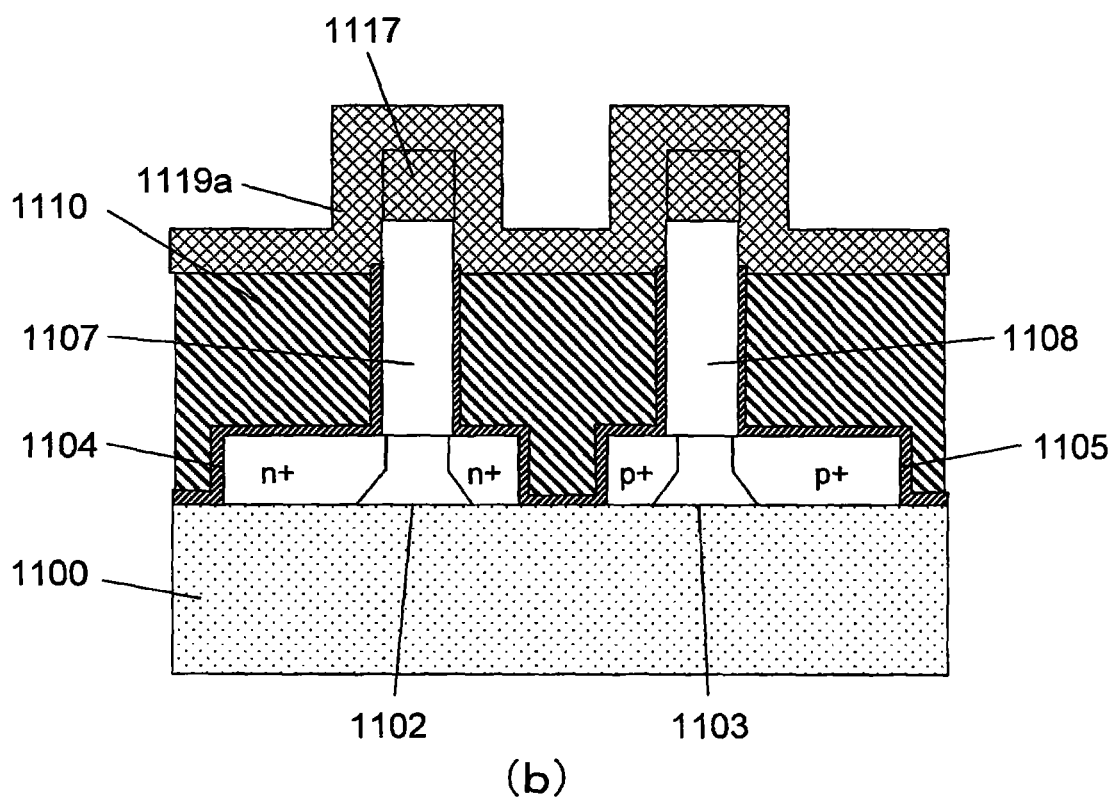

FIGS. 156(*a*) and 156(*b*) illustrate a part of the steps of the CMOS inverter production method according to the eleventh embodiment.

Figure 157:
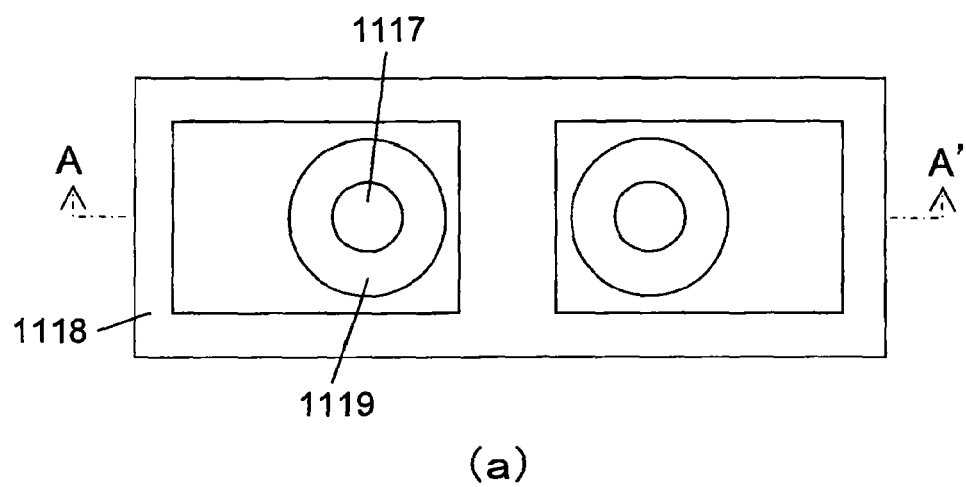
Figure 157:
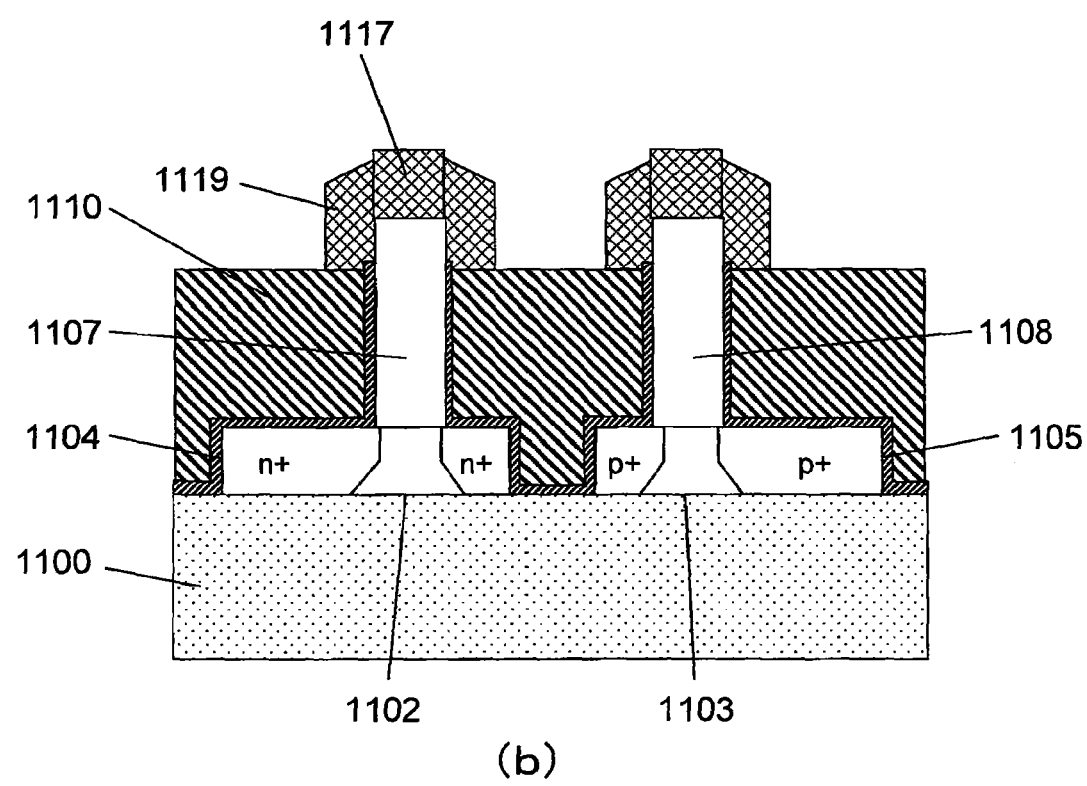

FIGS. 157(*a*) and 157(*b*) illustrate a part of the steps of the CMOS inverter production method according to the eleventh embodiment.

Figure 158:
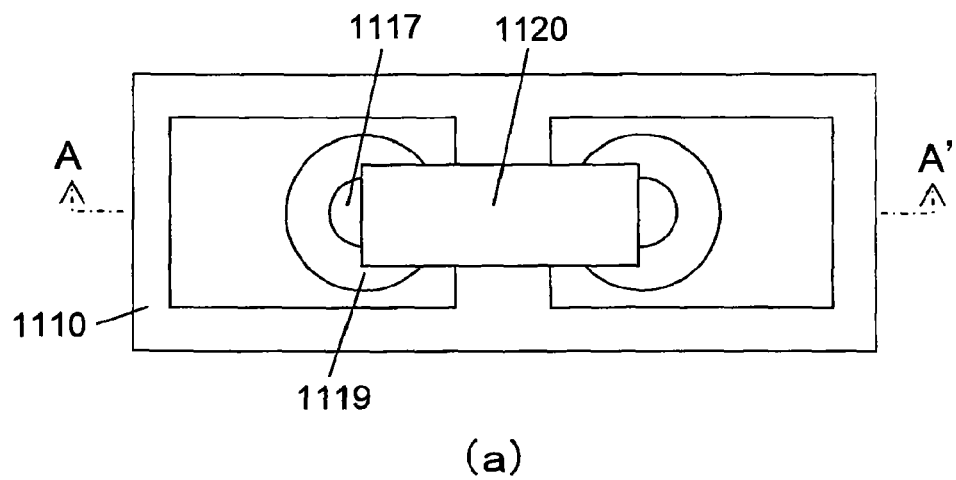
Figure 158:
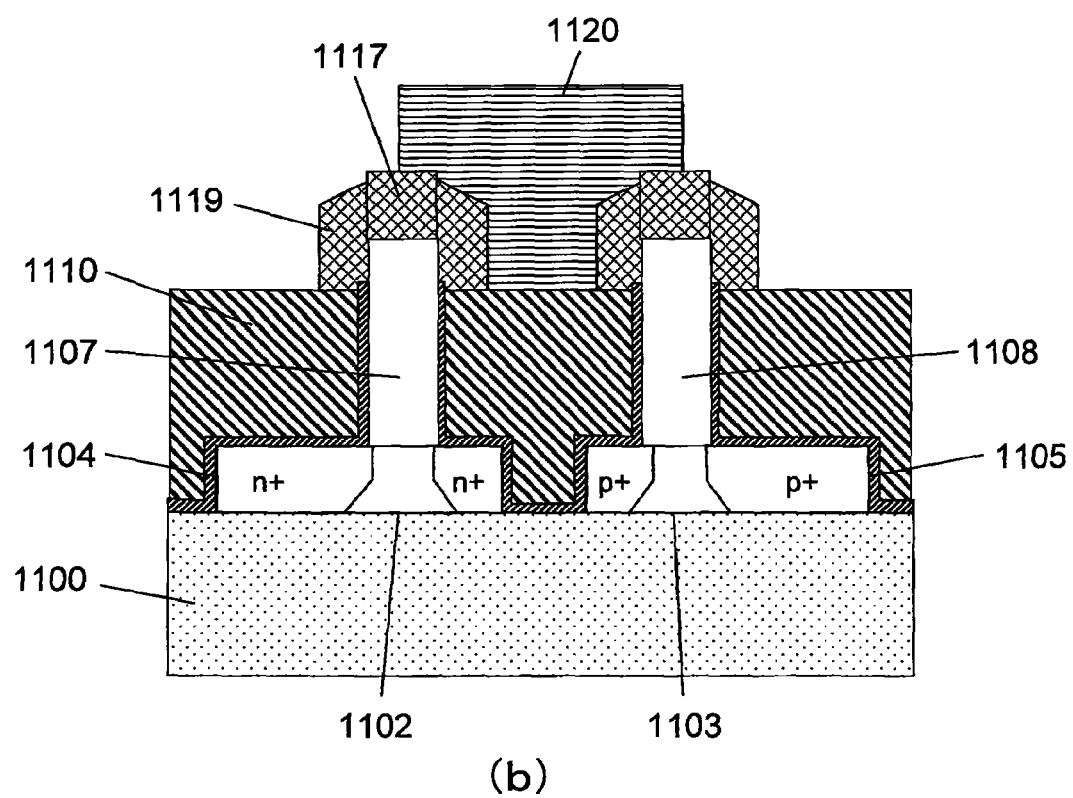

FIGS. 158(*a*) and 158(*b*) illustrate a part of the steps of the CMOS inverter production method according to the eleventh embodiment.

Figure 159:
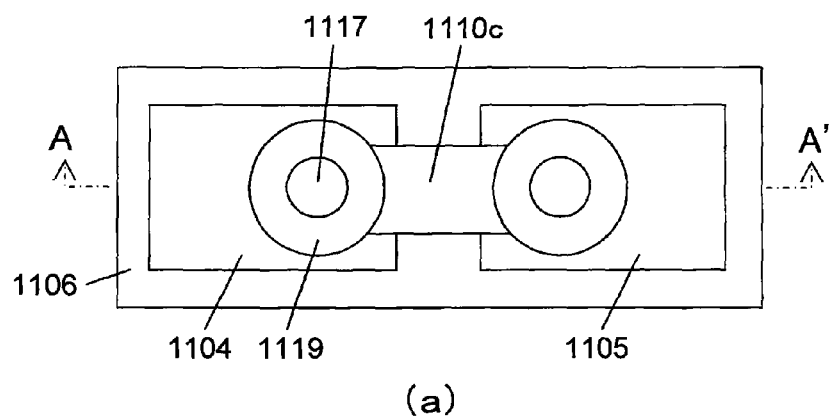
Figure 159:
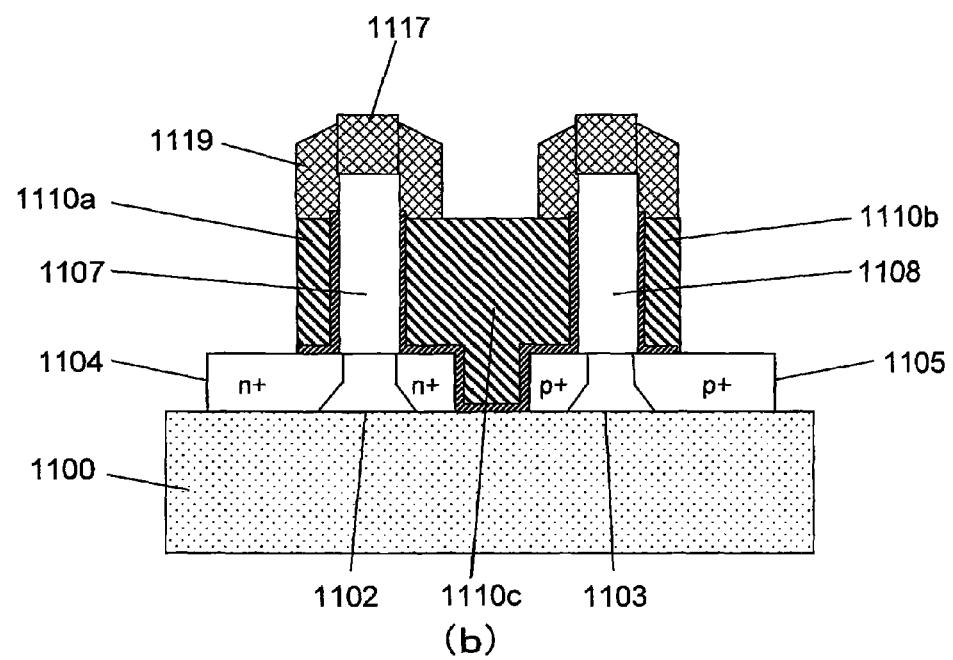

FIGS. 159(*a*) and 159(*b*) illustrate a part of the steps of the CMOS inverter production method according to the eleventh embodiment.

Figure 160:
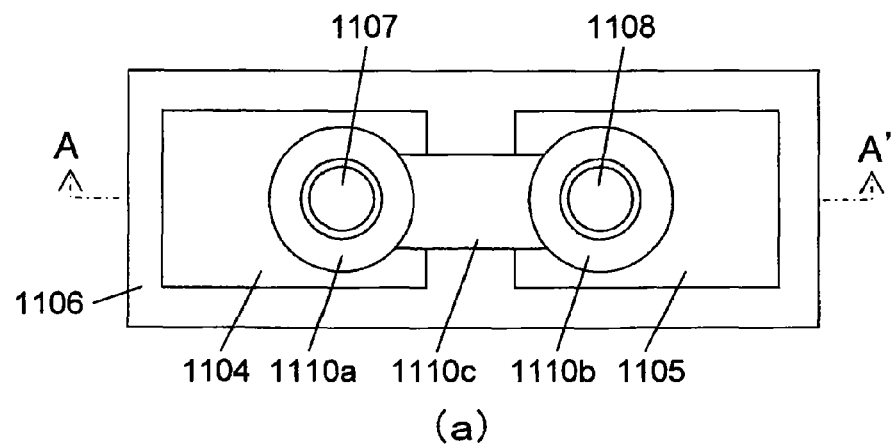
Figure 160:
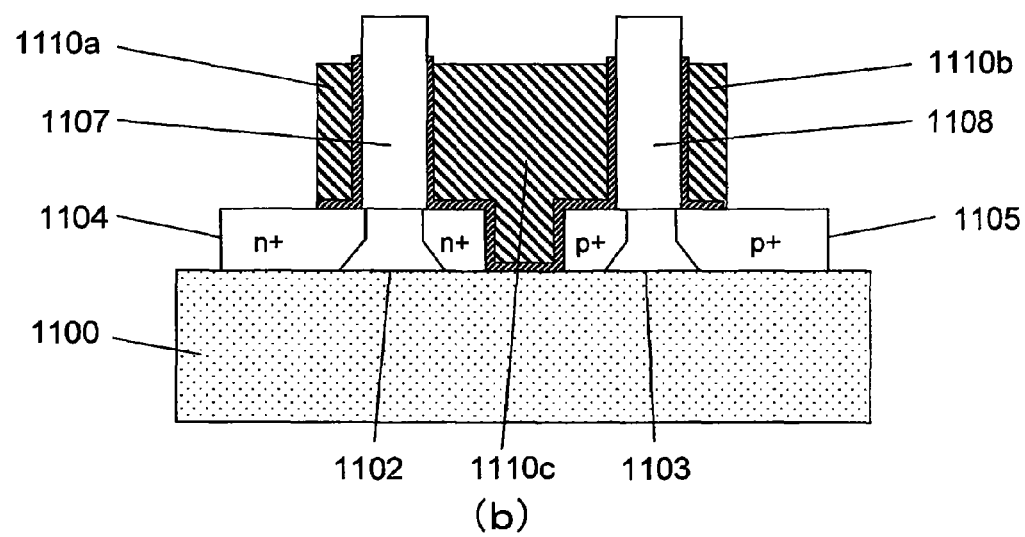

FIGS. 160(*a*) and 160(*b*) illustrate a part of the steps of the CMOS inverter production method according to the eleventh embodiment.

Figure 161:
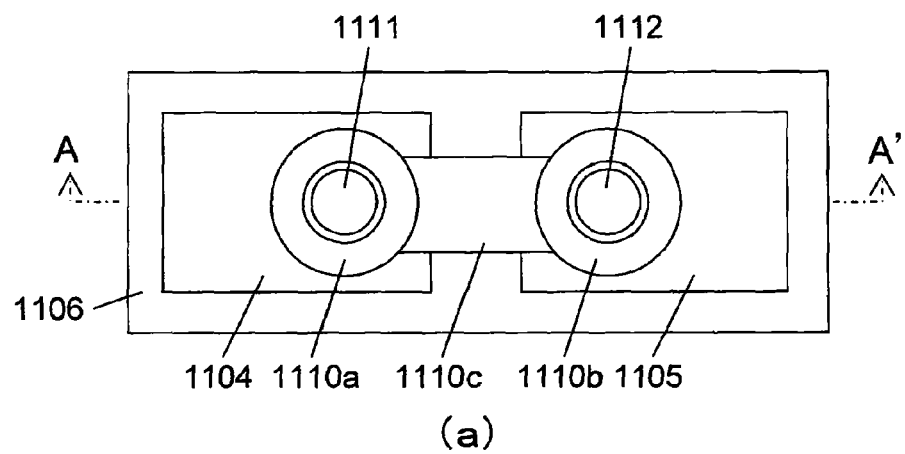
Figure 161:
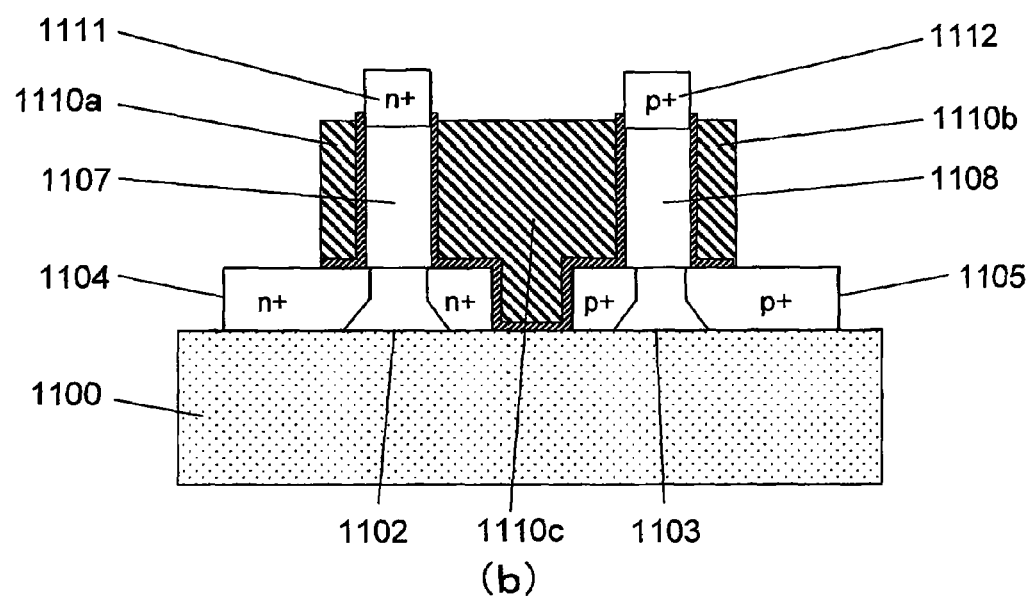

FIGS. 161(*a*) and 161(*b*) illustrate a part of the steps of the CMOS inverter production method according to the eleventh embodiment.

Figure 162:
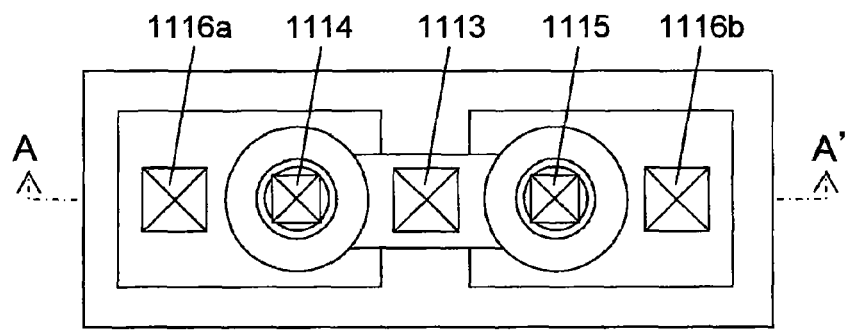
Figure 162:
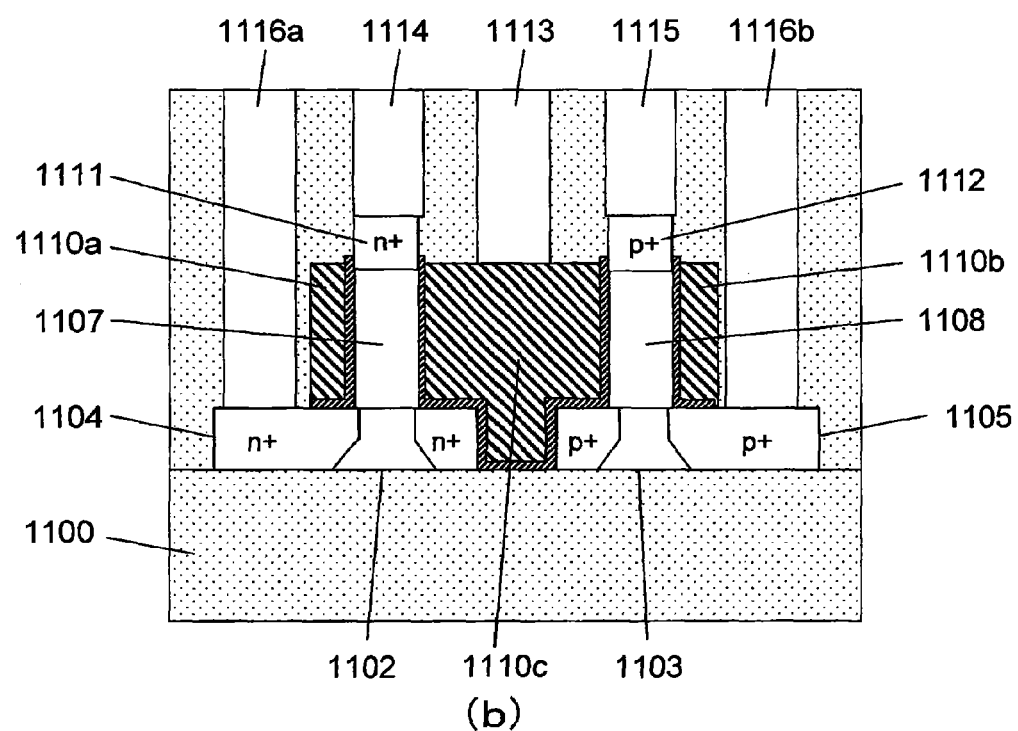

FIGS. 162(*a*) and 162(*b*) illustrate a part of the steps of the CMOS inverter production method according to the eleventh embodiment.

Figure 163:
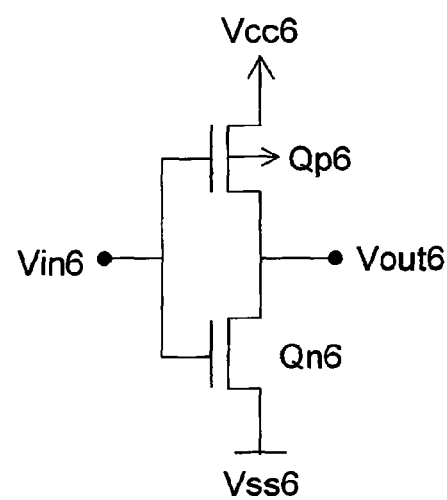

FIG. 163 is an equivalent circuit diagram of a CMOS inverter formed by a production method according to a twelfth embodiment of the present invention.

Figure 164:
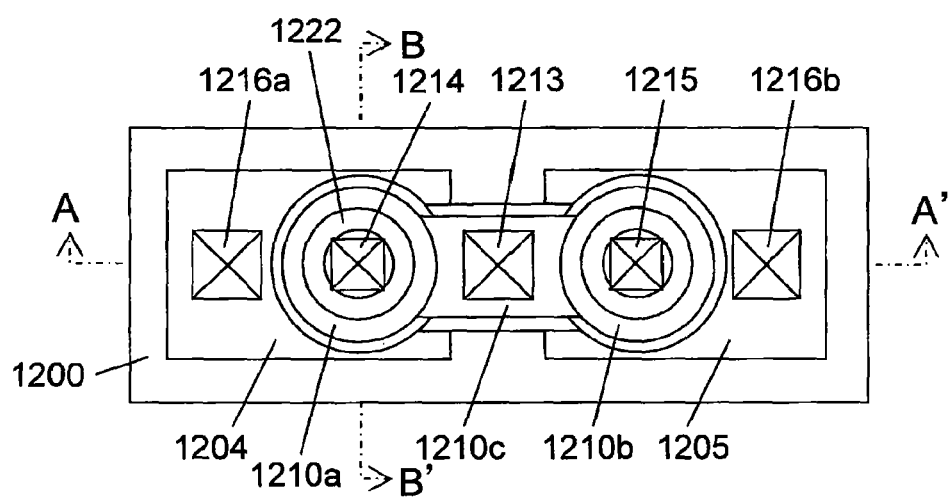

FIG. 164 is a top plan view of the CMOS inverter formed by the production method according to the twelfth embodiment.

Figure 165:
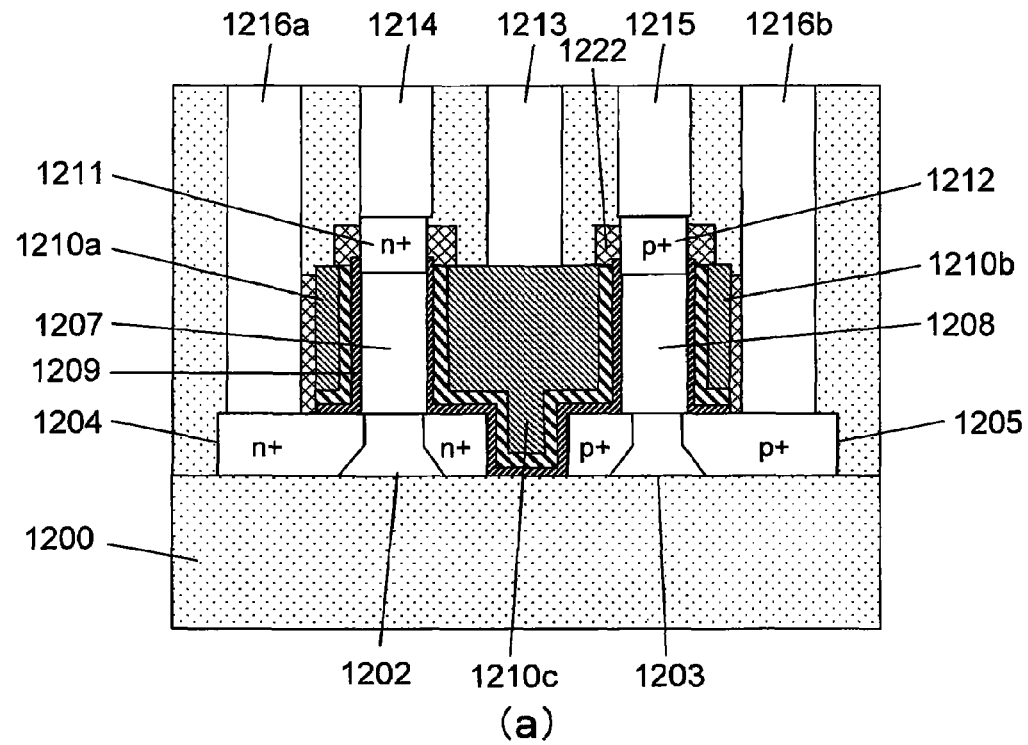
Figure 165:
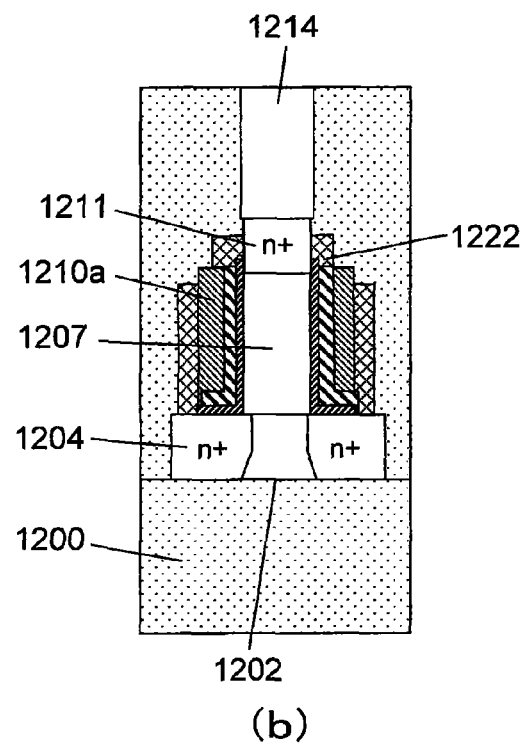

FIGS. 165(*a*) and 165(*b*) are sectional views of the CMOS inverter formed by the production method according to the twelfth embodiment.

Figure 166:
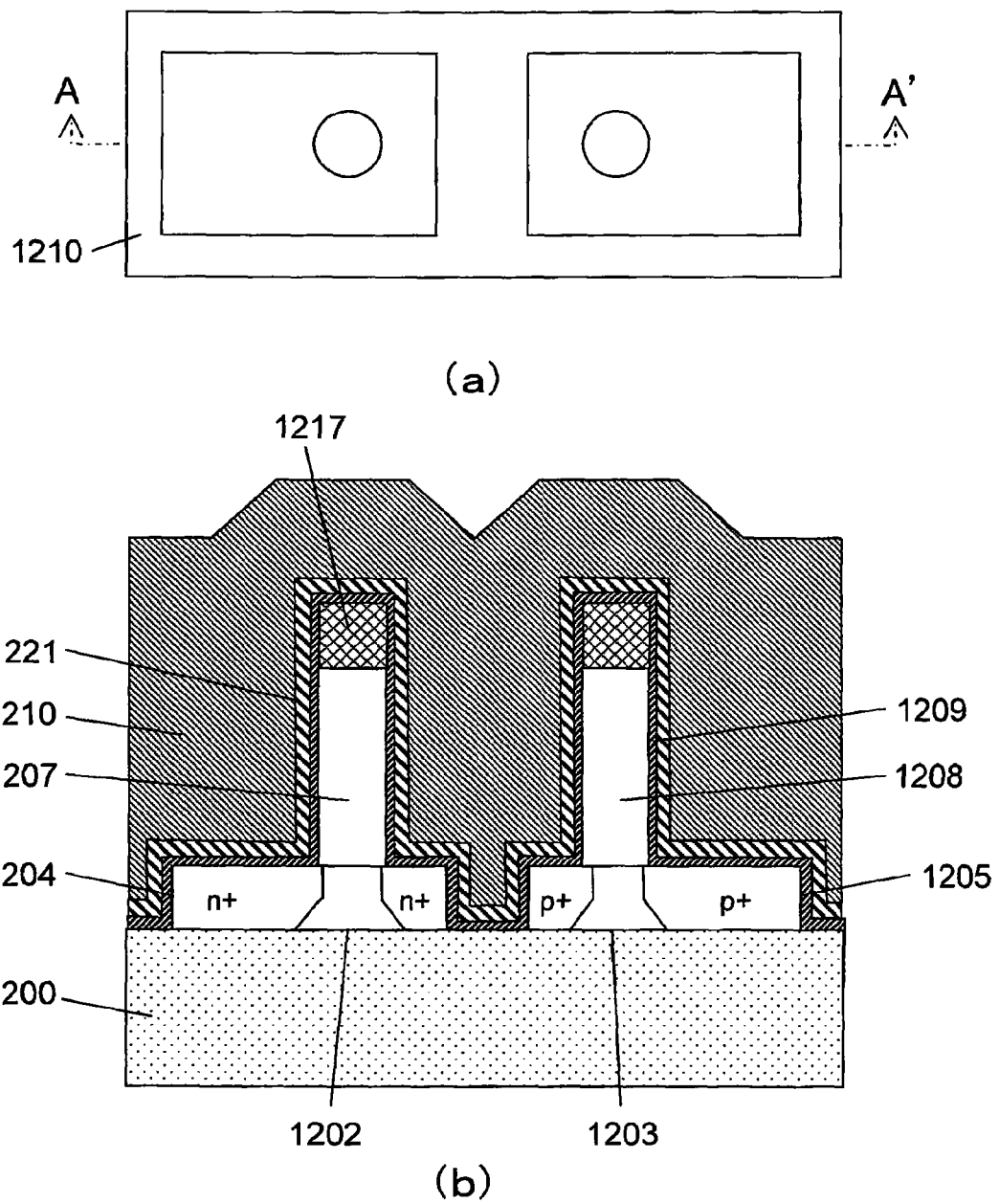

FIGS. 166(*a*) and 166(*b*) illustrate a part of a series of steps of the CMOS inverter production method according to the twelfth embodiment.

Figure 167:
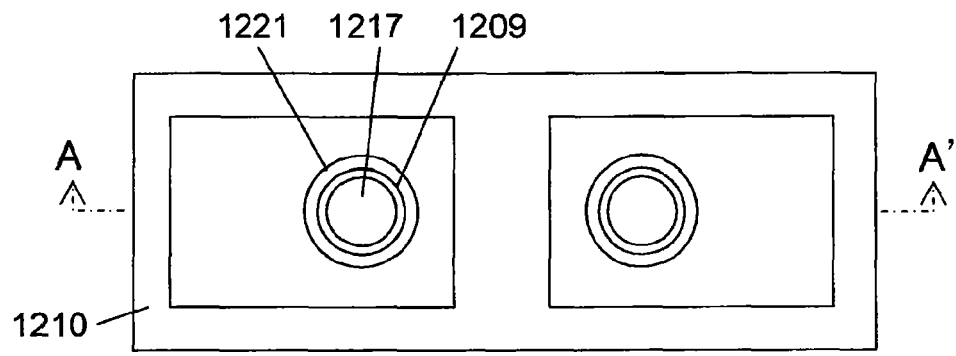
Figure 167:
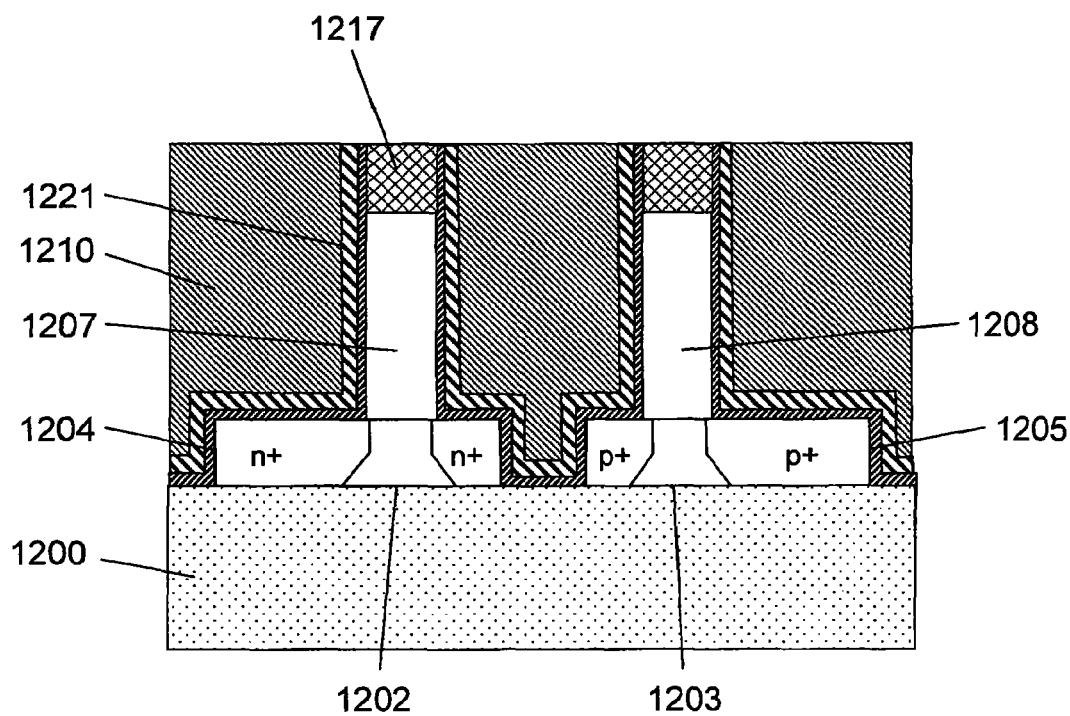

FIGS. 167(*a*) and 167(*b*) illustrate a part of the steps of the CMOS inverter production method according to the twelfth embodiment.

Figure 168:
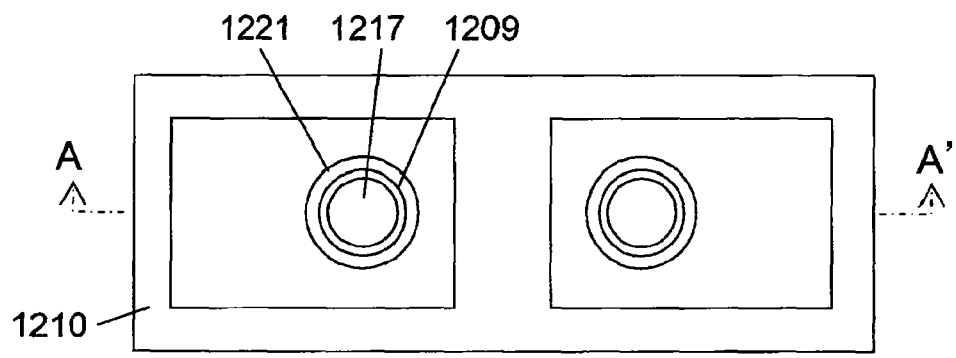
Figure 168:
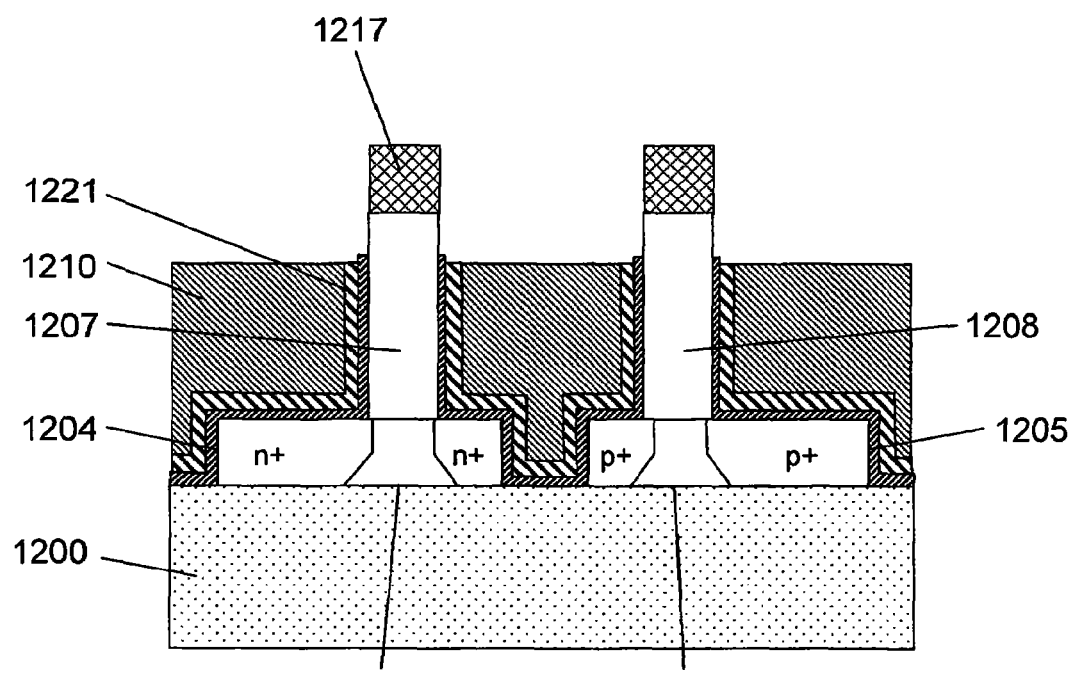

FIGS. 168(*a*) and 168(*b*) illustrate a part of the steps of the CMOS inverter production method according to the twelfth embodiment.

Figure 169:
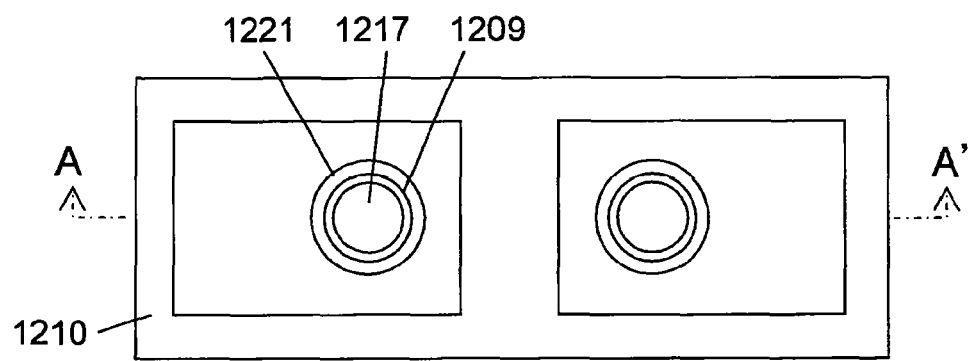
Figure 169:
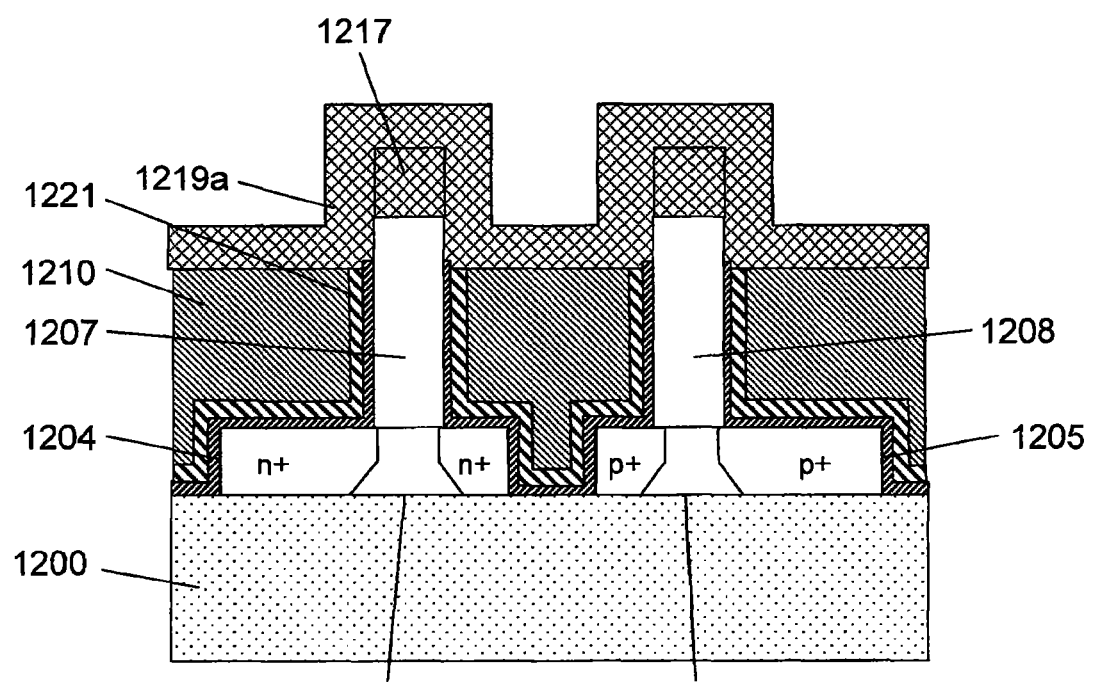

FIGS. 169(*a*) and 169(*b*) illustrate a part of the steps of the CMOS inverter production method according to the twelfth embodiment.

Figure 170:
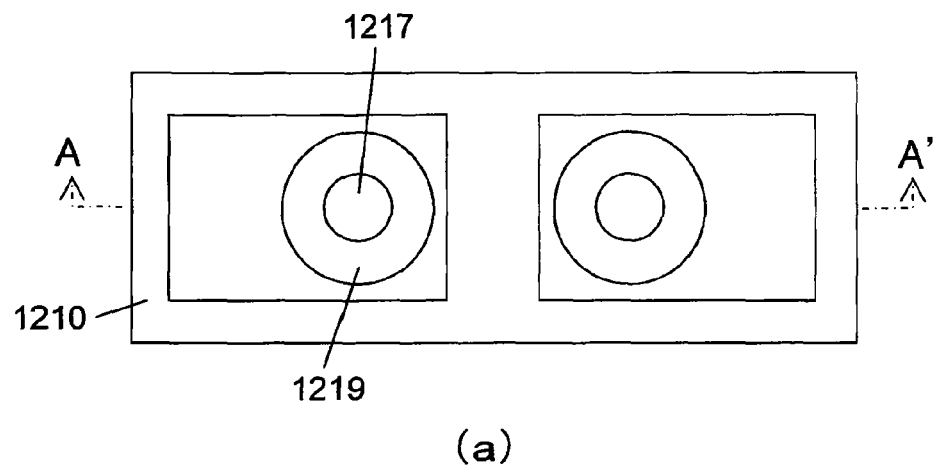
Figure 170:
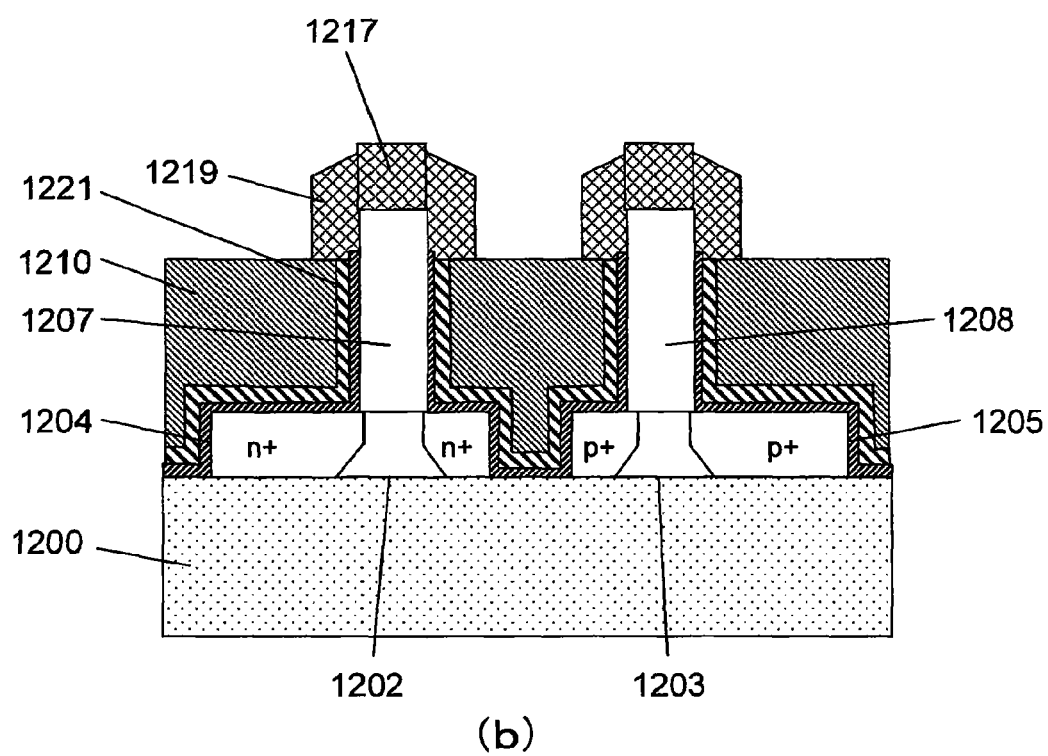

FIGS. 170(*a*) and 170(*b*) illustrate a part of the steps of the CMOS inverter production method according to the twelfth embodiment.

Figure 171:
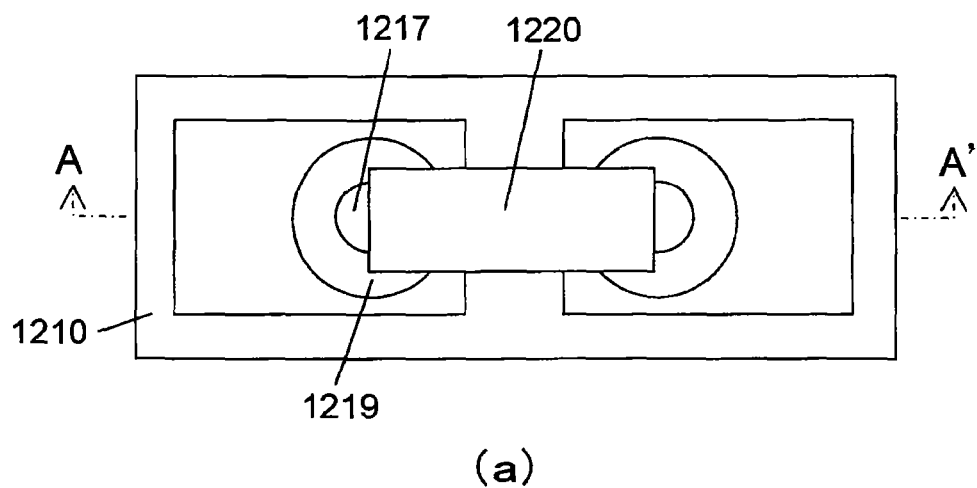
Figure 171:
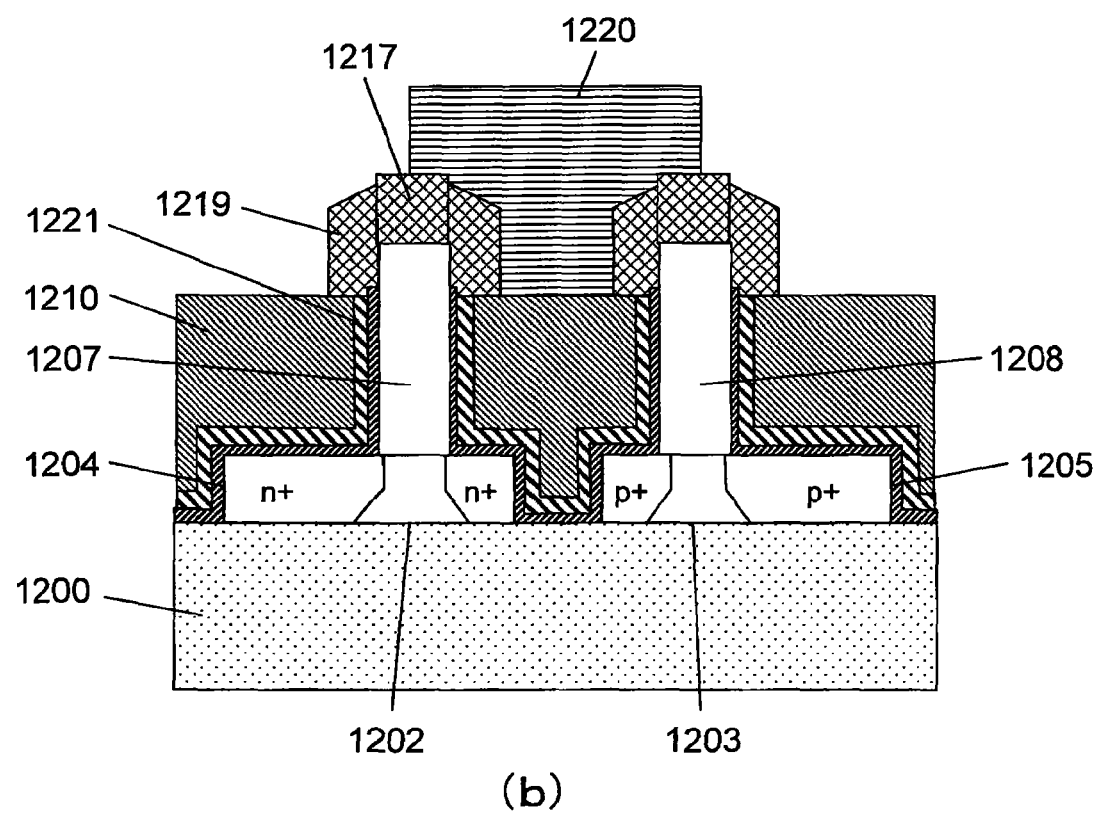

FIGS. 171(*a*) and 171(*b*) illustrate a part of the steps of the CMOS inverter production method according to the twelfth embodiment.

Figure 172:
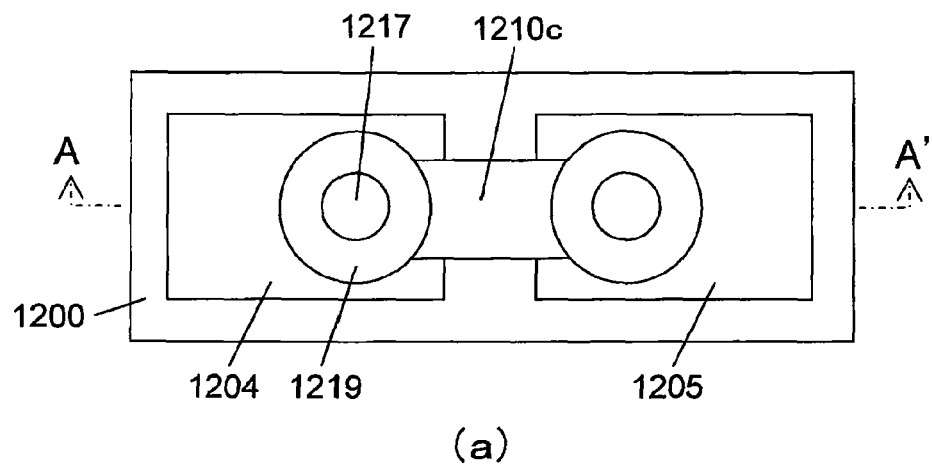
Figure 172:
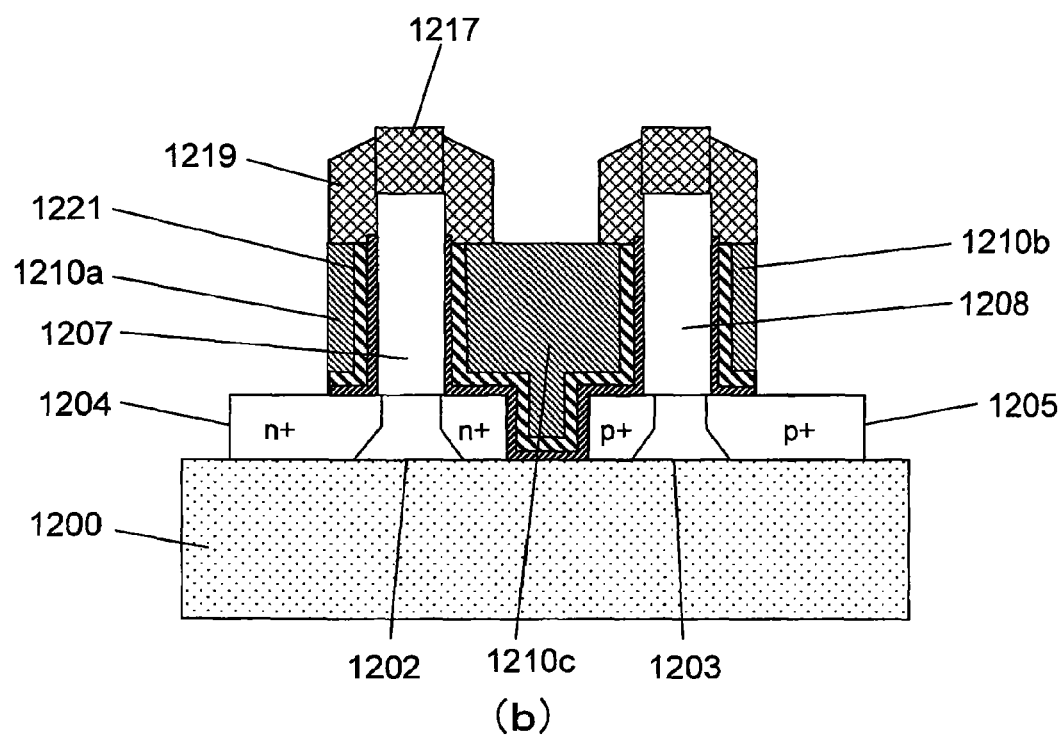

FIGS. 172(*a*) and 172(*b*) illustrate a part of the steps of the CMOS inverter production method according to the twelfth embodiment.

Figure 173:
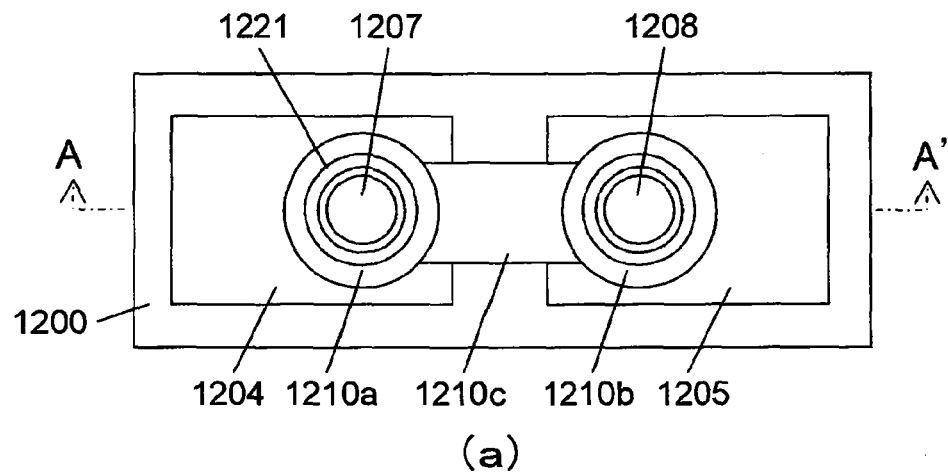
Figure 173:
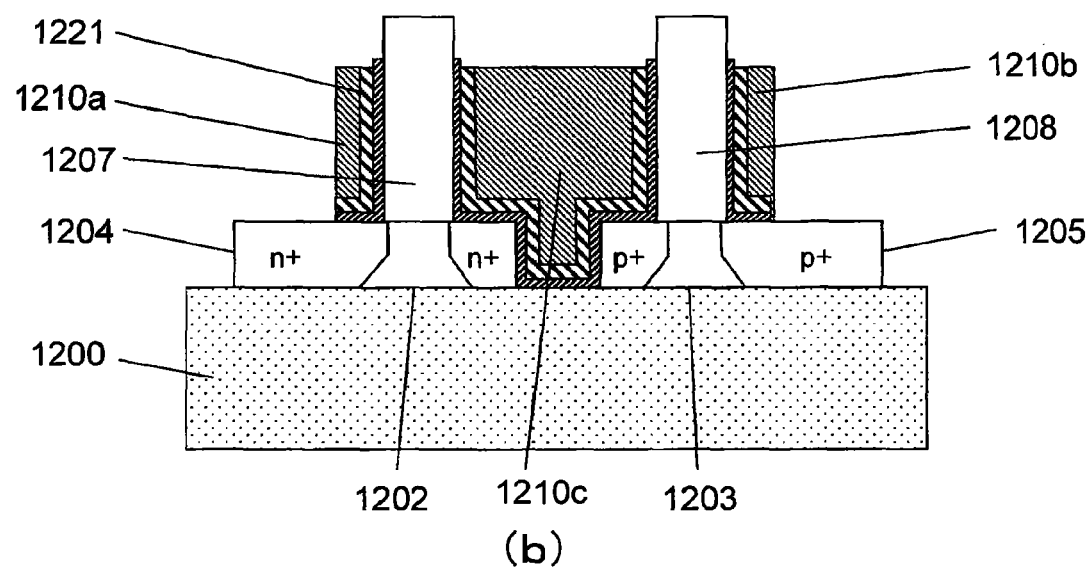

FIGS. 173(*a*) and 173(*b*) illustrate a part of the steps of the CMOS inverter production method according to the twelfth embodiment.

Figure 174:
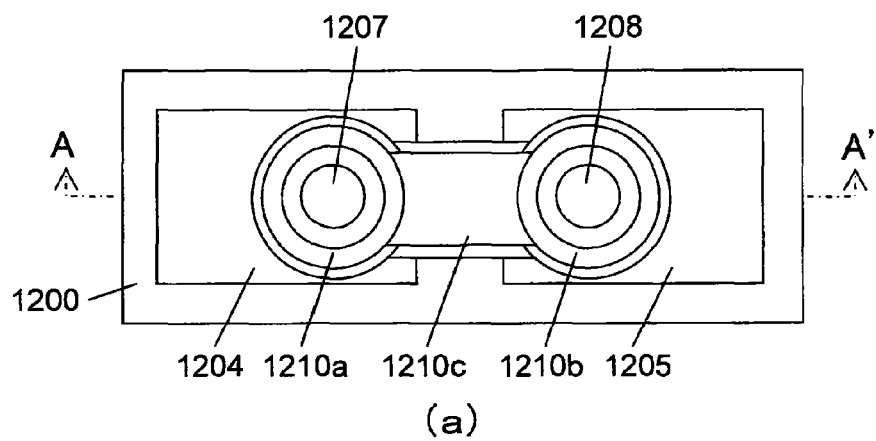
Figure 174:
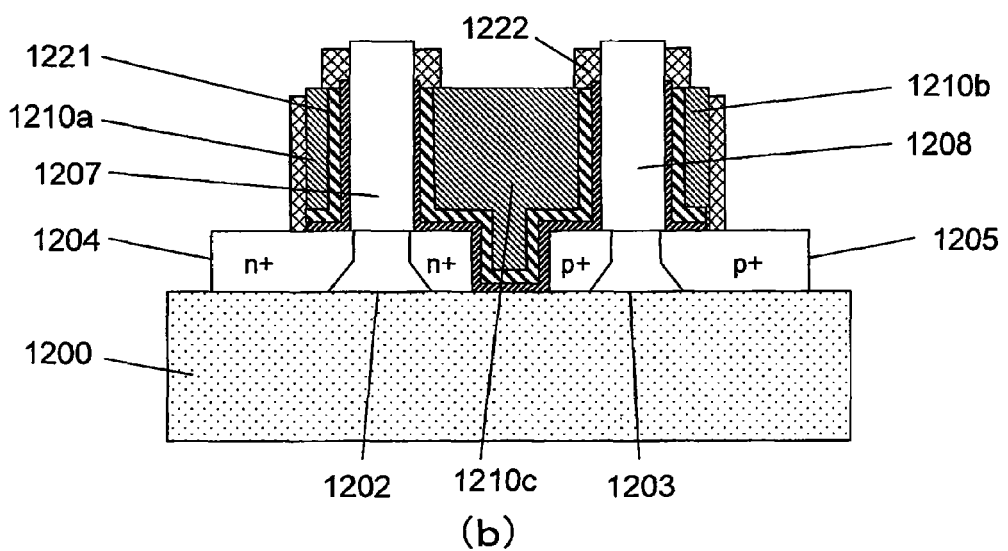

FIGS. 174(*a*) and 174(*b*) illustrate a part of the steps of the CMOS inverter production method according to the twelfth embodiment.

Figure 175:
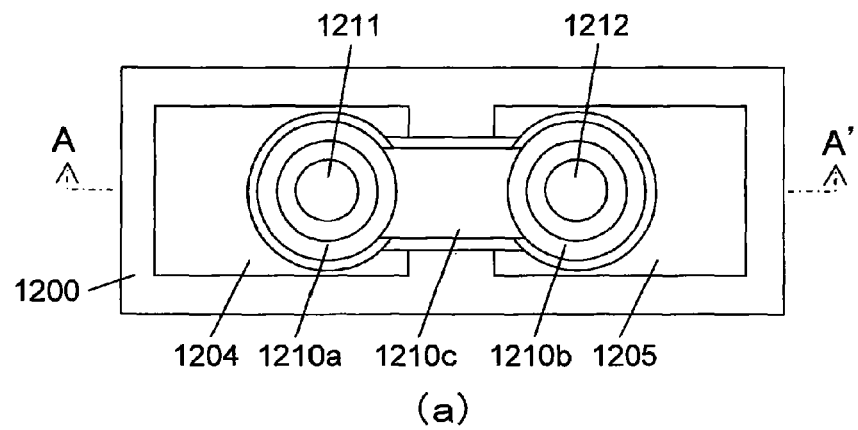
Figure 175:
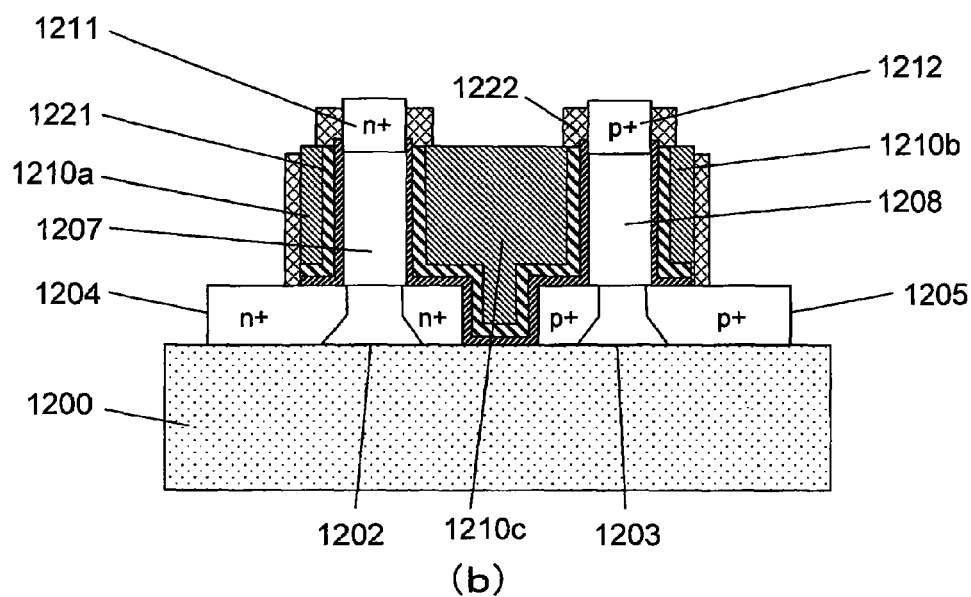

FIGS. 175(*a*) and 175(*b*) illustrate a part of the steps of the CMOS inverter production method according to the twelfth embodiment.

Figure 176:
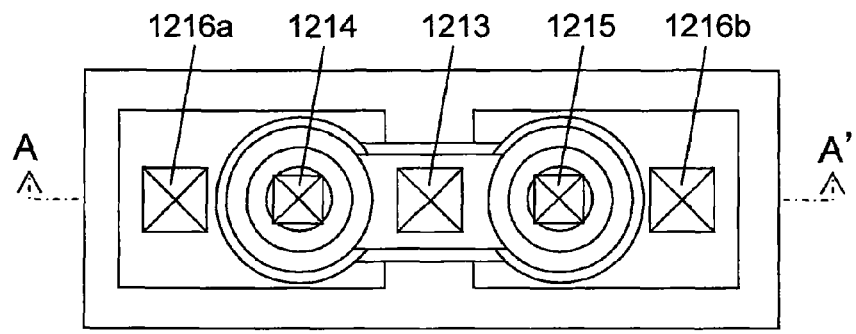
Figure 176:
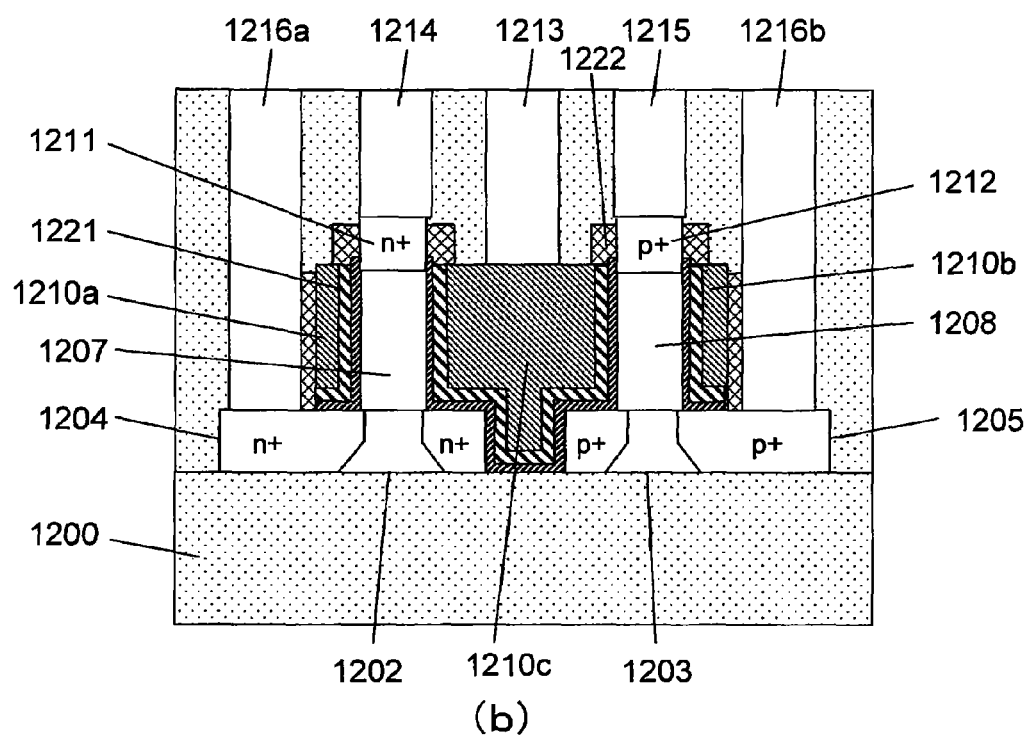

FIGS. 176(*a*) and 176(*b*) illustrate a part of the steps of the CMOS inverter production method according to the twelfth embodiment.

Figure 177:
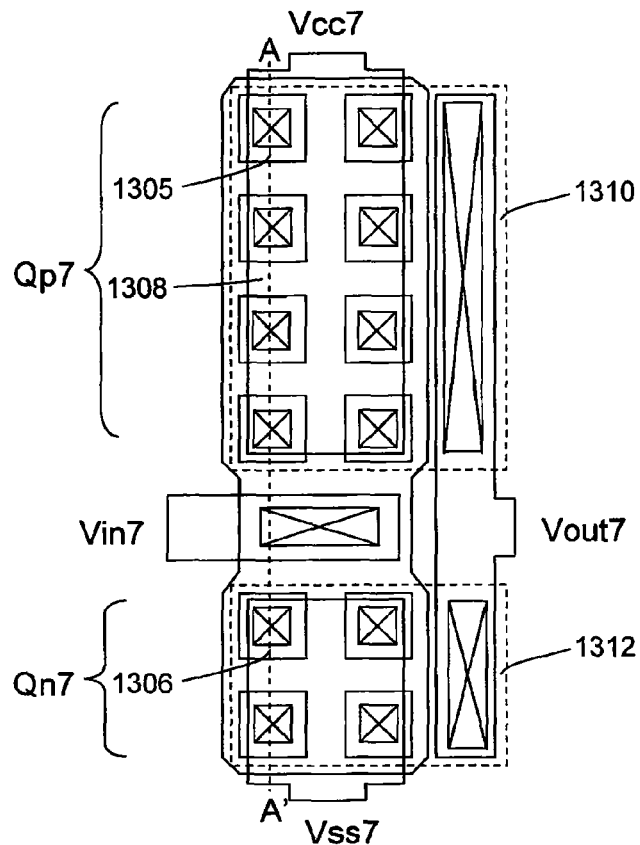
Figure 177:
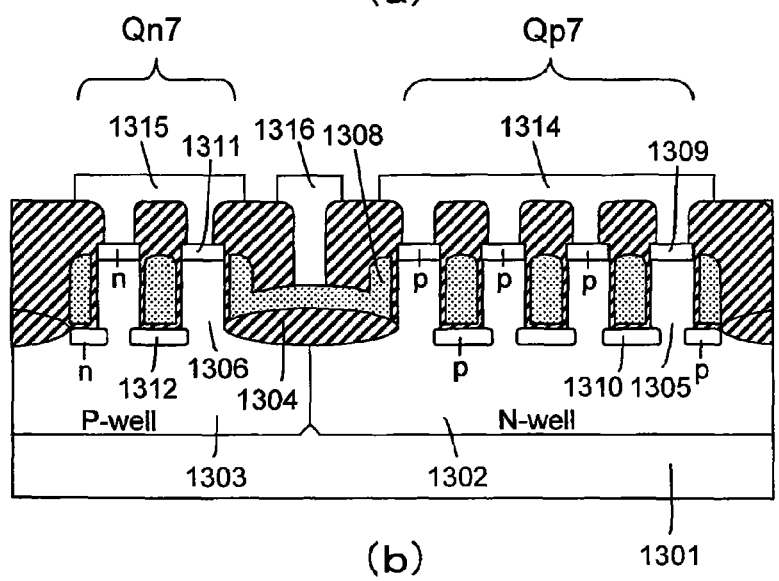

FIGS. 177(*a*) and 177(*b*) are, respectively, a top plan view and a sectional view of a conventional SGT.

Figure 178:
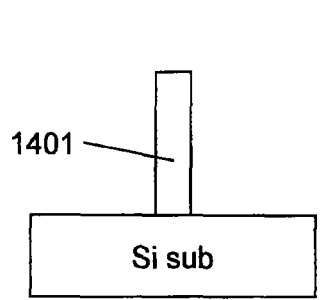
Figure 178:
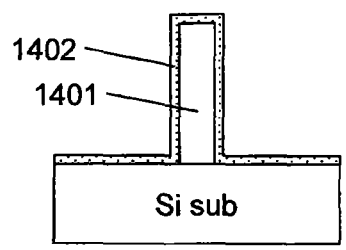
Figure 178:
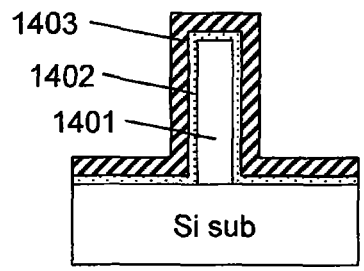
Figure 178:
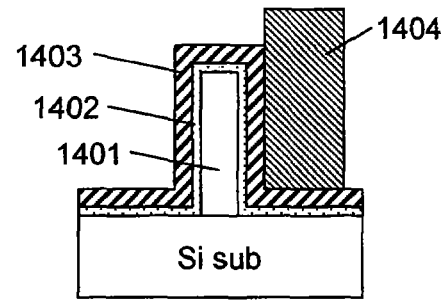
Figure 178:
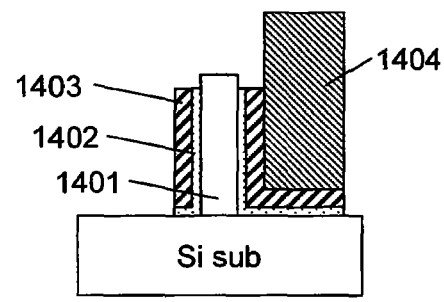
Figure 178:
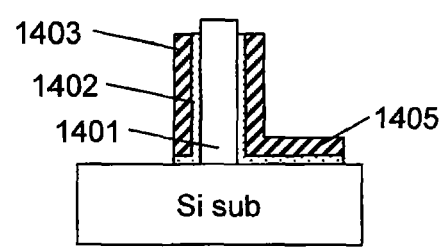

FIGS. 178(*a*) to 178(*f*) illustrate a series of steps of a conventional SGT production method.

Figure 179:
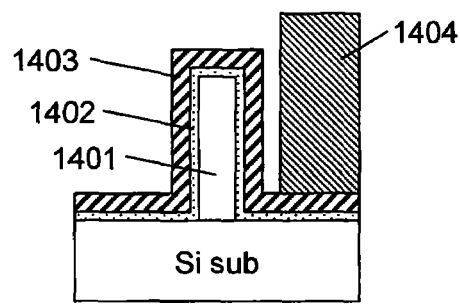
Figure 179:
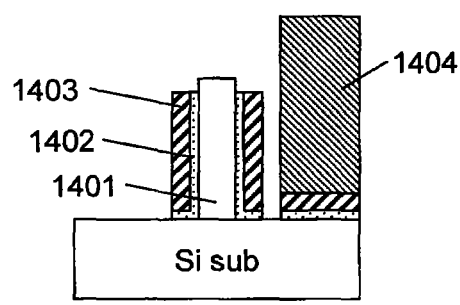
Figure 179:
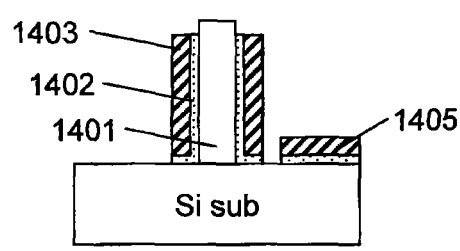

FIGS. 179(*a*) to 179(*c*) illustrate a part of the steps of the conventional SGT production method.

Figure 180:
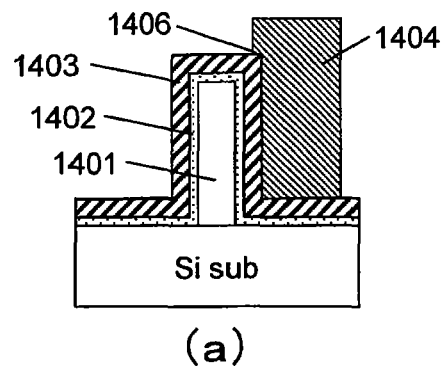
Figure 180:
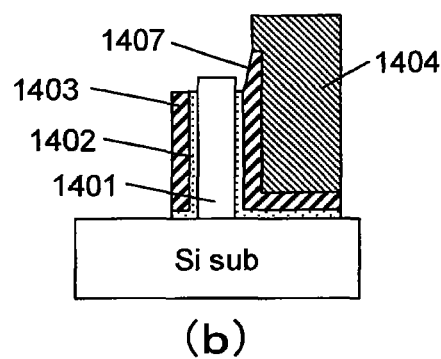
Figure 180:
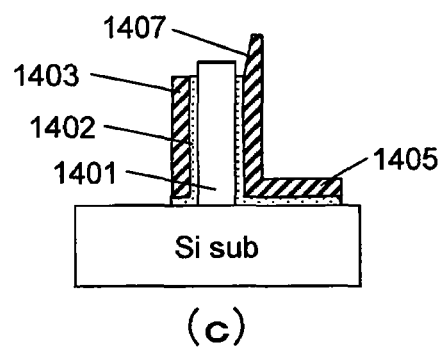

FIGS. 180(*a*) to 180(*c*) illustrate a part of the steps of the conventional SGT production method.

Figure 181:
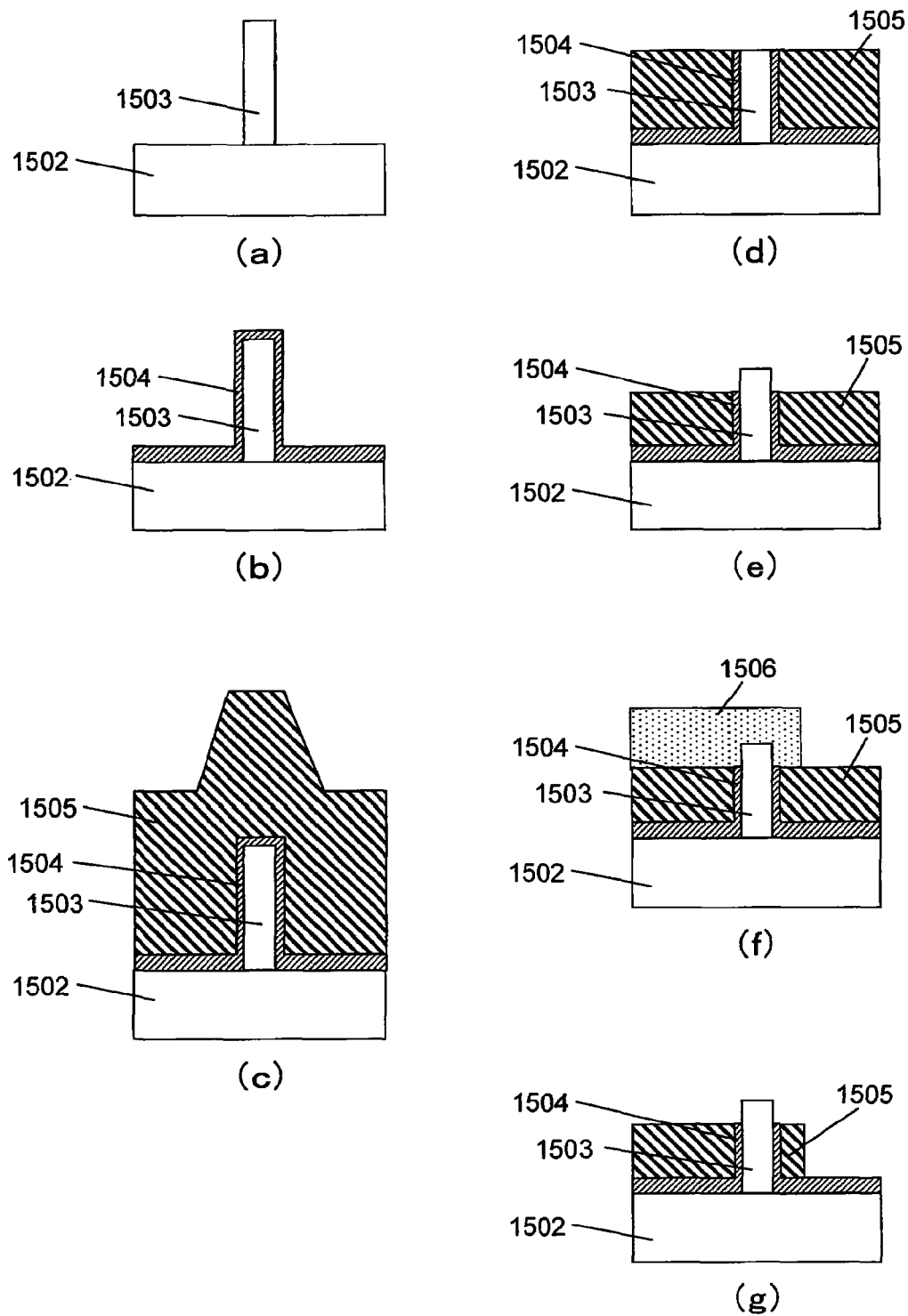

FIGS. 181(*a*) to 181(*g*) illustrate a series of steps of a conventional SGT production method.

DETAILED DESCRIPTION OF THE PREFERRED EMBODIMENTS

First Embodiment

Figure 1:
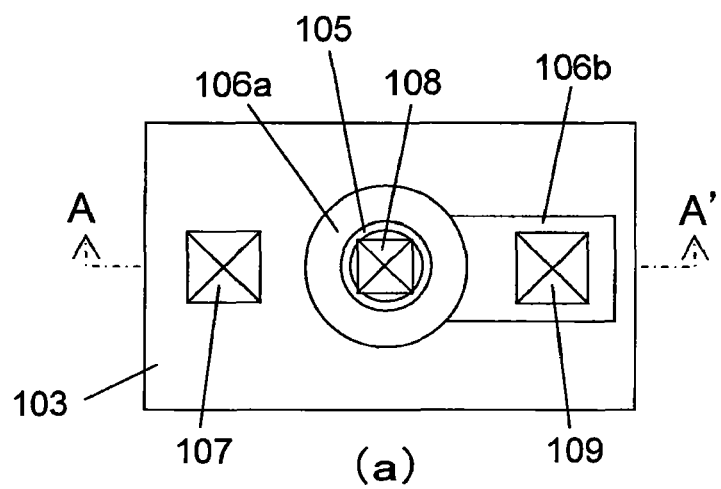
FIGS. 1(a) and 1(b) are, respectively, a top plan view and a sectional view of a single SGT formed by a production method according to a first embodiment of the present invention.
Figure 1:
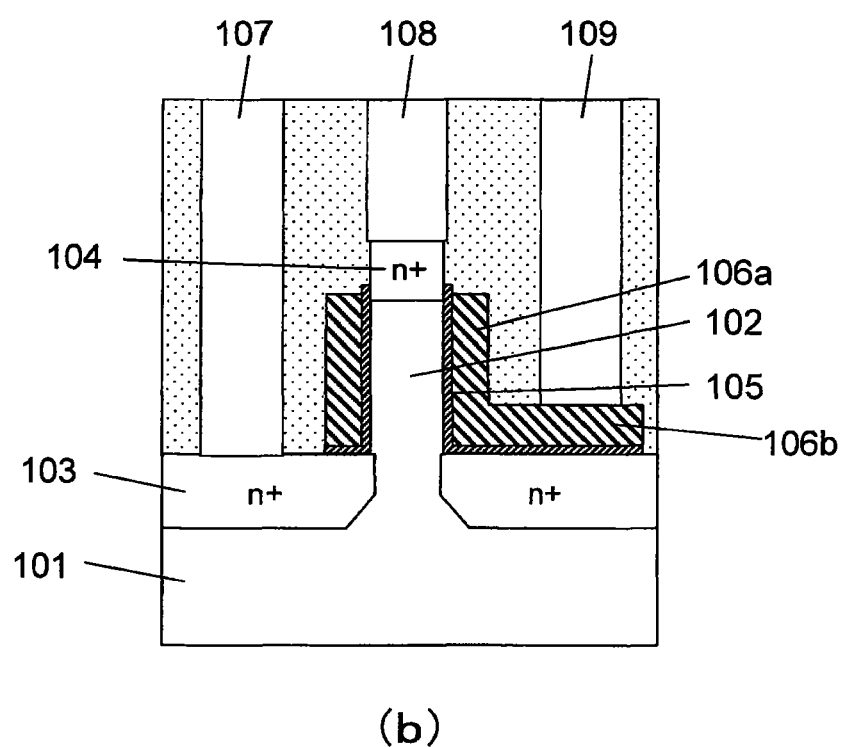
Figure 2:
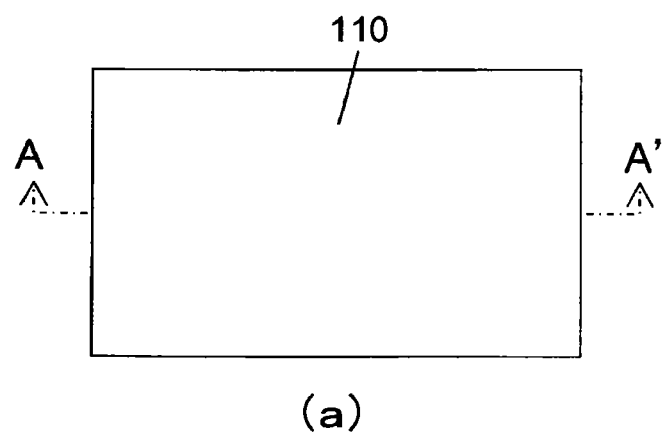
FIGS. 2(a) and 2(b) illustrate a part of a series of steps of the single-SGT production method according to the first embodiment.
Figure 2:
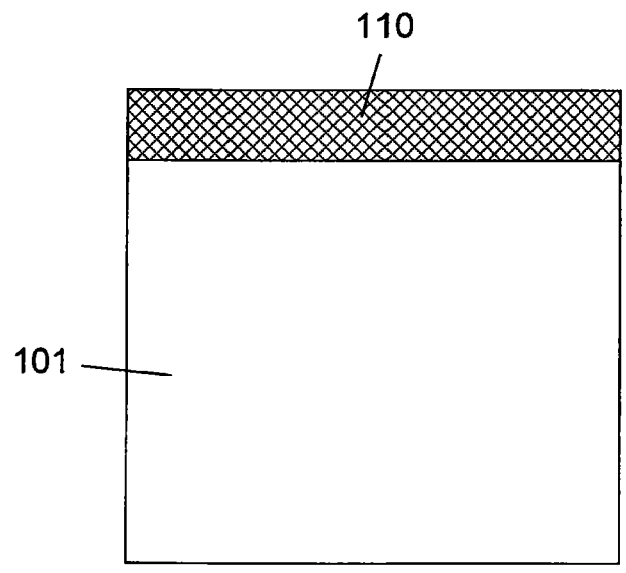
Figure 3:
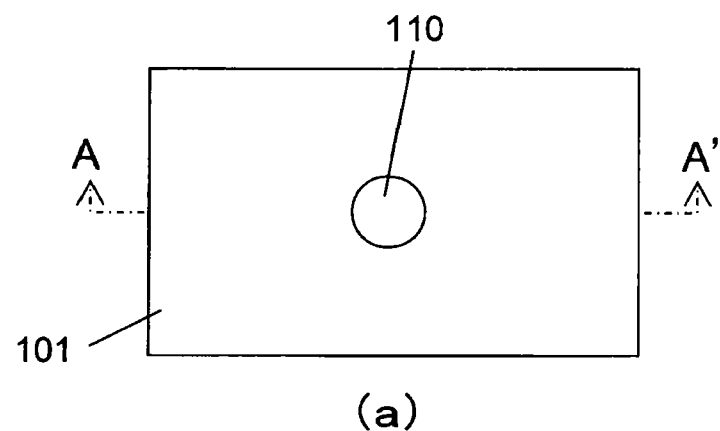
FIGS. 3(a) and 3(b) illustrate a part of the steps of the single-SGT production method according to the first embodiment.
Figure 3:
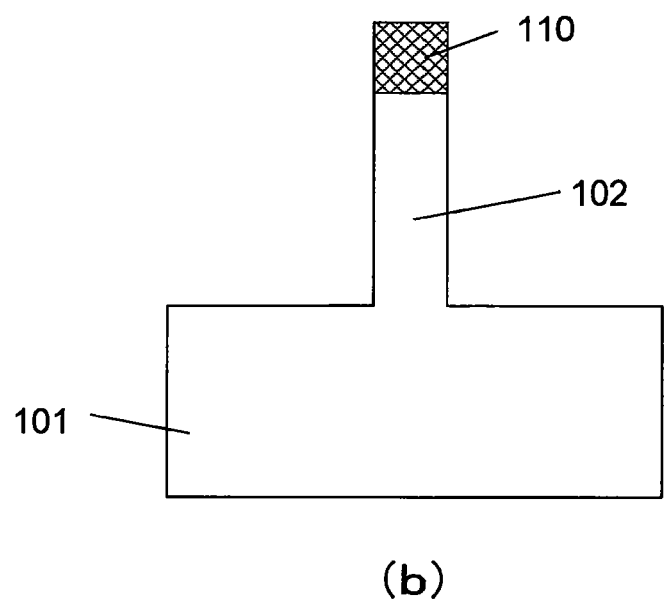
Figure 4:
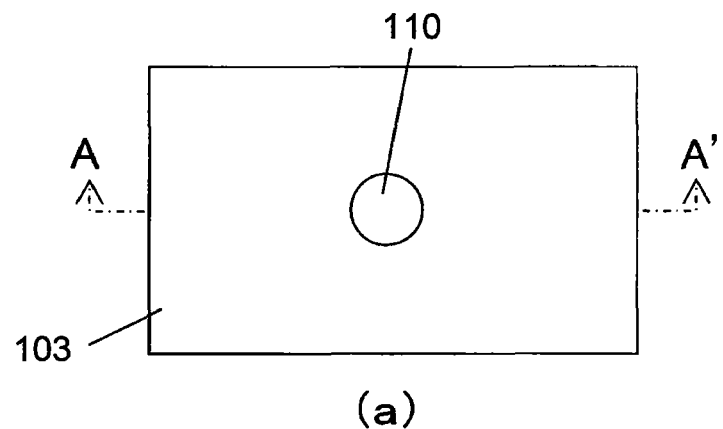
FIGS. 4(a) and 4(b) illustrate a part of the steps of the single-SGT production method according to the first embodiment.
Figure 4:
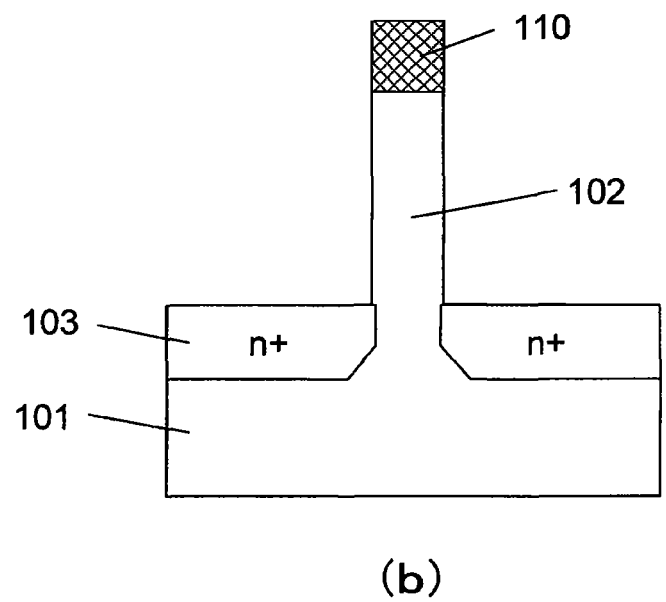
Figure 5:
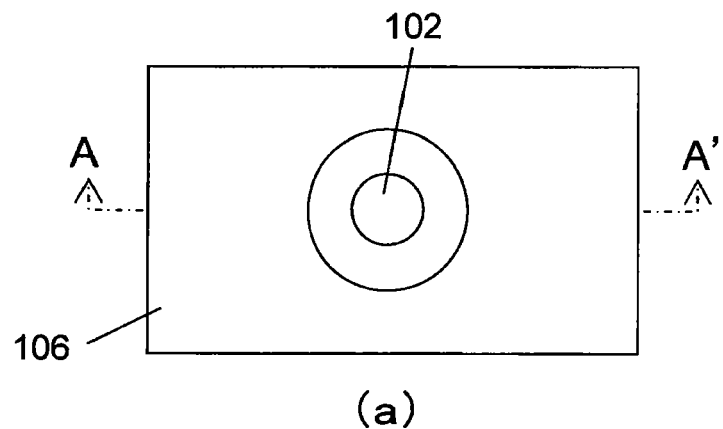
FIGS. 5(a) and 5(b) illustrate a part of the steps of the single-SGT production method according to the embodiment.
Figure 5:
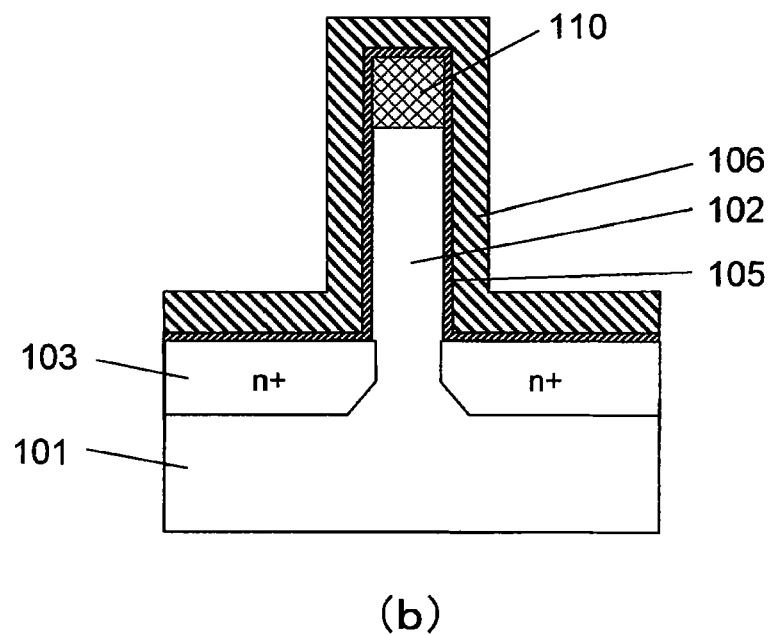
Figure 6:
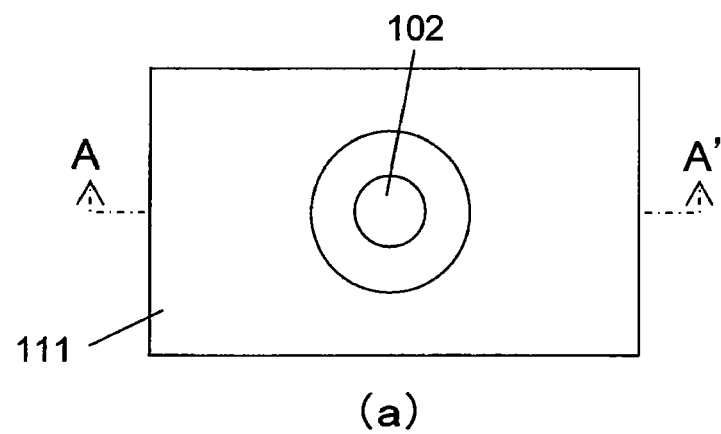
FIGS. 6(a) and 6(b) illustrate a part of the steps of the single-SGT production method according to the first embodiment.
Figure 6:
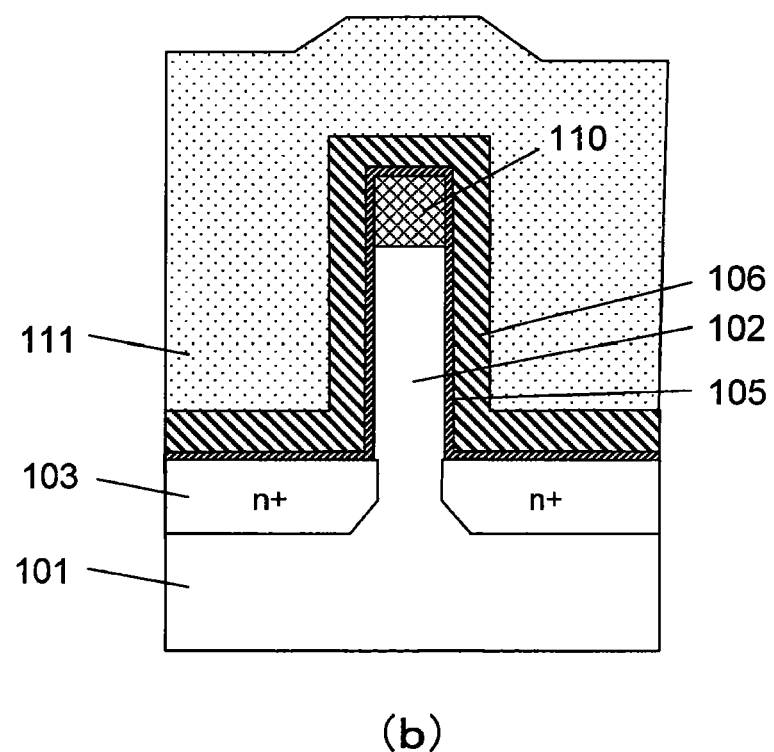
Figure 7:
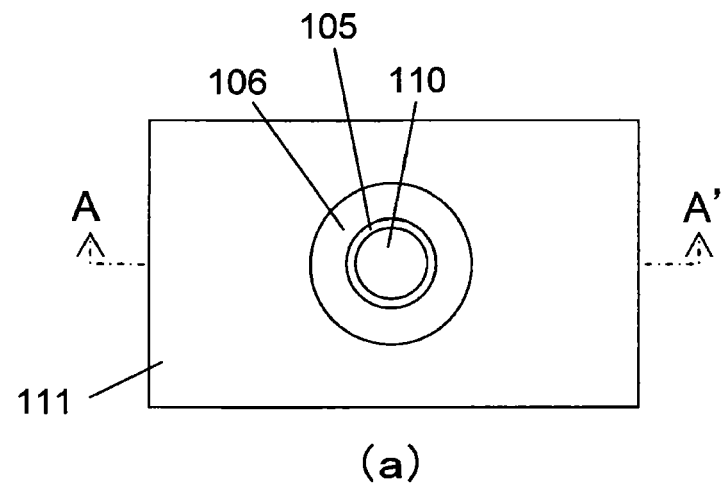
FIGS. 7(a) and 7(b) illustrate a part of the steps of the single-SGT production method according to the first embodiment.
Figure 7:
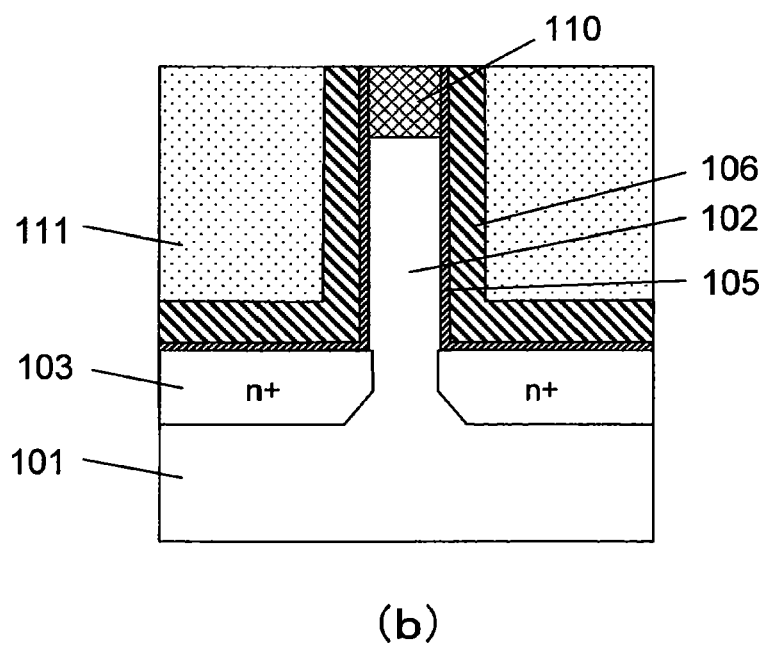
Figure 8:
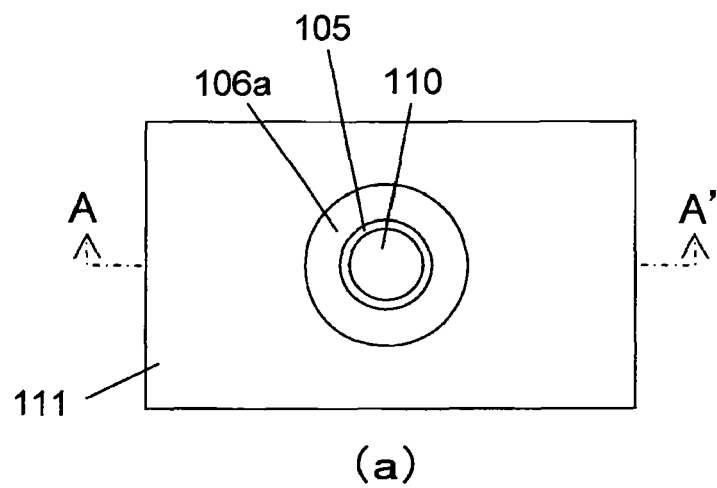
FIGS. 8(a) and 8(b) illustrate a part of the steps of the single-SGT production method according to the first embodiment.
Figure 8:
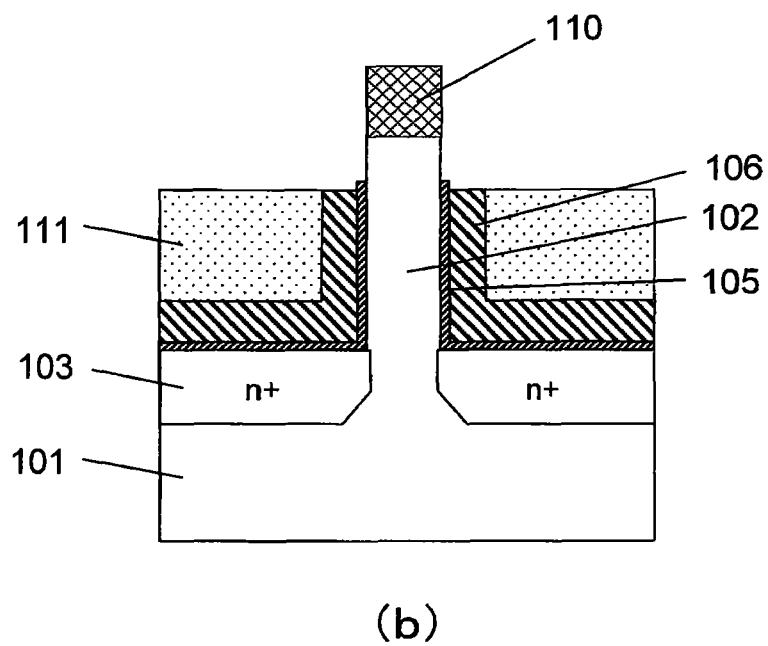
Figure 9:
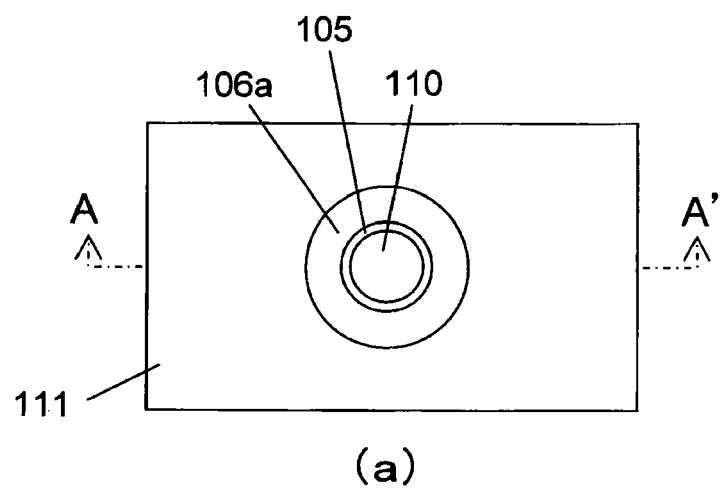
FIGS. 9(a) and 9(b) illustrate a part of the steps of the single-SGT production method according to the embodiment.
Figure 9:
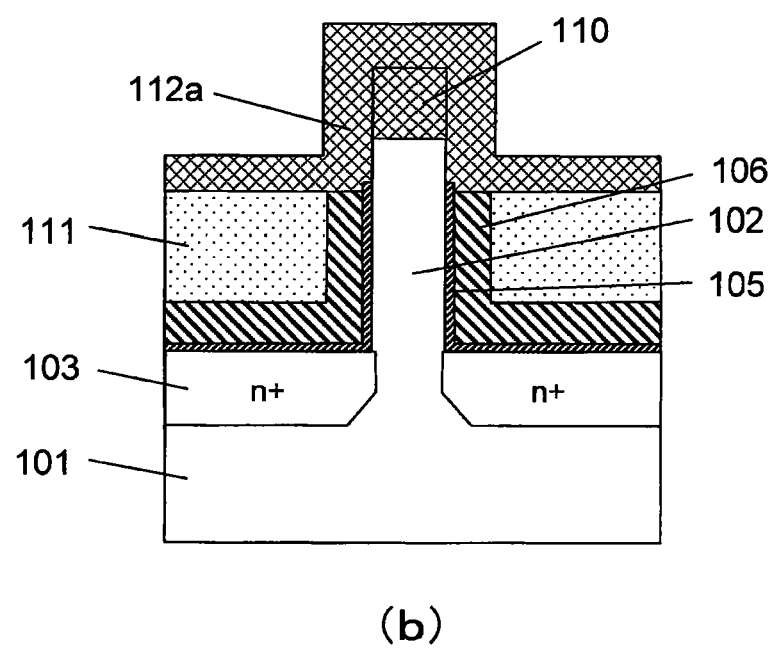
Figure 10:
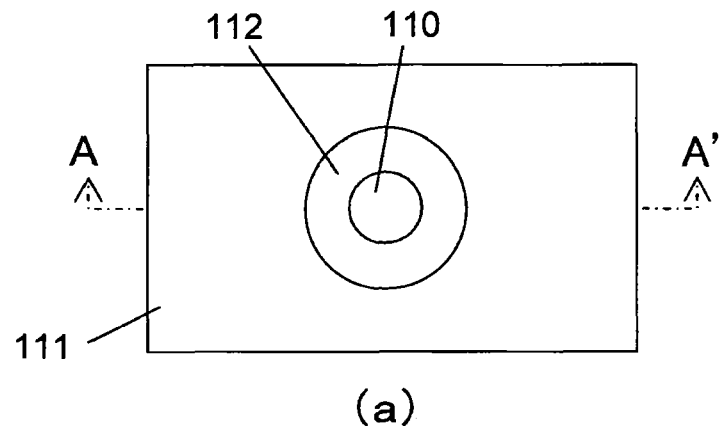
FIGS. 10(a) and 10(b) illustrate a part of the steps of the single-SGT production method according to first the embodiment.
Figure 10:
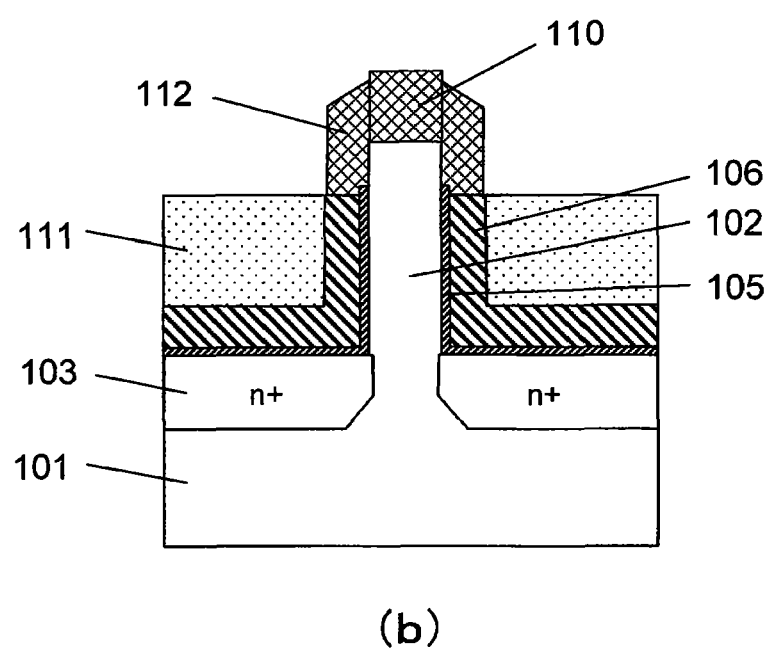
Figure 11:
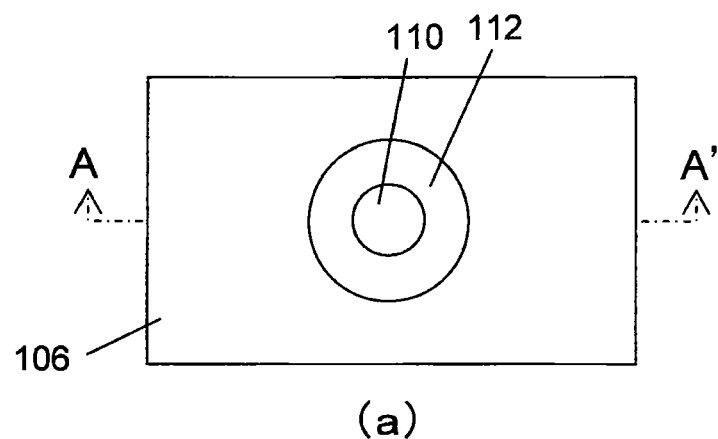
FIGS. 11(a) and 11(b) illustrate a part of the steps of the single-SGT production method according to the embodiment.
Figure 11:
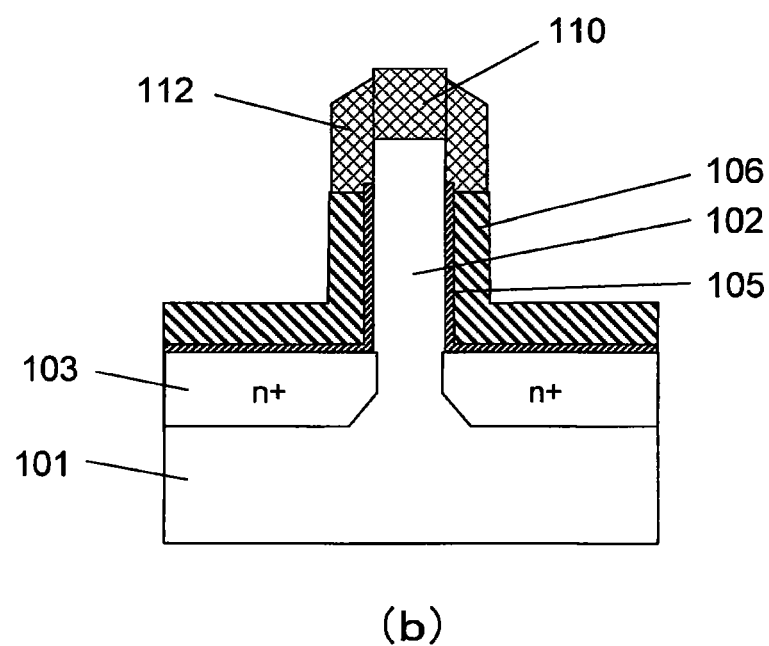
Figure 12:
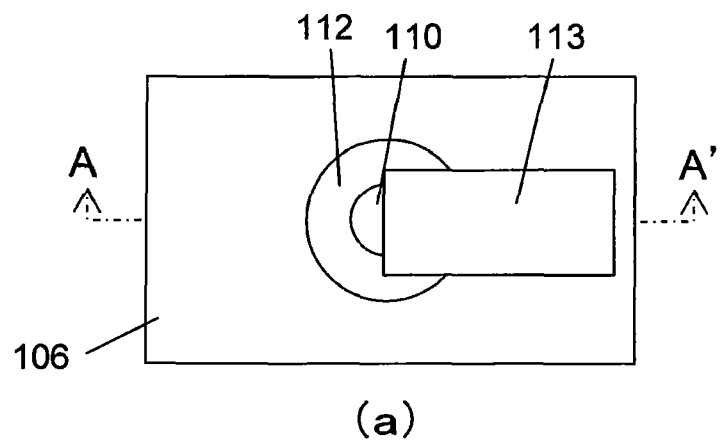
FIGS. 12(a) and 12(b) illustrate a part of the steps of the SGT production method according to first the embodiment.
Figure 12:
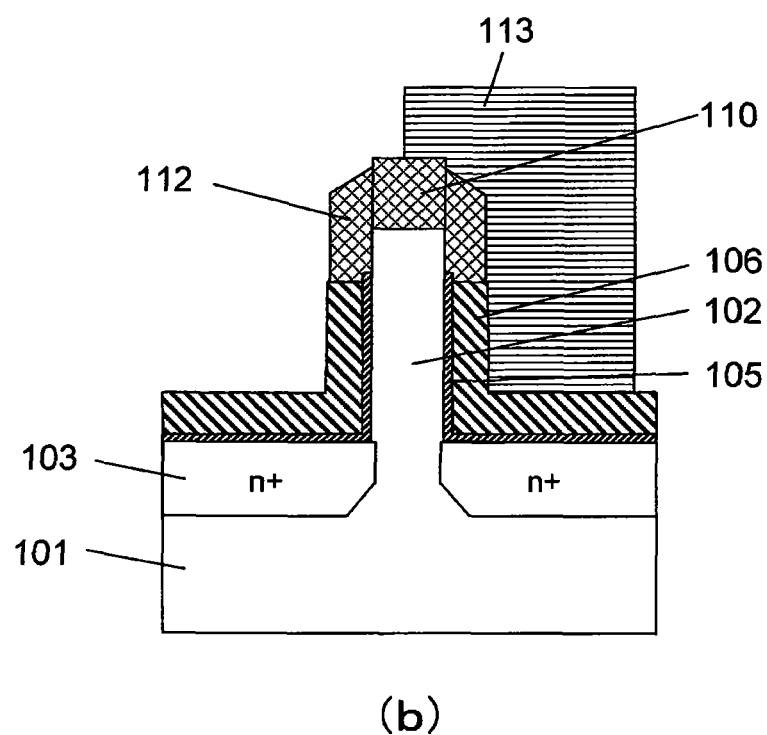
Figure 13:
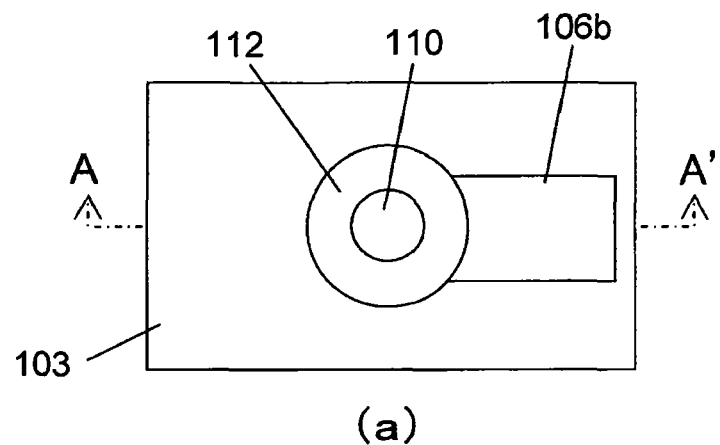
FIGS. 13(a) and 13(b) illustrate a part of the steps of the single-SGT production method according to the first embodiment.
Figure 13:
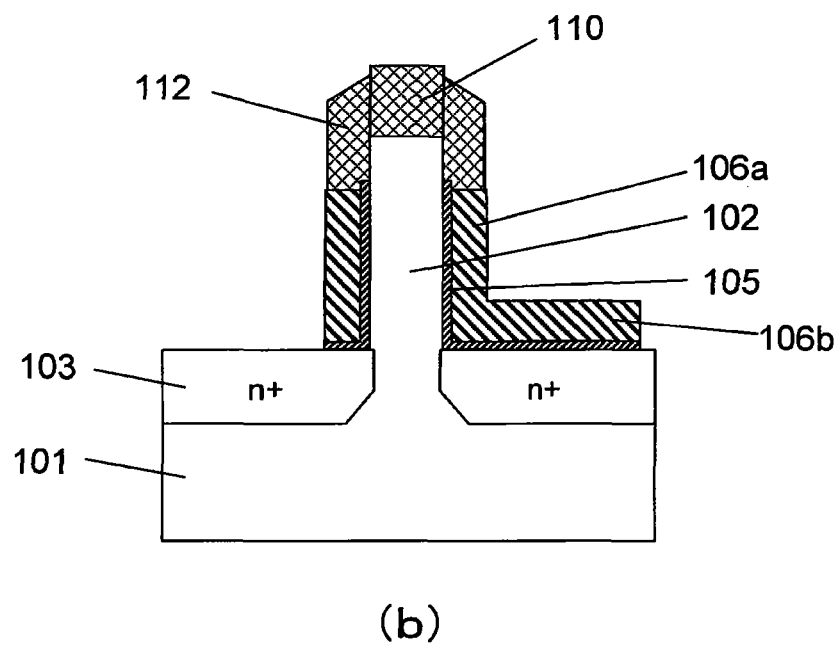
Figure 14:
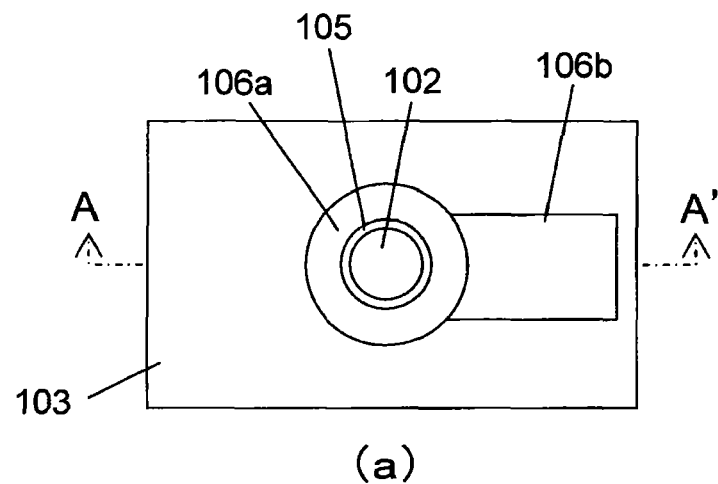
FIGS. 14(a) and 14(b) illustrate a part of the steps of the single-SGT production method according to the first embodiment.
Figure 14:
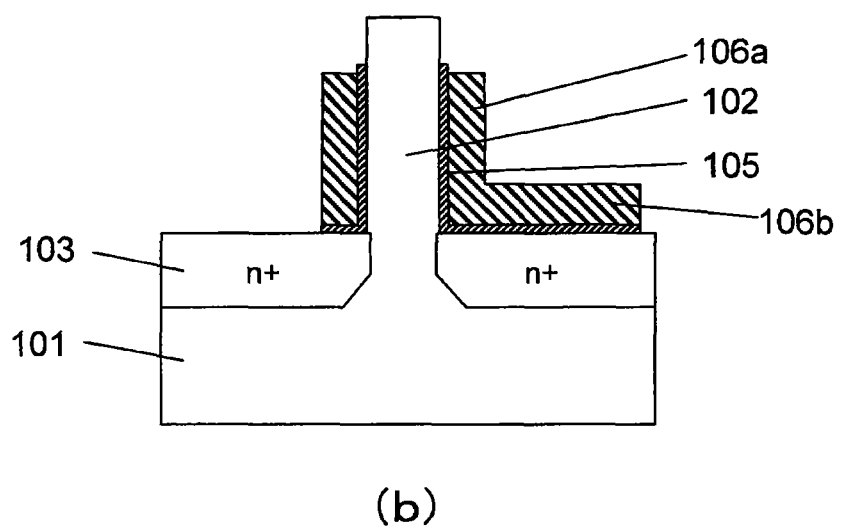
Figure 15:
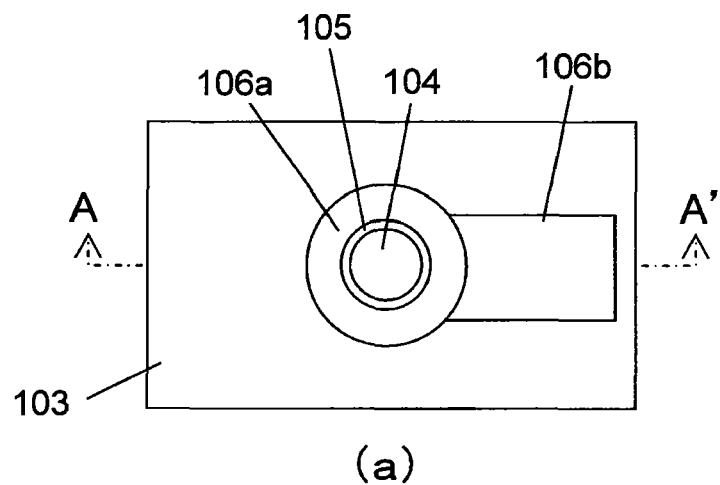
FIGS. 15(a) and 15(b) illustrate a part of the steps of the single-SGT production method according to the first embodiment.
Figure 15:
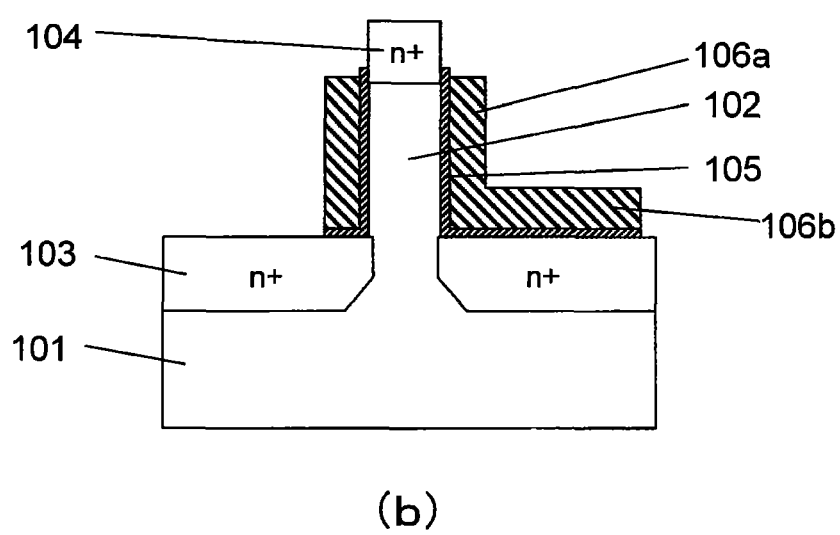
Figure 16:
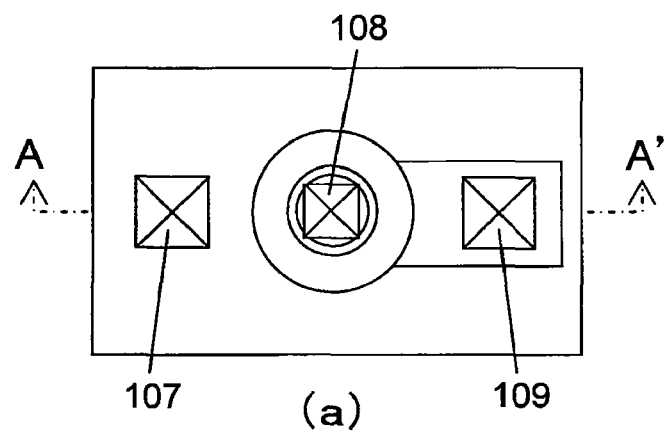
FIGS. 16(a) and 16(b) illustrate a part of the steps of the single-SGT production method according to the first embodiment.
Figure 16:
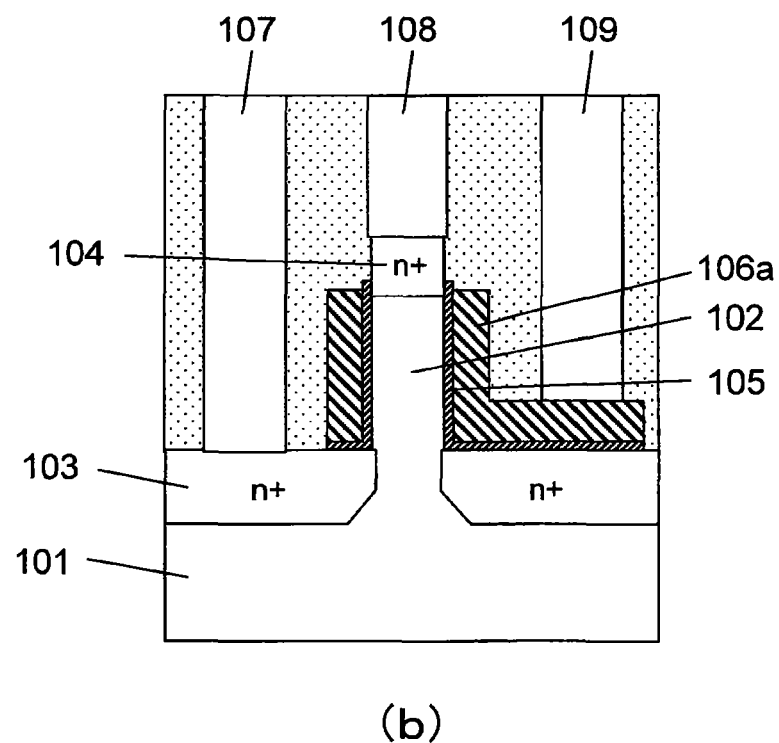

FIGS. 1(*a*) and 1(*b*) are, respectively, a top plan view and a sectional view of an NMOS SGT formed by a SGT production method according to a first embodiment of the present invention. With reference to FIGS. 1(*a*) and 1(*b*), the NMOS SGT formed by the SGT production method according to the first embodiment will be described below.

A pillar-shaped silicon layer 102 is formed on a silicon substrate 101, and a gate dielectric film 105 and a gate electrode 106*a* are formed around the pillar-shaped silicon layer

102. An N+ drain diffusion layer 103 is formed beneath the pillar-shaped silicon layer 102, and an N+ source diffusion layer 104 is formed in an upper portion of the pillar-shaped silicon layer 102. A contact 107, a contact 108, and a contact 109, are formed on the N+ drain diffusion layer 103, the N+ source diffusion layer 104, and a gate line 106b extending from the gate electrode 106a, respectively.

Under conditions that the N+ source diffusion layer 104 is connected to a GND potential, and the N+ drain diffusion layer 103 is connected to a power supply potential Vcc, a potential ranging from zero to Vcc is applied to the gate electrode 106a to allow the SGT to operate as a transistor.

With reference to FIGS. 2(a) to 16(b), one example of the SGT production method according to the first embodiment will be described below. In FIGS. 2(a) to 16(b), the figure suffixed by (a) is a top plan view, and the figure suffixed by (b) is a sectional view taken along the line A-A'.

Referring to FIGS. 2(a) and 2(b), a silicon nitride film 110 serving as a hard mask is formed on a silicon substrate 101 to have a film thickness of about 50 to 150 nm.

Referring to FIGS. 3(a) and 3(b), the hard mask 110 and the silicon substrate 101 are etched to form a pillar-shaped silicon layer 102. The pillar-shaped silicon layer 102 is formed to have a height dimension of about 30 to 300 nm, and a diameter of about 5 to 100 nm.

Referring to FIGS. 4(a) and 4(b), an impurity, such as P or As, is introduced into a top surface of the silicon substrate, for example, by ion implantation, to form an N+ drain diffusion layer 103 therein. During this step, the silicon nitride film 110 on a top of the pillar-shaped silicon layer functions as a stopper for preventing the impurity from being injected into the top of the pillar-shaped silicon layer.

Referring to FIGS. 5(a) and 5(b), a gate dielectric film 105 and a gate conductive film 106 are formed by chemical vapor deposition (CVD) or atomic layer deposition (ALD). The gate conductive film 106 is formed to have a film thickness of about 10 to 100 nm.

Referring to FIGS. 6(a) and 6(b), a silicon oxide film 111 is formed to allow the pillar-shaped silicon layer to be buried therein.

Referring to FIGS. 7(a) and 7(b), the silicon oxide film 111, and respective portions of the gate conductive film and the gate dielectric film above the pillar-shaped silicon layer, are polished by chemical mechanical polishing (CMP), to flatten a top surface of the gate conductive film. Through the flattening of a top of the gate conductive film by CMP, a configuration of the gate conductive film is improved to facilitate control of a gate length. During the CMP, the silicon nitride film 110 on the top of the pillar-shaped silicon layer is used as a CMP stopper. The use of the silicon nitride film 110 as a CMP stopper makes it possible to control an amount of CMP with high repeatability. In place of the silicon nitride film, the film to be used as a CMP stopper may be any other suitable film capable of functioning as the CMP stopper film. This modification may also be made in after-mentioned embodiments.

Referring to FIGS. 8(a) and 8(b), the gate conductive film 106 and the silicon oxide film 111 are etched back, wherein the gate conductive film 106 is etched to fix a gate length. Preferably, etching conditions to be used in this step are set to allow the gate conductive film 106 and the silicon oxide film 111 to be etched at the same rate, and at a higher selectivity ratio relative to the silicon nitride film 110. The etching of the gate conductive film 106 and the silicon oxide film 111 at the same rate makes it possible to suppress occurrence of a step between respective top surfaces of the two films, which improves a configuration of a silicon nitride film-based sidewall 112 to be formed in a next step.

Referring to FIGS. 9(a) and 9(b), a silicon nitride film 112a is formed by a film thickness required for the gate conductive film 106. Subsequently, as shown in FIGS. 10(a) and 10(b), the silicon nitride film 112a is etched back to form a silicon nitride film-based sidewall 112. In this step, a film thickness of the silicon nitride film-based sidewall 112 is controlled to become equal to that of the gate conductive film 106, by adjusting a formed film thickness of the silicon nitride film 112a, and then finely adjusting the formed film thickness based on an amount of the etch-back. A portion of the gate conductive film 106 covered by the silicon nitride film-based sidewall 112 will be protected during etching for forming a gate line in a subsequent step. This makes it possible to form the gate electrode in a self-alignment manner and with a desired film thickness, so as to reduce an occupancy area. In the first embodiment, the silicon nitride film is used as a sidewall protective film. Alternatively, any other suitable film capable of functioning as the sidewall protective film, such as a silicon oxide film, may also be used. This modification may also be made in the after-mentioned embodiments.

Referring to FIGS. 11(a) and 11(b), the silicon oxide film 111 remaining on the gate conductive film is removed by wet etching.

Referring to FIGS. 12(a) and 12(b), a resist or a multilayer resist is applied, and a gate line pattern is formed with a resist 113 by lithography.

Referring to FIGS. 13(a) and 13(b), the gate conductive film and the gate dielectric film are etched using the resist as a mask, to form a gate electrode 106a and a gate line 106b.

Referring to FIGS. 14(a) and 14(b), the silicon nitride film 110 on the top of the pillar-shaped silicon layer, and the silicon nitride film-based sidewall 112, are removed by wet etching.

Referring to FIGS. 15(a) and 15(b), an impurity, such as P or As, is introduced into a top portion of the pillar-shaped silicon layer 102, for example, by ion implantation, to form an N+ source diffusion layer 104 therein.

Referring to FIGS. 16(a) and 16(b), an interlayer dielectric film is formed, and a contact (107, 108, 109) is formed on each of the drain diffusion layer in the upper region of the silicon substrate, the source diffusion layer in the upper portion of the pillar-shaped silicon layer, and the gate line.

In the method according to the first embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the first embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening a top surface of a gate conductive film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the first embodiment makes it possible to simultaneously solve both the following problems: a disconnection or open of a gate line and a variation in gate length arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the first embodiment can form a gate electrode around a pillar-shaped silicon layer in a self-alignment manner and with a desired film thickness, and adjust a film thickness of the gate electrode to be formed around the pillar-shaped silicon layer, based on a formed film thickness of a gate conductive film. Thus, two pillar-shaped silicon layers each having a gate electrode to be applied with a different potential can be arranged side-by-side with a relatively small distance therebetween, to reduce a circuit area. In cases where the gate conductive film is formed to have a relatively small film thickness, a resistance value thereof becomes higher. Thus, in the first embodiment, the gate conductive film is preferably comprised of a metal film.

Second Embodiments

A second embodiment of the present invention shows a gate forming process capable of reducing the number of steps and further increasing a process margin, as compared with the gate forming process in the first embodiment.

Figure 17:
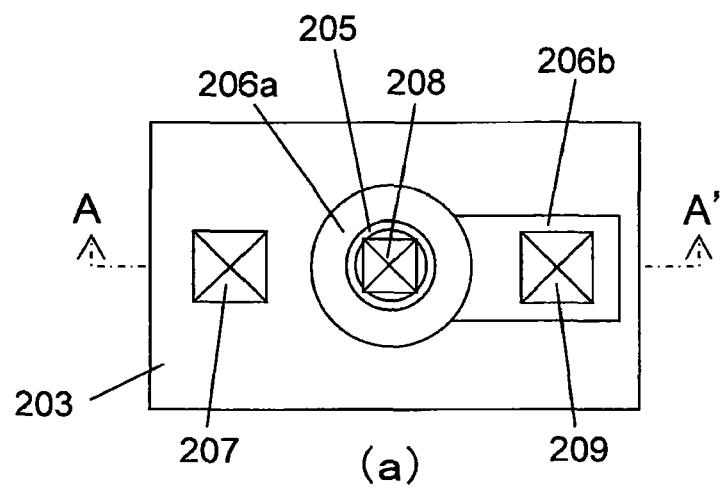
FIGS. 17(a) and 17(b) are, respectively, a top plan view and a sectional view of a single SGT formed by a production method according to a second embodiment of the present invention.
Figure 17:
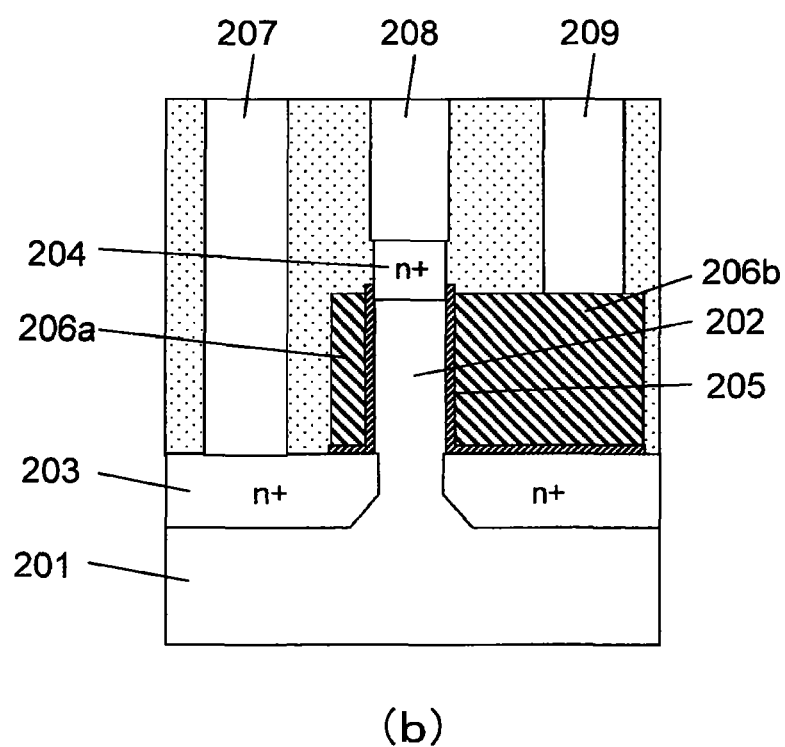
Figure 18:
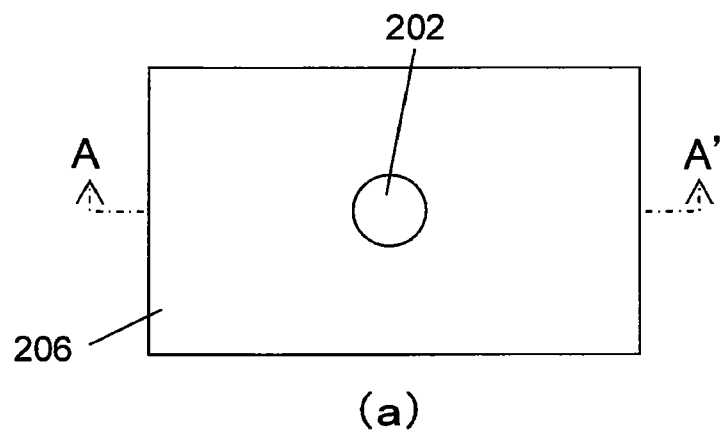
FIGS. 18(a) and 18(b) illustrate a part of a series of steps of the single-SGT production method according to the second embodiment.
Figure 18:
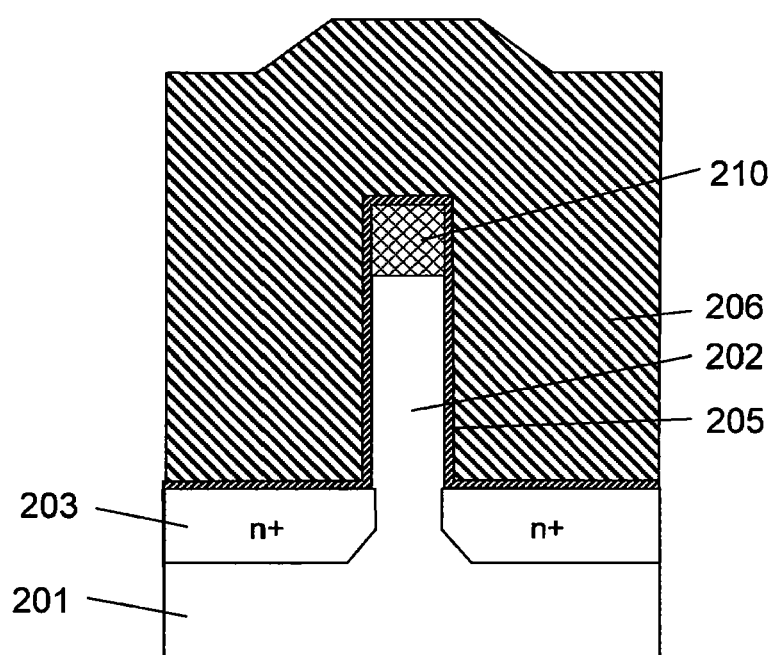
Figure 19:
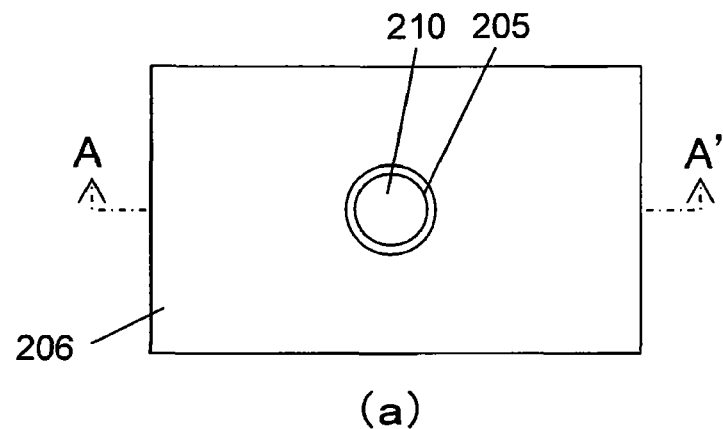
FIGS. 19(a) and 19(b) illustrate a part of the steps of the single-SGT production method according to the second embodiment.
Figure 19:
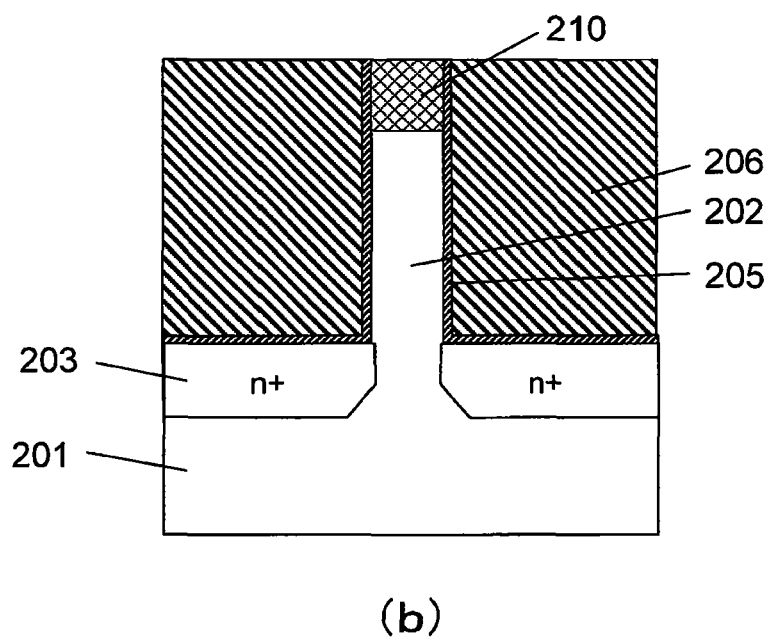
Figure 20:
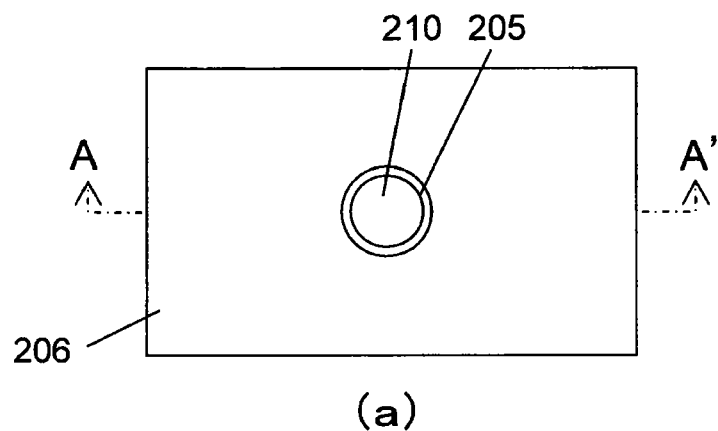
FIGS. 20(a) and 20(b) illustrate a part of the steps of the single-SGT production method according to the second embodiment.
Figure 20:
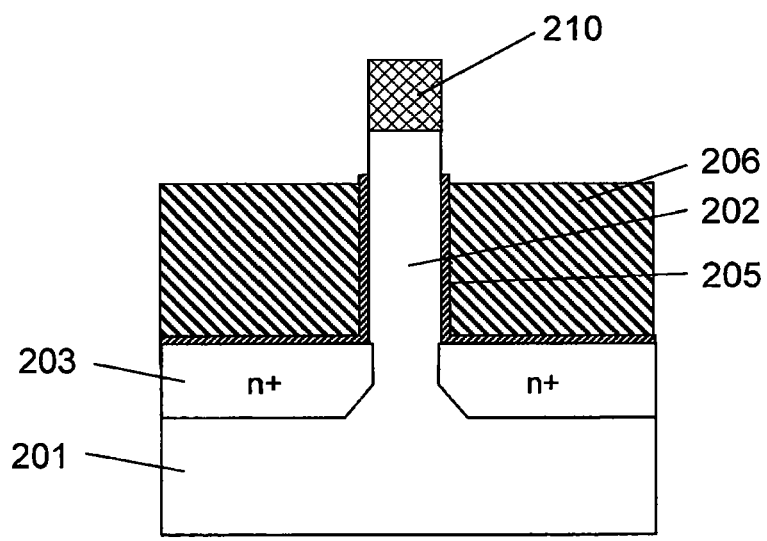
Figure 21:
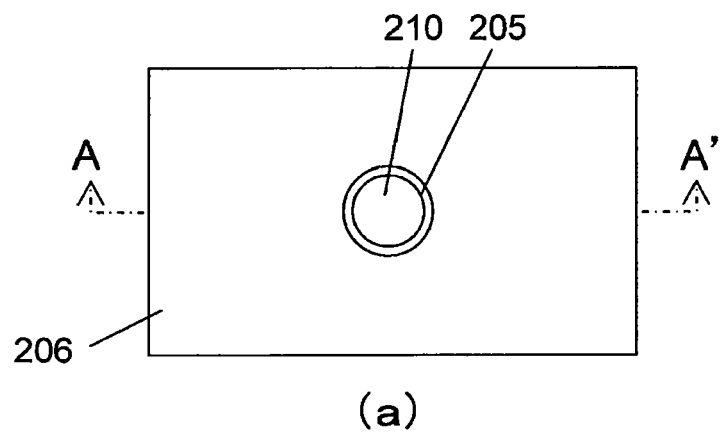
FIGS. 21(a) and 21(b) illustrate a part of the steps of the single-SGT production method according to the second embodiment.
Figure 21:
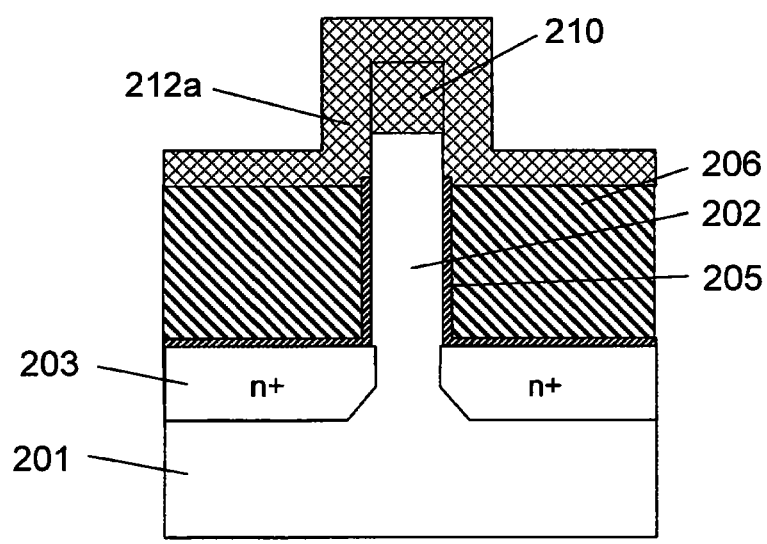
Figure 22:
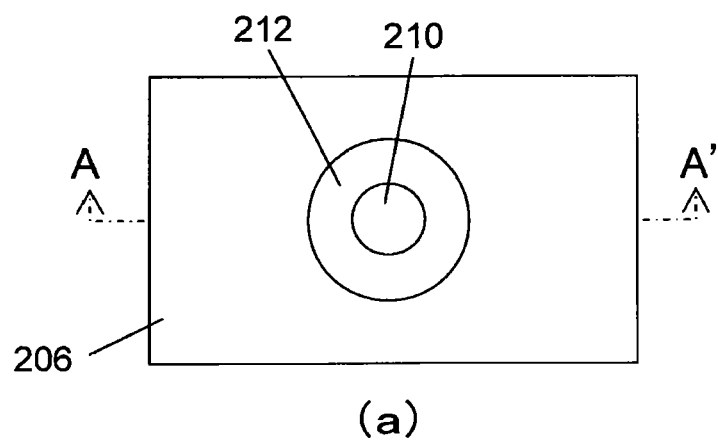
FIGS. 22(a) and 22(b) illustrate a part of the steps of the single-SGT production method according to the second embodiment.
Figure 22:
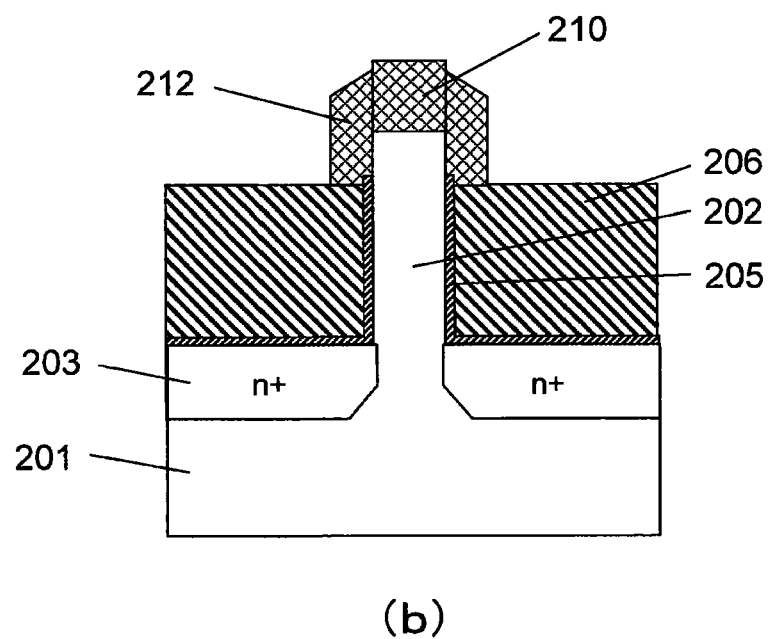
Figure 23:
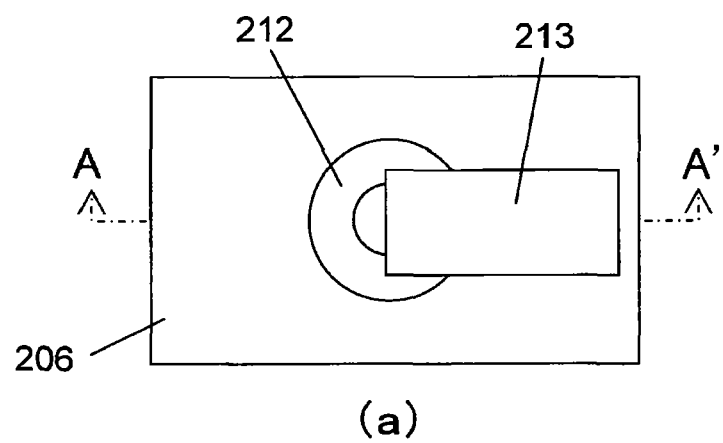
FIGS. 23(a) and 23(b) illustrate a part of the steps of the single-SGT production method according to the second embodiment.
Figure 23:
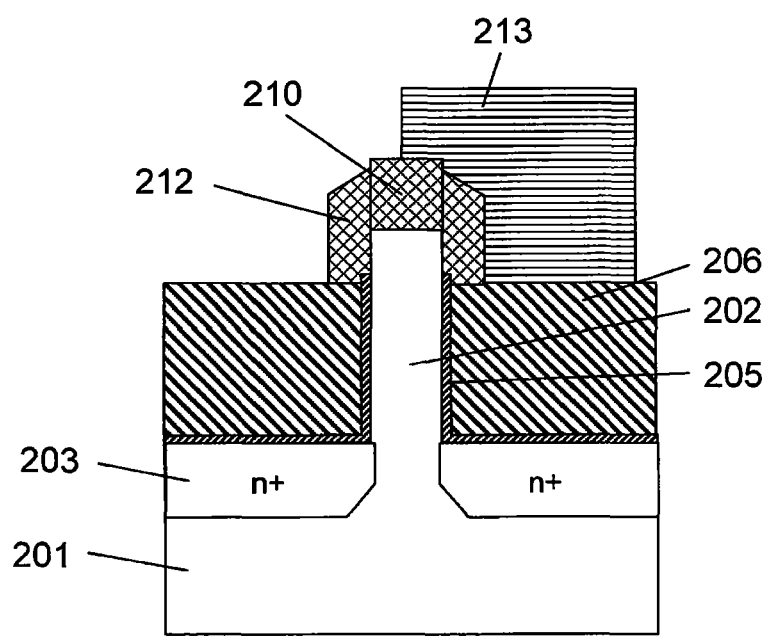
Figure 24:
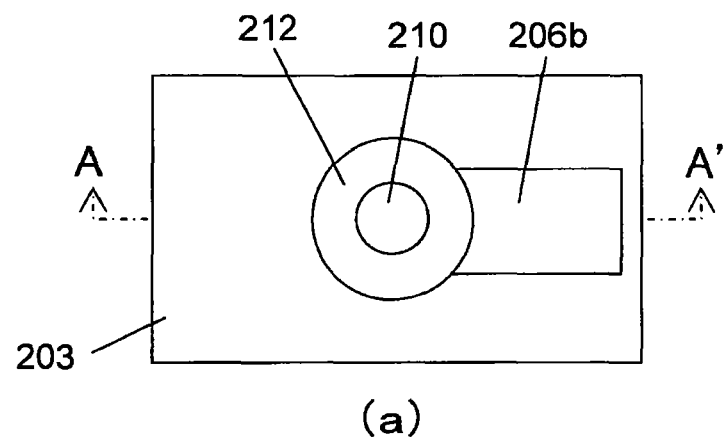
FIGS. 24(a) and 24(b) illustrate a part of the steps of the single-SGT production method according to the second embodiment.
Figure 24:
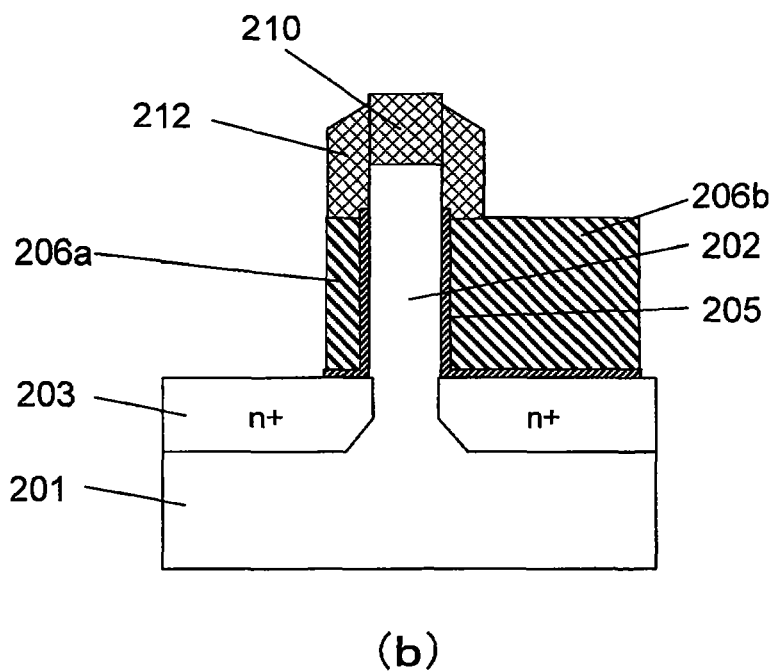
Figure 25:
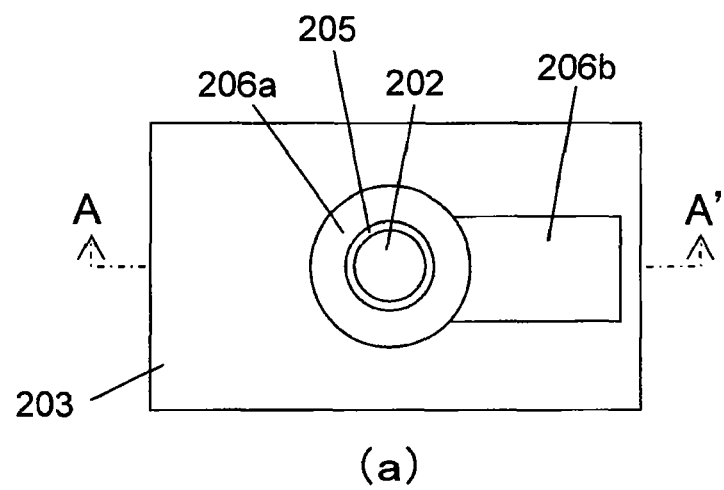
FIGS. 25(a) and 25(b) illustrate a part of the steps of the single-SGT production method according to the second embodiment.
Figure 25:
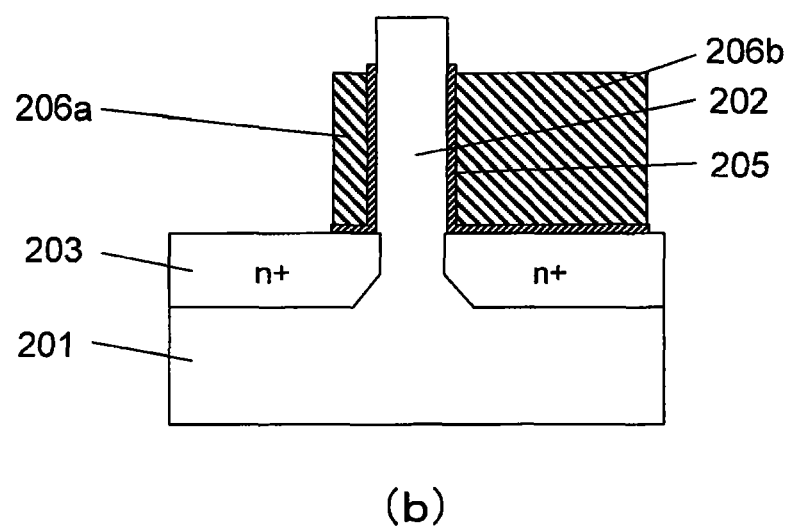
Figure 26:
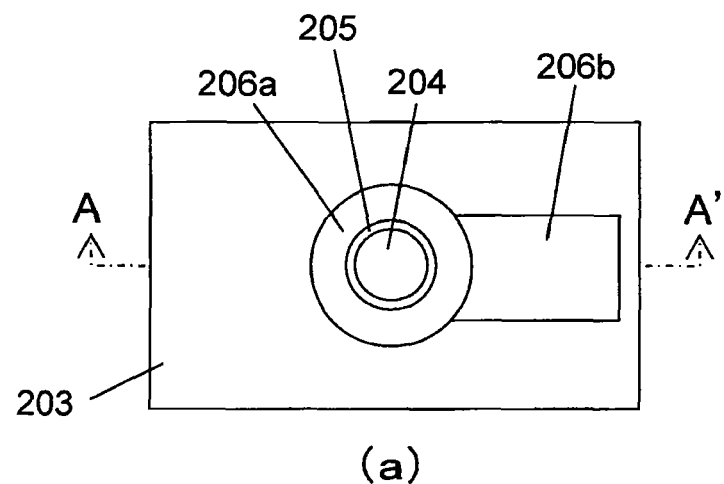
FIGS. 26(a) and 26(b) illustrate a part of the steps of the single-SGT production method according to the second embodiment.
Figure 26:
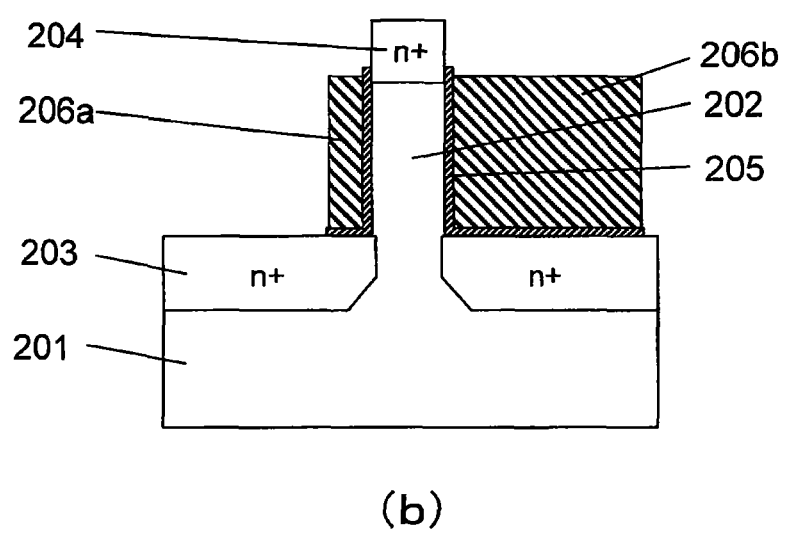
Figure 27:
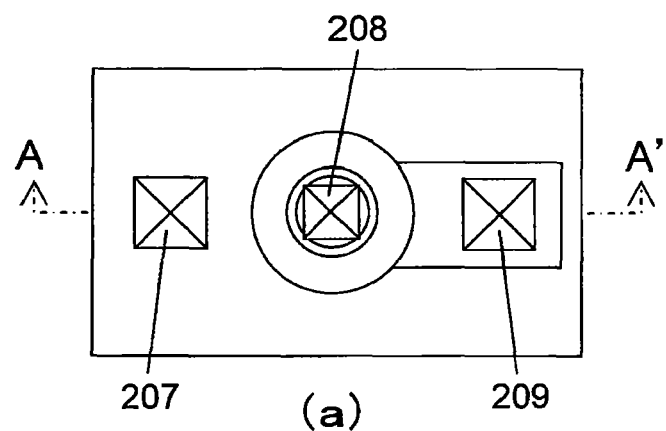
FIGS. 27(a) and 27(b) illustrate a part of the steps of the single-SGT production method according to the second embodiment.
Figure 27:
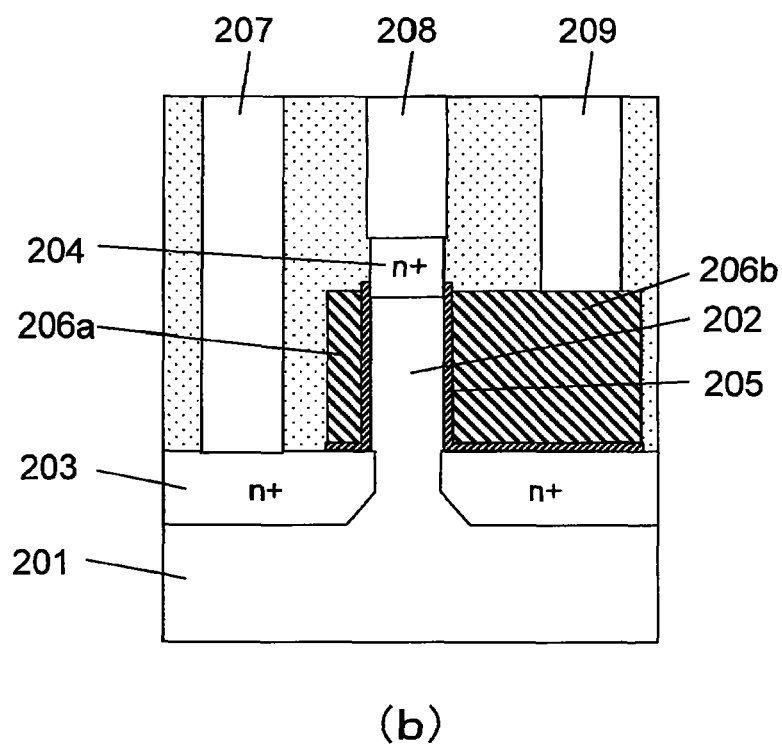

FIGS. 17(a) and 17(b) are, respectively, a top plan view and a sectional view of an NMOS SGT formed by a SGT production method according to the second embodiment. With reference to FIGS. 17(a) and 17(b), the NMOS SGT formed by the SGT production method according to the second embodiment will be described below.

A pillar-shaped silicon layer 202 is formed on a silicon substrate 201, and a gate dielectric film 205 and a gate electrode 206a are formed around the pillar-shaped silicon layer 202. An $N^+$ drain diffusion layer 203 is formed beneath the pillar-shaped silicon layer 202, and an $N^+$ source diffusion layer 204 is formed in an upper portion of the pillar-shaped silicon layer 202. A contact 207, a contact 208, and a contact 209, are formed on the $N^+$ drain diffusion layer 203, the $N^+$ source diffusion layer 204, and a gate line 206b extending from the gate electrode 206a, respectively.

In the second embodiment, the gate electrode 206a and the gate line 206b are formed to be at the same height position. Specifically, the gate electrode is integrally formed with the gate line in such a manner that an entire area of a top surface of the integrated combination of the gate electrode and the gate line becomes parallel to the substrate.

Under conditions that the $N^+$ source diffusion layer 204 is connected to a GND potential, and the $N^+$ drain diffusion layer 203 is connected to a power supply potential Vcc, a potential ranging from zero to Vcc is applied to the gate electrode 206a to allow the SGT to operate as a transistor.

With reference to FIGS. 18(a) to 27(b), one example of the SGT production method according to the second embodiment will be described below. In FIGS. 18(a) to 27(b), the figure suffixed by (a) is a top plan view, and the figure suffixed by (b) is a sectional view taken along the line A-A'.

In the second embodiment, the step of forming a gate dielectric film and any step therebefore are the same as those in the first embodiment. Thus, the following description will be started from the step of forming a gate conductive film.

Referring to FIGS. 18(a) and 18(b), a gate conductive film 206 is formed by CVD or ALD, to allow a pillar-shaped silicon layer 202 to be buried therein.

Referring to FIGS. 19(a) and 19(b), the gate conductive film 206 is polished by CMP, to flatten a top of the gate conductive film. Through the flattening of the top of the gate conductive film by CMP, a configuration of the gate conductive film is improved to facilitate control of a gate length. During the CMP, a silicon nitride film 210 on a top of a pillar-shaped silicon layer 202 is used as a CMP stopper. The use of the silicon nitride film 210 as a CMP stopper makes it possible to control an amount of CMP with high repeatability.

Referring to FIGS. 20(a) and 20(b), the gate conductive film 206 is etched back to fix a gate length.

Referring to FIGS. 21(a) and 21(b), a silicon nitride film 212a is formed by a film thickness required for an aftermentioned gate electrode. Subsequently, as shown in FIGS. 22(a) and 22(b), the silicon nitride film 212a is etched back to form a silicon nitride film-based sidewall 212. In the second embodiment, a film thickness of the gate electrode is determined by a film thickness of the silicon nitride film-based sidewall 212. Thus, a final film thickness of the silicon nitride film-based sidewall 212 is controlled to become equal to a desired film thickness of the gate electrode, by adjusting a formed film thickness of the silicon nitride film 212a and then finely adjusting the formed film thickness based on an amount of the etch-back.

Referring to FIGS. 23(a) and 23(b), a resist or a multilayer resist is applied, and a gate line pattern is formed with a resist 213 by lithography.

Referring to FIGS. 24(a) and 24(b), the gate conductive film and the gate dielectric film are etched using the resist as a mask, to form a gate electrode 206a and a gate line 206b.

Referring to FIGS. 25(a) and 25(b), the silicon nitride film 210 on the top of the pillar-shaped silicon layer, and the silicon nitride film-based sidewall 212, are removed by wet etching.

Referring to FIGS. 26(a) and 26(b), an impurity, such as P or As, is introduced into a top portion of the pillar-shaped silicon layer 202, for example, by ion implantation, to form an $N^+$ source diffusion layer 204 therein.

Referring to FIGS. 27(a) and 27(b), an interlayer dielectric film is formed, and a contact (207, 208, 209) is formed on each of the drain diffusion layer in the upper region of the silicon substrate, the source diffusion layer in the upper portion of the pillar-shaped silicon layer, and the gate line.

In the method according to the second embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the second embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening a top surface of a gate conductive film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the second embodiment makes it possible to simultaneously solve both the following problems: a disconnection or open of a gate line and a variation in gate length arising from a lithography step of forming the gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the second embodiment can form a gate electrode around a pillar-shaped silicon layer in a self-alignment manner and with a desired film thickness. In the first embodiment, a film thickness of a gate electrode is controlled based on a formed film thickness of a gate conductive film. Differently, in the second embodiment, the film thickness of the gate electrode can be controlled based on a film thickness of the silicon nitride film-based sidewall 212. Further, in the second embodiment, the gate line 206b has a relatively large film thickness as compared with that of the gate line in the first embodiment. Thus, the gate conductive film is not limited to a metal film, but may be made of a material having relatively high electrical resistance, such as polysilicon.

Figure 28:
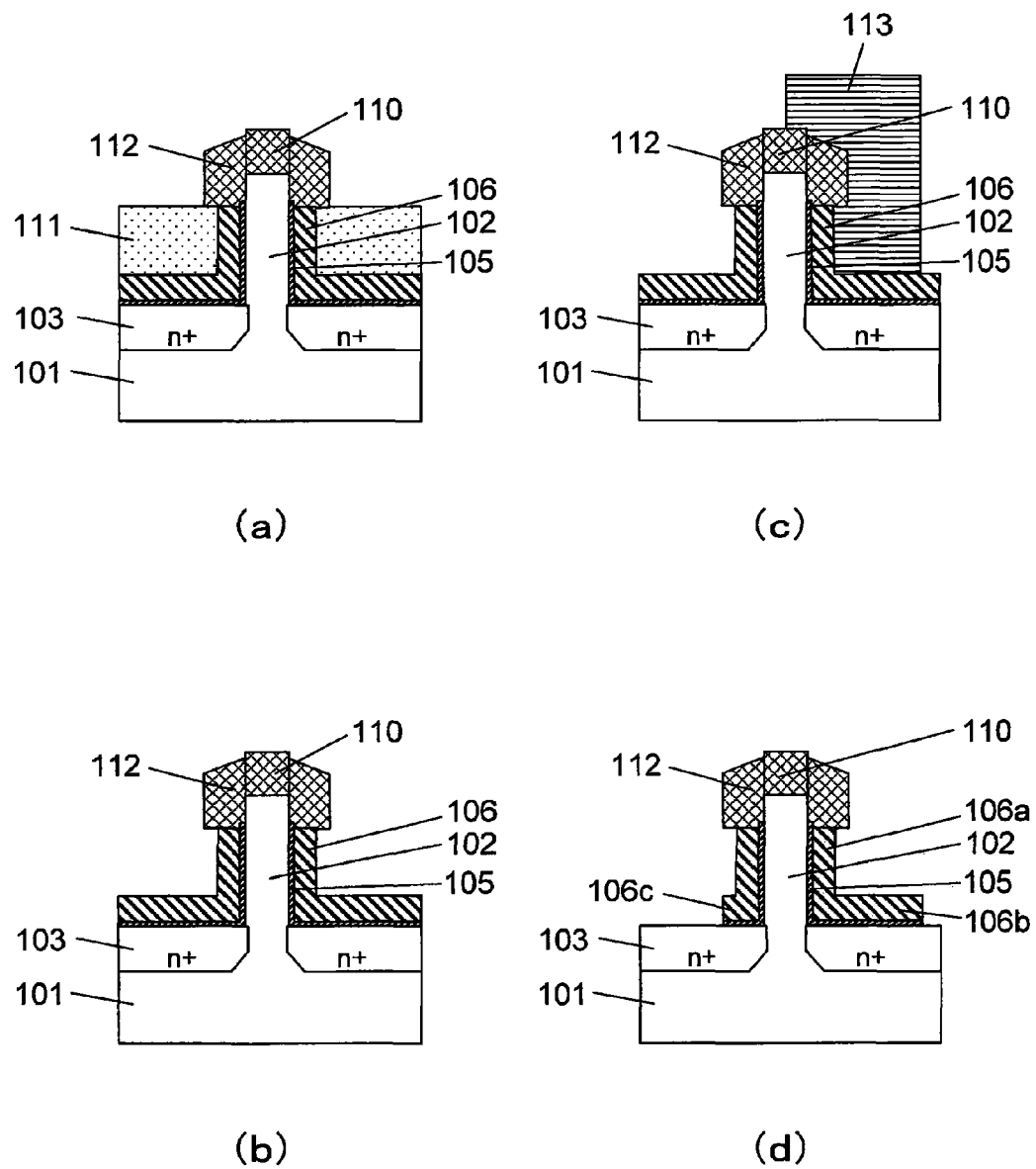
FIGS. 28(a) to 28(d) are explanatory diagrams showing a misalignment of gate line pattern occurring in the first embodiment.
Figure 29:
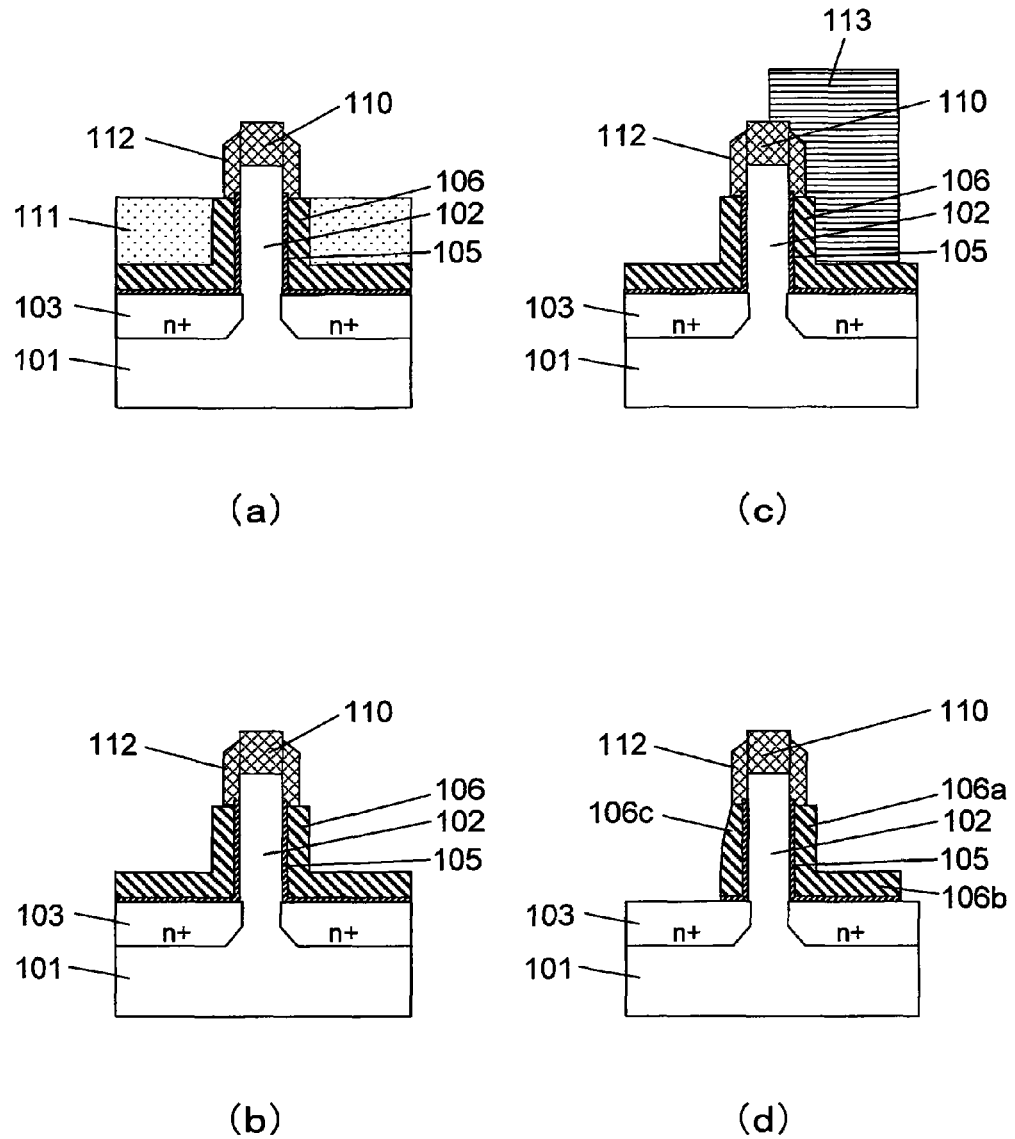
FIGS. 29(a) to 29(d) are explanatory diagrams showing a defect which is likely to occur in the first embodiment.

In the first embodiment, the silicon nitride film-based sidewall 112 must be formed to have a thickness approximately equal to that of the gate conductive film 106. Thus, if the sidewall 112 is excessively thicker or thinner than the gate conductive film 106, a problem is likely to occur. Specifically, as shown in FIGS. 28(*a*) to 28(*d*), in the case where the sidewall 112 is excessively thicker than the gate conductive film 106, a silicon nitride film-based sidewall 112 having a film thickness greater than that of a gate conductive film 106 is formed (FIG. 28(*a*)), and a silicon oxide film 111 is removed by wet etching (FIG. 28(*b*)), whereafter a gate line pattern is formed by lithography (FIG. 28(*c*)), and a gate electrode 106a and a gate line 106b are formed by etching. In this case, the gate electrode has a protrusion 106c formed in a lower end thereof corresponding to a region which has not been covered by a resist 113. If the protrusion becomes significantly large, such a defective structure is likely to become cause a problem, such as a short-circuiting between the protrusion 106c of the gate electrode and an adjacent contact. As shown in FIGS. 29(*a*) to 29(*d*), in the case where the sidewall 112 is excessively thinner than the gate conductive film 106, a silicon nitride film-based sidewall 112 having a film thickness less than that of a gate conductive film 106 is formed (FIG. 29(*a*)), and a silicon oxide film 111 is removed by wet etching (FIG. 29(*b*)), whereafter a gate line pattern is formed by lithography (FIG. 29(*c*)), and a gate electrode 106a and a gate line 106b are formed by etching. In this case, a part of a top of the gate conductive film is not covered by a resist 113, and thereby subjected to etching. Thus, a film thickness of the gate electrode is reduced. If the reduction in film thickness becomes significant, such a defective structure is likely to cause a problem, such as etching damage on a gate dielectric film, or a change in transistor characteristics. Differently, in the second embodiment, the gate electrode is formed to have a desired film thickness, in a self-alignment manner based on the silicon nitride film-based sidewall 112 having a film thickness equal to the desired film thickness of the gate electrode. This makes it possible to eliminate a risk of occurrence of the above problems, and further increase a process margin in the gate forming process, as compared with that in the first embodiment.

Third Embodiment

A NMOS SGT formed by a SGT production method according to a third embodiment of the present invention is different from the NMOS SGT in the second embodiment, in that a gate electrode and a gate line extending from the gate electrode are formed in a layered structure which comprises a thin metal film and a polysilicon layer. In a gate forming process in the third embodiment, the thin metal film is formed to be in contact with a gate dielectric film so as to suppress depletion of the gate electrode, and the polysilicon layer is formed to define respective top surfaces of the gate electrode and the gate line, so as to allow the SGT to be produced in the same production line as that for a transistor having a conventional polysilicon gate.

Figure 30:
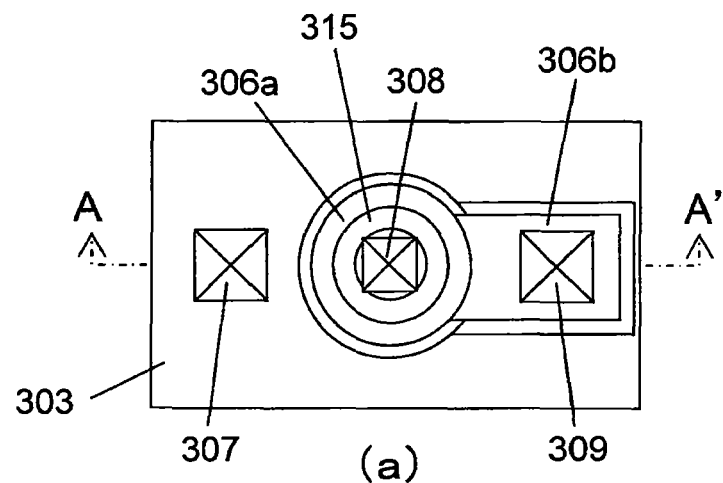
FIGS. 30(a) and 30(b) are, respectively, a top plan view and a sectional view of a single SGT formed by a production method according to a third embodiment of the present invention.
Figure 30:
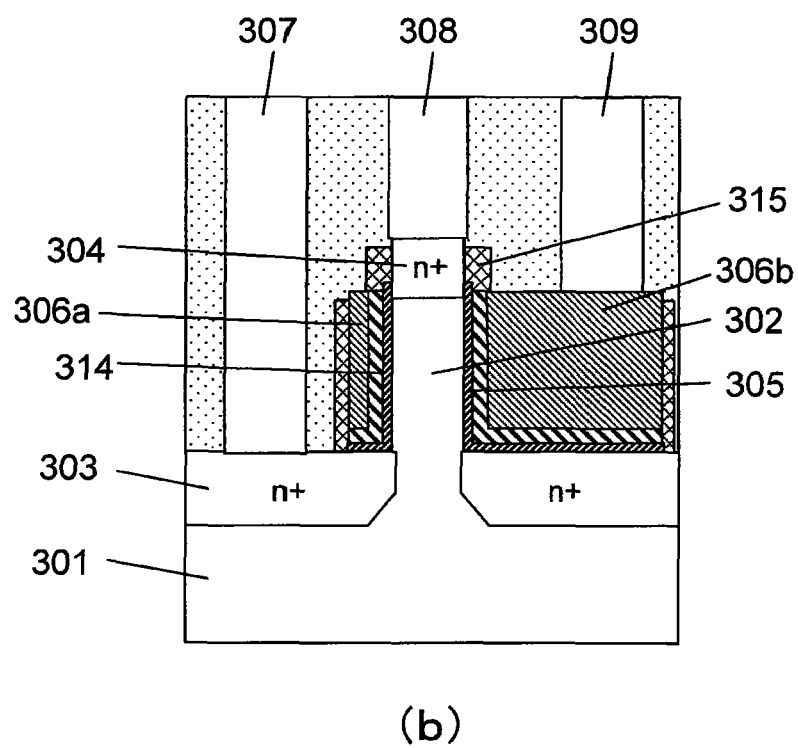

FIGS. 30(*a*) and 30(*b*) are, respectively, a top plan view and a sectional view of the NMOS SGT formed by the SGT production method according to the third embodiment. With reference to FIGS. 30(*a*) and 30(*b*), the NMOS SGT formed by the method according to the third embodiment will be described below.

A pillar-shaped silicon layer 302 is formed on a silicon substrate 301, and a gate dielectric film 305 and a gate electrode 306a are formed around the pillar-shaped silicon layer 302. The gate electrode has a layered structure which comprises a thin metal film 314 having a film thickness of about 1 to 10 nm, and a polysilicon layer 306a covering the metal film. An N$^+$ drain diffusion layer 303 is formed beneath the pillar-shaped silicon layer 302, and an N$^+$ source diffusion layer 304 is formed in an upper portion of the pillar-shaped silicon layer 302. A contact 307, a contact 308, and a contact 309, are formed on the N$^+$ drain diffusion layer 303, the N$^+$ source diffusion layer 304, and a gate line 306b extending from the gate electrode 306a, respectively.

In the third embodiment, the gate electrode 306a and the gate line 306b are formed to be at the same height position, in the same manner as that in the second embodiment. Specifically, the gate electrode is integrally formed with the gate line in such a manner that an entire area of a top surface of the integrated combination of the gate electrode and the gate line becomes parallel to the substrate.

Under conditions that the N$^+$ source diffusion layer 304 is connected to a GND potential, and the N$^+$ drain diffusion layer 303 is connected to a power supply potential Vcc, a potential ranging from zero to Vcc is applied to the gate electrode 306a to allow the SGT to operate as a transistor.

Figure 31:
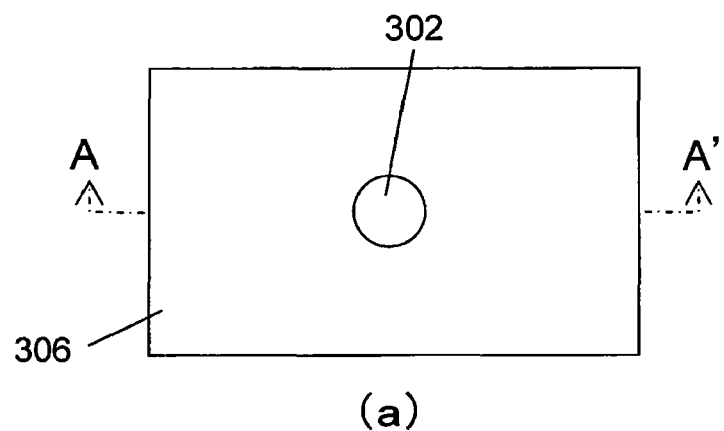
FIGS. 31(a) and 31(b) illustrate a part of a series of steps of the single-SGT production method according to the third embodiment.
Figure 31:
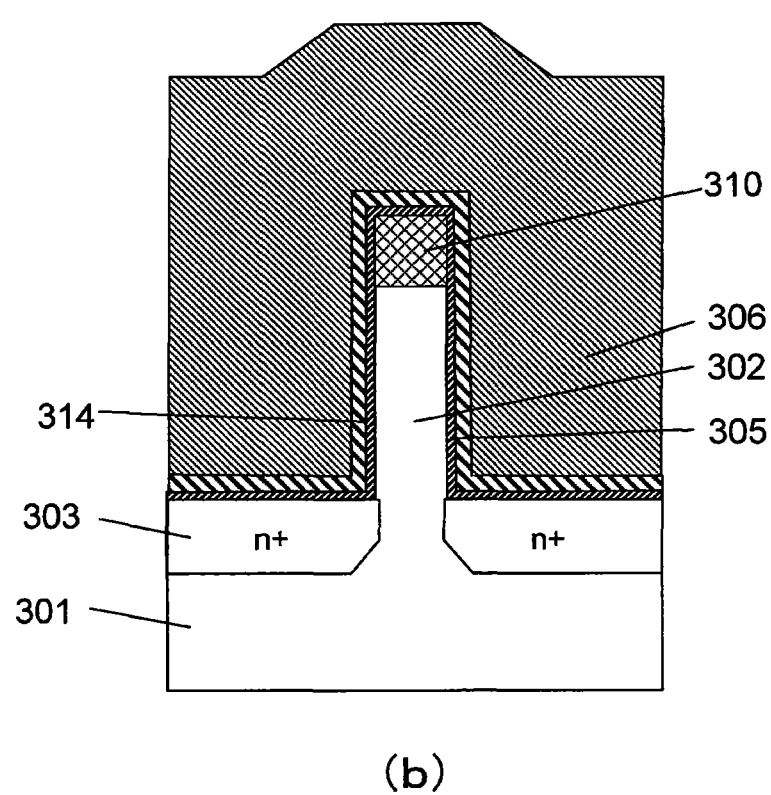

With reference to FIGS. 31(*a*) to 41(*b*), one example of the SGT production method according to the third embodiment will be described below. In FIGS. 31(*a*) to 41(*b*), the figure suffixed by (a) is a top plan view, and the figure suffixed by (b) is a sectional view taken along the line A-A'.

In the third embodiment, the step of forming a gate dielectric film and any step therebefore are the same as those in the second embodiment. Thus, the following description will be started from the step of forming a thin metal film and a polysilicon layer.

Referring to FIGS. 31(a) and 31(b), after forming a gate dielectric film 305, a thin metal film 314 is formed to have a film thickness of about 1 to 10 nm, and then a polysilicon layer 306 is formed to allow a pillar-shaped silicon layer 302 to be buried therein.

Figure 32:
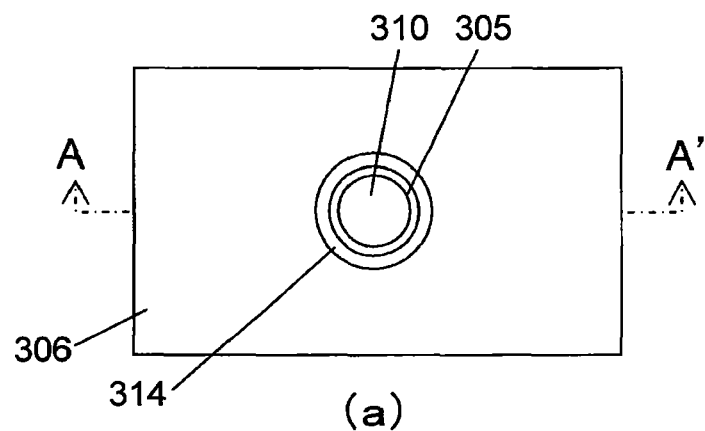
FIGS. 32(a) and 32(b) illustrate a part of the steps of the single-SGT production method according to the third embodiment.
Figure 32:
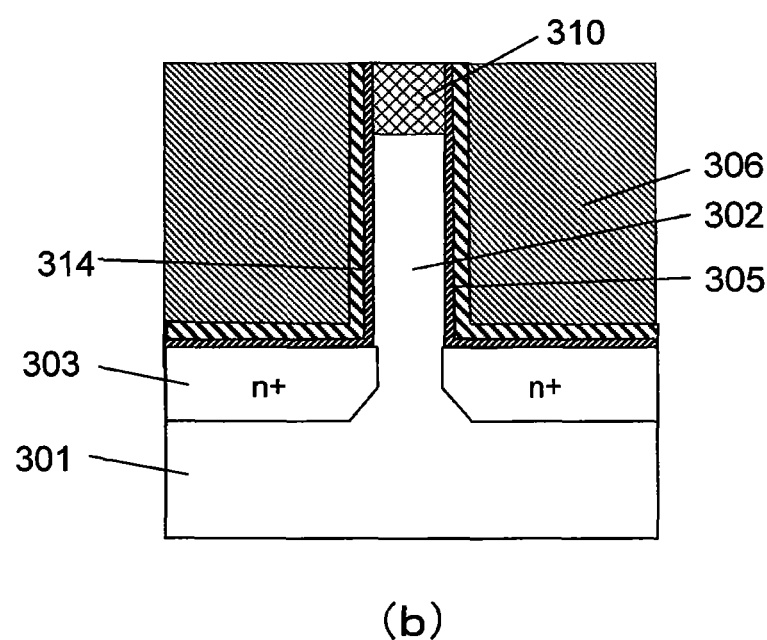

Referring to FIGS. 32(a) and 32(b), the polysilicon layer 306, and respective portions of the thin metal film 314 and the gate dielectric film 305 above the pillar-shaped silicon layer, are polished by CMP, to flatten respective top surfaces of the polysilicon layer 306 and the thin metal film 314. Through the flattening of respective tops of the polysilicon layer 306 and the thin metal film 314 by CMP, respective configurations of the polysilicon layer 306 and the thin metal film 314 are improved to facilitate control of a gate length. During the CMP, a silicon nitride film 310 on a top of the pillar-shaped silicon layer is used as a CMP stopper. The use of the silicon nitride film 310 as a CMP stopper makes it possible to control an amount of CMP with high repeatability.

Figure 33:
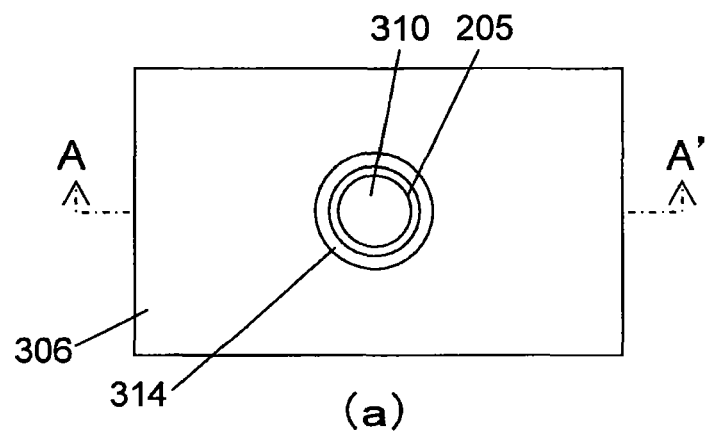
FIGS. 33(a) and 33(b) illustrate a part of the steps of the single-SGT production method according to the third embodiment.
Figure 33:
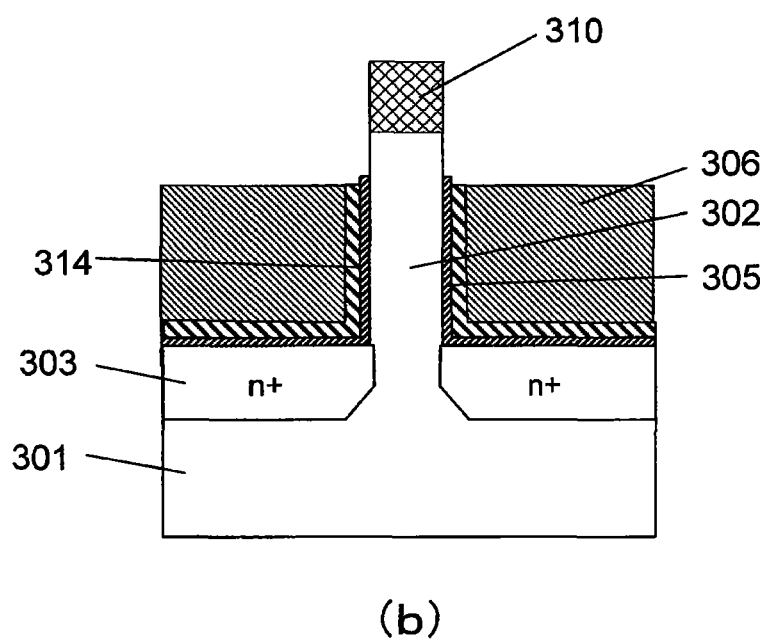

Referring to FIGS. 33(a) and 33(b), the polysilicon layer 306 and the thin metal film 314 are etched back to fix a gate length.

Figure 34:
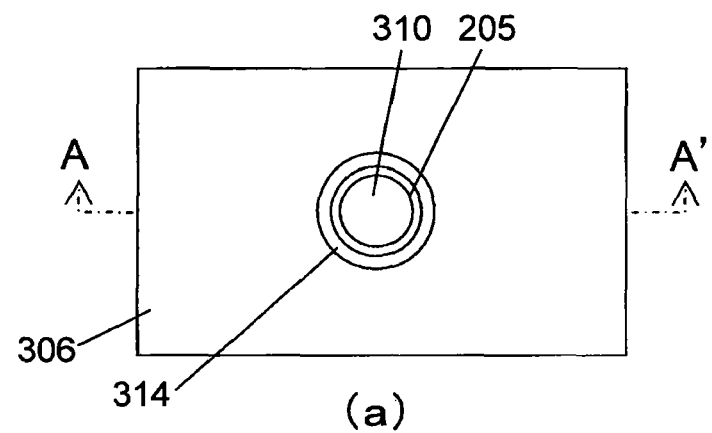
FIGS. 34(a) and 34(b) illustrate a part of the steps of the single-SGT production method according to the third embodiment.
Figure 34:
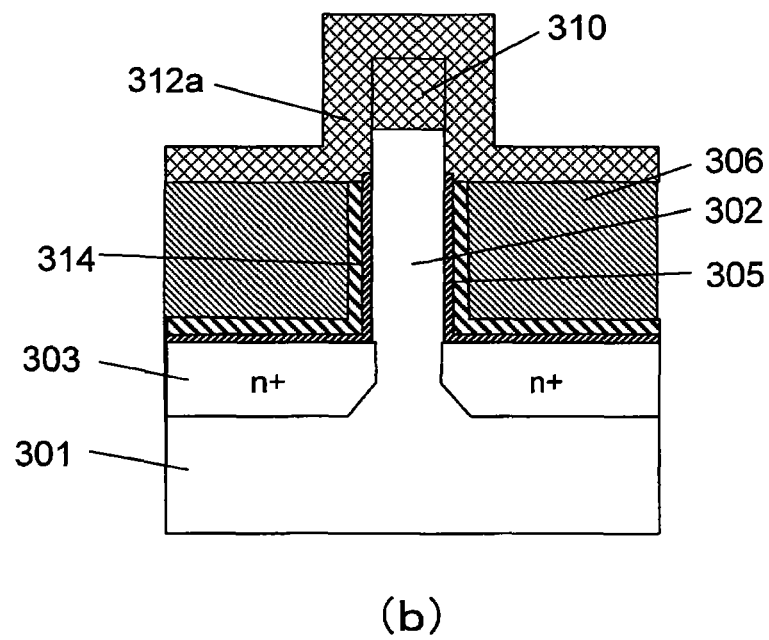
Figure 35:
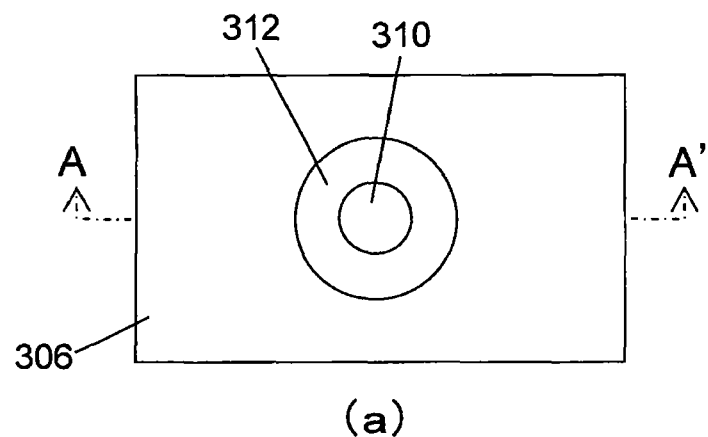
FIGS. 35(a) and 35(b) illustrate a part of the steps of the single-SGT production method according to the third embodiment.
Figure 35:
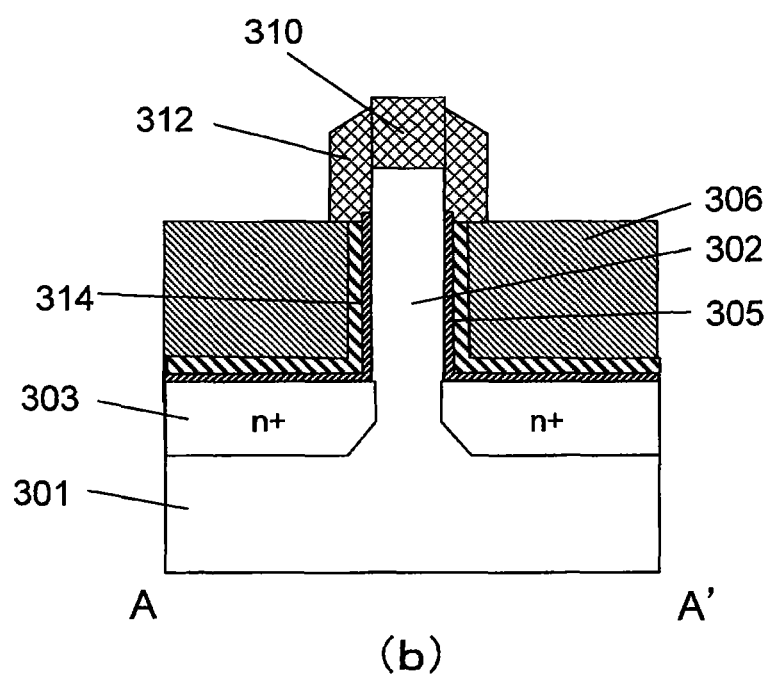

Referring to FIGS. 34(a) and 34(b), a silicon nitride film 312a is formed by a film thickness required for an aftermentioned gate electrode. Subsequently, as shown in FIGS. 35(a) and 35(b), the silicon nitride film 312a is etched back to form a silicon nitride film-based sidewall 312. In the third embodiment, a film thickness of the gate electrode is determined by a film thickness of the silicon nitride film-based sidewall 312. Thus, a final film thickness of the silicon nitride film-based sidewall 312 is controlled to become equal to a desired film thickness of the gate electrode, by adjusting a formed film thickness of the silicon nitride film 312a and then finely adjusting the formed film thickness based on an amount of the etch-back.

Figure 36:
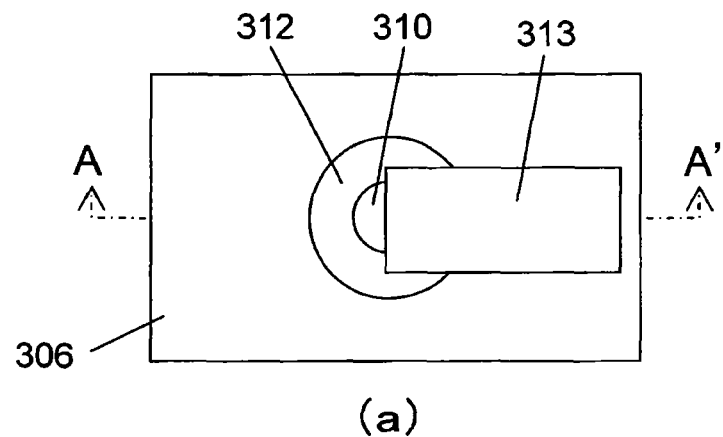
FIGS. 36(a) and 36(b) illustrate a part of the steps of the single-SGT production method according to the third embodiment.
Figure 36:
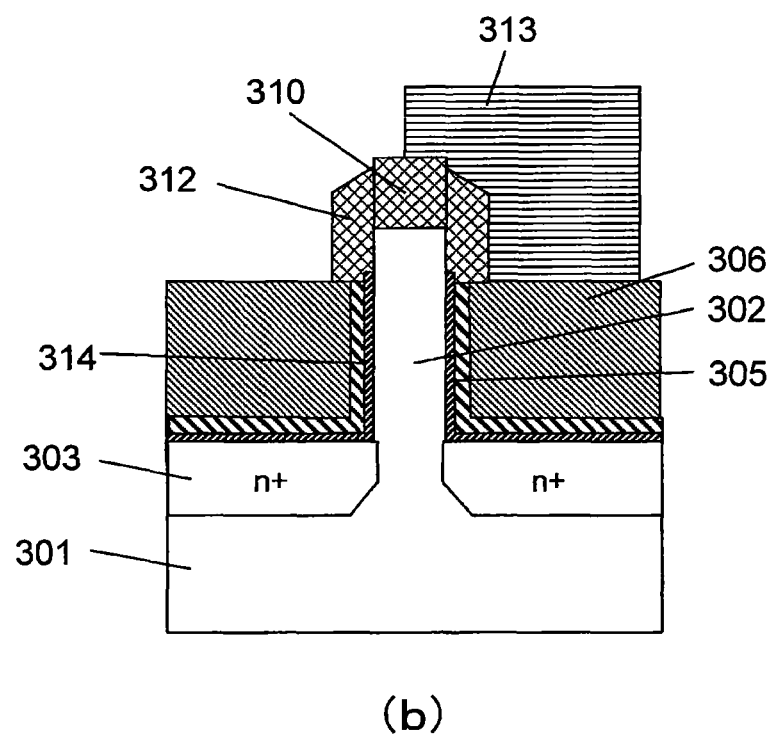

Referring to FIGS. 36(a) and 36(b), a resist or a multilayer resist is applied, and a gate line pattern is formed with a resist 313 by lithography.

Figure 37:
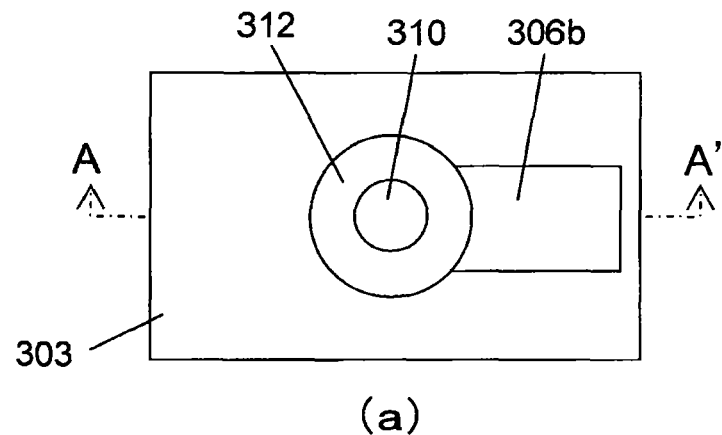
FIGS. 37(a) and 37(b) illustrate a part of the steps of the single-SGT production method according to the third embodiment.
Figure 37:
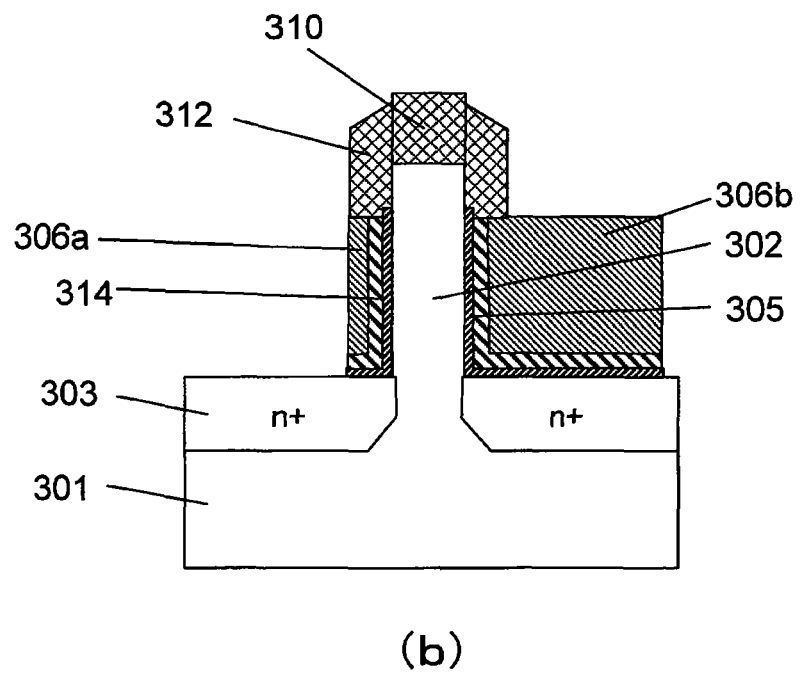

Referring to FIGS. 37(a) and 37(b), the polysilicon layer, the thin metal film and the gate dielectric film are etched using the resist as a mask, to form a gate electrode 306a and a gate line 306b.

Figure 38:
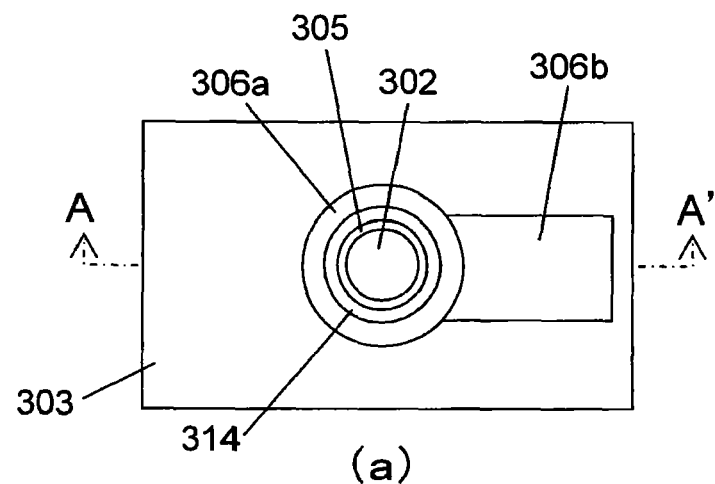
FIGS. 38(a) and 38(b) illustrate a part of the steps of the single-SGT production method according to the third embodiment.
Figure 38:
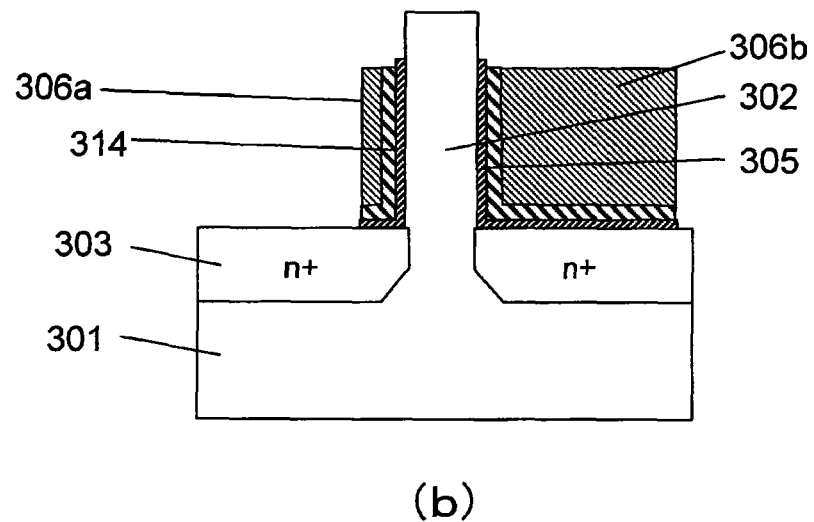

Referring to FIGS. 38(a) and 38(b), the silicon nitride film 310 on the top of the pillar-shaped silicon layer, and the silicon nitride film-based sidewall 312, are removed by wet etching.

Figure 39:
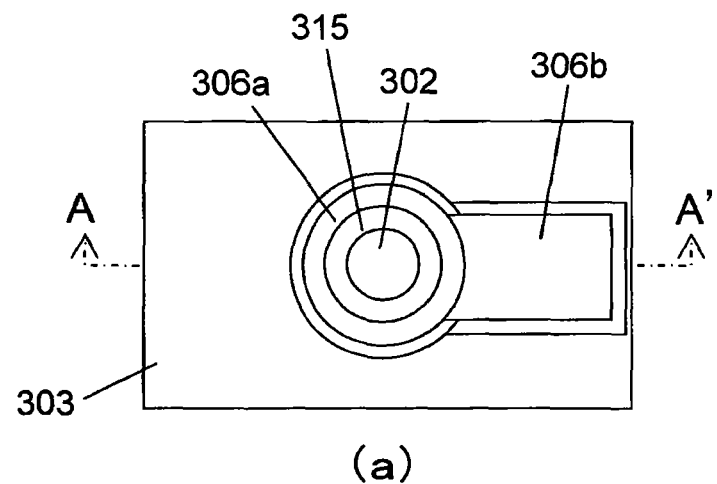
FIGS. 39(a) and 39(b) illustrate a part of the steps of the single-SGT production method according to the third embodiment.
Figure 39:
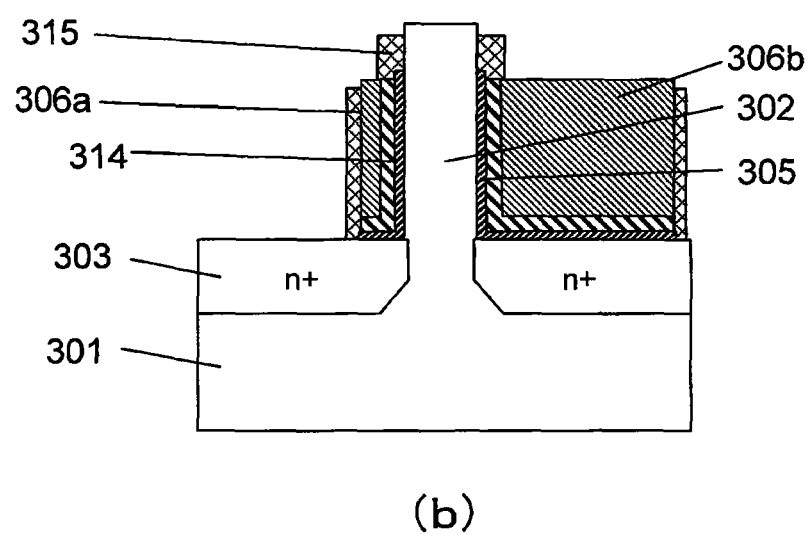

Referring to FIGS. 39(a) and 39(b), a silicon nitride film is formed and then etched back to form a silicon nitride film 315. The silicon nitride film 315 is formed to cover the thin metal film 314 of the gate electrode to keep a top surface of the thin metal film 314 from being exposed. This makes it possible to produce an intended SGT in the same production line as that for a transistor having a conventional polysilicon gate.

Figure 40:
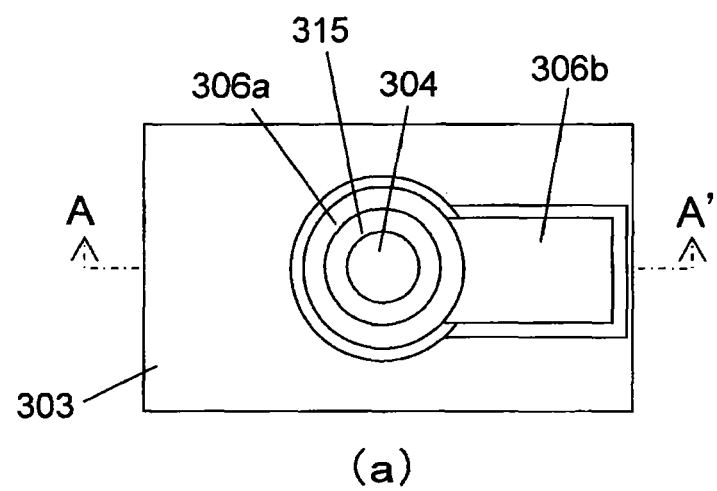
FIGS. 40(a) and 40(b) illustrate a part of the steps of the single-SGT production method according to the third embodiment.
Figure 40:
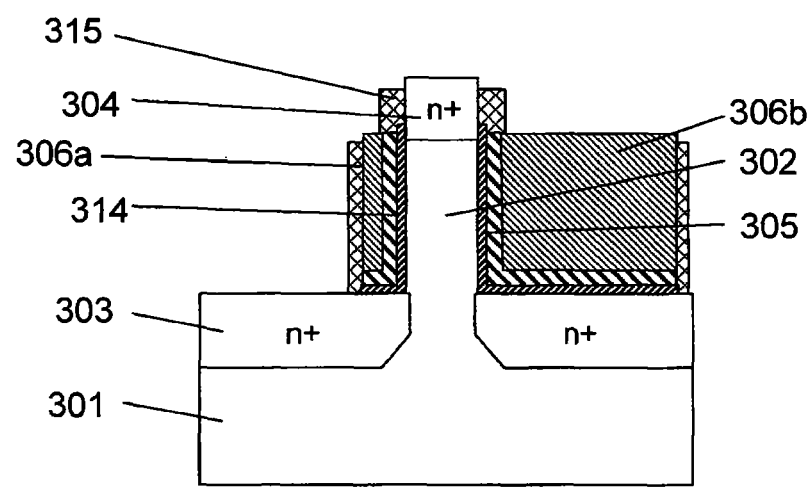

Referring to FIGS. 40(a) and 40(b), an impurity, such as P or As, is introduced into a top portion of the pillar-shaped silicon layer 302, for example, by ion implantation, to form an $N^+$ source diffusion layer 304 therein.

Figure 41:
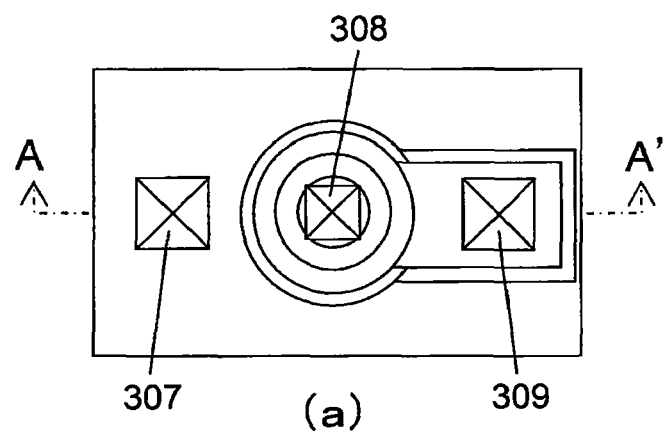
FIGS. 41(a) and 41(b) illustrate a part of the steps of the single-SGT production method according to the third embodiment.
Figure 41:
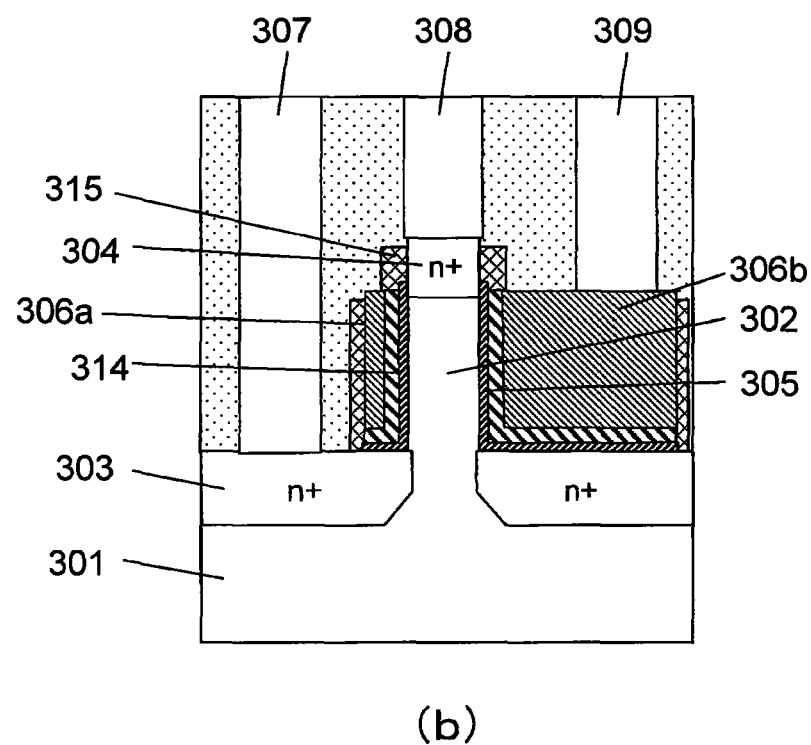

Referring to FIGS. 41(a) and 41(b), an interlayer dielectric film is formed, and a contact (307, 308, 309) is formed on each of the drain diffusion layer in the upper region of the silicon substrate, the source diffusion layer in the upper portion of the pillar-shaped silicon layer, and the gate line.

In the method according to the third embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the third embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening respective top surfaces of a polysilicon layer and a thin metal film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the third embodiment makes it possible to simultaneously solve both the following problems: a disconnection or open of a gate line and a variation in gate length arising from a lithography step of forming the gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the third embodiment can form a gate electrode around a pillar-shaped silicon layer in a self-alignment manner and with a desired film thickness, and control a film thickness of the gate electrode based on a film thickness of the silicon nitride film-based sidewall 312, as with the second embodiment.

In the third embodiment, a gate is formed in a layered structure which comprises the thin metal film and the polysilicon layer, which is capable of suppressing depletion of the gate electrode, and allowing an intended SGT to be produced in the same production line as that for a transistor having a conventional polysilicon gate.

In the first embodiment, if the silicon nitride film-based sidewall has a film thickness largely different from that of the gate conductive film, the difference is likely to cause the problems as described in connection with the second embodiment. Differently, the gate forming process in the third embodiment can form a gate electrode to have a desired film thickness, in a self-alignment manner according to a film thickness of the silicon nitride film-based sidewall 312, as with the second embodiment. This makes it possible to eliminate a risk of occurrence of the above problems, and further increase a process margin in the gate forming process, as compared with that in the first embodiment.

Fourth Embodiment

A fourth embodiment of the present invention shows a method of producing a CMOS inverter using the same gate forming process as that in the first embodiment. Thus, the method according to the fourth embodiment can be employed to obtain the same advantageous effects as those in the first embodiment.

Figure 42:
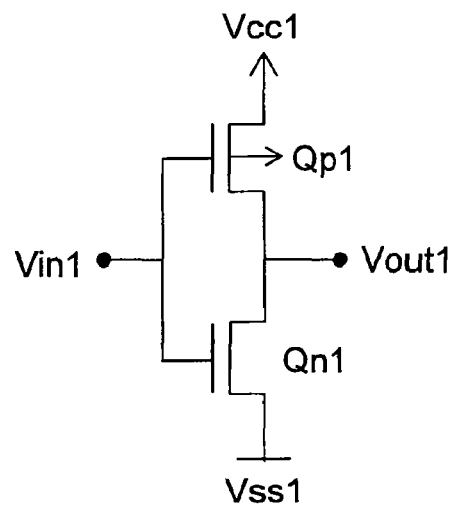
FIG. 42 is an equivalent circuit diagram of a CMOS inverter formed by a production method according to a fourth embodiment of the present invention.

FIG. 42 is an equivalent circuit diagram of a CMOS inverter formed by the method according to the fourth embodiment. A circuit operation of the CMOS inverter will be described below. An input signal Vin 1 is applied to a gate of an NMOS Qn 1 and a gate of a PMOS Qp 1. When the Vin 1 is "1", the NMOS Qn 1 is placed in an ON state, and the PMOS Qp 1 is placed in an OFF state, so that an output signal Vout 1 becomes "0". Reversely, when the Vin 1 is "0", the NMOS Qn 1 is placed in an OFF state, and the PMOS Qp 1 is placed in an ON state, so that the Vout 1 becomes "1". As above, the CMOS inverter is operable to allow the output signal Vout 1 to have a value opposite to that of the input signal Vin 1.

Figure 43:
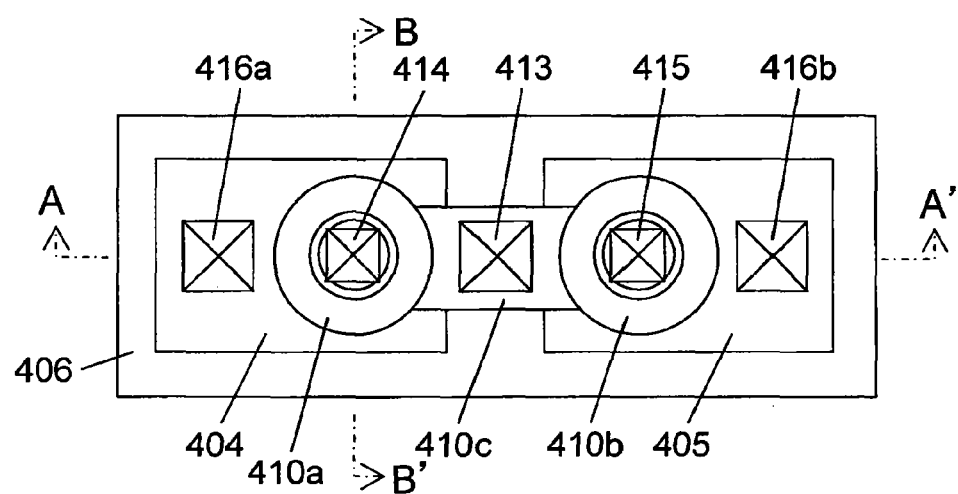
FIG. 43 is a top plan view of the CMOS inverter formed by the production method according to the fourth embodiment.
Figure 44:
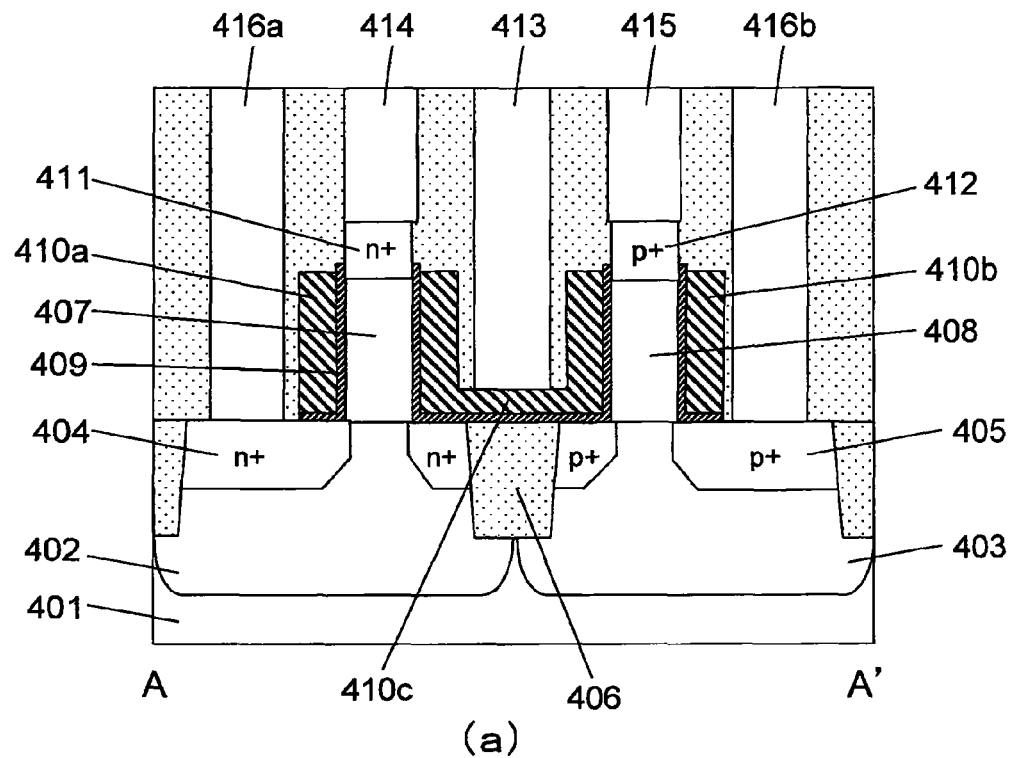
FIGS. 44(a) and 44(b) are sectional views of the CMOS inverter formed by the production method according to the fourth embodiment.
Figure 44:
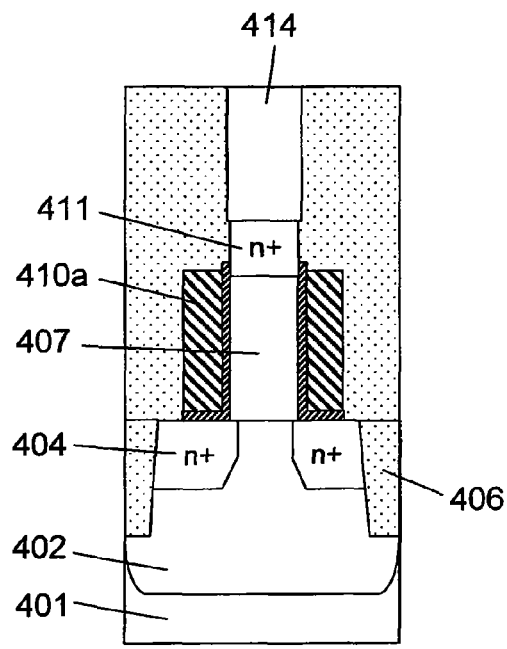
Figure 45:
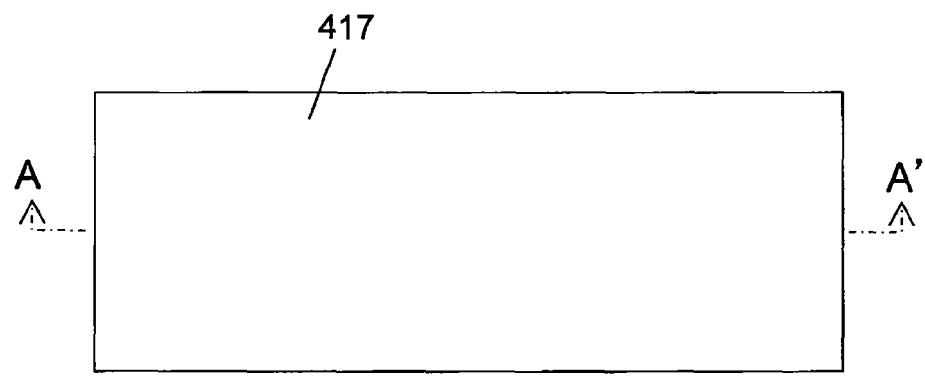
FIGS. 45(a) and 45(b) illustrate a part of a series of steps of the CMOS inverter production method according to the fourth embodiment.
Figure 45:
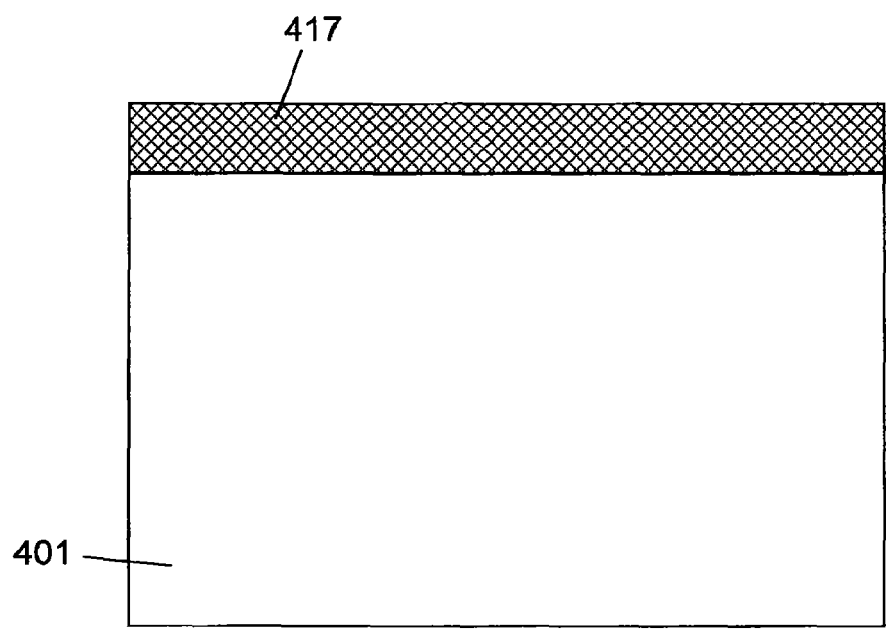
Figure 46:
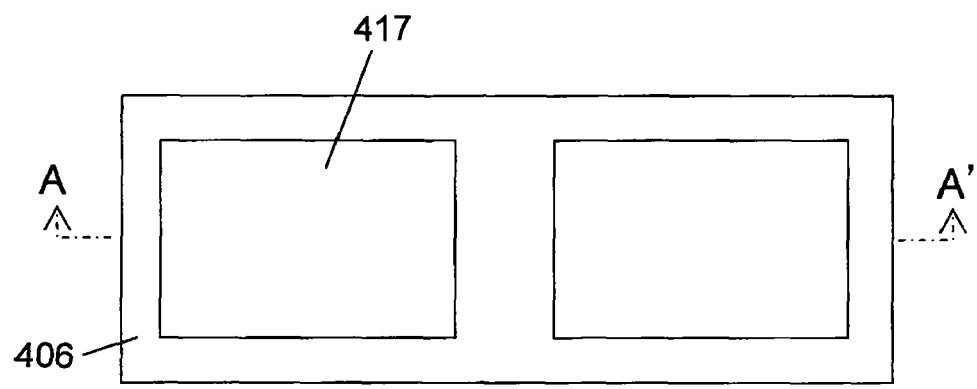
FIGS. 46(a) and 46(b) illustrate a part of the steps of the CMOS inverter production method according to the fourth embodiment.
Figure 46:
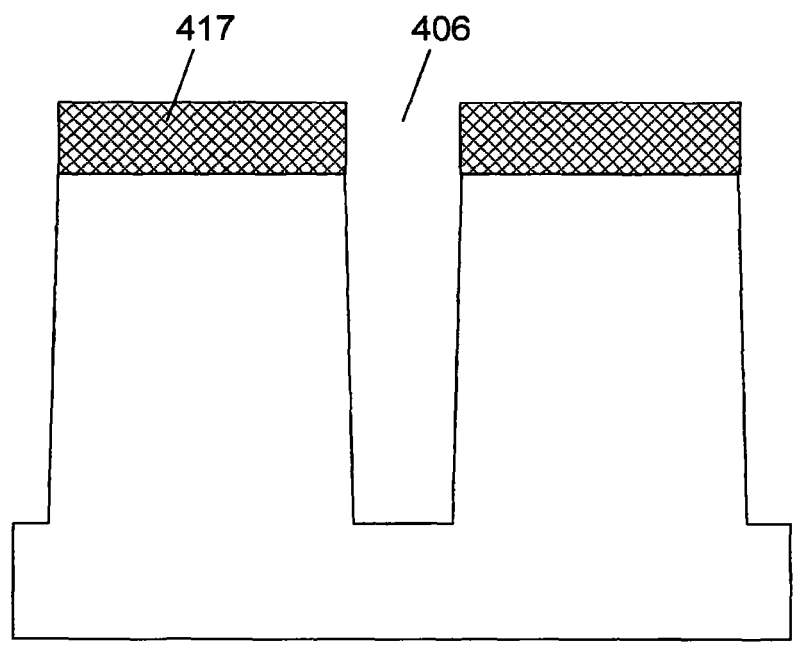
Figure 47:
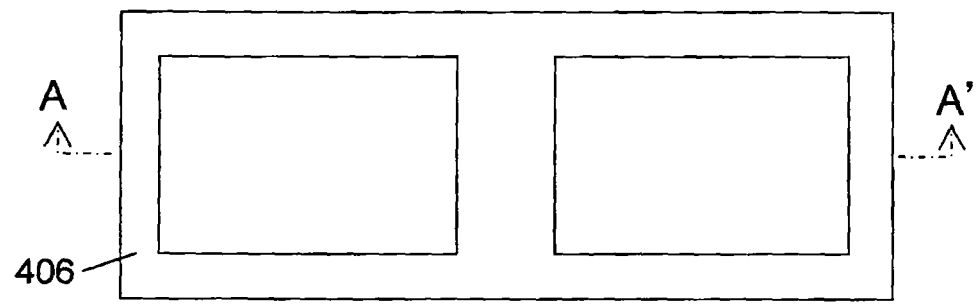
FIGS. 47(a) and 47(b) illustrate a part of the steps of the CMOS inverter production method according to the fourth embodiment.
Figure 47:
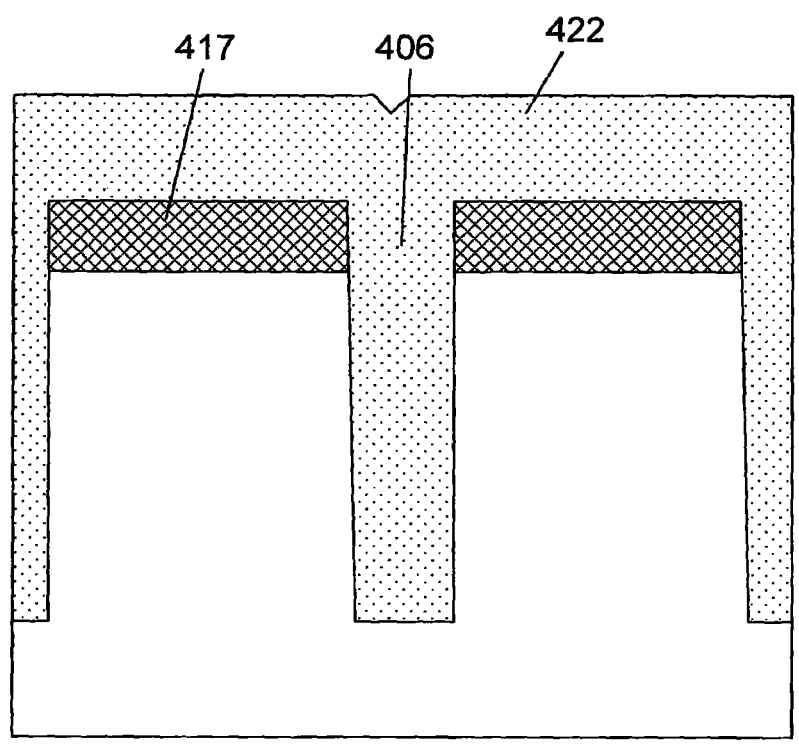
Figure 48:
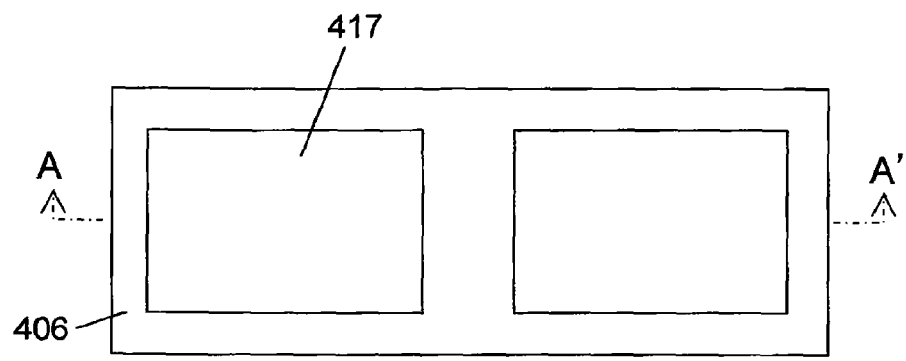
FIGS. 48(a) and 48(b) illustrate a part of the steps of the CMOS inverter production method according to the fourth embodiment.
Figure 48:
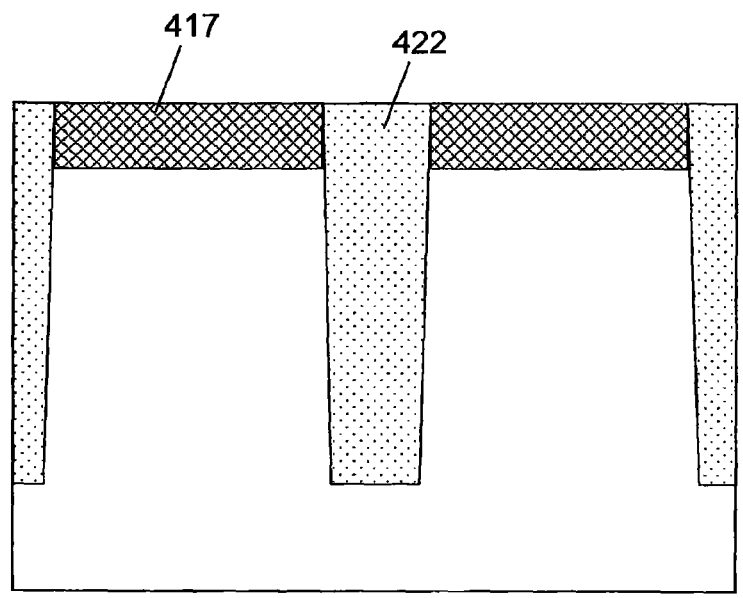
Figure 49:
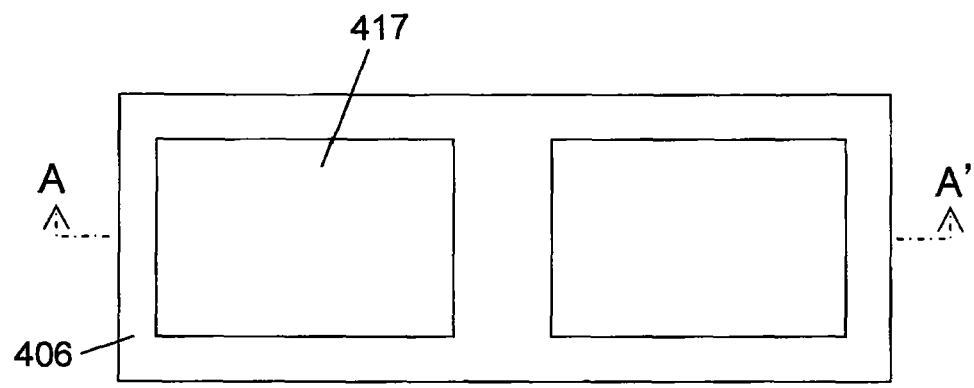
FIGS. 49(a) and 49(b) illustrate a part of the steps of the CMOS inverter production method according to the fourth embodiment.
Figure 49:
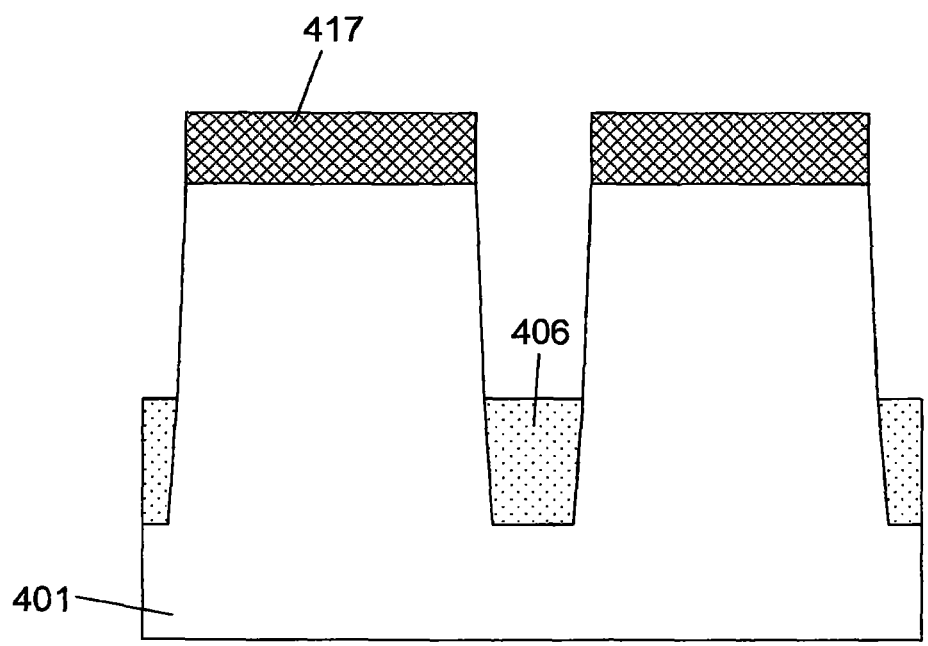
Figure 50:
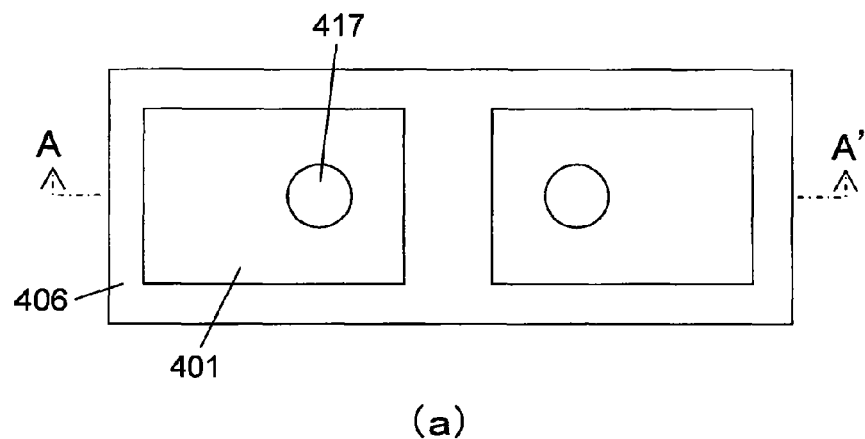
FIGS. 50(a) and 50(b) illustrate a part of the steps of the CMOS inverter production method according to the fourth embodiment.
Figure 50:
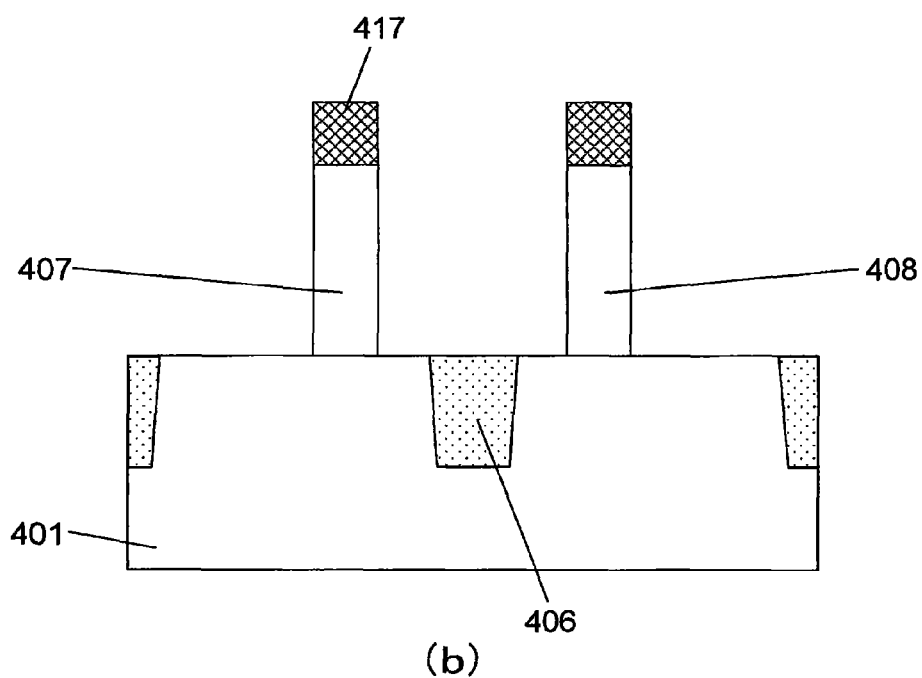
Figure 51:
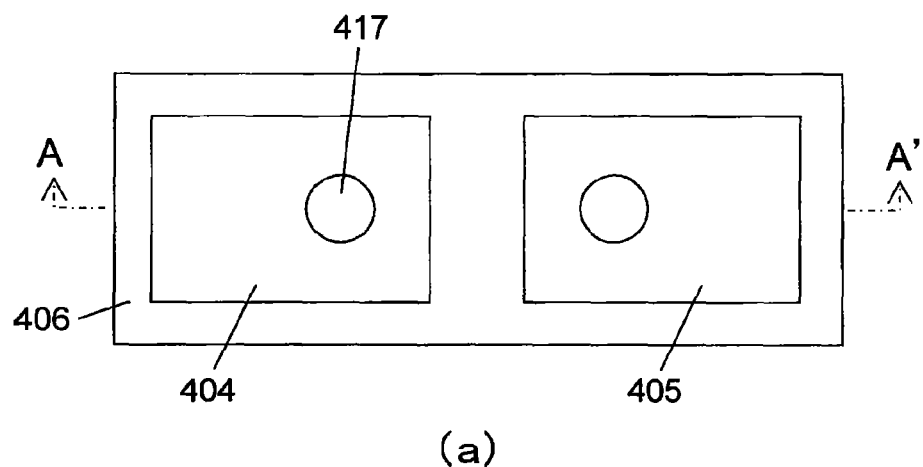
FIGS. 51(a) and 51(b) illustrate a part of the steps of the CMOS inverter production method according to the fourth embodiment.
Figure 51:
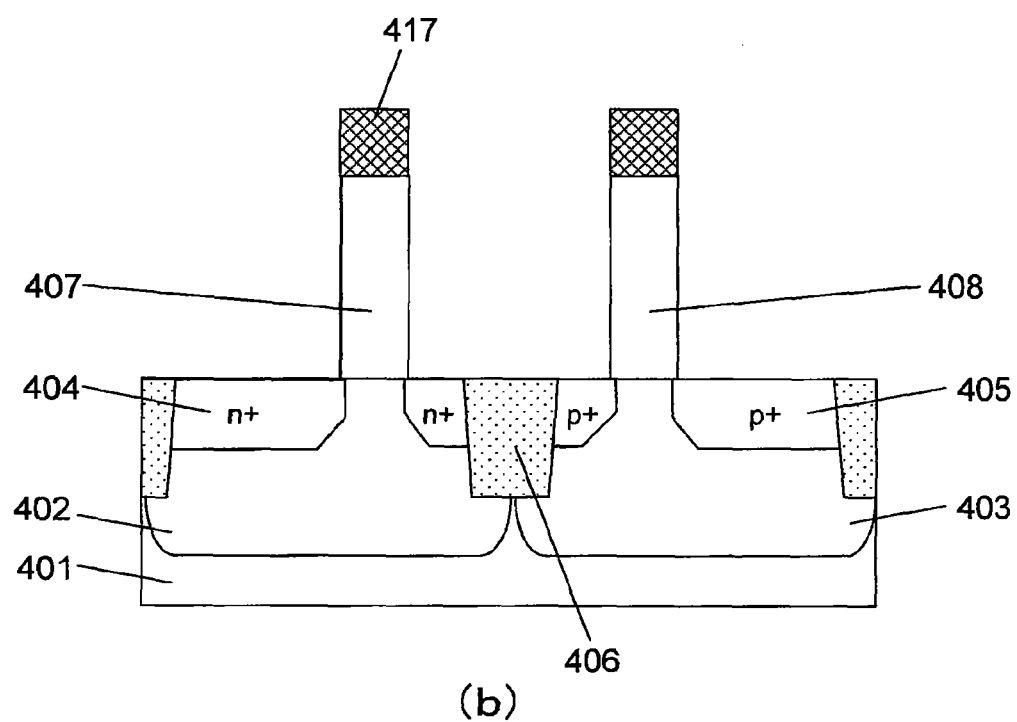
Figure 52:
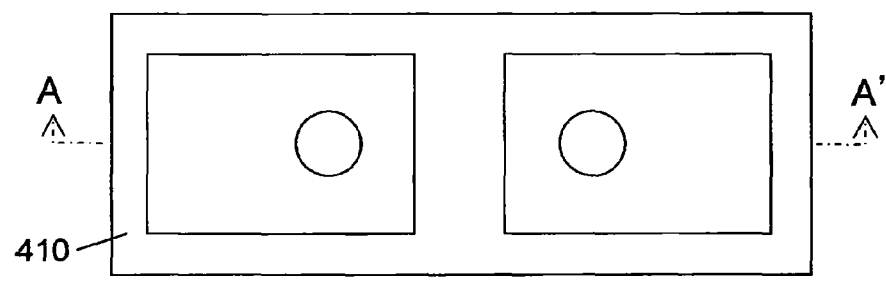
FIGS. 52(a) and 52(b) illustrate a part of the steps of the CMOS inverter production method according to the fourth embodiment.
Figure 52:
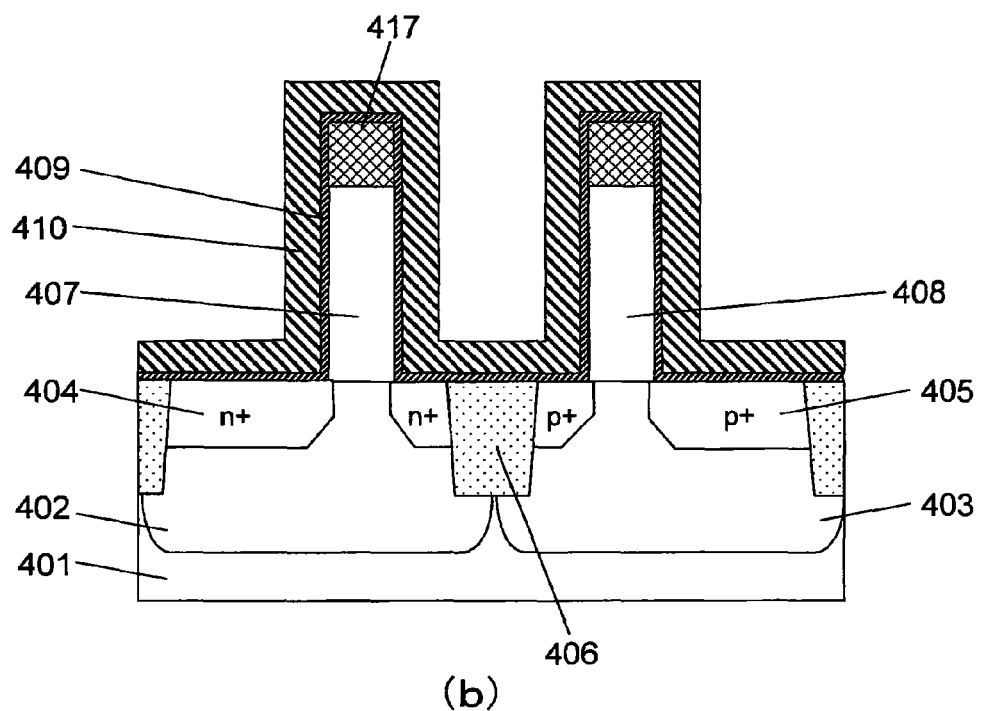
Figure 53:
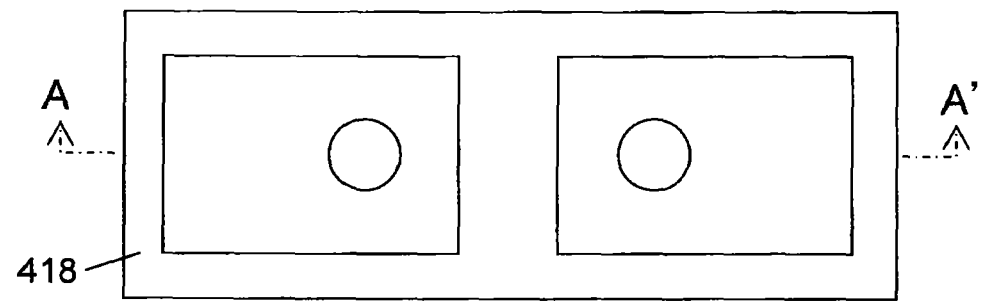
FIGS. 53(a) and 53(b) illustrate a part of the steps of the CMOS inverter production method according to the fourth embodiment.
Figure 53:
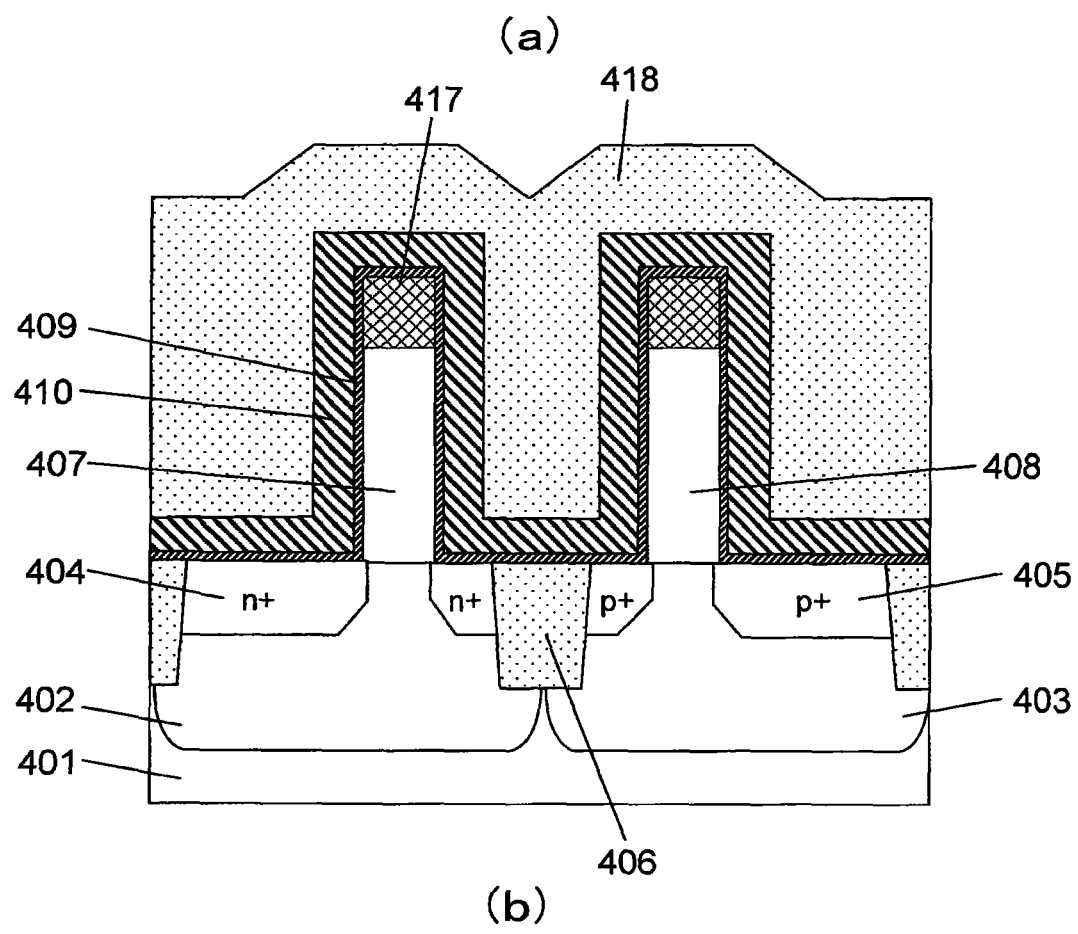
Figure 54:
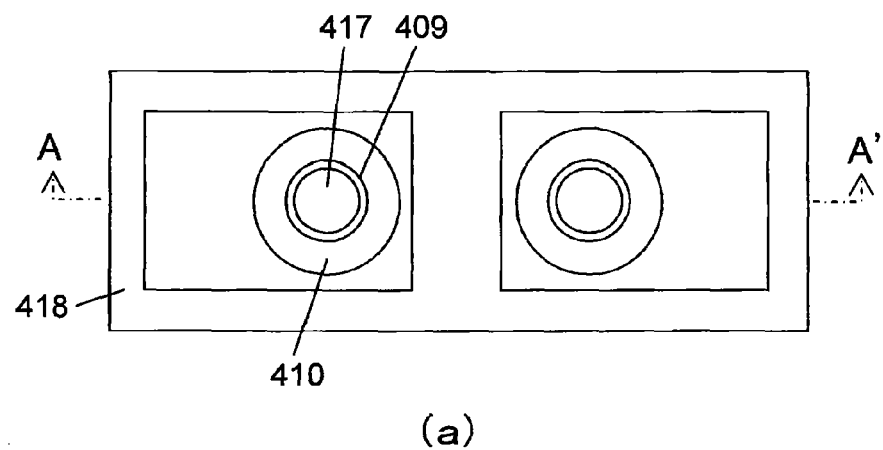
FIGS. 54(*a*) and 54(*b*) illustrate a part of the steps of the CMOS inverter production method according to the fourth embodiment.
Figure 54:
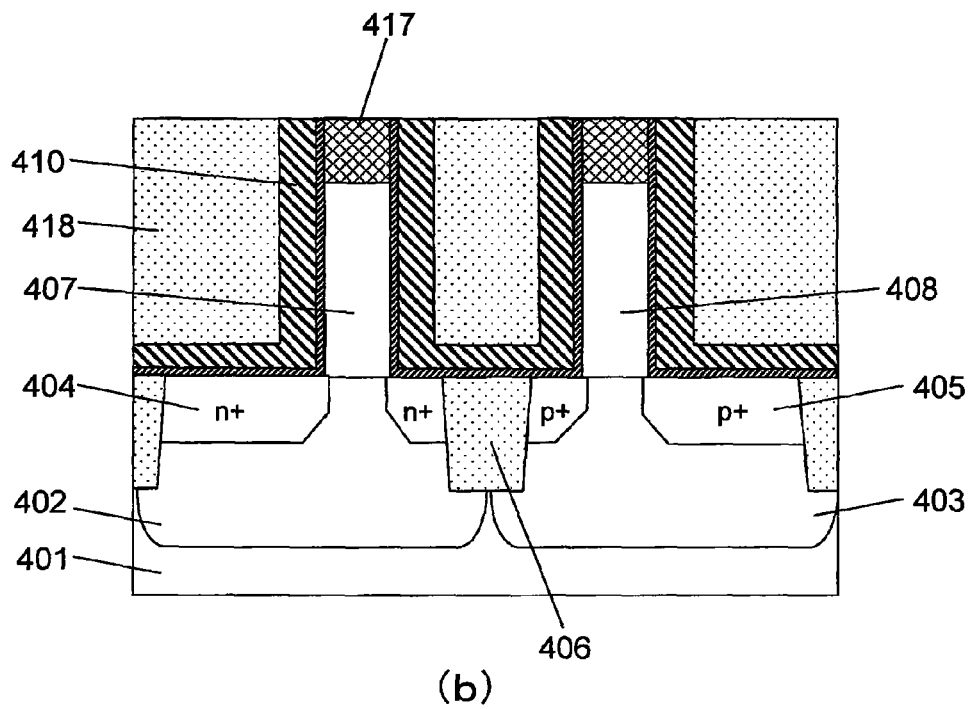
Figure 55:
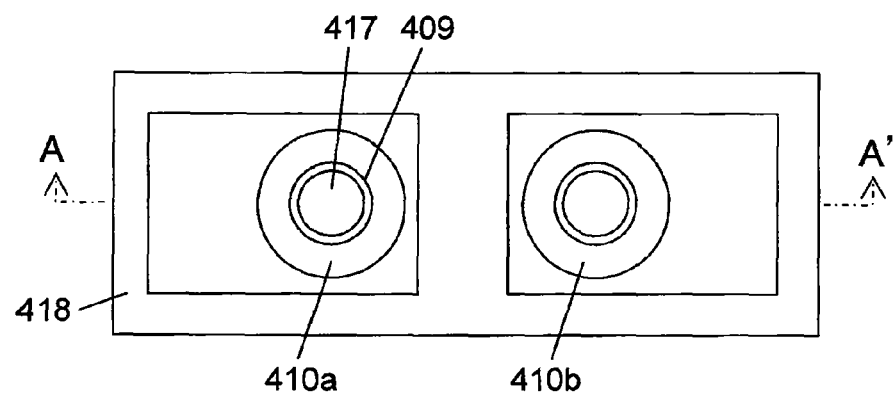
FIGS. 55(*a*) and 55(*b*) illustrate a part of the steps of the CMOS inverter production method according to the fourth embodiment.
Figure 55:
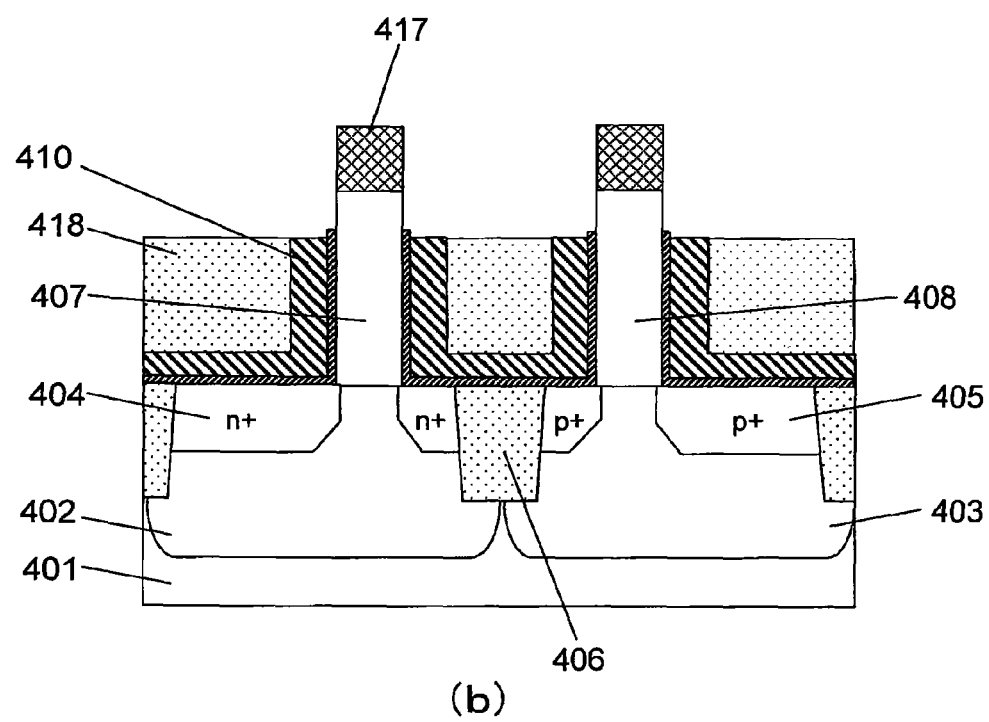
Figure 56:
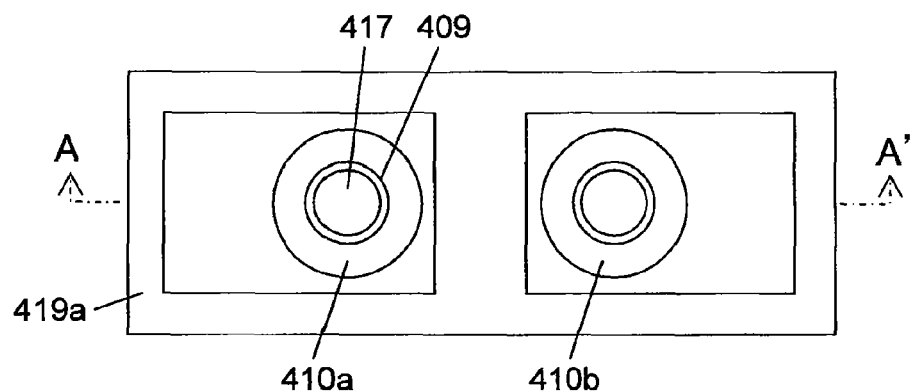
FIGS. 56(*a*) and 56(*b*) illustrate a part of the steps of the CMOS inverter production method according to the fourth embodiment.
Figure 56:
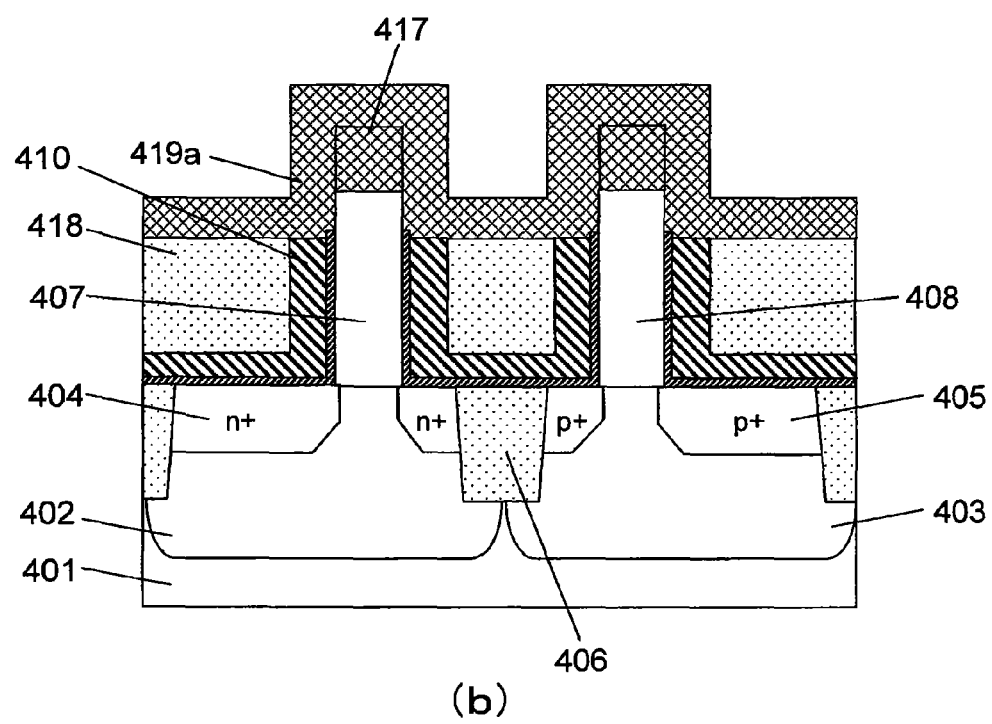
Figure 57:
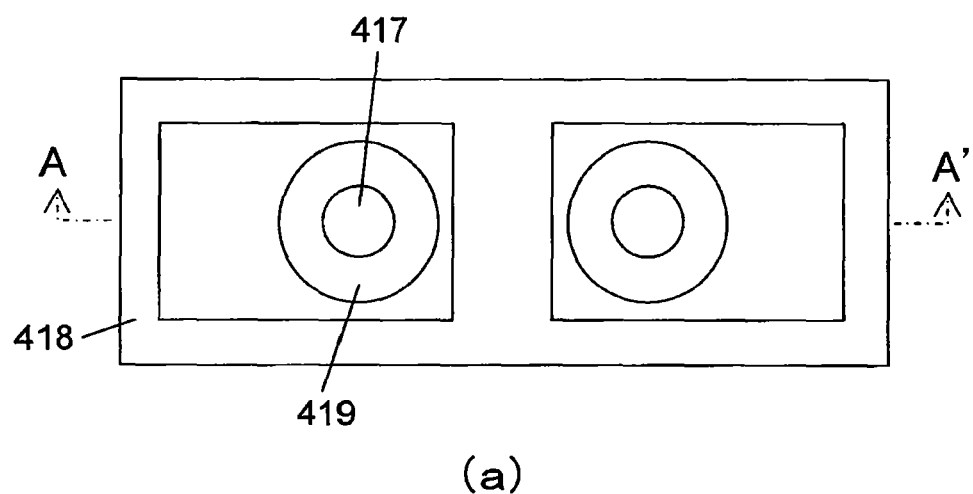
FIGS. 57(*a*) and 57(*b*) illustrate a part of the steps of the CMOS inverter production method according to the fourth embodiment.
Figure 57:
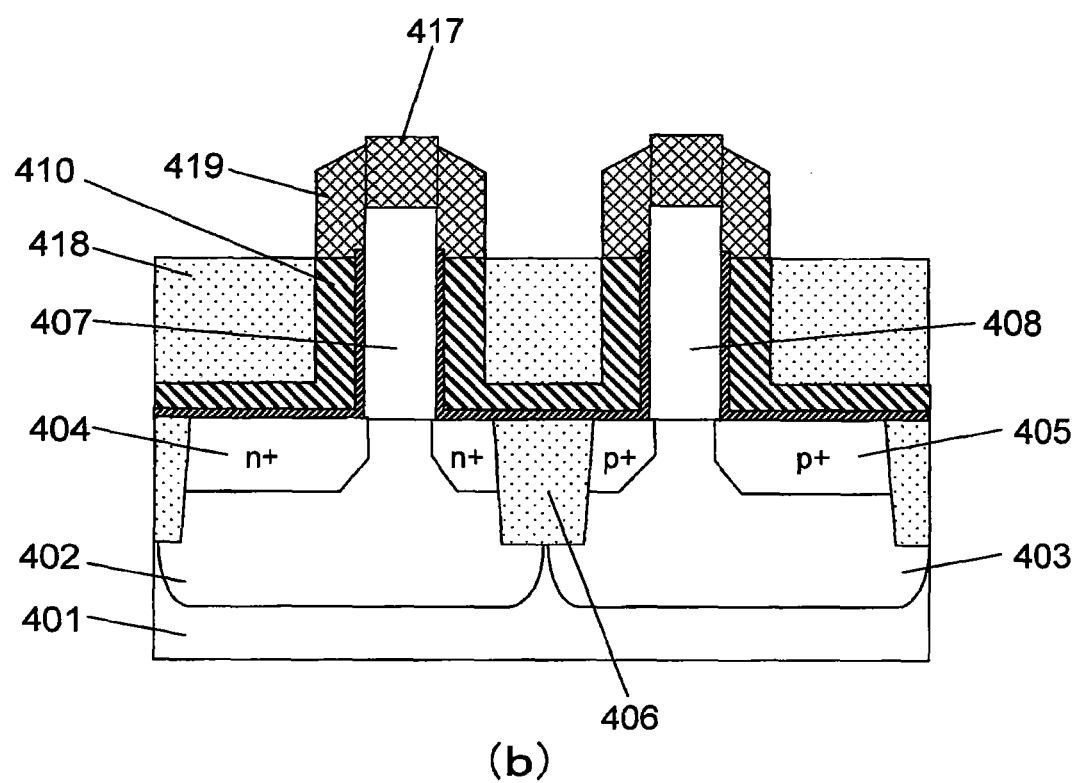
Figure 58:
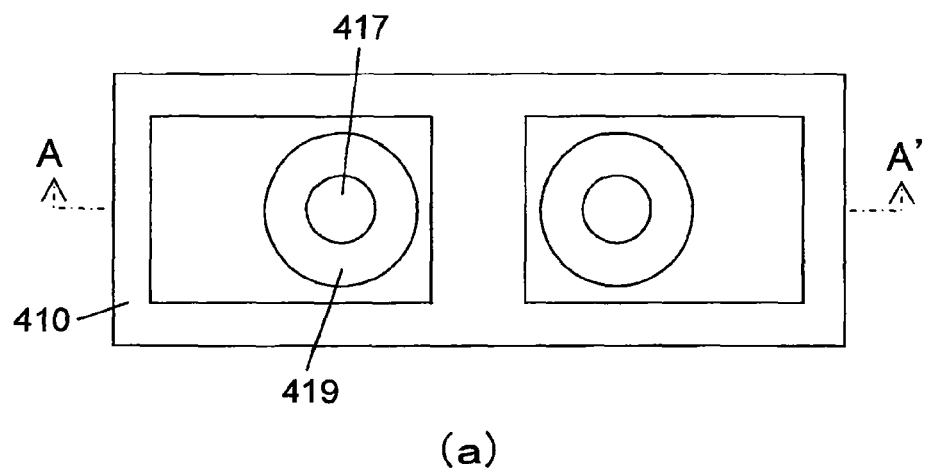
FIGS. 58(*a*) and 58(*b*) illustrate a part of the steps of the CMOS inverter production method according to the fourth embodiment.
Figure 58:
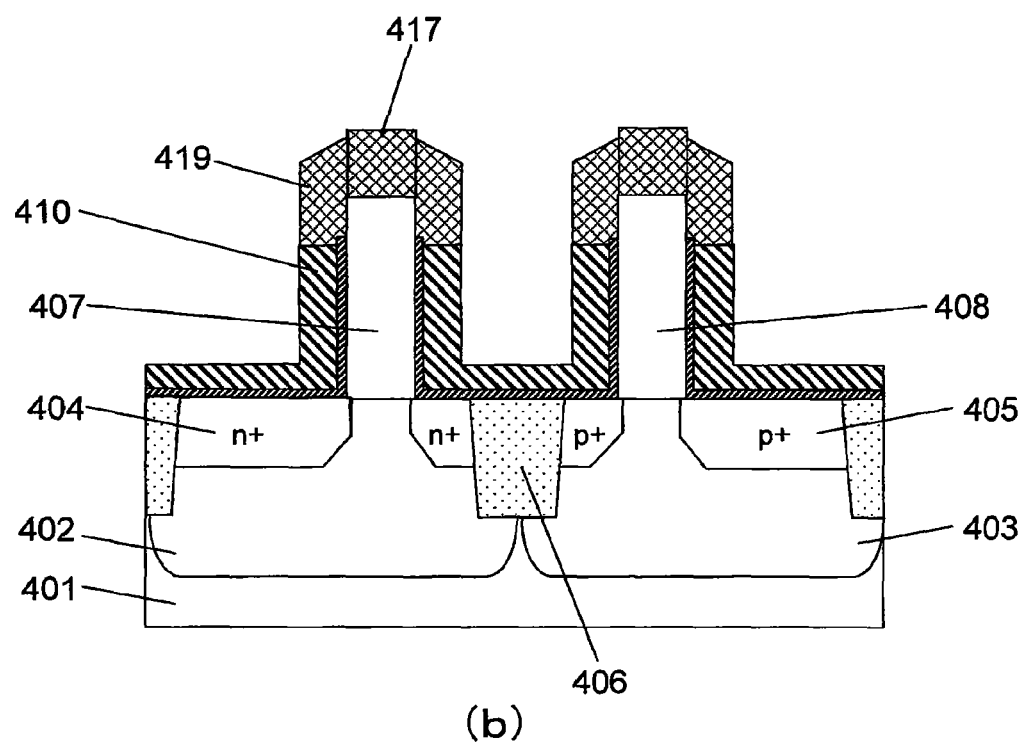
Figure 59:
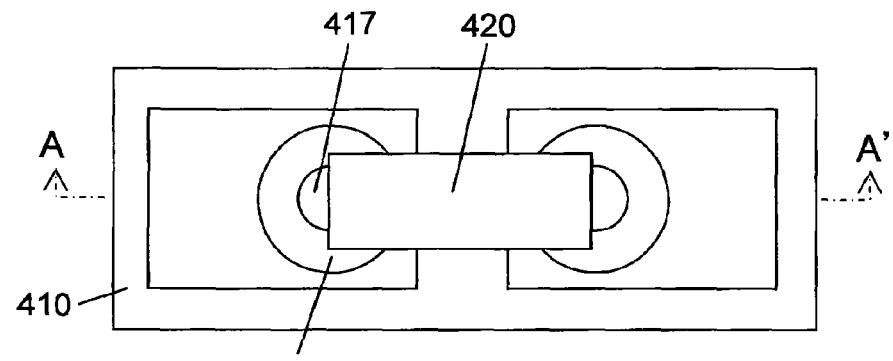
FIGS. 59(*a*) and 59(*b*) illustrate a part of the steps of the CMOS inverter production method according to the fourth embodiment.
Figure 59:
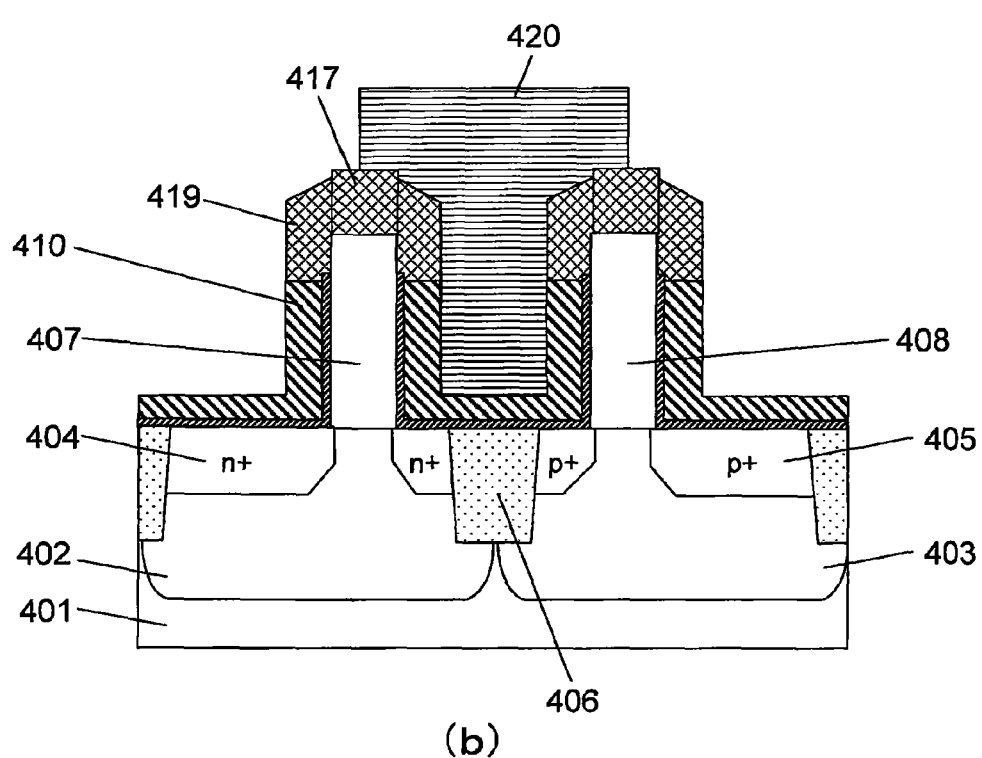
Figure 60:
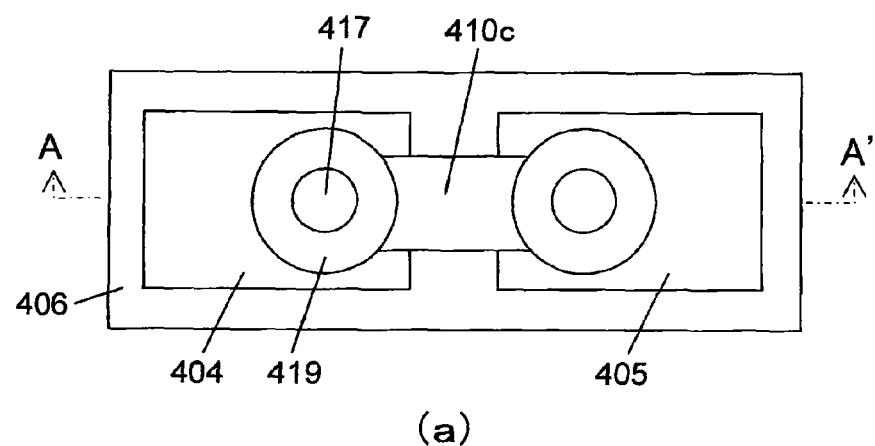
FIGS. 60(*a*) and 60(*b*) illustrate a part of the steps of the CMOS inverter production method according to the fourth embodiment.
Figure 60:
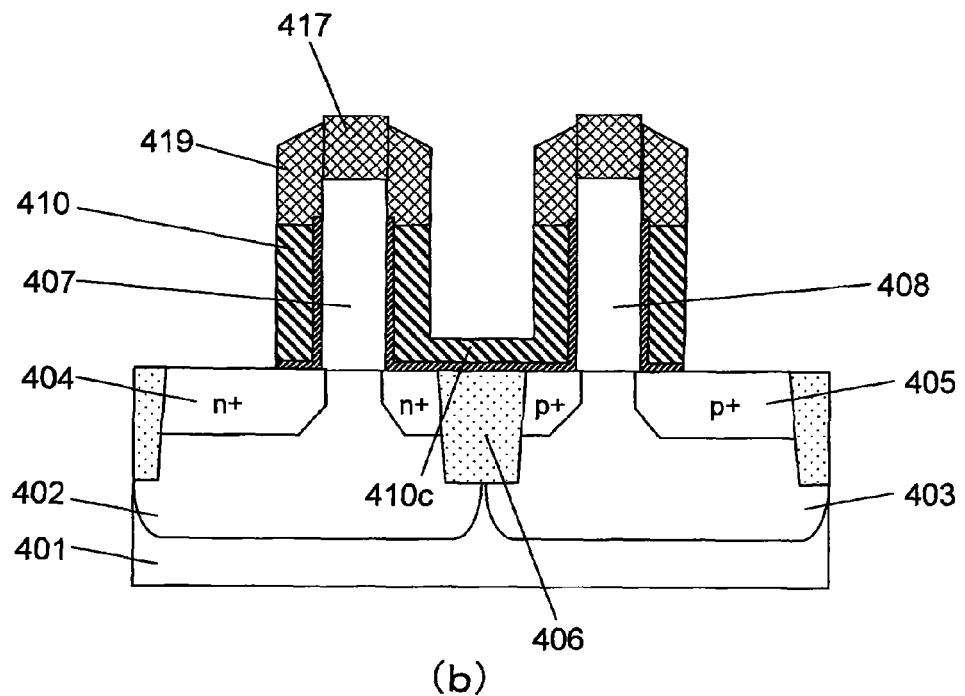
Figure 61:
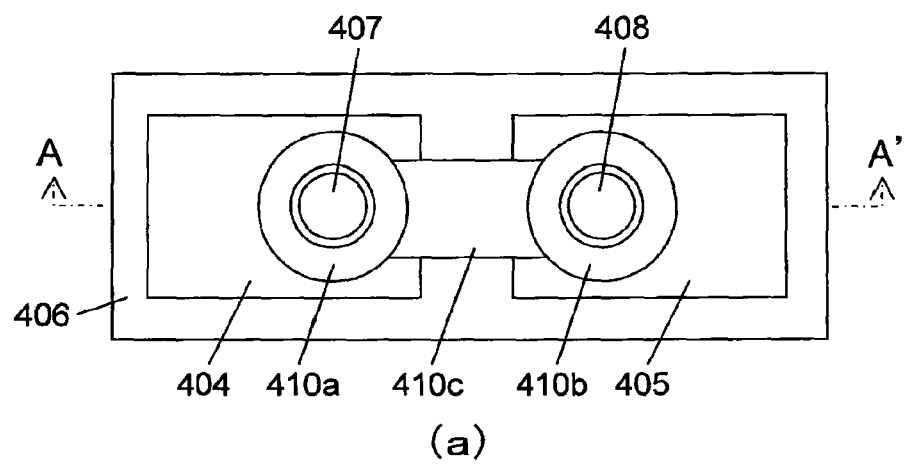
FIGS. 61(*a*) and 61(*b*) illustrate a part of the steps of the CMOS inverter production method according to the fourth embodiment.
Figure 61:
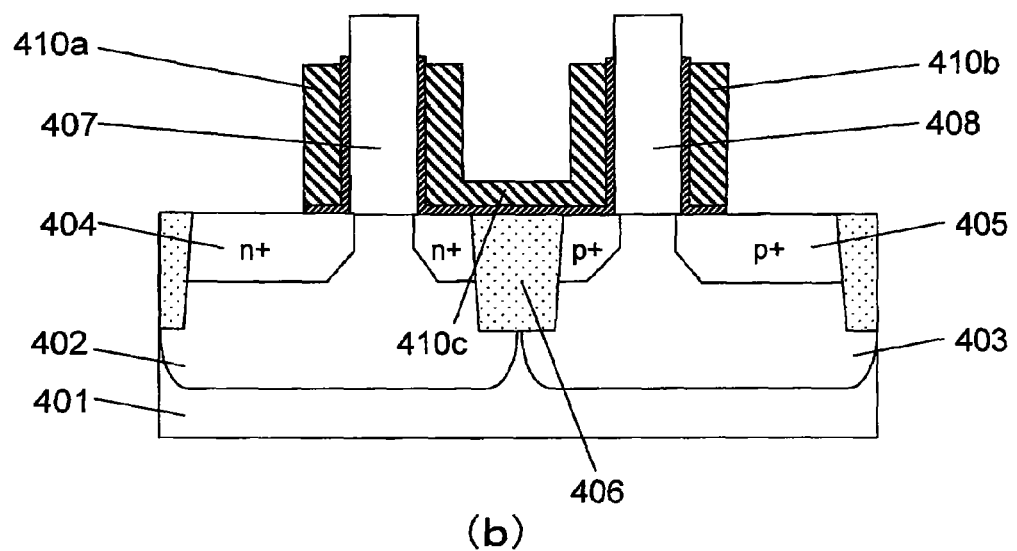
Figure 62:
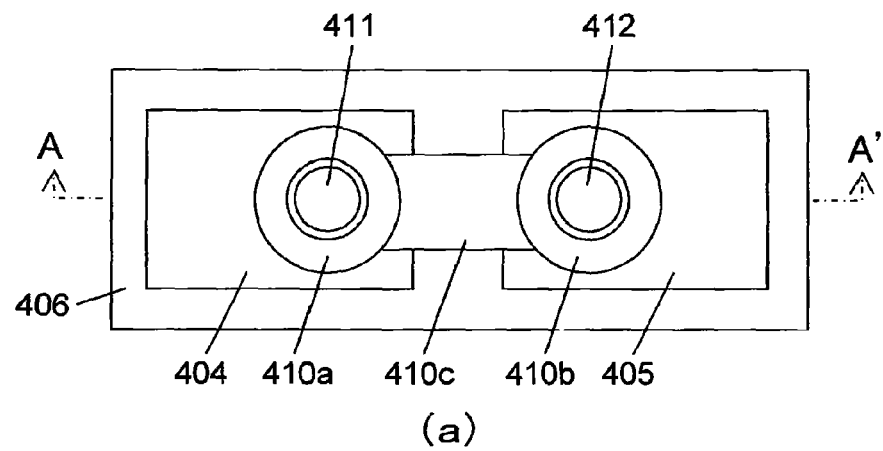
FIGS. 62(*a*) and 62(*b*) illustrate a part of the steps of the CMOS inverter production method according to the fourth embodiment.
Figure 62:
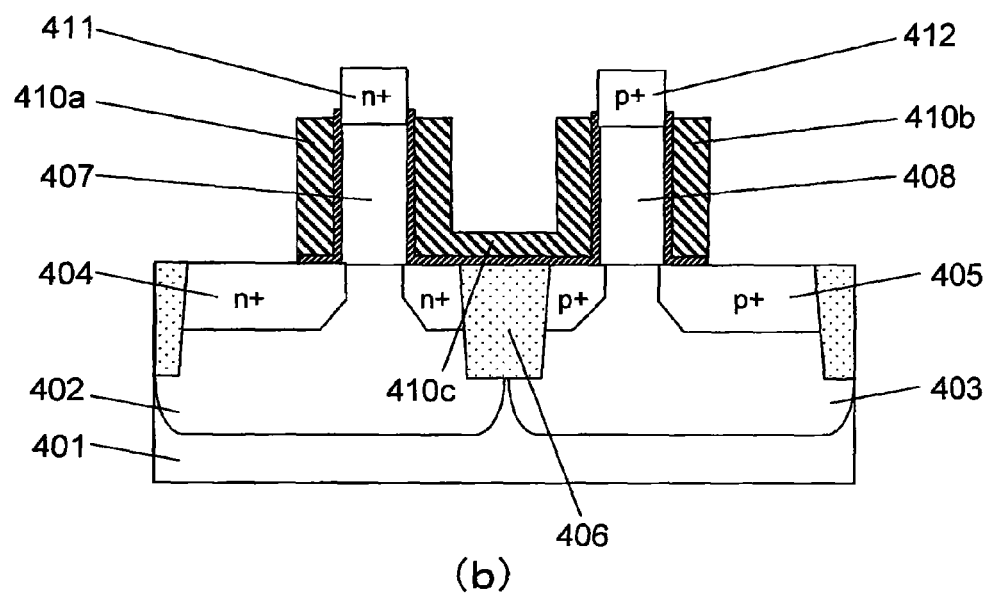
Figure 63:
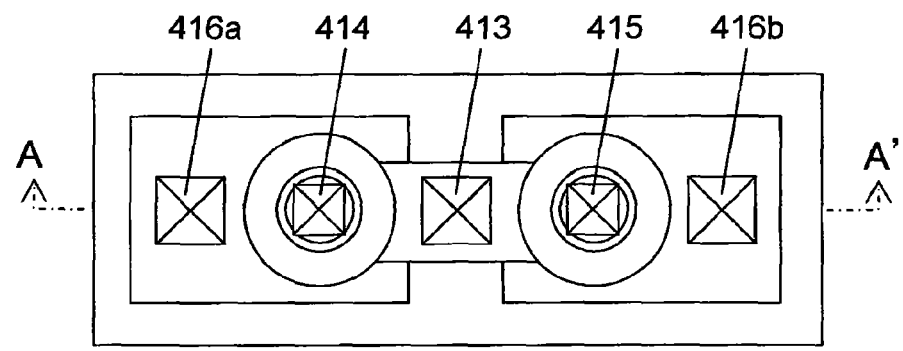
FIGS. 63(*a*) and 63(*b*) illustrate a part of the steps of the CMOS inverter production method according to the fourth embodiment.
Figure 63:
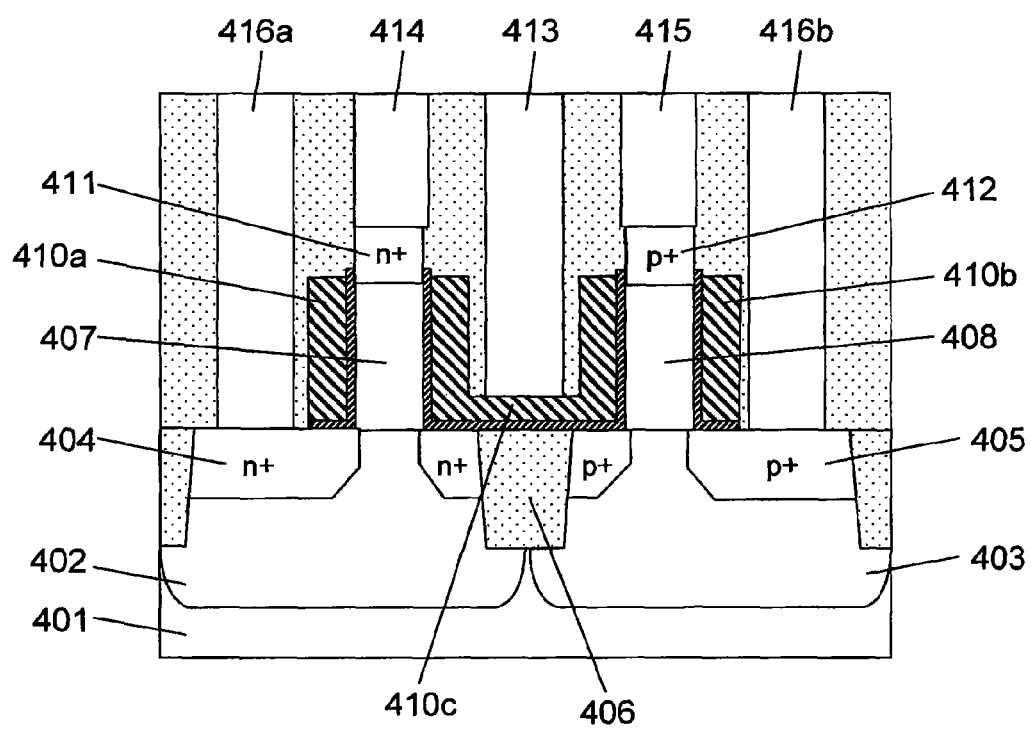

FIG. 43 is a top plan view of the CMOS inverter formed by the method according to the fourth embodiment. FIGS. 44(a) and 44(b) are sectional views taken along the cutting-plane line A-A' and the cutting-plane line B-B' in FIG. 43, respectively. With reference to FIGS. 43, 44(a) and 44(b), a structure of the CMOS inverter will be described.

A P-well 402 and an N-well 403 are formed in an upper region of a silicon substrate 401. A pillar-shaped silicon layer 407 forming an NMOS (NMOS-forming pillar-shaped silicon layer 407) and a pillar-shaped silicon layer 408 forming a PMOS (PMOS-forming pillar-shaped silicon layer 408) are formed on a surface of the silicon substrate, specifically on respective ones of the P-well region and the N-well region. A gate dielectric film 409 and a gate electrode (410a, 410b) are formed to surround the pillar-shaped silicon layers. Further, the gate electrodes 410a, 410b are connected to each other through a gate line 410c extending therefrom.

An N+ drain diffusion layer 404 is formed beneath the NMOS-forming pillar-shaped silicon layer 407, and an N+ source diffusion layer 411 is formed in an upper portion of the NMOS-forming pillar-shaped silicon layer 407. A P+ drain diffusion layer 405 is formed beneath the PMOS-forming pillar-shaped silicon layer 408, and a P+ source diffusion layer 412 is formed in an upper portion of the PMOS-forming pillar-shaped silicon layer 408. Each of the N+ drain diffusion layer 404 and the P+ drain diffusion layer 405 formed beneath respective ones of the pillar-shaped silicon layers 407, 408 is connected to the output terminal Vout 1 via a contact (416a, 416b). The N+ source diffusion layer 411 formed in the upper portion of the NMOS-forming pillar-shaped silicon layer 407 is connected to a ground potential Vss 1 via a contact 414, and the P+ source diffusion layer 412 formed in the upper portion of the PMOS-forming pillar-shaped silicon layer 408 is connected to a power supply potential Vcc 1 via a contact 415. Further, the gate line 410c connecting between the gate electrodes for the PMOS and the NMOS is connected to the input terminal Vin 1 via a contact 413. In this manner, the CMOS inverter is formed.

With reference to FIGS. 45(a) to 63(b), one example of the SGT production method according to the fourth embodiment will be described below. In FIGS. 45(a) to 63(b), the figure suffixed by (a) is a top plan view, and the figure suffixed by (b) is a sectional view taken along the line A-A'.

Referring to FIGS. 45(a) and 45(b), a silicon nitride film 417 serving as a hard mask is formed on a silicon substrate 401 to have a film thickness of about 50 to 150 nm.

Referring to FIGS. 46(a) and 46(b), the hard mask 417 and the silicon substrate 401 are etched to form an element isolation region 406.

Referring to FIGS. 47(a) and 47(b), a silicon oxide film 422 is filled in the element isolation region 406.

Referring to FIGS. 48(a) and 48(b), a portion of the silicon oxide film 422 above the hard mask 417 is polished and flattened by CMP.

Referring to FIGS. 49(a) and 49(b), the silicon oxide film 422 filled in the element isolation region 406 is etched back in such a manner that a height position of the silicon oxide film 422 is adjusted to become equal to that of a drain diffusion layer which is to be formed in a subsequent step.

Referring to FIGS. 50(a) and 50(b), the hard mask 417 and the silicon substrate 401 are etched to form a pillar-shaped silicon layer (407, 408).

Referring to FIGS. 51(a) and 51(b), impurities are introduced into a surface of the silicon substrate, for example, by ion implantation, to form an N+ drain diffusion layer 404 and a P+ drain diffusion layer 405 therein. During this step, the silicon nitride film 417 on a top of each of the pillar-shaped silicon layers functions as a stopper for preventing the impurity from being injected into the top of the pillar-shaped silicon layer.

Referring to FIGS. 52(a) and 52(b), a gate dielectric film 409 and a gate conductive film 410 are formed by CVD or ALD. The gate conductive film 410 is formed to have a film thickness of about 10 to 100 nm.

Referring to FIGS. 53(a) and 53(b), a silicon oxide film 418 is formed to allow the pillar-shaped silicon layers to be buried therein.

Referring to FIGS. 54(a) and 54(b), the silicon oxide film 418, and respective portions of the gate conductive film and the gate dielectric film above the pillar-shaped silicon layer, are polished by CMP, to flatten a top surface of the gate conductive film. Through the flattening of a top of the gate conductive film by CMP, a configuration of the gate conductive film is improved to facilitate control of a gate length. During the CMP, the silicon nitride film 417 on the top of the pillar-shaped silicon layer is used as a CMP stopper. The use of the silicon nitride film 417 as a CMP stopper makes it possible to control an amount of CMP with high repeatability.

Referring to FIGS. 55(a) and 55(b), the gate conductive film 410 and the silicon oxide film 418 are etched back, wherein the gate conductive film 410 is etched to fix a gate length. Preferably, etching conditions to be used in this step are set to allow the gate conductive film 410 and the silicon oxide film 418 to be etched at the same rate, and at a higher selectivity ratio relative to the silicon nitride film 417. The etching of the gate conductive film 410 and the silicon oxide film 418 at the same rate makes it possible to suppress occurrence of a step between respective top surfaces of the two films, which improves a configuration of a silicon nitride film-based sidewall 112 to be formed in a next step.

Referring to FIGS. 56(a) and 56(b), a silicon nitride film 419a is formed by a film thickness required for the gate conductive film 410. Subsequently, as shown in FIGS. 57(a) and 57(b), the silicon nitride film 419a is etched back to form a silicon nitride film-based sidewall 419. In this step, a film thickness of the silicon nitride film-based sidewall 419 is controlled to become equal to that of the gate conductive film 410, by adjusting a formed film thickness of the silicon nitride film 419a, and then finely adjusting the formed film thickness based on an amount of the etch-back. A portion of the gate conductive film covered by the silicon nitride film-based sidewall 419 will be protected during etching for forming a gate line in a subsequent step. This makes it possible to form the gate electrode in a self-alignment manner and with a desired film thickness, so as to reduce an occupancy area.

Referring to FIGS. 58(a) and 58(b), the silicon oxide film 418 remaining on the gate conductive film is removed by wet etching.

Referring to FIGS. 59(a) and 59(b), a resist or a multilayer resist is applied, and a gate line pattern is formed with a resist 420 by lithography.

Referring to FIGS. 60(a) and 60(b), the gate conductive film and the gate dielectric film are etched using the resist as a mask, to form a gate electrode (410a, 410b) and a gate line 410c.

Referring to FIGS. 61(a) and 61(b), the silicon nitride film 417 on the top of the pillar-shaped silicon layer, and the silicon nitride film-based sidewall 419, are removed by wet etching.

Referring to FIGS. 62(a) and 62(b), impurities are introduced into respective top portions of the pillar-shaped silicon layers 407, 408, for example, by ion implantation, to form an $N^+$ source diffusion layer 411 and a $P^+$ source diffusion layer 412 therein.

Referring to FIGS. 63(a) and 63(b), an interlayer dielectric film is formed, and a contact (413, 414, 415, 416a, 416b) is formed on each of the gate line, the source diffusion layers in the upper portions of the pillar-shaped silicon layers, and the drain diffusion layers in the upper region of the silicon substrate.

In the method according to the fourth embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the fourth embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening a top surface of a gate conductive film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the fourth embodiment makes it possible to simultaneously solve both the following problems: a disconnection or open of a gate line and a variation in gate length arising from a lithography step of forming the gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the fourth embodiment can form a gate electrode around a pillar-shaped silicon layer in a self-alignment mariner and with a desired film thickness, and adjust a film thickness of the gate electrode to be formed around the pillar-shaped silicon layer, based on a formed film thickness of a gate conductive film. Thus, a distance between a pillar-shaped silicon layer (410a, 410b) and a contact (416a, 416b) on a drain diffusion layer can be reduced so that an area of a circuit, such as an inverter circuit, can be reduced. In cases where the gate conductive film is formed to have a relatively small film thickness, a resistance value thereof becomes higher. Thus, in the fourth embodiment, the gate conductive film is preferably comprised of a metal film.

Although the SGT production method according to the fourth embodiment has been described based on one example where it is applied to a CMOS inverter, it is understood that the present invention may be applied to any suitable circuit other than the CMOS inverter, in just the same manner.

Fifth Embodiment

A fifth embodiment of the present invention shows a method of producing a CMOS inverter using the same gate forming process as that in the second embodiment. Thus, the method according to the fifth embodiment can be employed to obtain the same advantageous effects as those in the second embodiment.

Figure 64:
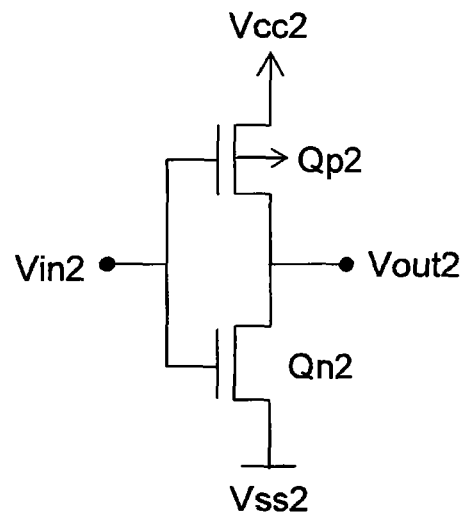
FIG. 64 is an equivalent circuit diagram of a CMOS inverter formed by a production method according to a fifth embodiment of the present invention.

FIG. 64 is an equivalent circuit diagram of a CMOS inverter formed by the method according to the fifth embodiment. A circuit operation of the CMOS inverter will be described below. An input signal Vin 2 is applied to a gate of an NMOS Qn 2 and a gate of a PMOS Qp 2. When the Vin 2 is "1", the NMOS Qn 2 is placed in an ON state, and the PMOS Qp 2 is placed in an OFF state, so that an output signal Vout 2 becomes "0". Reversely, when the Vin 2 is "0", the NMOS Qn 2 is placed in an OFF state, and the PMOS Qp 2 is placed in an ON state, so that the Vout 2 becomes "1". As above, the CMOS inverter is operable to allow the output signal Vout 2 to have a value opposite to that of the input signal Vin 2.

Figure 65:
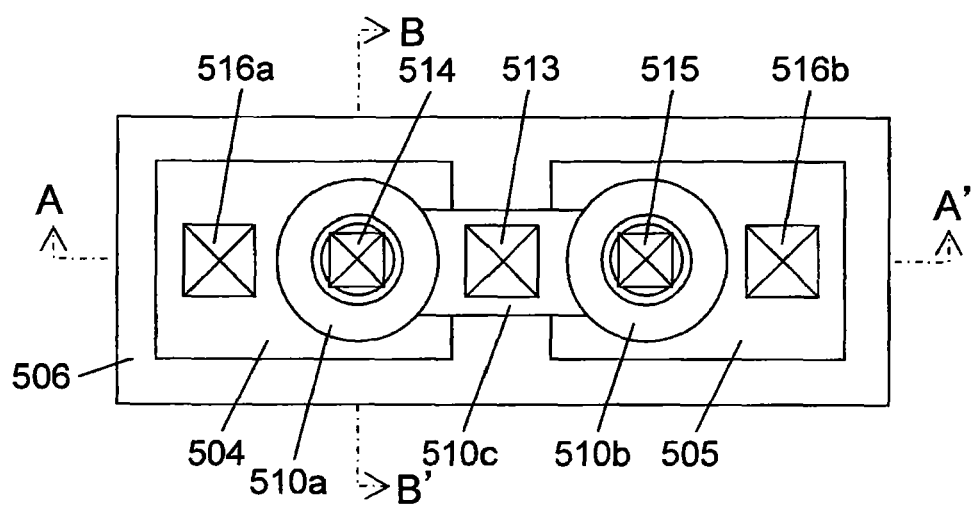
FIG. 65 is a top plan view of the CMOS inverter formed by the production method according to the fifth embodiment.
Figure 66:
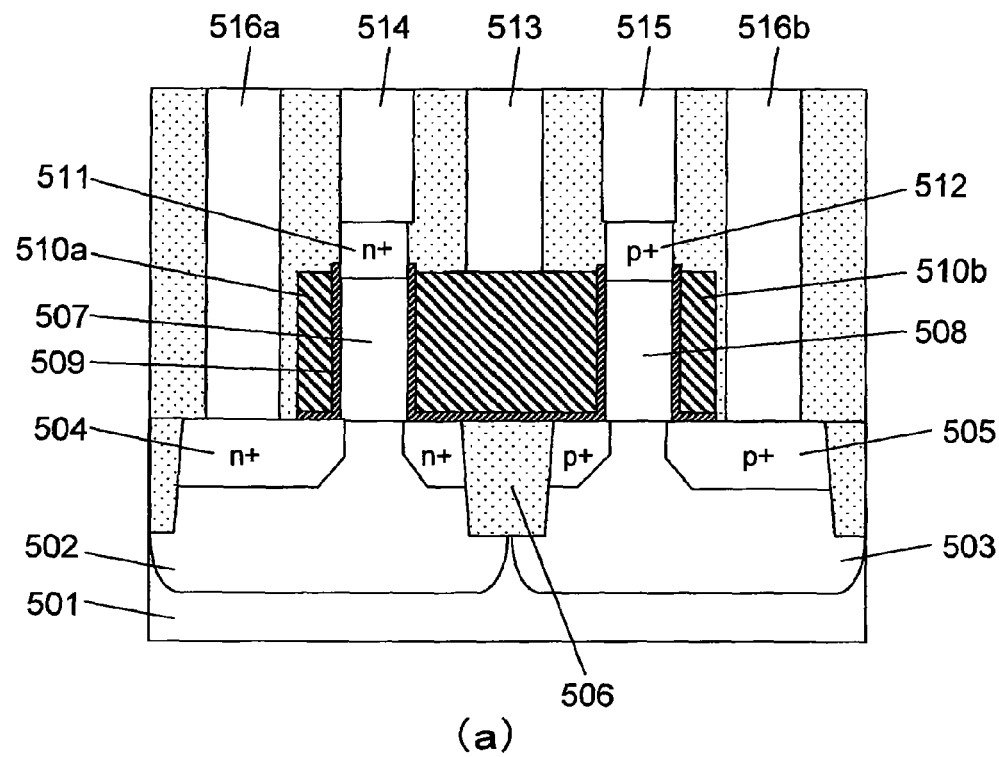
FIGS. 66(*a*) and 66(*b*) are sectional views of the CMOS inverter formed by the production method according to the fifth embodiment.
Figure 66:
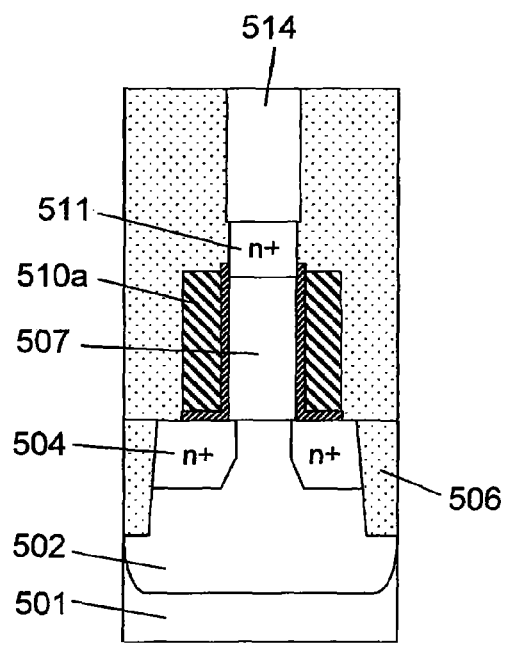
Figure 67:
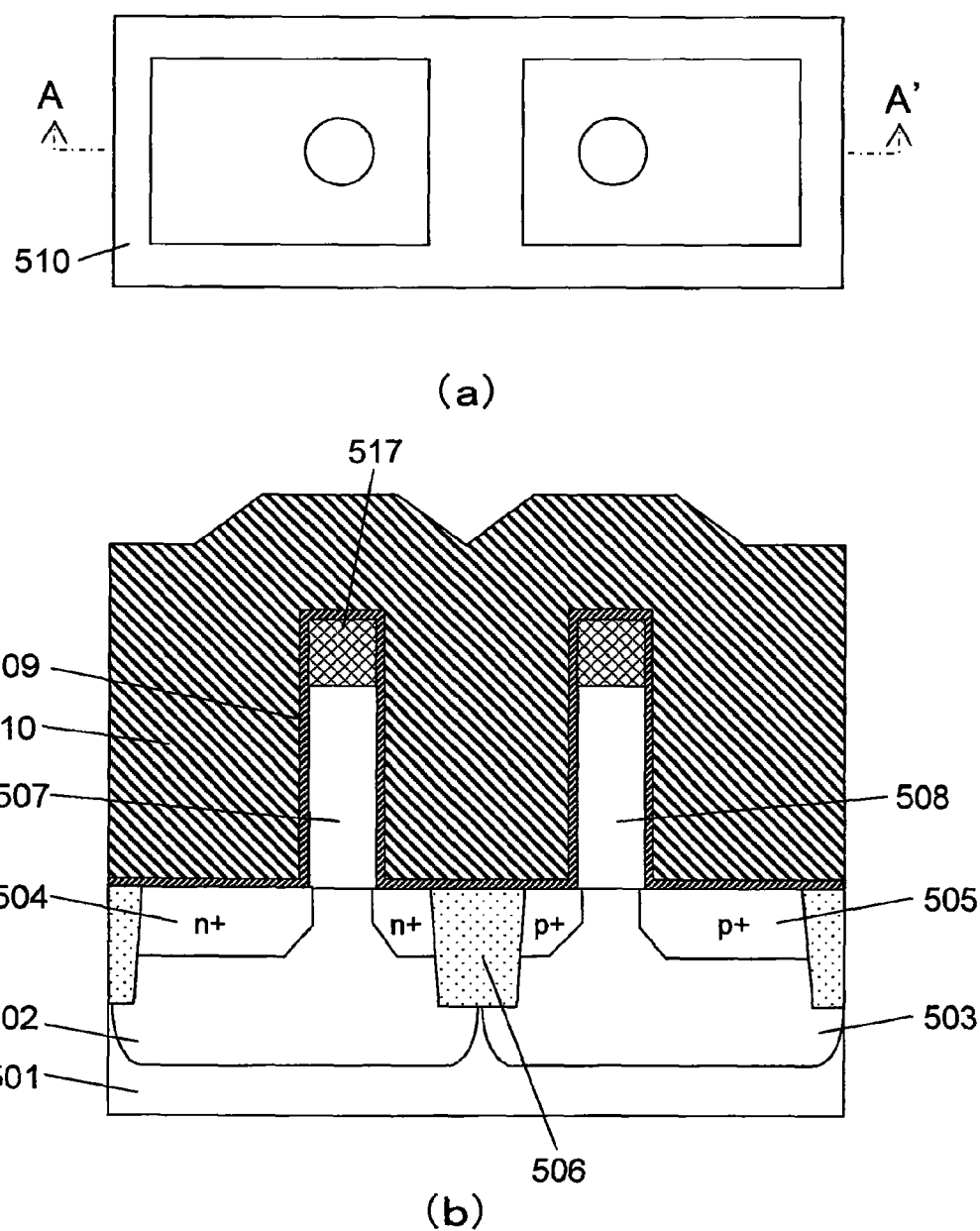
FIGS. 67(*a*) and 67(*b*) illustrate a part of a series of steps of the CMOS inverter production method according to the fifth embodiment.
Figure 68:
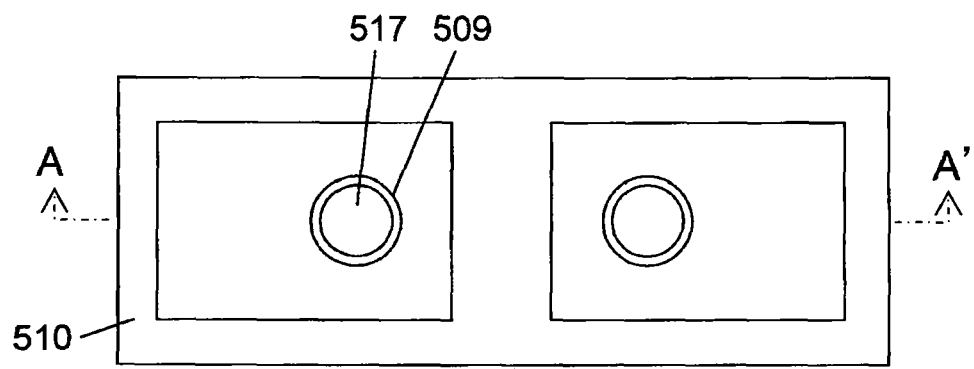
FIGS. 68(*a*) and 68(*b*) illustrate a part of the steps of the CMOS inverter production method according to the fifth embodiment.
Figure 68:
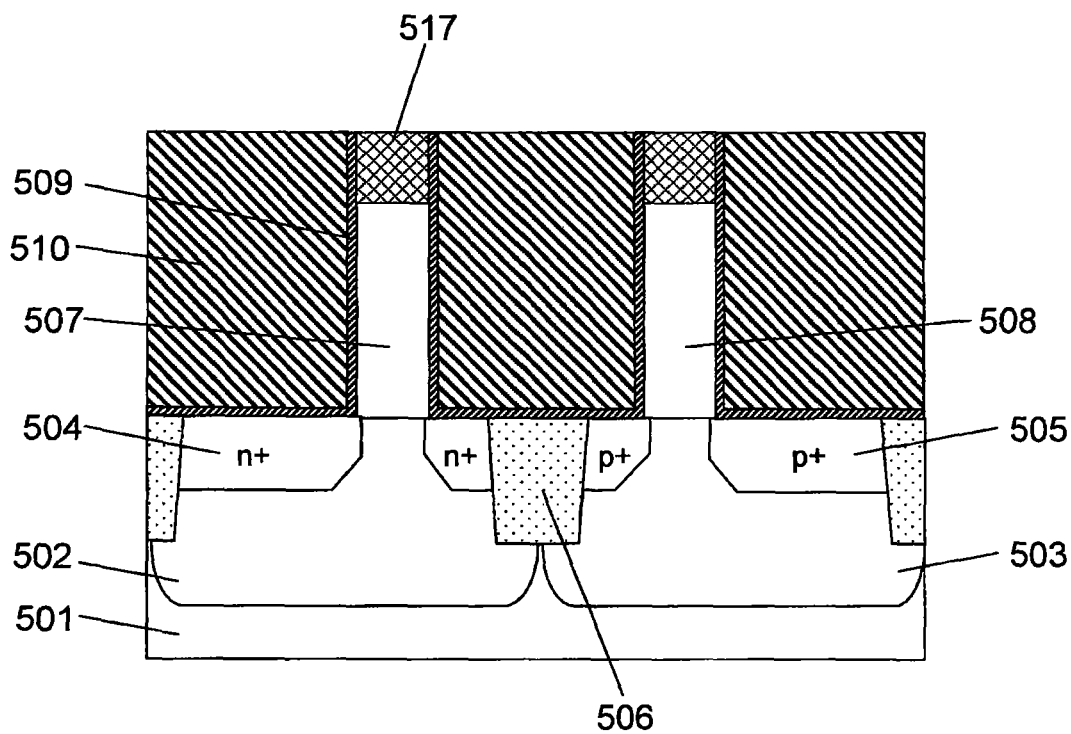
Figure 69:
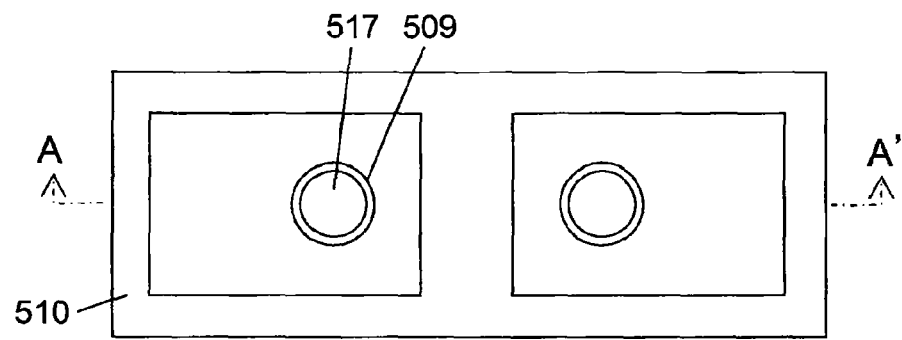
FIGS. 69(*a*) and 69(*b*) illustrate a part of the steps of the CMOS inverter production method according to the fifth embodiment.
Figure 69:
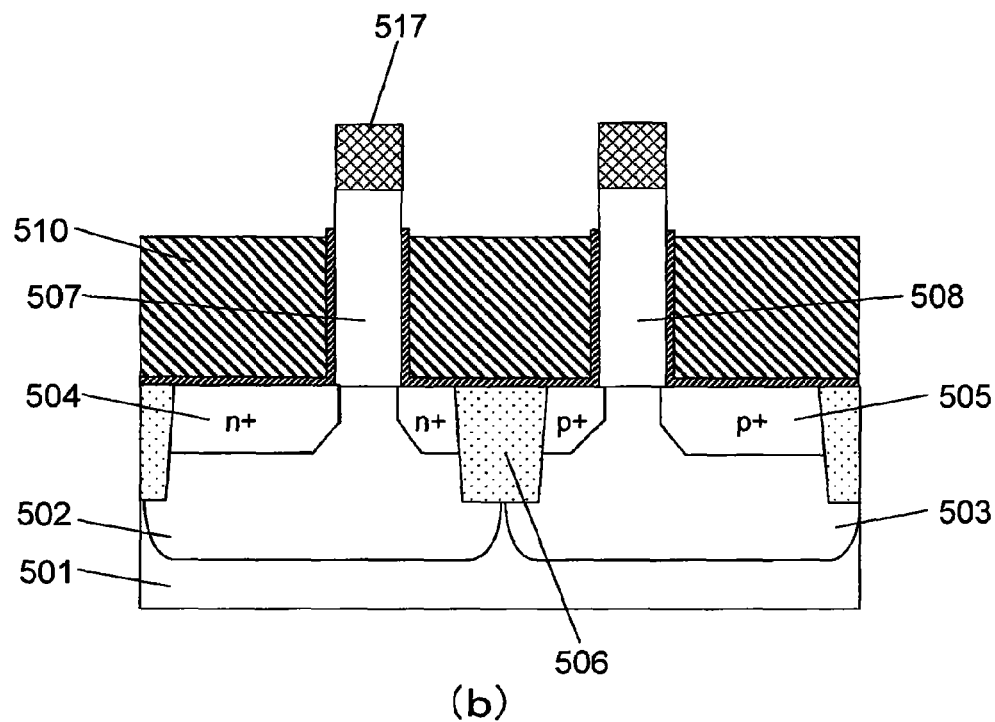
Figure 70:
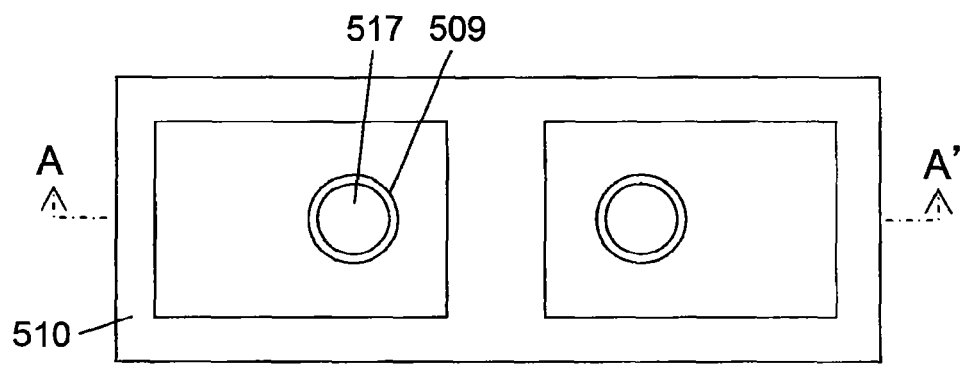
FIGS. 70(*a*) and 70(*b*) illustrate a part of the steps of the CMOS inverter production method according to the fifth embodiment.
Figure 70:
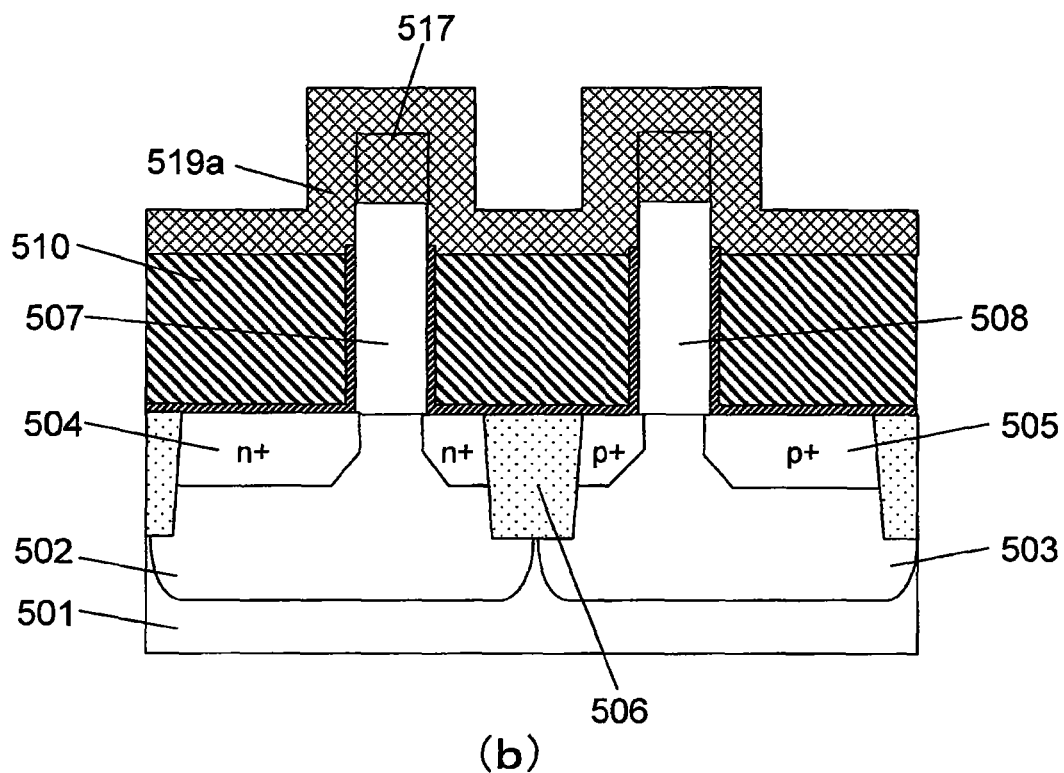
Figure 71:
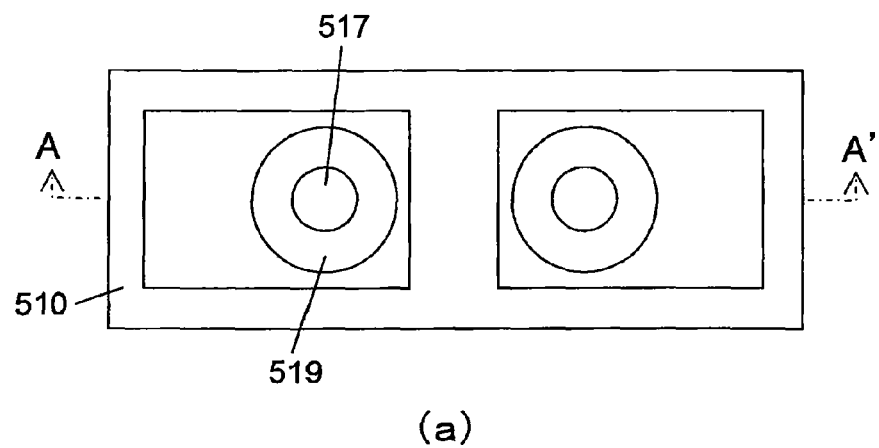
FIGS. 71(*a*) and 71(*b*) illustrate a part of the steps of the CMOS inverter production method according to the fifth embodiment.
Figure 71:
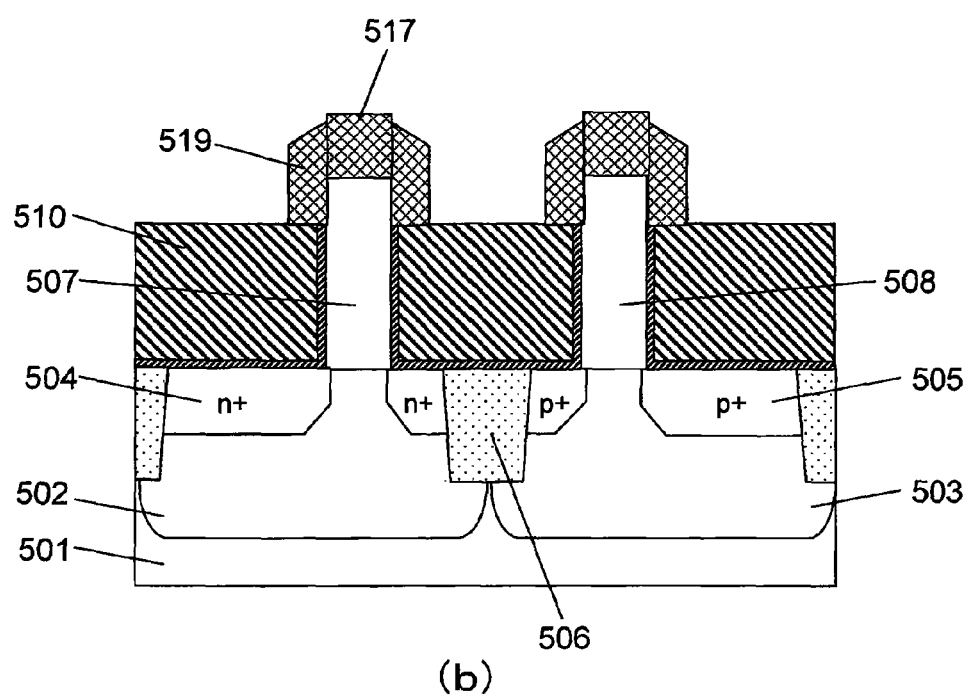
Figure 72:
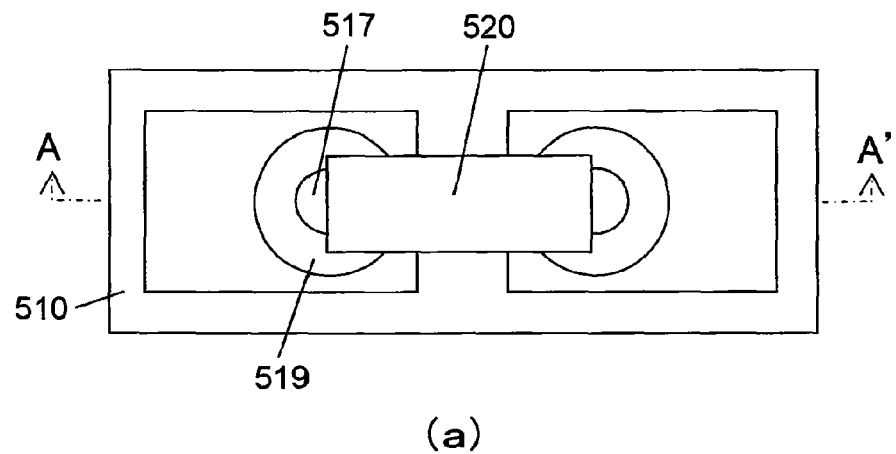
FIGS. 72(*a*) and 72(*b*) illustrate a part of the steps of the CMOS inverter production method according to the fifth embodiment.
Figure 72:
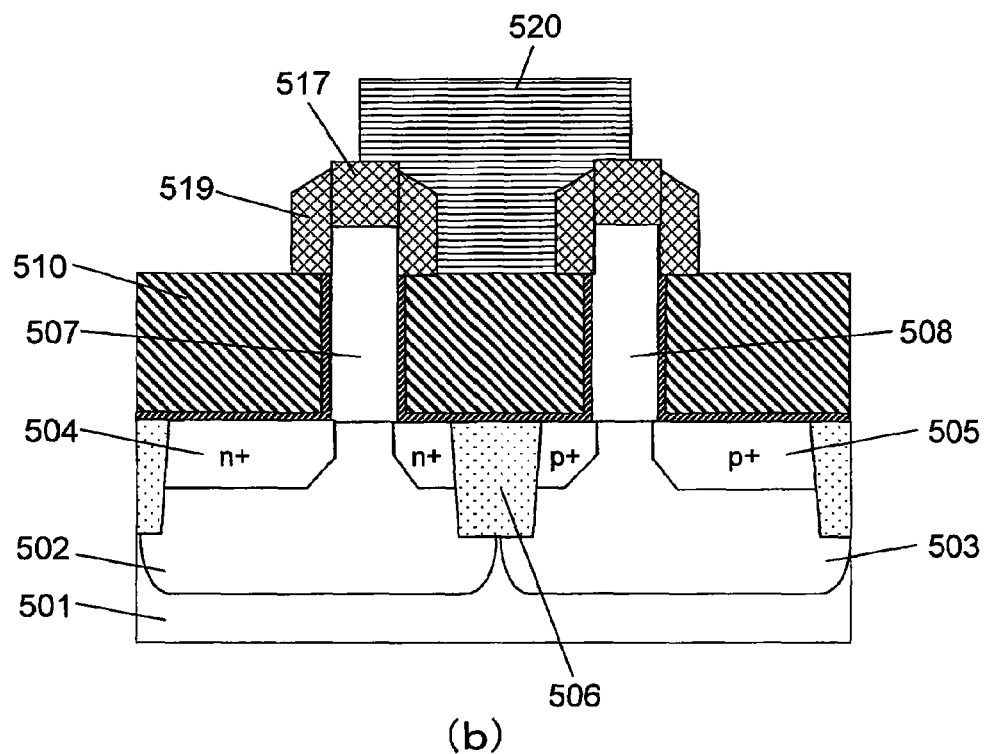
Figure 73:
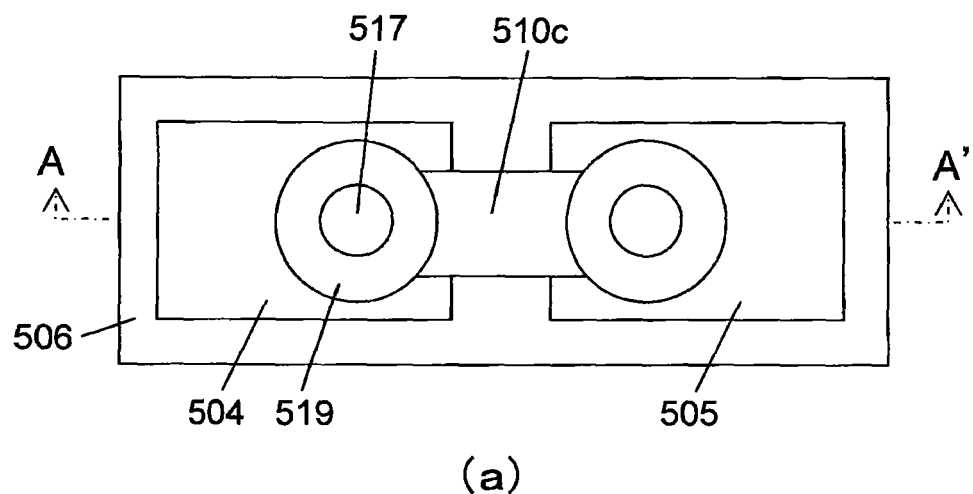
FIGS. 73(*a*) and 73(*b*) illustrate a part of the steps of the CMOS inverter production method according to the fifth embodiment.
Figure 73:
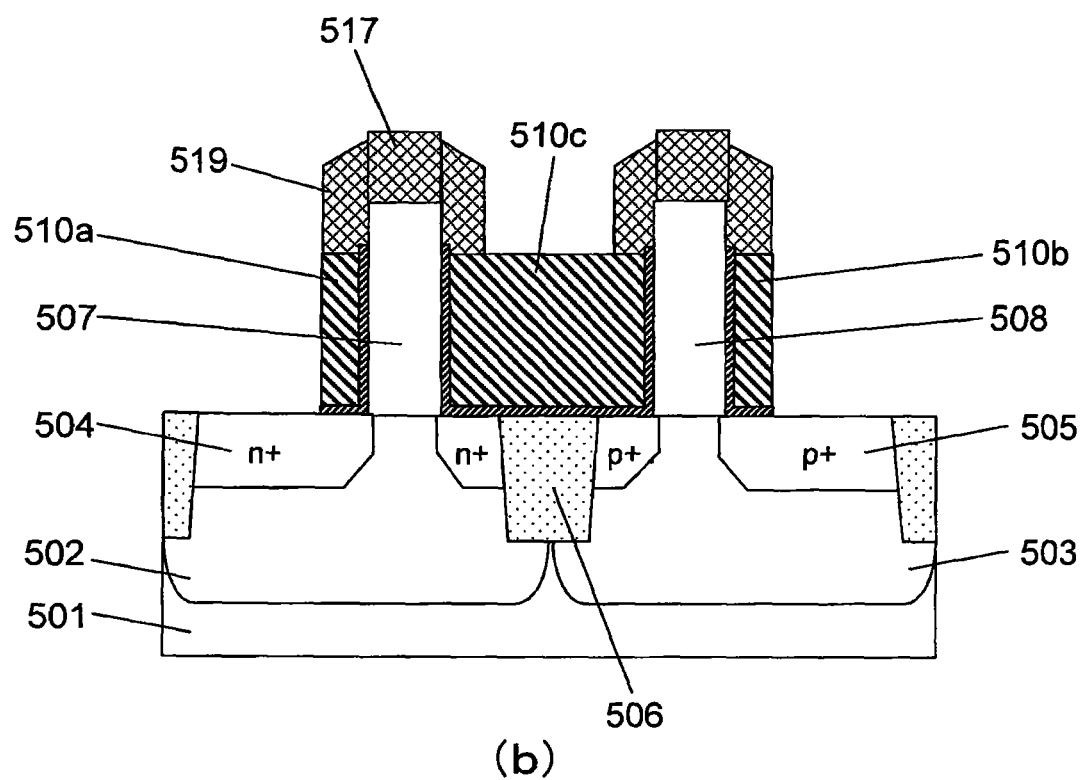
Figure 74:
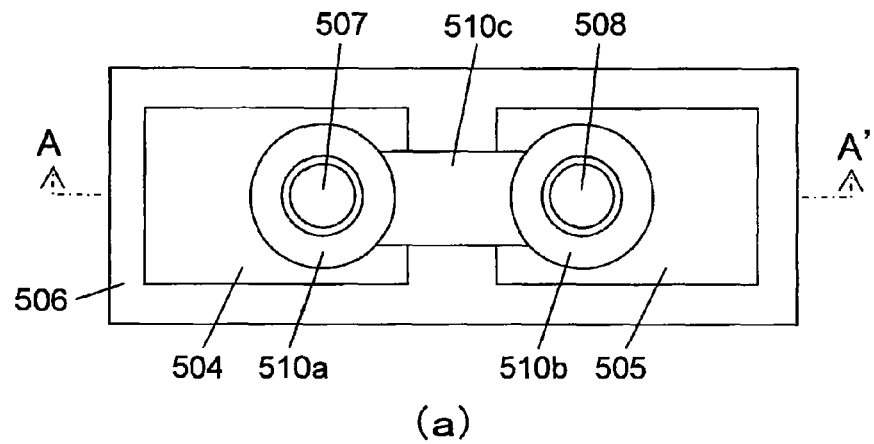
FIGS. 74(*a*) and 74(*b*) illustrate a part of the steps of the CMOS inverter production method according to the fifth embodiment.
Figure 74:
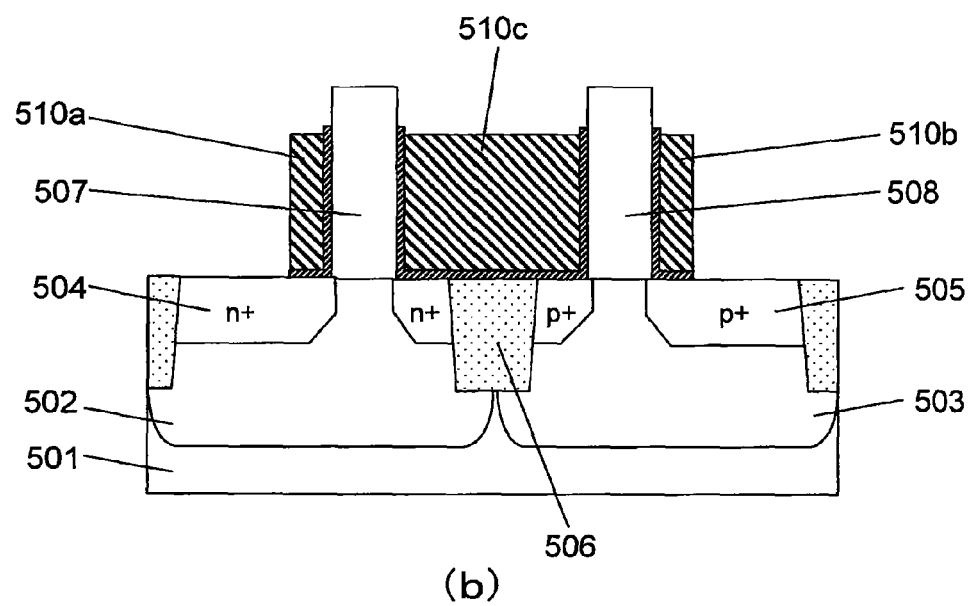
Figure 75:
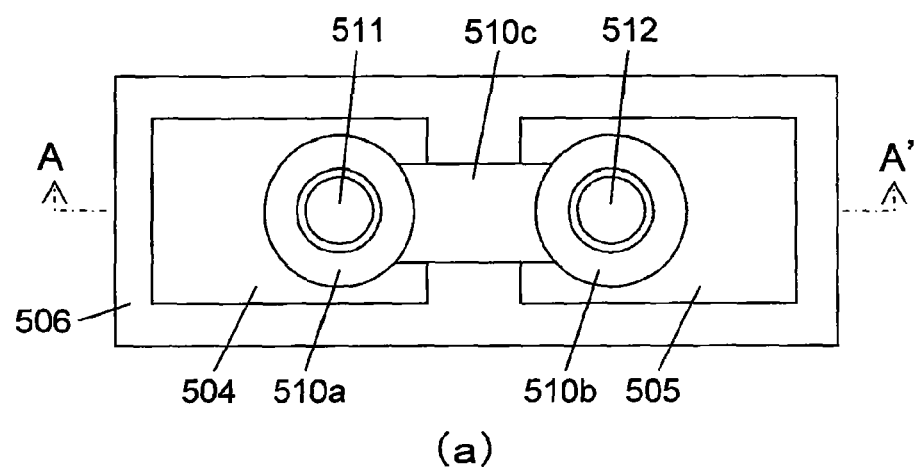
FIGS. 75(*a*) and 75(*b*) illustrate a part of the steps of the CMOS inverter production method according to the fifth embodiment.
Figure 75:
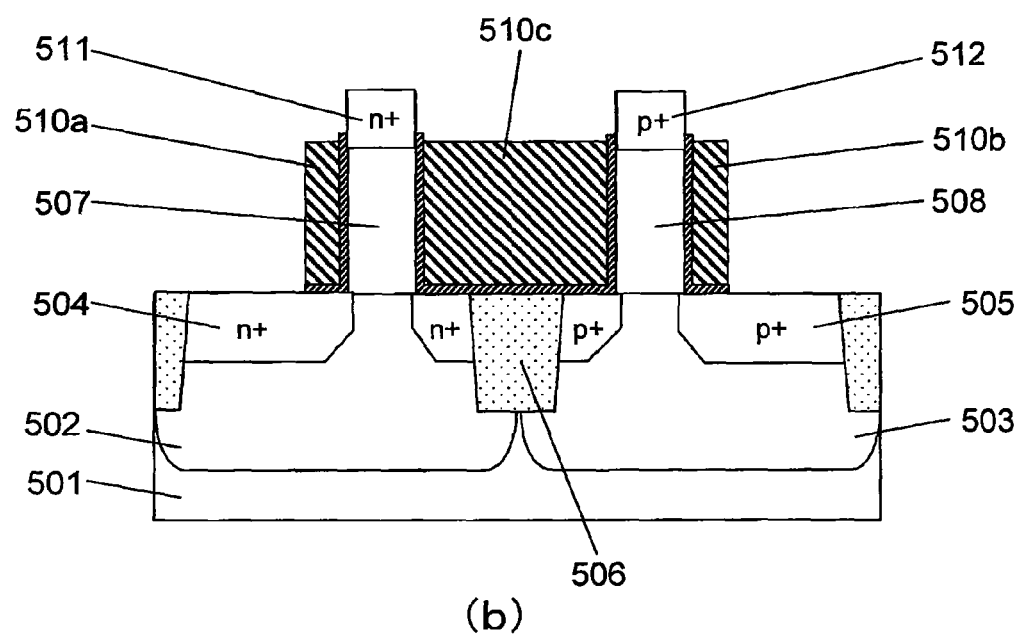
Figure 76:
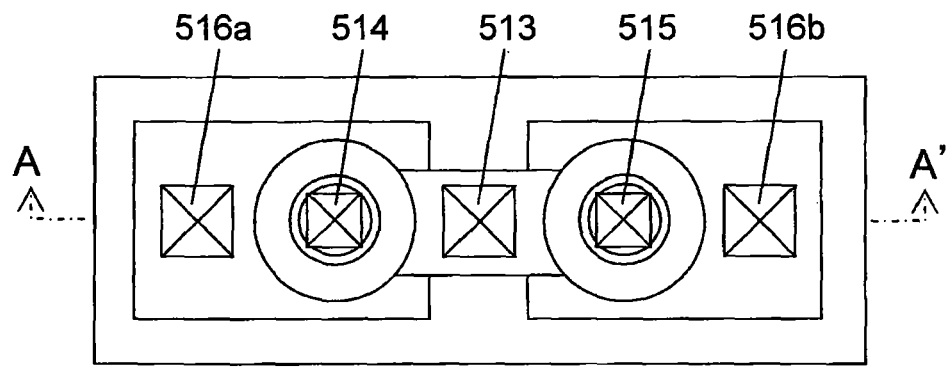
FIGS. 76(*a*) and 76(*b*) illustrate a part of the steps of the CMOS inverter production method according to the fifth embodiment.
Figure 76:
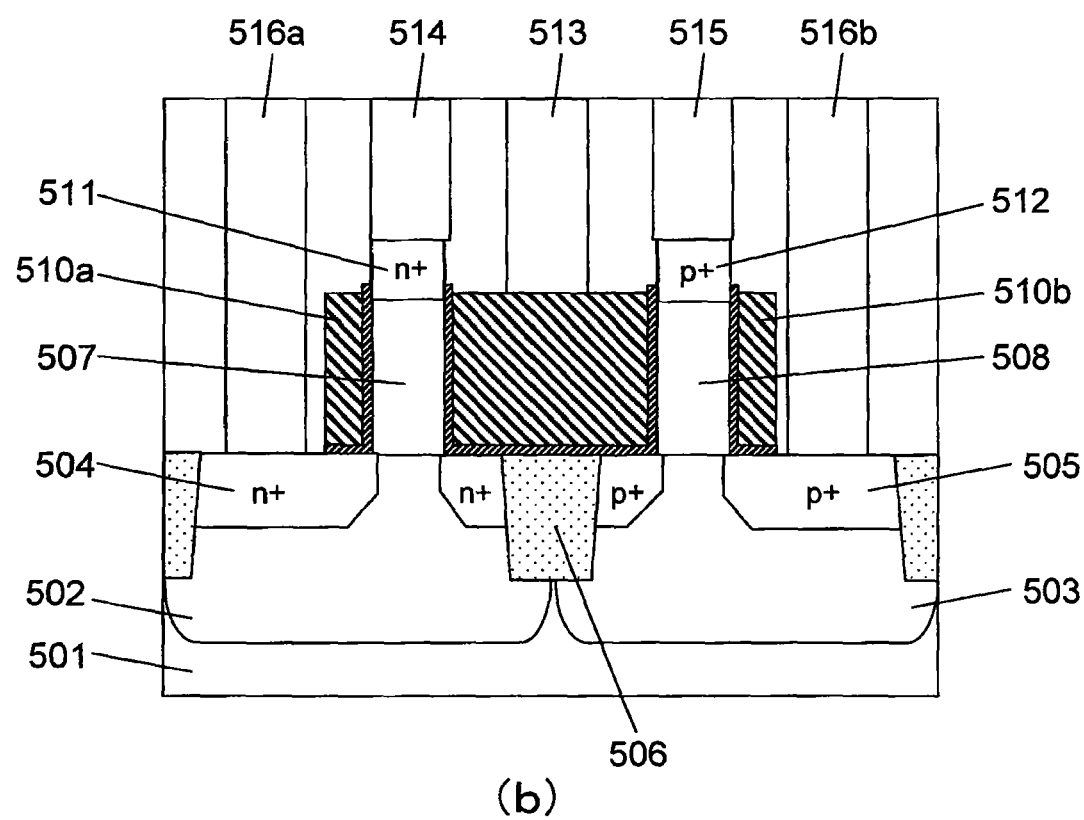

FIG. 65 is a top plan view of the CMOS inverter formed by the method according to the fifth embodiment. FIGS. 66(a) and 66(b) are sectional views taken along the cutting-plane line A-A' and the cutting-plane line B-B' in FIG. 65, respectively. With reference to FIGS. 65, 66(a) and 66(b), a structure of the CMOS inverter will be described.

A P-well 502 and an N-well 503 are formed in an upper region of a silicon substrate 501. A pillar-shaped silicon layer 507 forming an NMOS (NMOS-forming pillar-shaped silicon layer 507) and a pillar-shaped silicon layer 508 forming a PMOS (PMOS-forming pillar-shaped silicon layer 508) are formed on a surface of the silicon substrate, specifically on respective ones of the P-well region and the N-well region. A gate dielectric film 509 and a gate electrode (510a, 510b) are formed to surround the pillar-shaped silicon layers. Further, the gate electrodes 510a, 510b are connected to each other through a gate line 510c extending therefrom, and the gate electrode (510a, 510b) and the gate line 510c are formed to be at the same height position. An $N^+$ drain diffusion layer 504 is formed beneath the NMOS-forming pillar-shaped silicon layer 507, and an $N^+$ source diffusion layer 511 is formed in an upper portion of the NMOS-forming pillar-shaped silicon layer 507. A $P^+$ drain diffusion layer 505 is formed beneath the PMOS-forming pillar-shaped silicon layer 508, and a $P^+$ source diffusion layer 512 is formed in an upper portion of the PMOS-forming pillar-shaped silicon layer 508.

Each of the $N^+$ drain diffusion layer 504 and the $P^+$ drain diffusion layer 505 formed beneath respective ones of the pillar-shaped silicon layers 507, 508 is connected to the output terminal Vout 2 via a contact (516a, 516b). The N+ source diffusion layer 511 formed in the upper portion of the NMOS-forming pillar-shaped silicon layer 507 is connected to a ground potential Vss 2 via a contact 514, and the P+ source diffusion layer 512 formed in the upper portion of the PMOS-forming pillar-shaped silicon layer 508 is connected to a power supply potential Vcc 2 via a contact 515. Further, the gate line 510c connecting between the gate electrodes for the PMOS and the NMOS is connected to the input terminal Vin 2 via a contact 513. In this manner, the CMOS inverter is formed.

With reference to FIGS. 67(a) to 76(b), one example of the SGT production method according to the fifth embodiment will be described below. In FIGS. 67(a) to 76(b), the figure suffixed by (a) is a top plan view, and the figure suffixed by (b) is a sectional view taken along the line A-A'. In the fifth embodiment, any step before the step of forming a gate dielectric film is the same as those in the fourth embodiment. Thus, the following description will be started from the step of forming a gate conductive film.

Referring to FIGS. 67(a) and 67(b), a gate dielectric film 509 and a gate conductive film 510 are formed by CVD or ALD, wherein the gate conductive film 510 is formed to allow a pillar-shaped silicon layer (507, 508) to be buried therein.

Referring to FIGS. 68(a) and 68(b), the gate conductive film 510 is polished by CMP, to flatten a top surface of the gate conductive film. Through the flattening of a top of the gate conductive film by CMP, a configuration of the gate conductive film is improved to facilitate control of a gate length. During the CMP, a silicon nitride film 517 on a top of a pillar-shaped silicon layer is used as a CMP stopper. The use of the silicon nitride film 517 as a CMP stopper makes it possible to control an amount of CMP with high repeatability.

Referring to FIGS. 69(a) and 69(b), the gate conductive film 510 is etched back to fix a gate length.

Referring to FIGS. 70(a) and 70(b), a silicon nitride film 519a is formed by a film thickness required for an aftermentioned gate electrode. Subsequently, as shown in FIGS. 71(a) and 71(b), the silicon nitride film 519a is etched back to form a silicon nitride film-based sidewall 519. In the fifth embodiment, a film thickness of the gate electrode is determined by a film thickness of the silicon nitride film-based sidewall 519. Thus, a final film thickness of the silicon nitride film-based sidewall is controlled to become equal to a desired film thickness of the gate electrode, by adjusting a formed film thickness of the silicon nitride film 519a and then finely adjusting the formed film thickness based on an amount of the etch-back.

Referring to FIGS. 72(a) and 72(b), a resist or a multilayer resist is applied, and a gate line pattern is formed with a resist 520 by lithography.

Referring to FIGS. 73(a) and 73(b), the gate conductive film and the gate dielectric film are etched using the resist as a mask, to form a gate electrode (510a, 510b) and a gate line 510c.

Referring to FIGS. 74(a) and 74(b), the silicon nitride film 517 on the top of the pillar-shaped silicon layer, and the silicon nitride film-based sidewall 519, are removed by wet etching.

Referring to FIGS. 75(a) and 75(b), impurities are is introduced into respective top portions of the pillar-shaped silicon layers 507, 508, for example, by ion implantation, to form an N+ source diffusion layer 511 and P+ source diffusion layer 512 therein.

Referring to FIGS. 76(a) and 76(b), an interlayer dielectric film is formed, and a contact (513, 514, 515, 516a, 516b) is formed on each of the gate line, the source diffusion layers in the upper portions of the pillar-shaped silicon layers and the drain diffusion layers in the upper region of the silicon substrate.

In the method according to the fifth embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the fifth embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening a top surface of a gate conductive film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the fifth embodiment makes it possible to simultaneously solve both the following problems: a disconnection or open of a gate line and a variation in gate length arising from a lithography step of forming the gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the fifth embodiment can form a gate electrode around a pillar-shaped silicon layer in a self-alignment manner and with a desired film thickness. In the fourth embodiment, a film thickness of a gate electrode is controlled based on a formed film thickness of a gate conductive film. Differently, in the fifth embodiment, the film thickness of the gate electrode can be controlled based on a film thickness of the silicon nitride film-based sidewall 519. Further, in the fifth embodiment, the gate line 510c has a relatively large film thickness as compared with that of the gate line in the fourth embodiment. Thus, the gate conductive film is not limited to a metal film, but may be made of a material having relatively high electrical resistance, such as polysilicon.

In the fourth embodiment, if the silicon nitride film-based sidewall has a film thickness largely different from that of the gate conductive film, the difference is likely to cause the problems as described in connection with the second embodiment. Differently, the gate forming process in the fifth embodiment can form a gate electrode to have a desired film thickness, in a self-alignment manner according to a film thickness of the silicon nitride film-based sidewall 519, as with the second embodiment. This makes it possible to eliminate a risk of occurrence of the above problems, and further increase a process margin in the gate forming process, as compared with that in the fourth embodiment.

Although the SGT production method according to the fifth embodiment has been described based on one example where it is applied to a CMOS inverter, it is understood that the present invention may be applied to any suitable circuit other than the CMOS inverter, in just the same manner.

Sixth Embodiment

A sixth embodiment of the present invention shows a method of producing a CMOS inverter using the same gate forming process as that in the third embodiment. Thus, the method according to the sixth embodiment can be employed to obtain the same advantageous effects as those in the third embodiment.

Figure 77:
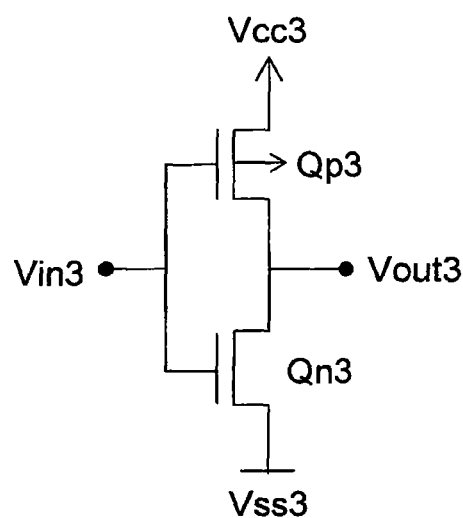
FIG. 77 is an equivalent circuit diagram of a CMOS inverter formed by a production method according to a sixth embodiment of the present invention.

FIG. 77 is an equivalent circuit diagram of a CMOS inverter formed by the method according to the sixth embodiment. A circuit operation of the CMOS inverter will be described below. An input signal Vin 3 is applied to a gate of an NMOS Qn 3 and a gate of a PMOS Qp 3. When the Vin 3 is "1", the NMOS Qn 3 is placed in an ON state, and the PMOS Qp 3 is placed in an OFF state, so that an output signal Vout 3 becomes "0". Reversely, when the Vin 3 is "0", the NMOS Qn 3 is placed in an OFF state, and the PMOS Qp 3 is placed in an ON state, so that the Vout 3 becomes "1". As above, the CMOS inverter is operable to allow the output signal Vout 3 to have a value opposite to that of the input signal Vin 3.

Figure 78:
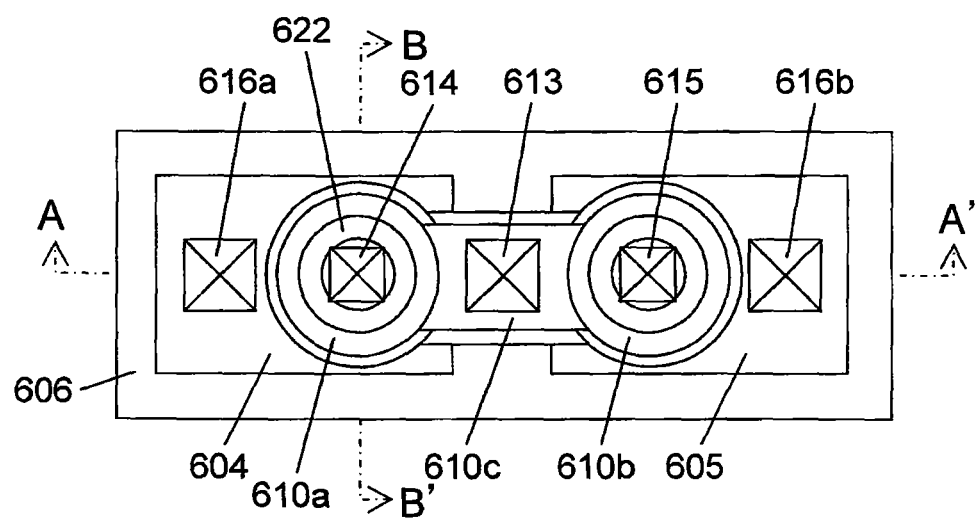
FIG. 78 is a top plan view of the CMOS inverter formed by the production method according to the sixth embodiment.
Figure 79:
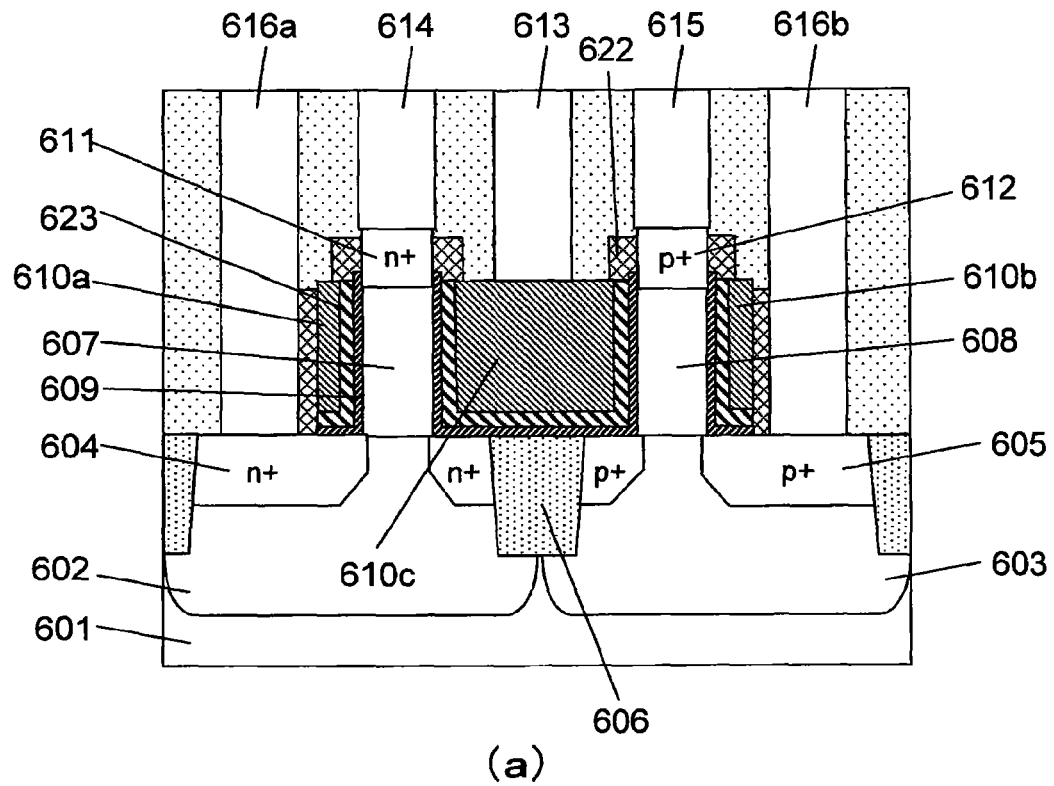
FIGS. 79(*a*) and 79(*b*) are sectional views of the CMOS inverter formed by the production method according to the sixth embodiment.
Figure 79:
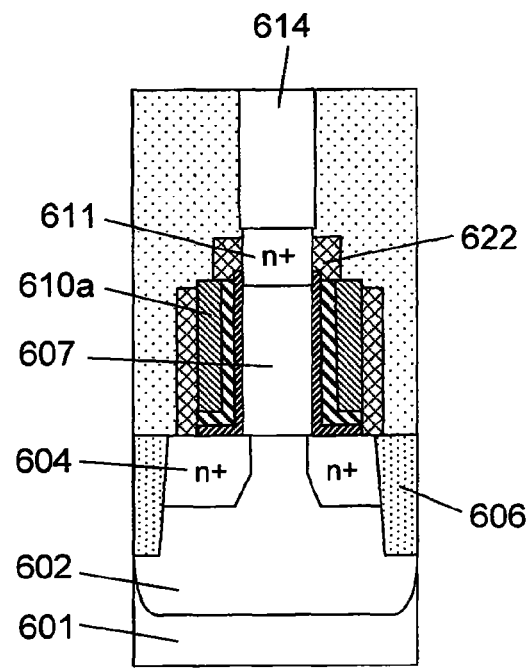
Figure 80:
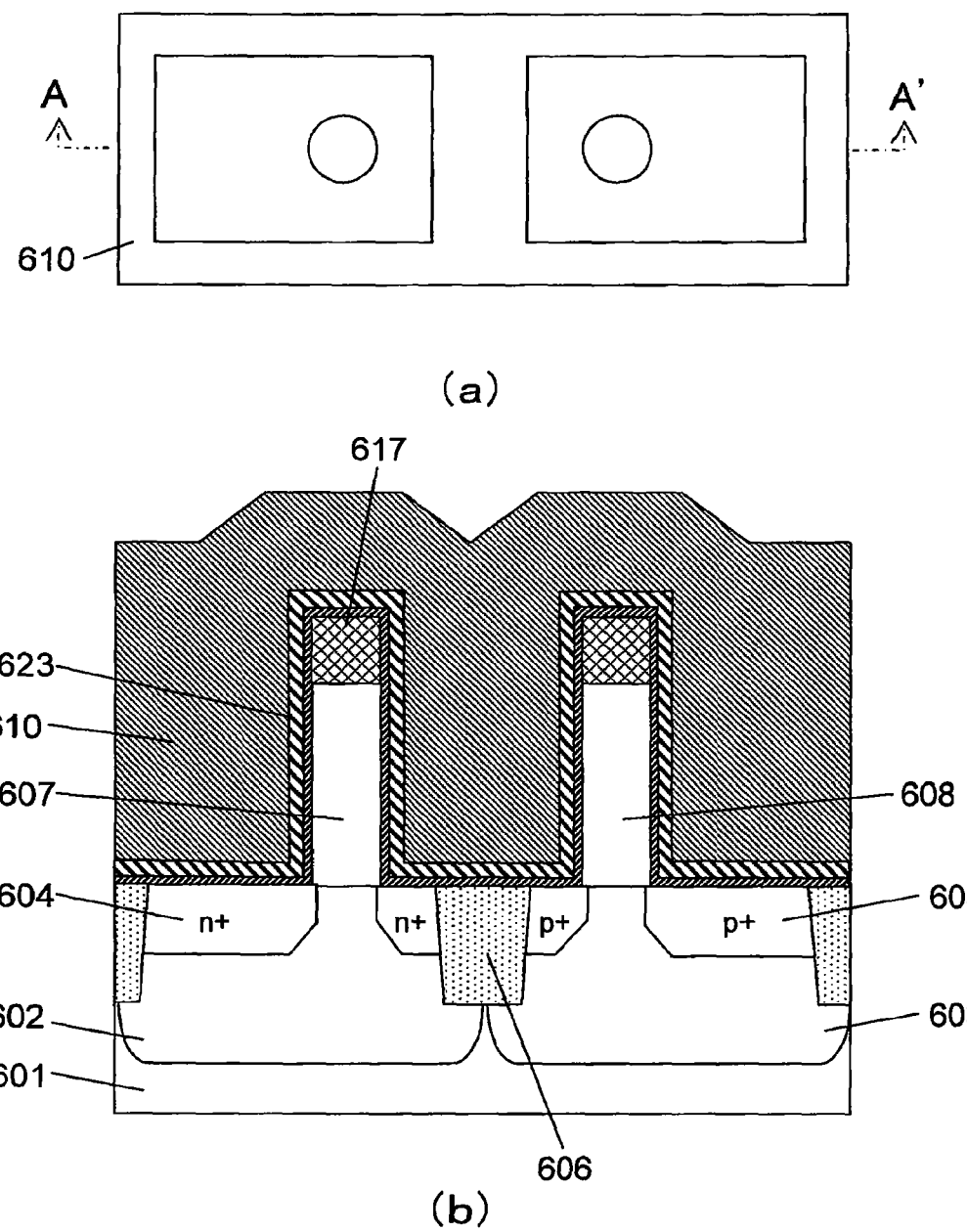
FIGS. 80(*a*) and 80(*b*) illustrate a part of a series of steps of the CMOS inverter production method according to the sixth embodiment.
Figure 81:
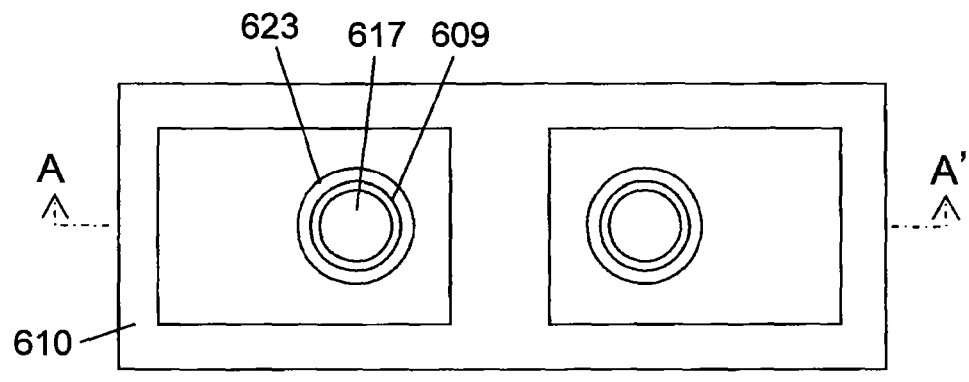
FIGS. 81(*a*) and 81(*b*) illustrate a part of the steps of the CMOS inverter production method according to the sixth embodiment.
Figure 81:
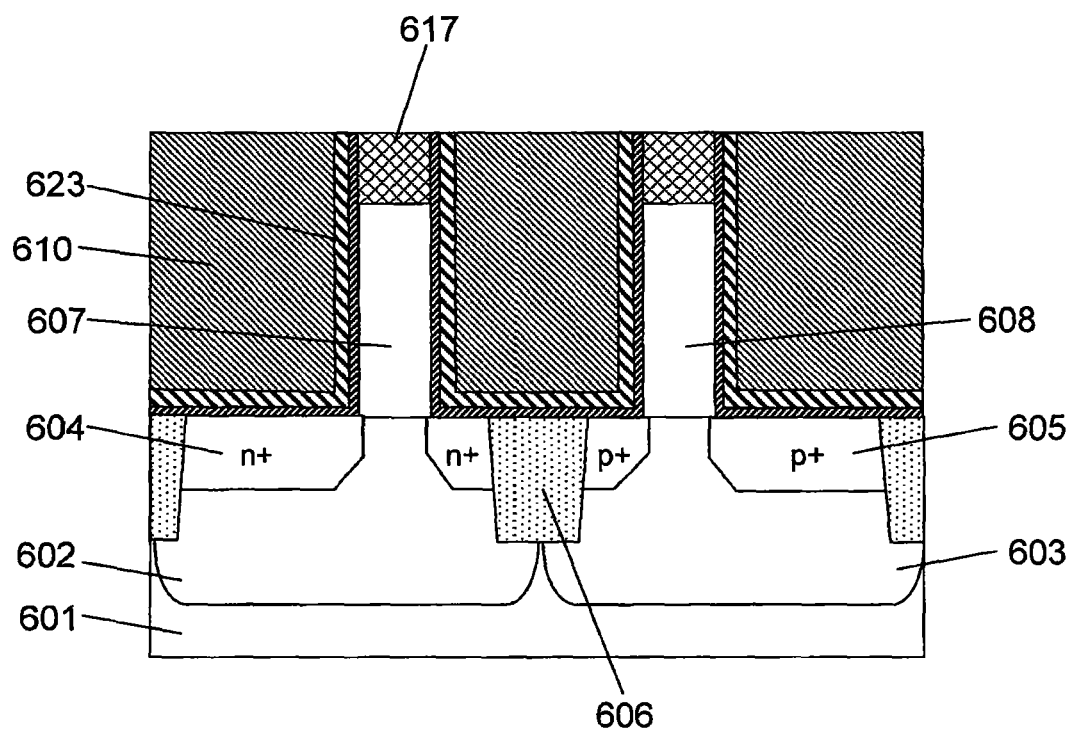
Figure 82:
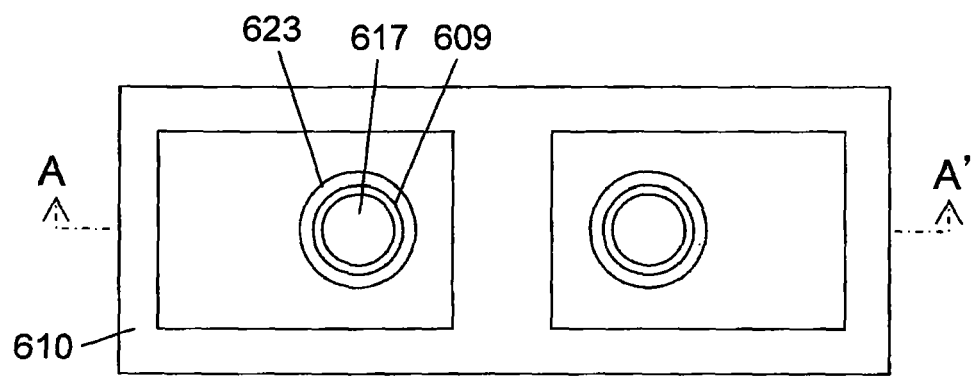
FIGS. 82(*a*) and 82(*b*) illustrate a part of the steps of the CMOS inverter production method according to the sixth embodiment.
Figure 82:
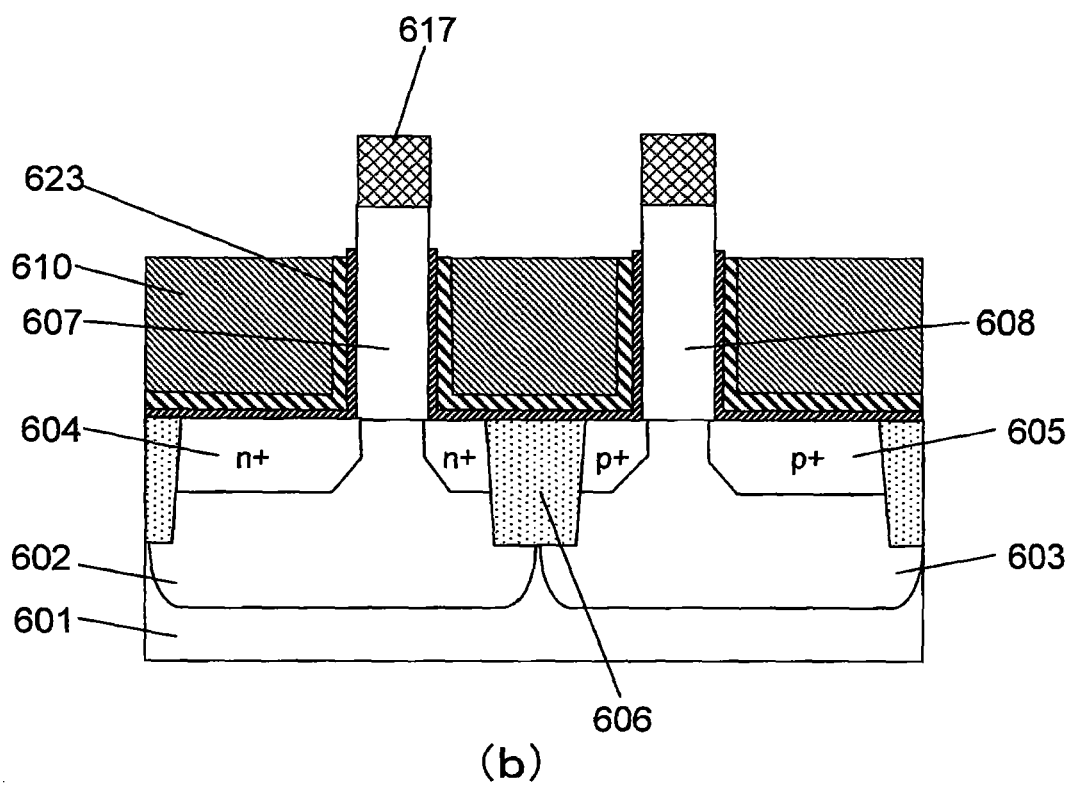
Figure 83:
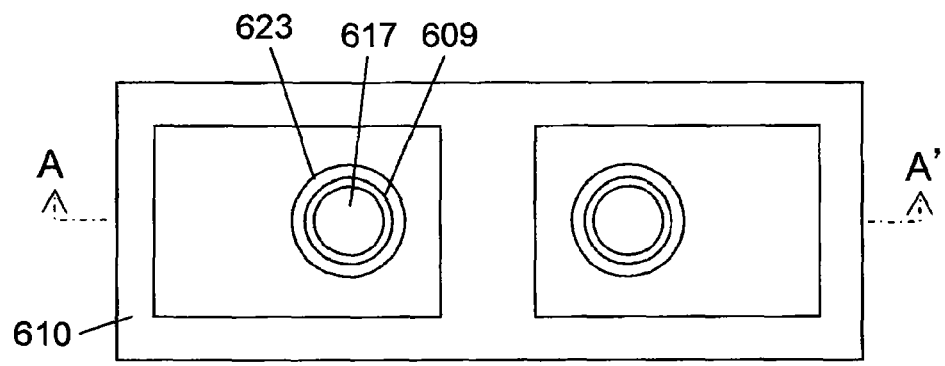
FIGS. 83(*a*) and 83(*b*) illustrate a part of the steps of the CMOS inverter production method according to the sixth embodiment.
Figure 83:
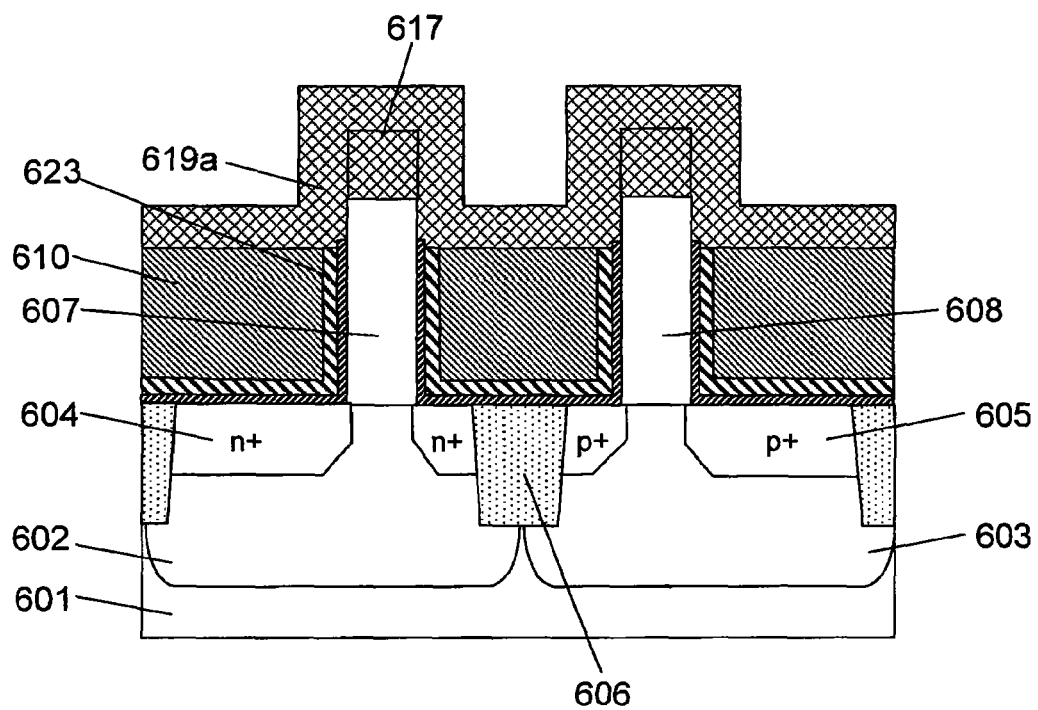
Figure 84:
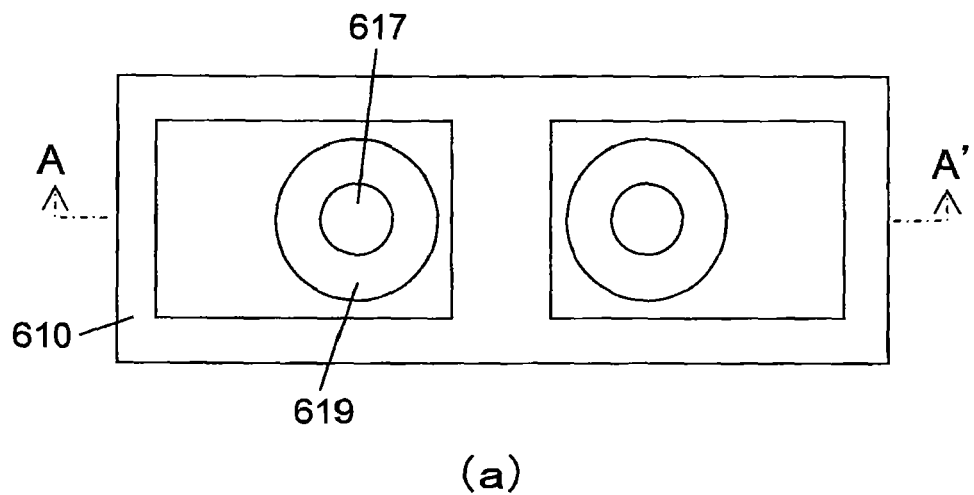
FIGS. 84(*a*) and 84(*b*) illustrate a part of the steps of the CMOS inverter production method according to the sixth embodiment.
Figure 84:
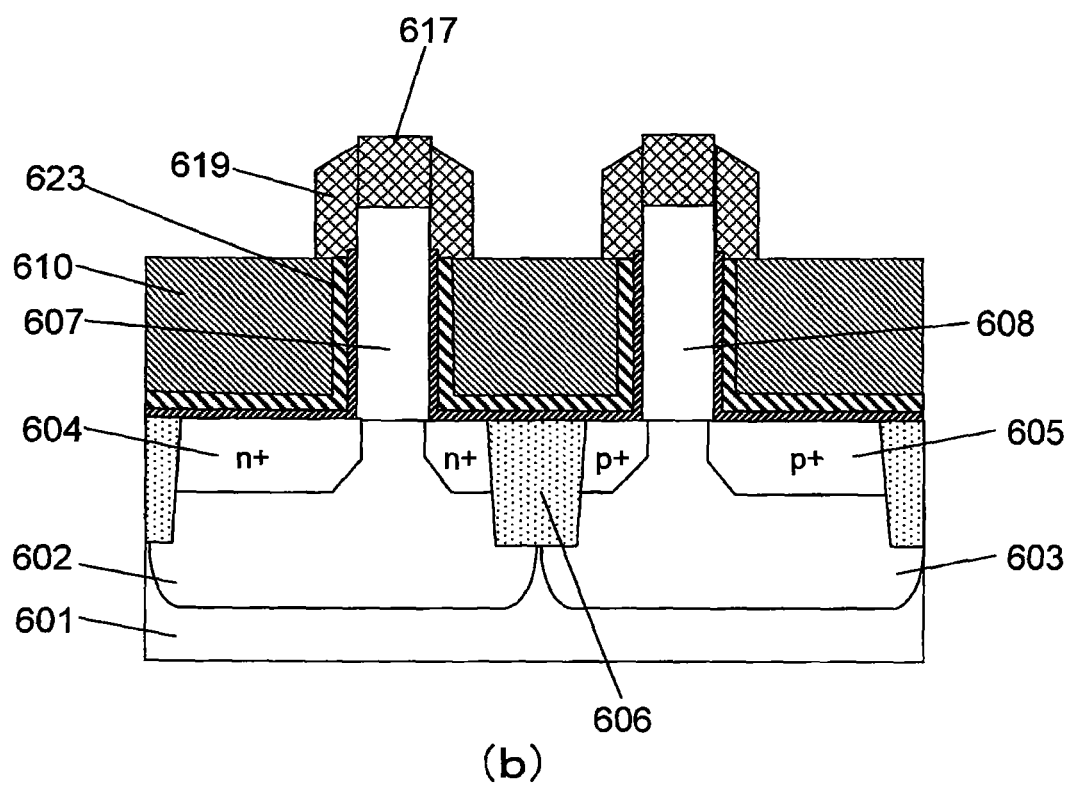
Figure 85:
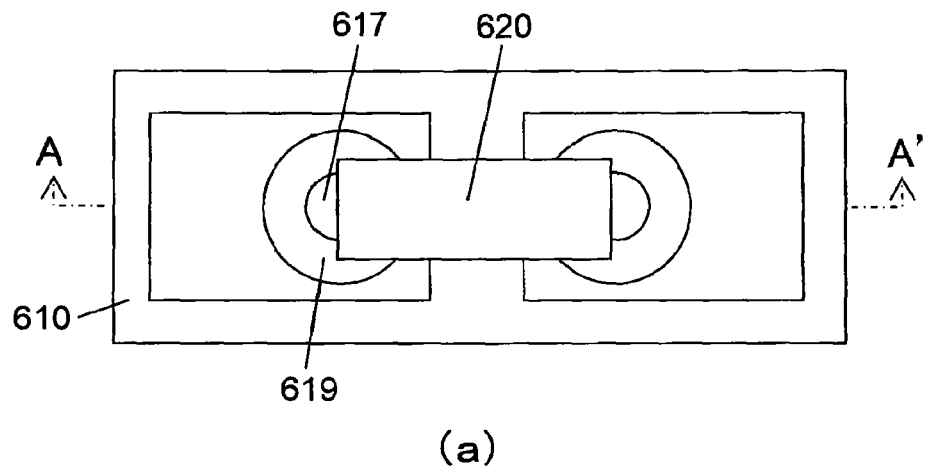
FIGS. 85(*a*) and 85(*b*) illustrate a part of the steps of the CMOS inverter production method according to the sixth embodiment.
Figure 85:
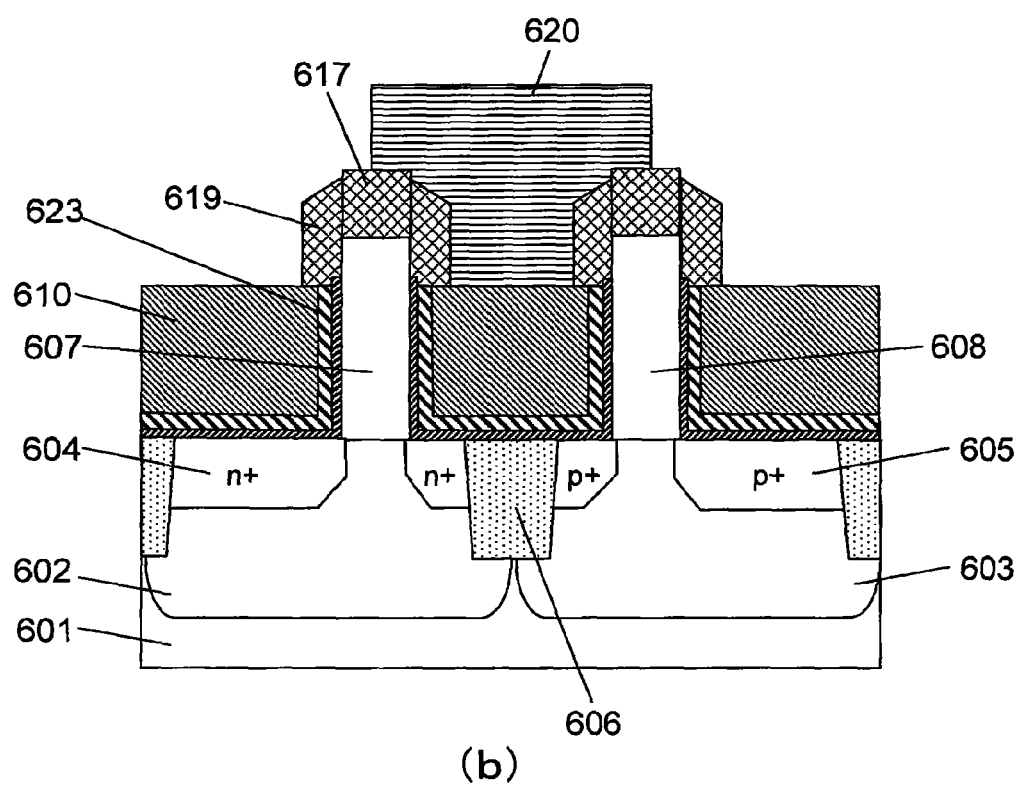
Figure 86:
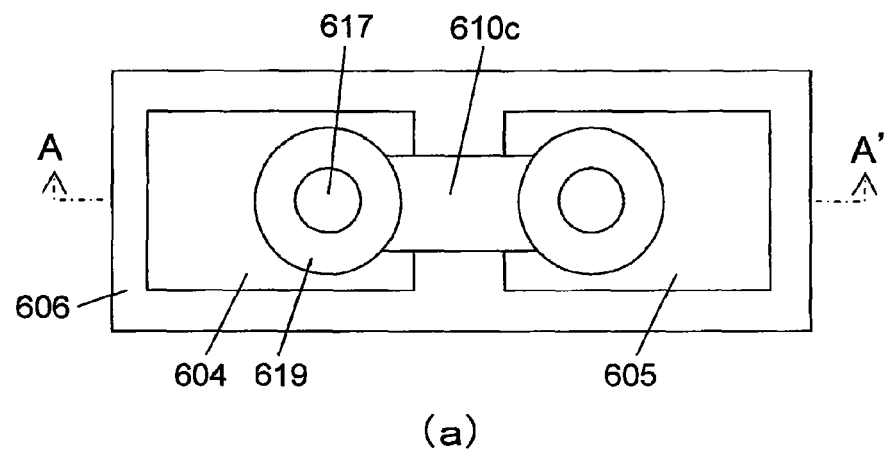
FIGS. 86(*a*) and 86(*b*) illustrate a part of the steps of the CMOS inverter production method according to the sixth embodiment.
Figure 86:
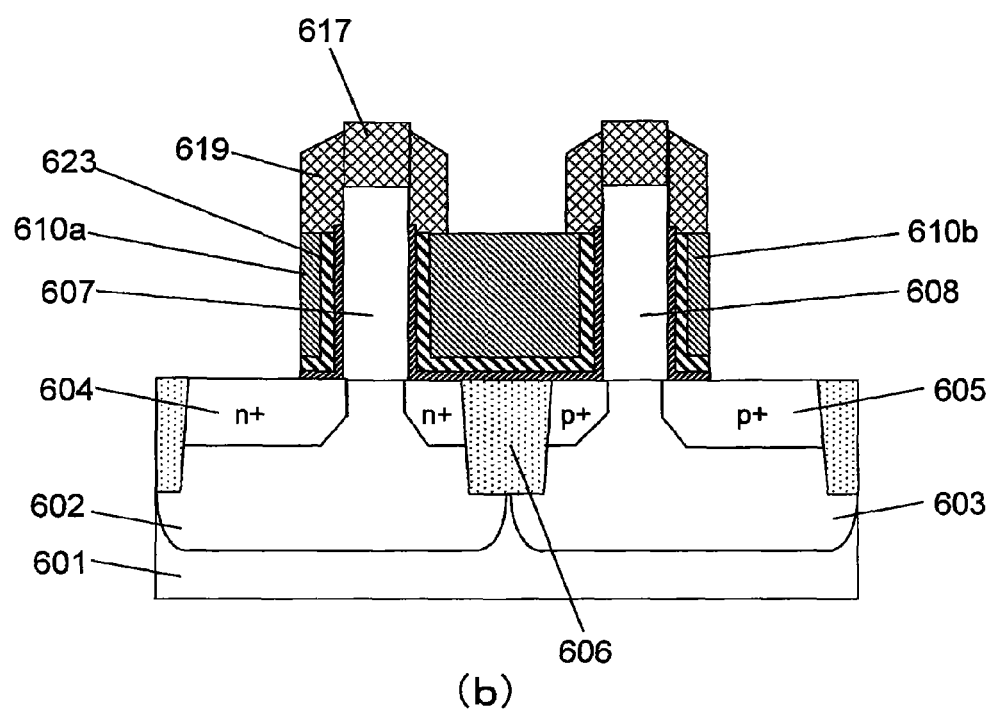
Figure 87:
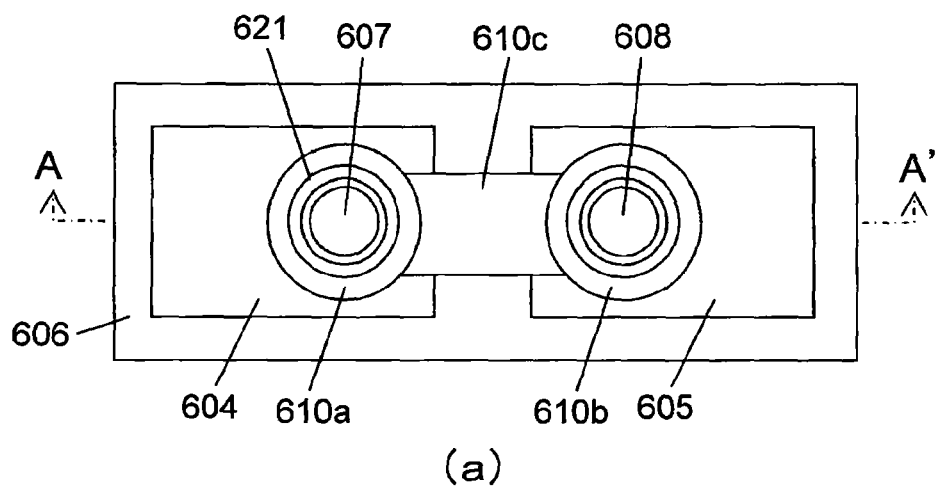
FIGS. 87(*a*) and 87(*b*) illustrate a part of the steps of the CMOS inverter production method according to the sixth embodiment.
Figure 87:
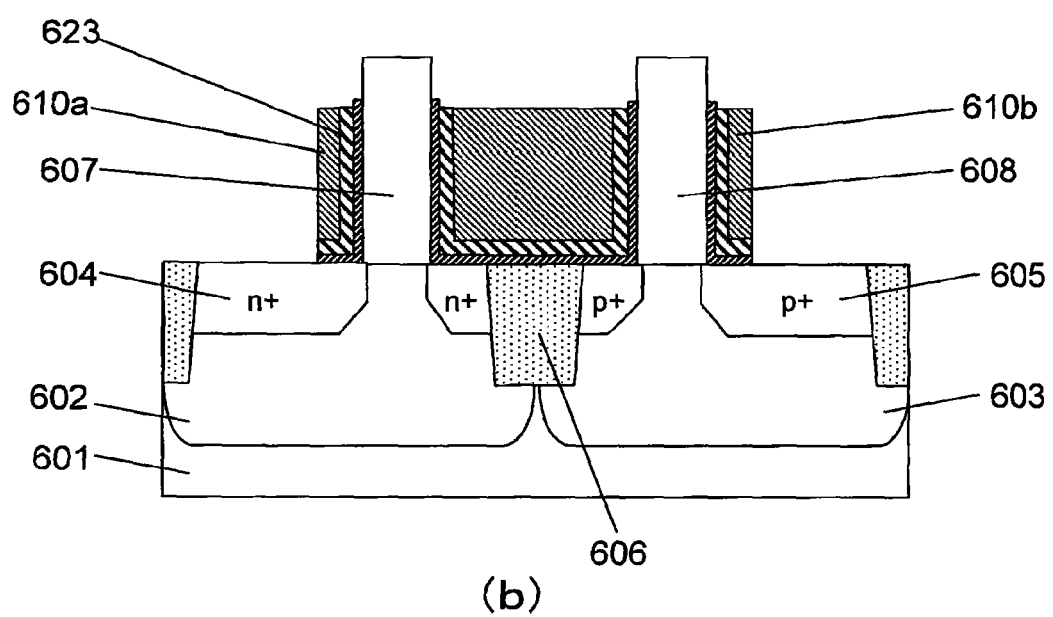
Figure 88:
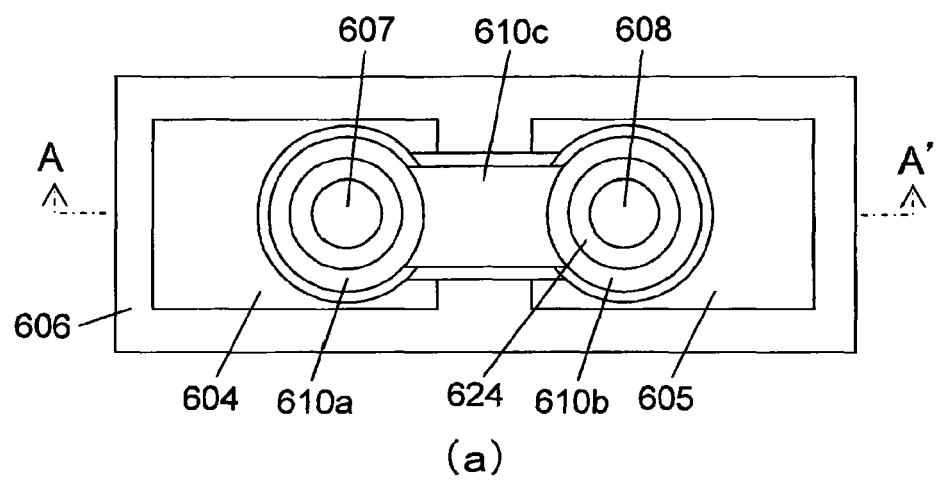
FIGS. 88(*a*) and 88(*b*) illustrate a part of the steps of the CMOS inverter production method according to the sixth embodiment.
Figure 88:
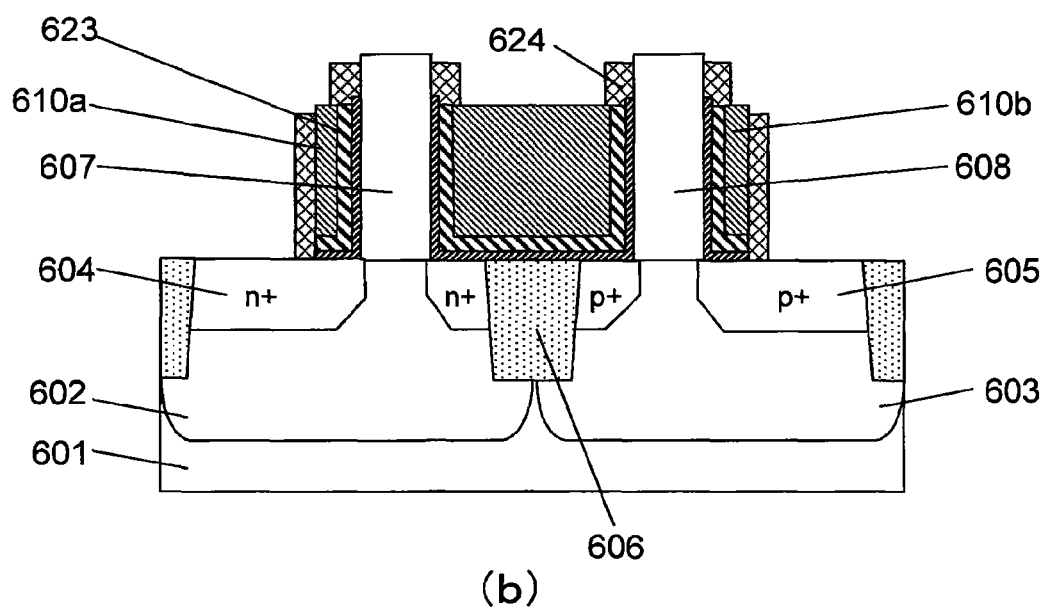
Figure 89:
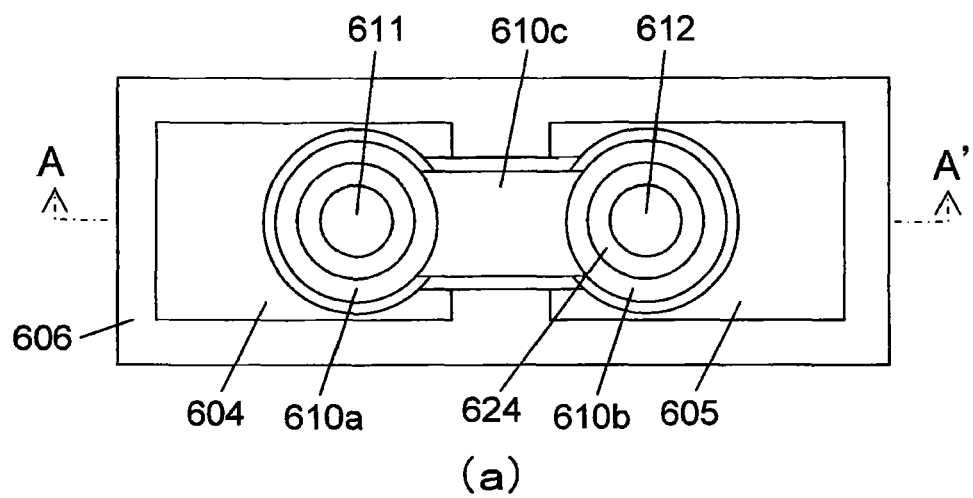
FIGS. 89(*a*) and 89(*b*) illustrate a part of the steps of the CMOS inverter production method according to the sixth embodiment.
Figure 89:
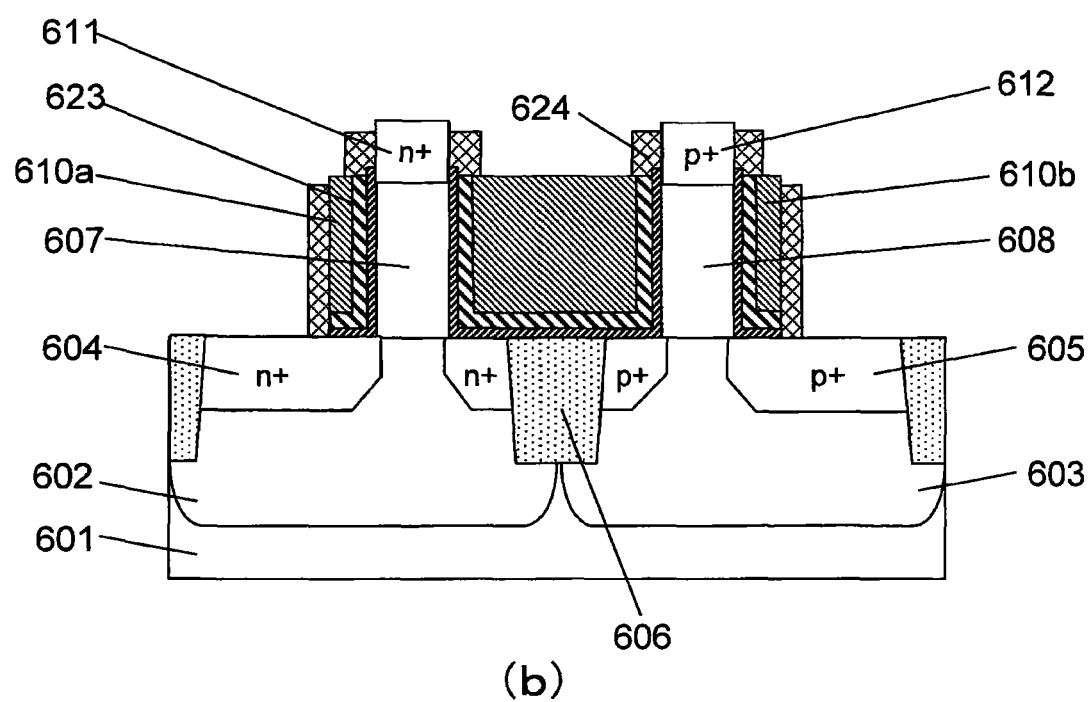
Figure 90:
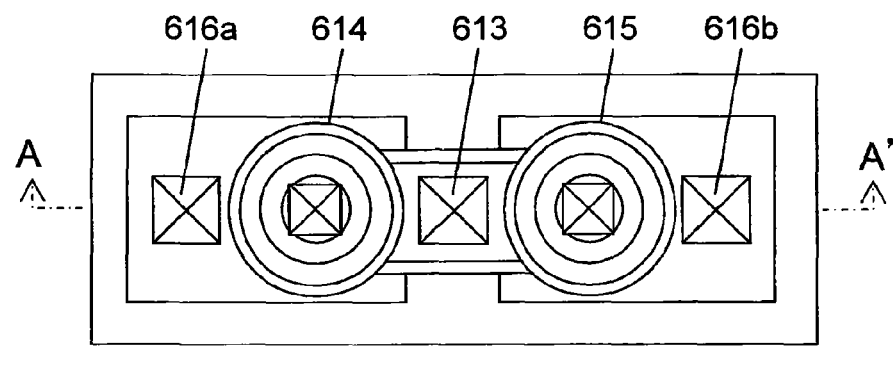
FIGS. 90(*a*) and 90(*b*) illustrate a part of the steps of the CMOS inverter production method according to the sixth embodiment.
Figure 90:
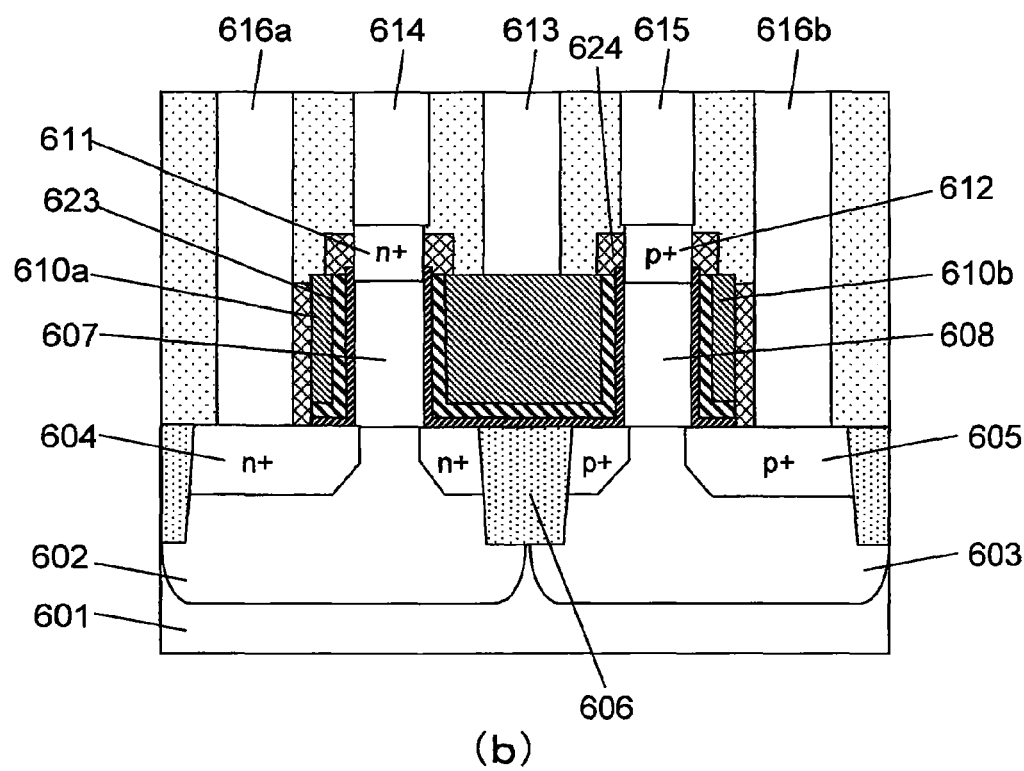

FIG. 78 is a top plan view of the CMOS inverter formed by the method according to the sixth embodiment. FIGS. 79(a) and 79(b) are sectional views taken along the cutting-plane line A-A' and the cutting-plane line B-B' in FIG. 78, respectively. With reference to FIGS. 78, 79(a) and 79(b), a structure of the CMOS inverter will be described.

A P-well 602 and an N-well 603 are formed in an upper region of a silicon substrate 601. A pillar-shaped silicon layer 607 forming an NMOS (NMOS-forming pillar-shaped silicon layer 607) and a pillar-shaped silicon layer 608 forming a PMOS (PMOS-forming pillar-shaped silicon layer 608) are formed on a surface of the silicon substrate, specifically on respective ones of the P-well region and the N-well region. A gate dielectric film 609 and a gate electrode (610a, 610b) are formed to surround the pillar-shaped silicon layers. Each of the gate electrodes is formed in a layered structure which comprises a polysilicon layer defining a top surface thereof, and a thin metal film 623 in contact with the gate dielectric film. Further, the gate electrodes 610a, 610b are connected to each other through a gate line 610c extending therefrom, and the gate electrode (610a, 610b) and the gate line 610c are formed to be at the same height position. An N$^+$ drain diffusion layer 604 is formed beneath the NMOS-forming pillar-shaped silicon layer 607, and an N$^+$ source diffusion layer 611 is formed in an upper portion of the NMOS-forming pillar-shaped silicon layer 607. A P$^+$ drain diffusion layer 605 is formed beneath the PMOS-forming pillar-shaped silicon layer 608, and a P$^+$ source diffusion layer 612 is formed in an upper portion of the PMOS-forming pillar-shaped silicon layer 608.

Each of the N$^+$ drain diffusion layer 604 and the P$^+$ drain diffusion layer 605 formed beneath respective ones of the pillar-shaped silicon layers 607, 608 is connected to the output terminal Vout 3 via a contact (616a, 616b). The N$^+$ source diffusion layer 611 formed in the upper portion of the NMOS-forming pillar-shaped silicon layer 607 is connected to a ground potential Vss 3 via a contact 614, and the P$^+$ source diffusion layer 612 formed in the upper portion of the PMOS-forming pillar-shaped silicon layer 608 is connected to a power supply potential Vcc 3 via a contact 615. Further, the gate line 610c connecting between the gate electrodes for the PMOS and the NMOS is connected to the input terminal Vin 3 via a contact 613. In this manner, the CMOS inverter is formed.

With reference to FIGS. 80(a) to 90(b), one example of the SGT production method according to the sixth embodiment will be described below. In FIGS. 80(a) to 90(b), the figure suffixed by (a) is a top plan view, and the figure suffixed by (b) is a sectional view taken along the line A-A'. In the sixth embodiment, the step of forming a gate dielectric film and any step therebefore are the same as those in the fourth embodiment. Thus, the following description will be started from the step of forming a thin metal film and a polysilicon layer.

Referring to FIGS. 80(a) and 80(b), after forming a gate dielectric film 609, a thin metal film 623 is formed to have a film thickness of about 1 to 10 nm, and then a polysilicon layer 610 is formed to allow a pillar-shaped silicon layer (607, 608) to be buried therein.

Referring to FIGS. 81(a) and 81(b), the polysilicon layer 610, and respective portions of the thin metal film 623 and the gate dielectric film 609 above the pillar-shaped silicon layer, are polished by CMP, to flatten respective top surfaces of the polysilicon layer 610 and the thin metal film 623. Through the flattening of respective tops of the polysilicon layer 610 and the thin metal film 623 by CMP, respective configurations of the polysilicon layer 610 and the thin metal film 623 are improved to facilitate control of a gate length. During the CMP, a silicon nitride film 617 on a top of the pillar-shaped silicon layer is used as a CMP stopper. The use of the silicon nitride film 617 as a CMP stopper makes it possible to control an amount of CMP with high repeatability.

Referring to FIGS. 82(a) and 82(b), the polysilicon layer 610 and the thin metal film 623 are etched back to fix a gate length.

Referring to FIGS. 83(a) and 83(b), a silicon nitride film 619a is formed by a film thickness required for an after-mentioned gate electrode. Subsequently, as shown in FIGS. 84(a) and 84(b), the silicon nitride film 619a is etched back to form a silicon nitride film-based sidewall 619. In the sixth embodiment, a film thickness of the gate electrode is determined by a film thickness of the silicon nitride film-based sidewall 619. Thus, a final film thickness of the silicon nitride film-based sidewall is controlled to become equal to a desired film thickness of the gate electrode, by adjusting a formed film thickness of the silicon nitride film 312a and then finely adjusting the formed film thickness based on an amount of the etch-back.

Referring to FIGS. 85(a) and 85(b), a resist or a multilayer resist is applied, and a gate line pattern is formed with a resist 620 by lithography.

Referring to FIGS. 86(a) and 86(b), the polysilicon layer, the thin metal film and the gate dielectric film are etched using the resist as a mask, to form a gate electrode (610a, 610b) and a gate line 610c.

Referring to FIGS. 87(a) and 87(b), the silicon nitride film 617 on the top of the pillar-shaped silicon layer, and the silicon nitride film-based sidewall 619, are removed by wet etching.

Referring to FIGS. 88(a) and 88(b), a silicon nitride film is formed and then etched back to form a silicon nitride film 624. The silicon nitride film 624 is formed to cover the thin metal film 623 of the gate electrode to keep a top surface of the thin metal film 623 from being exposed. This makes it possible to produce an intended SGT in the same production line as that for a transistor having a conventional polysilicon gate.

Referring to FIGS. 89(a) and 89(b), impurities are introduced into respective top portions of the pillar-shaped silicon layers 607, 608, for example, by ion implantation, to form an N+ source diffusion layer 611 and a P+ source diffusion layer 612 therein.

Referring to FIGS. 90(a) and 90(b), an interlayer dielectric film is formed, and a contact (613, 614, 615, 616a, 616b) is formed on each of the gate line, the source diffusion layers in the upper portions of the pillar-shaped silicon layers and the drain diffusion layers in the upper region of the silicon substrate.

In the method according to the sixth embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the sixth embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening respective top surfaces of a polysilicon layer and a thin metal film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the sixth embodiment makes it possible to simultaneously solve both the following problems: a disconnection or open of a gate line and a variation in gate length arising from a lithography step of forming the gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the sixth embodiment can form a gate electrode around a pillar-shaped silicon layer in a self-alignment manner and with a desired film thickness, and control a film thickness of the gate electrode based on a film thickness of the silicon nitride film-based sidewall 619.

In the sixth embodiment, a gate is formed in a layered structure which comprises the thin metal film and the polysilicon layer, which is capable of suppressing depletion of the gate electrode, and allowing an intended SGT to be produced in the same production line as that for a transistor having a conventional polysilicon gate.

In the fourth embodiment, if the silicon nitride film-based sidewall has a film thickness largely different from that of the gate conductive film, the difference is likely to cause the problems as described in connection with the second embodiment. Differently, the gate forming process in the sixth embodiment can form a gate electrode to have a desired film thickness, in a self-alignment manner according to a film thickness of the silicon nitride film-based sidewall 619. This makes it possible to eliminate a risk of occurrence of the above problems, and further increase a process margin in the gate forming process, as compared with that in the fourth embodiment.

Although the SGT production method according to the sixth embodiment has been described based on one example where it is applied to a CMOS inverter, it is understood that the present invention may be applied to any suitable circuit other than the CMOS inverter, in just the same manner.

Seventh Embodiment

A seventh embodiment of the present invention shows a method of producing an NMOS SGT on an SOI substrate (SOI NMOS SGT), using the same gate forming process as that in the first embodiment.

Figure 91:
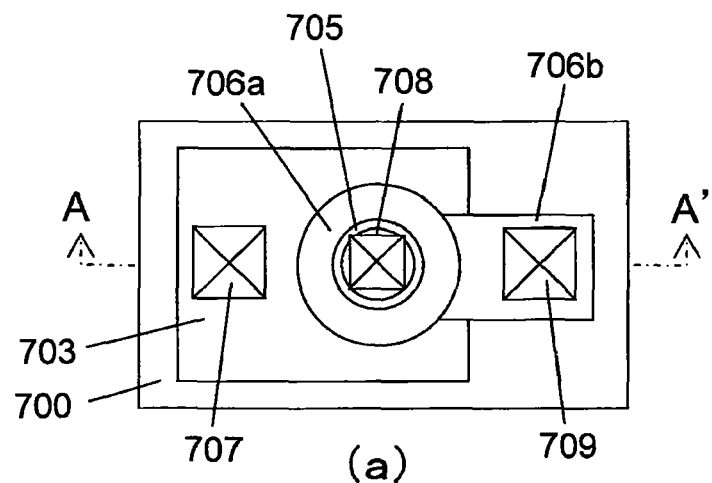
FIGS. 91(*a*) and 91(*b*) are, respectively, a top plan view and a sectional view of a single SGT formed by a production method according to a seventh embodiment of the present invention.
Figure 91:
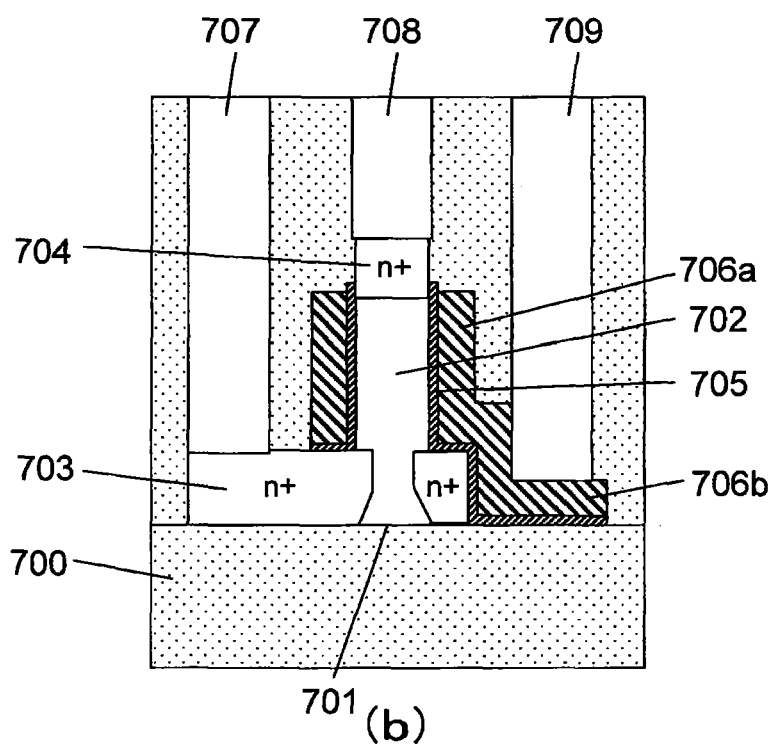
Figure 92:
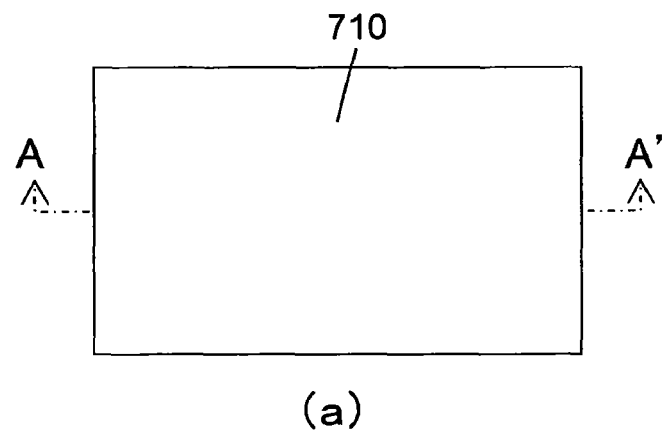
FIGS. 92(*a*) and 92(*b*) illustrate a part of the steps of the single-SGT production method according to the seventh embodiment.
Figure 92:
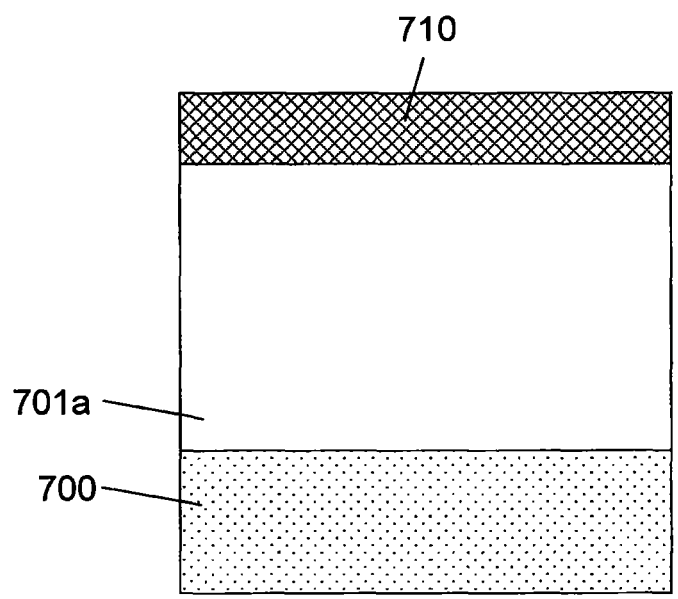
Figure 93:
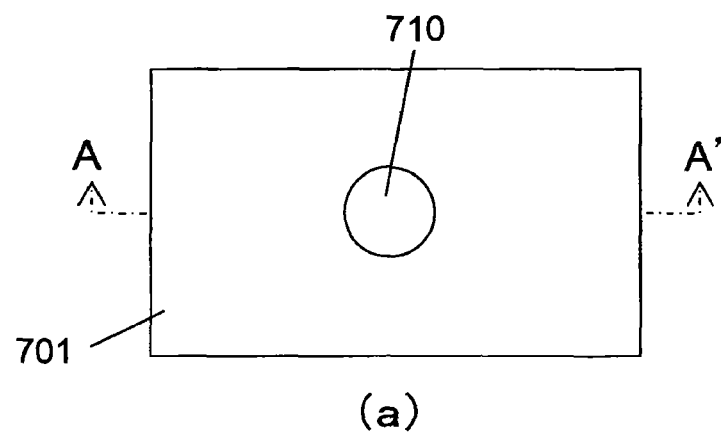
FIGS. 93(*a*) and 93(*b*) illustrate a part of the steps of the single-SGT production method according to the seventh embodiment.
Figure 93:
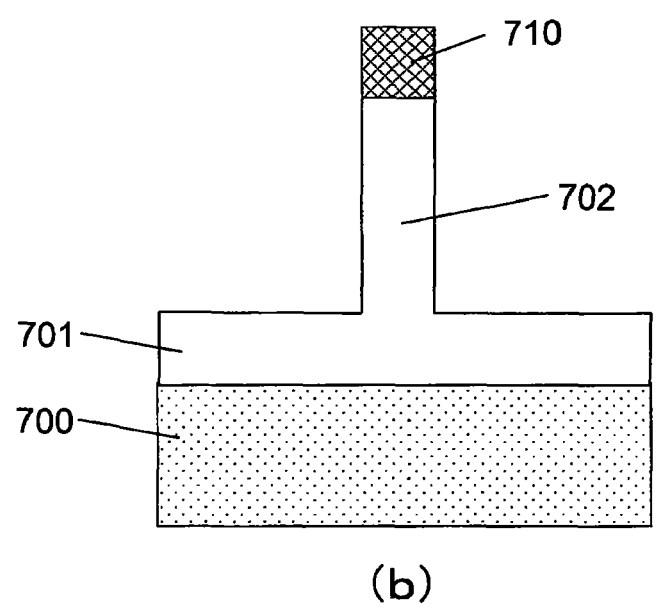
Figure 94:
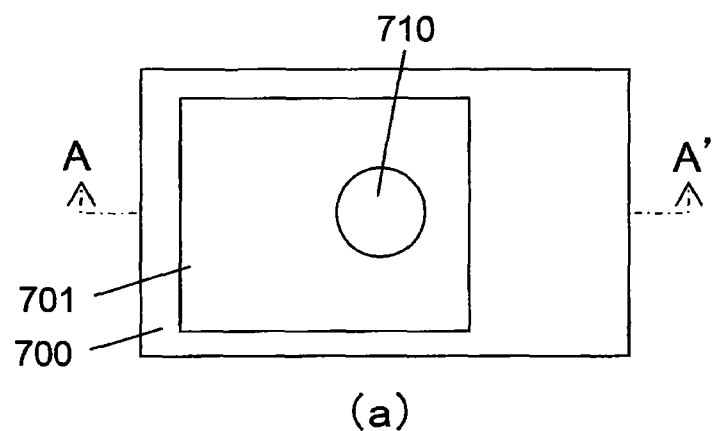
FIGS. 94(*a*) and 94(*b*) illustrate a part of the steps of the single-SGT production method according to the seventh embodiment.
Figure 94:
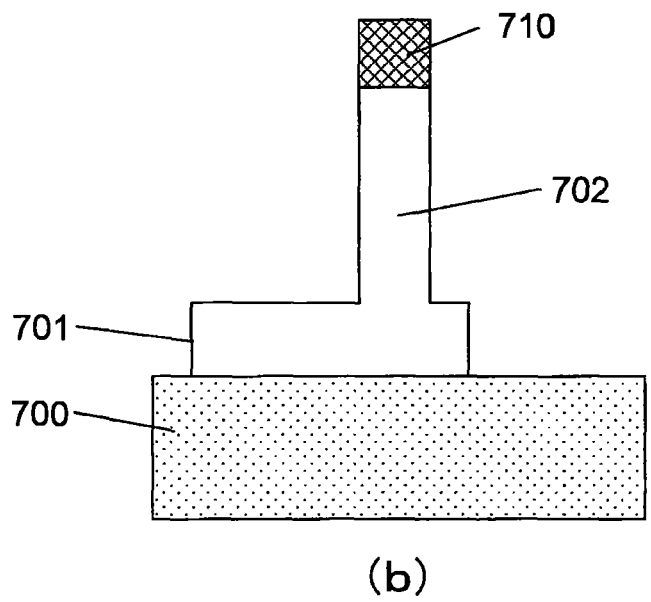
Figure 95:
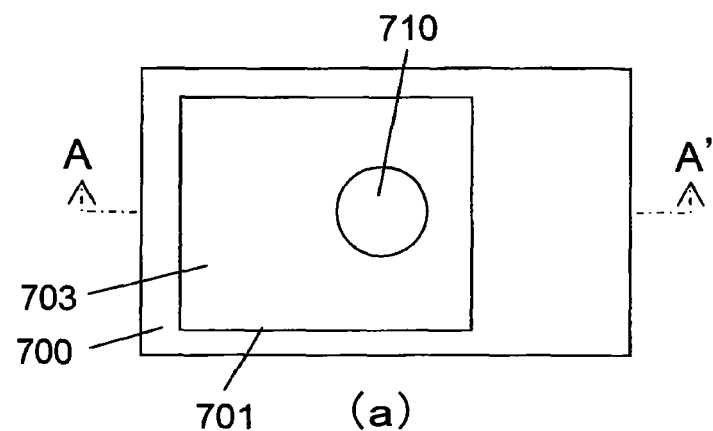
FIGS. 95(*a*) and 95(*b*) illustrate a part of the steps of the single-SGT production method according to the seventh embodiment.
Figure 95:
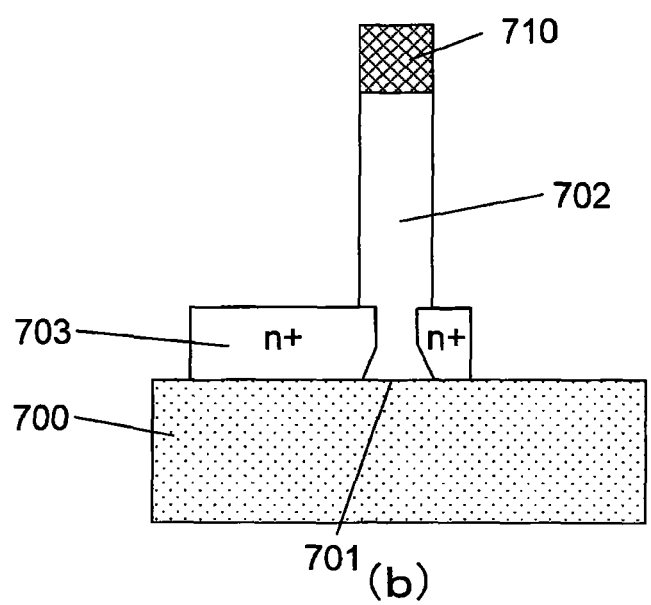

FIGS. 91(a) and 91(b) are, respectively, a top plan view and a sectional view of the SOI NMOS SGT formed by the SGT production method according to the seventh embodiment. With reference to FIGS. 91(a) and 91(b), the SOI NMOS SGT formed by the SGT production method according to the seventh embodiment will be described below.

A planar silicon layer 701 is formed on a buried oxide film layer 700. A pillar-shaped silicon layer 702 is formed on the planar silicon layer 701, and a gate dielectric film 705 and a gate electrode 706a are formed around the pillar-shaped silicon layer 702. An N+ drain diffusion layer 703 is formed in the planar silicon layer 701 beneath the pillar-shaped silicon layer 702, and an N+ source diffusion layer 704 is formed in an upper portion of the pillar-shaped silicon layer 702. A contact 707, a contact 708, and a contact 709, are formed on the N+ drain diffusion layer 703, the N+ source diffusion layer 704, and a gate line 706b extending from the gate electrode 706a, respectively.

Under conditions that the N+ source diffusion layer is connected to a GND potential, and the N+ drain diffusion layer is connected to a power supply potential Vcc, a potential ranging from zero to Vcc is applied to the gate electrode to allow the SGT to operate as a transistor.

With reference to FIGS. 92(a) to 107(b), one example of the SGT production method according to the seventh embodiment will be described below. In FIGS. 92(a) to 107(b), the figure suffixed by (a) is a top plan view, and the figure suffixed by (b) is a sectional view taken along the line A-A'.

Referring to FIGS. 92(a) and 92(b), a silicon nitride film 710 serving as a hard mask is formed on a silicon layer 701a on a buried oxide film layer 700 in an SOI substrate, to have a film thickness of about 50 to 150 nm.

Referring to FIGS. 93(a) and 93(b), the hard mask 710 and the silicon layer 701a are etched to form a pillar-shaped silicon layer 702. Through the etching, the pillar-shaped silicon layer 702 is formed to have a height dimension of about 30 to 300 nm, and a diameter of about 5 to 100 nm. Further, a planar silicon layer 701 is formed beneath the pillar-shaped silicon layer 702 to have a thickness of about 10 to 100 nm.

Referring to FIGS. 94(a) and 94(b), the planar silicon layer 701 is formed in an isolated structure by etching.

Referring to FIGS. 95(a) and 95(b), an impurity, such as P or As, is introduced into a top surface of planar silicon layer, for example, by ion implantation, to form an N+ drain diffusion layer 703 therein. During this step, the silicon nitride film

710 on a top of the pillar-shaped silicon layer functions as a stopper for preventing the impurity from being injected into the top of the pillar-shaped silicon layer.

Figure 96:
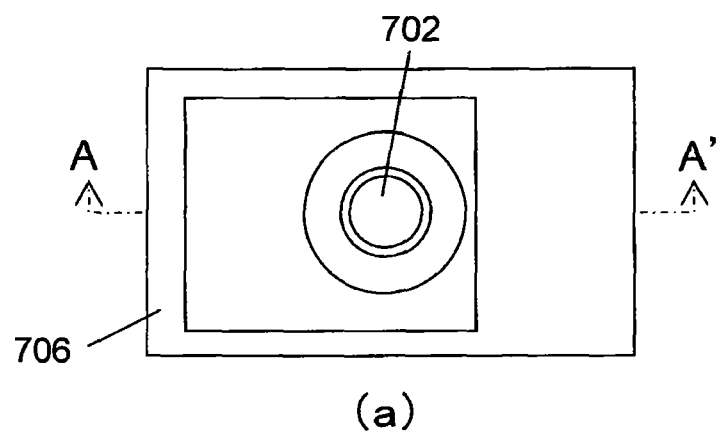
FIGS. 96(*a*) and 96(*b*) illustrate a part of the steps of the single-SGT production method according to the seventh embodiment.
Figure 96:
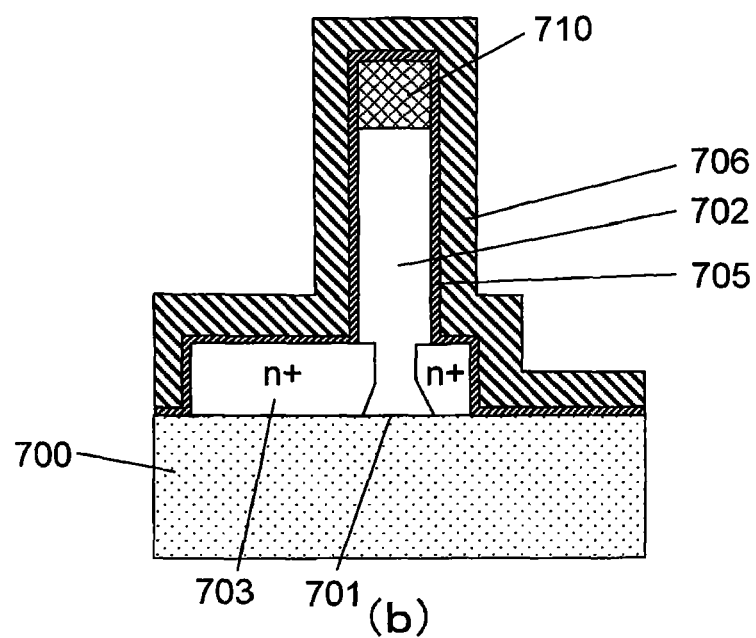

Referring to FIGS. 96(*a*) and 96(*b*), a gate dielectric film 705 and a gate conductive film 706 are formed by CVD or ALD. The gate conductive film 706 is formed to have a film thickness of about 10 to 100 nm.

Figure 97:
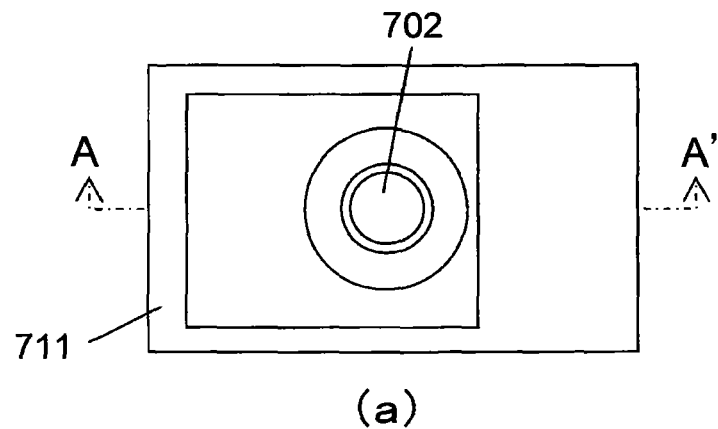
FIGS. 97(*a*) and 97(*b*) illustrate a part of the steps of the single-SGT production method according to the seventh embodiment.
Figure 97:
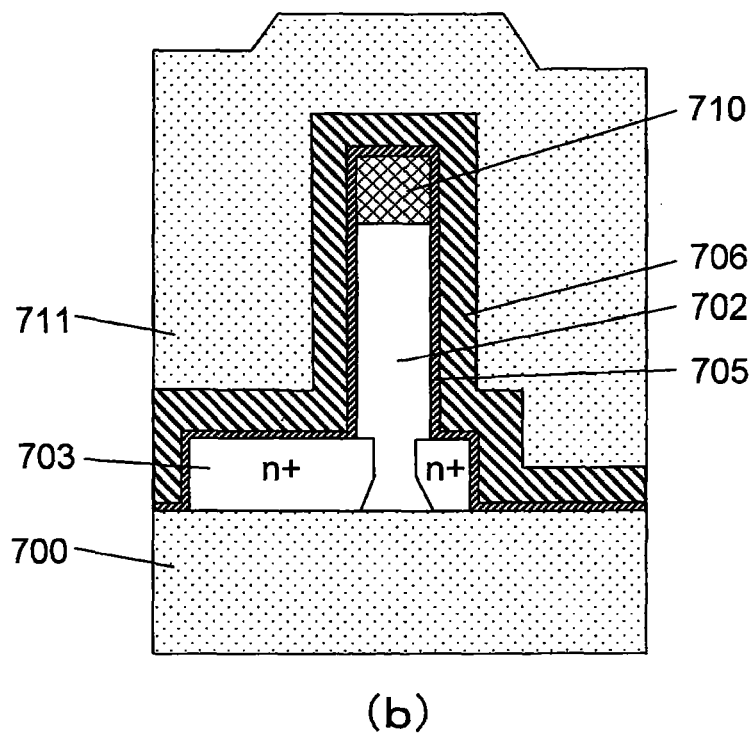

Referring to FIGS. 97(*a*) and 97(*b*), a silicon oxide film 711 is formed to allow the pillar-shaped silicon layer to be buried therein.

Figure 98:
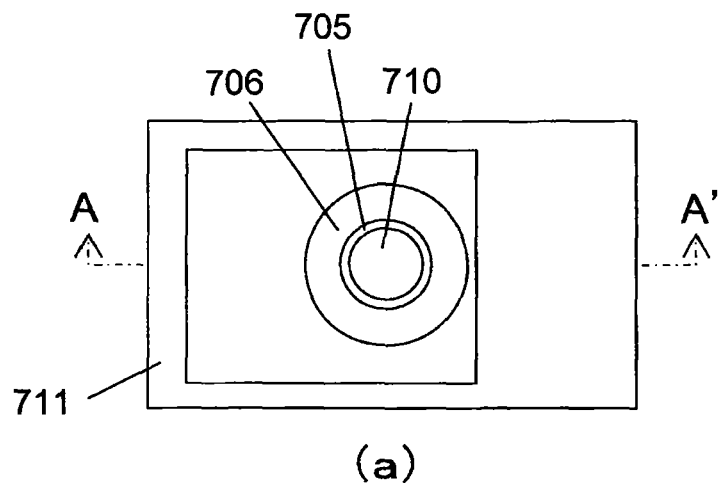
FIGS. 98(*a*) and 98(*b*) illustrate a part of the steps of the single-SGT production method according to the seventh embodiment.
Figure 98:
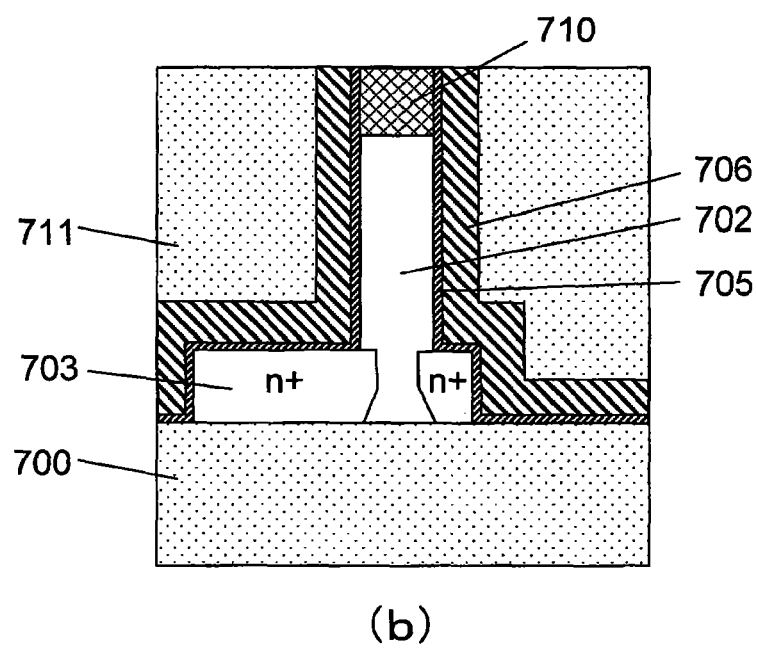

Referring to FIGS. 98(*a*) and 98(*b*), the silicon oxide film 711, and respective portions of the gate conductive film and the gate dielectric film above the pillar-shaped silicon layer, are polished by CMP, to flatten a top surface of the gate conductive film. Through the flattening of a top of the gate conductive film by CMP, a configuration of the gate conductive film is improved to facilitate control of a gate length. During the CMP, the silicon nitride film 710 on the top of the pillar-shaped silicon layer is used as a CMP stopper. The use of the silicon nitride film 710 as a CMP stopper makes it possible to control an amount of CMP with high repeatability.

Figure 99:
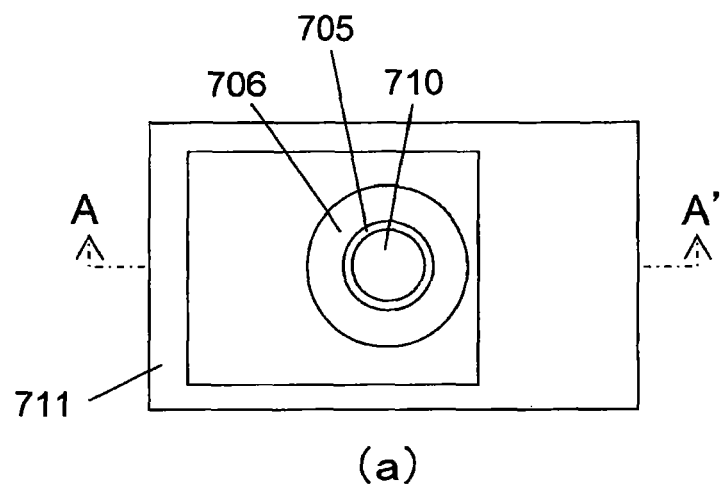
FIGS. 99(*a*) and 99(*b*) illustrate a part of the steps of the single-SGT production method according to the seventh embodiment.
Figure 99:
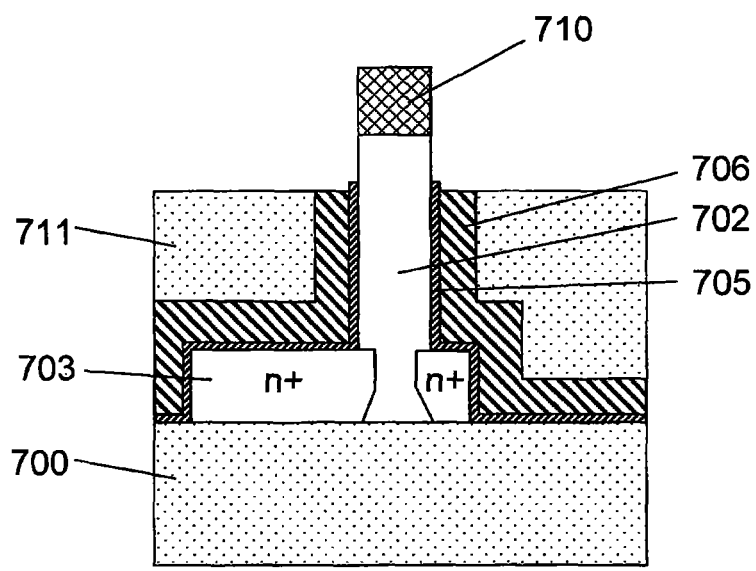

Referring to FIGS. 99(*a*) and 99(*b*), the gate conductive film 706 and the silicon oxide film 711 are etched back, wherein the gate conductive film 706 is etched to fix a gate length. Preferably, etching conditions to be used in this step are set to allow the gate conductive film 706 and the silicon oxide film 711 to be etched at the same rate, and at a higher selectivity ratio relative to the silicon nitride film 710. The etching of the gate conductive film 706 and the silicon oxide film 711 at the same rate makes it possible to suppress occurrence of a step between respective top surfaces of the two films, which improves a configuration of a silicon nitride film-based sidewall 712 to be formed in a next step.

Figure 100:
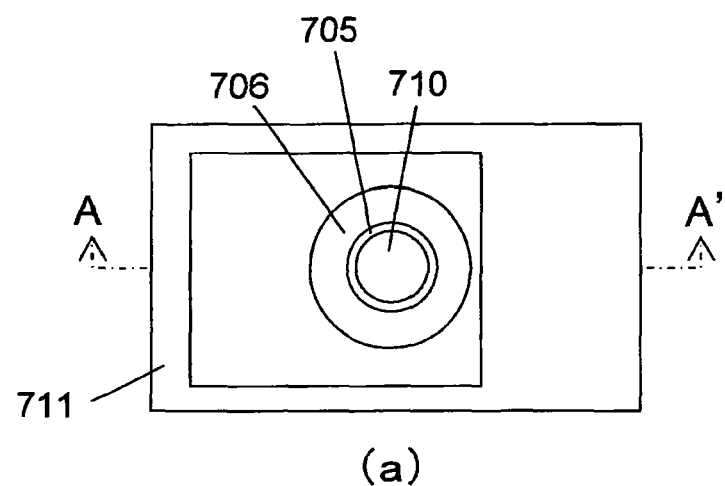
FIGS. 100(*a*) and 100(*b*) illustrate a part of the steps of the single-SGT production method according to the seventh embodiment.
Figure 100:
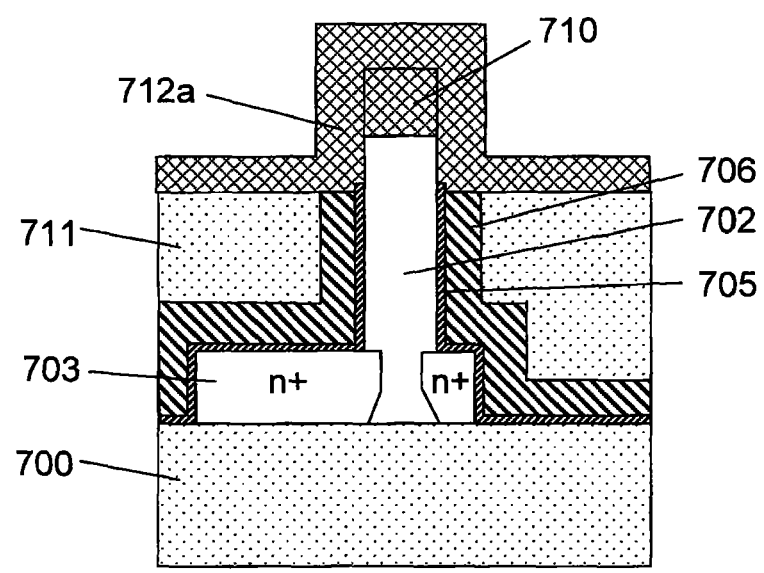
Figure 101:
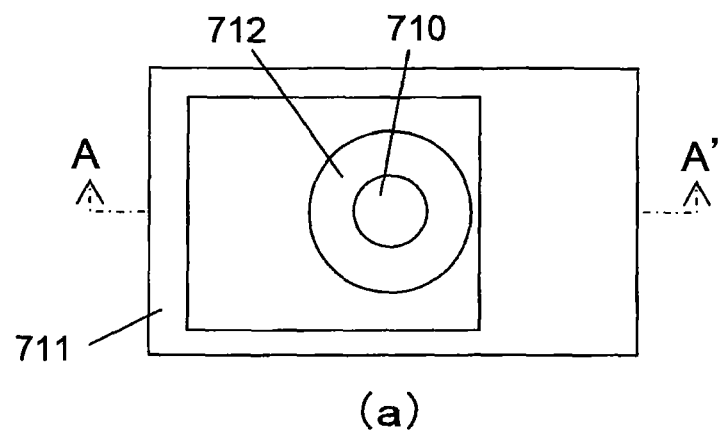
FIGS. 101(*a*) and 101(*b*) illustrate a part of the steps of the single-SGT production method according to the seventh embodiment.
Figure 101:
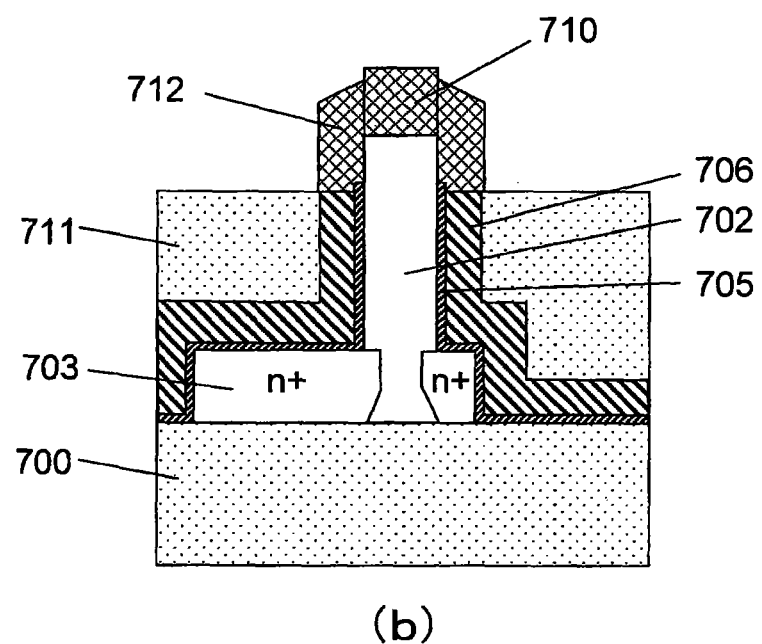

Referring to FIGS. 100(*a*) and 100(*b*), a silicon nitride film 712*a* is formed by a film thickness required for the gate conductive film 706. Subsequently, as shown in FIGS. 101(*a*) and 101(*b*), the silicon nitride film 712*a* is etched back to form a silicon nitride film-based sidewall 712. In this step, a film thickness of the silicon nitride film-based sidewall 712 is controlled to become equal to that of the gate conductive film 706, by adjusting a formed film thickness of the silicon nitride film 712*a*, and then finely adjusting the formed film thickness based on an amount of the etch-back. A portion of the gate conductive film 706 covered by the silicon nitride film-based sidewall 712 will be protected during etching for forming a gate line in a subsequent step. This makes it possible to form the gate electrode in a self-alignment manner and with a desired film thickness, so as to reduce an occupancy area.

Figure 102:
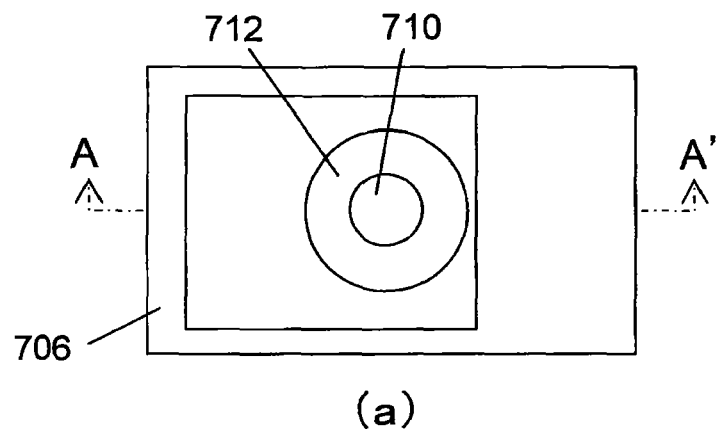
FIGS. 102(*a*) and 102(*b*) illustrate a part of the steps of the single-SGT production method according to the seventh embodiment.
Figure 102:
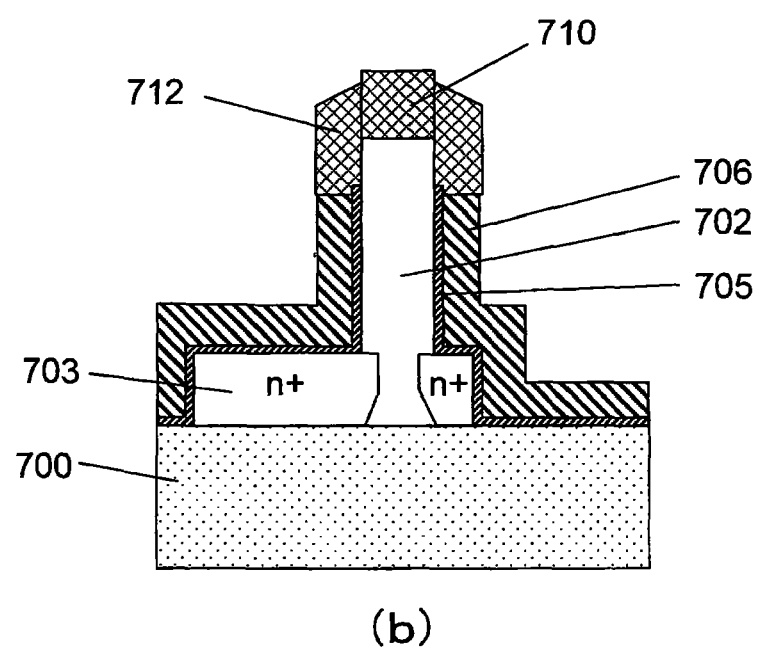

Referring to FIGS. 102(*a*) and 102(*b*), the silicon oxide film 711 remaining on the gate conductive film is removed by wet etching.

Figure 103:
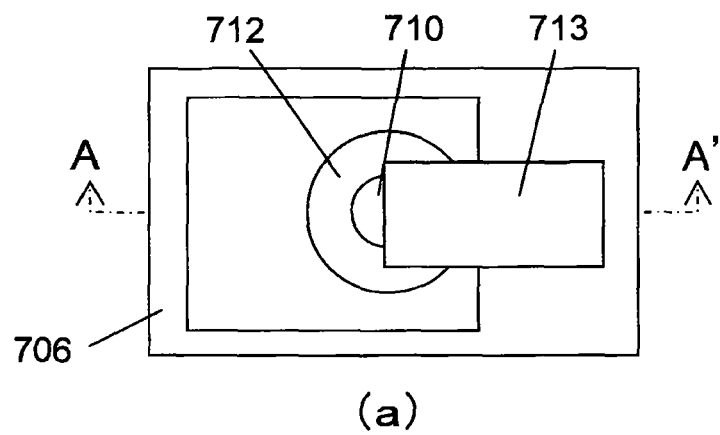
FIGS. 103(*a*) and 103(*b*) illustrate a part of the steps of the single-SGT production method according to the seventh embodiment.
Figure 103:
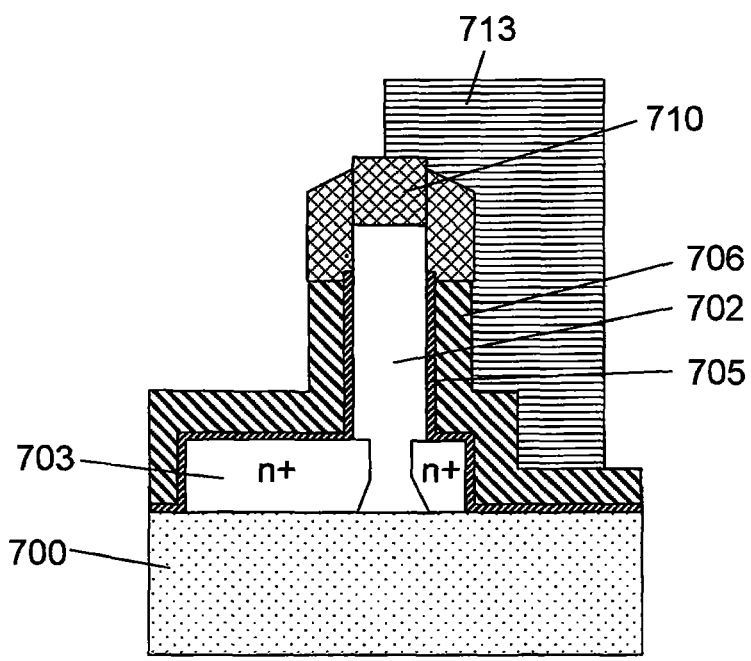

Referring to FIGS. 103(*a*) and 103(*b*), a resist or a multi-layer resist is applied, and a gate line pattern is formed with a resist 713 by lithography.

Figure 104:
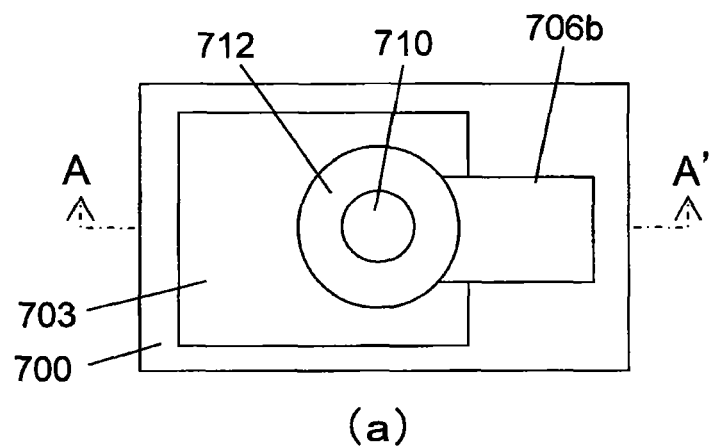
FIGS. 104(*a*) and 104(*b*) illustrate a part of the steps of the single-SGT production method according to the seventh embodiment.
Figure 104:
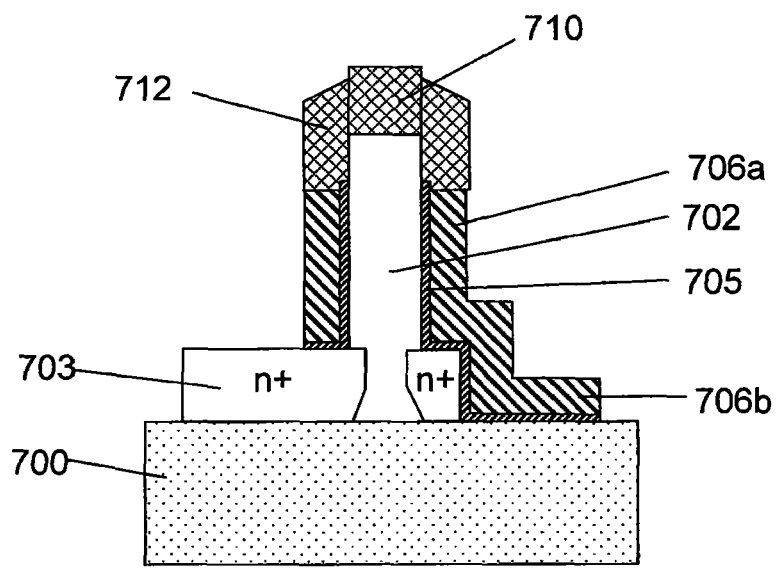

Referring to FIGS. 104(*a*) and 104(*b*), the gate conductive film and the gate dielectric film are etched using the resist as a mask, to form a gate electrode 706*a* and a gate line 706*b*.

Figure 105:
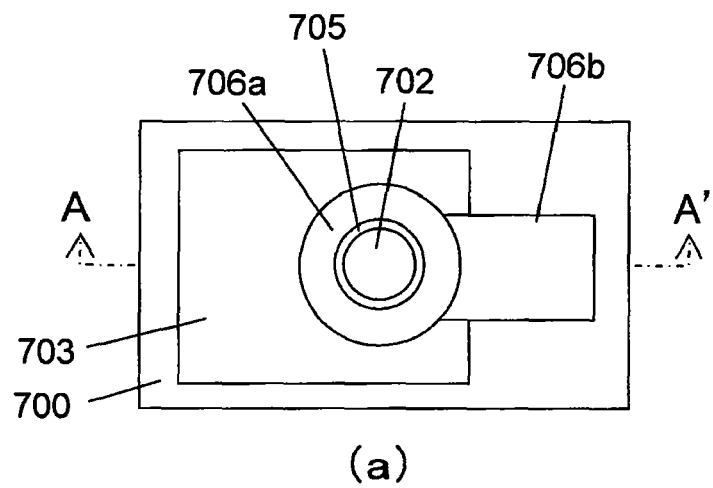
FIGS. 105(*a*) and 105(*b*) illustrate a part of the steps of the single-SGT production method according to the seventh embodiment.
Figure 105:
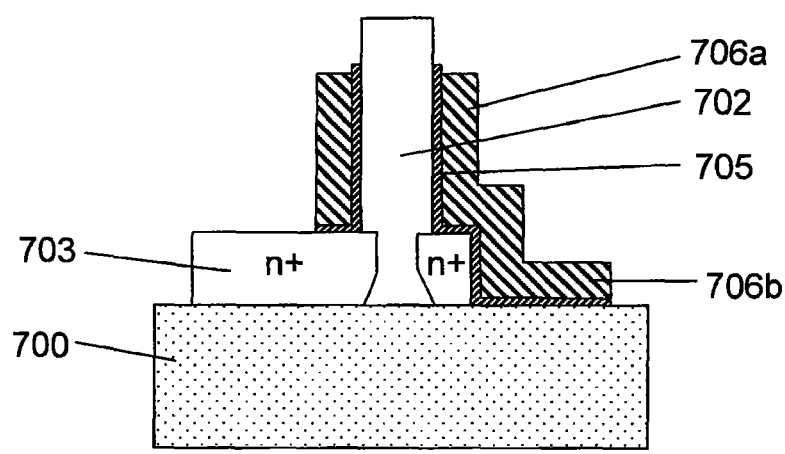

Referring to FIGS. 105(*a*) and 105(*b*), the silicon nitride film 710 on the top of the pillar-shaped silicon layer, and the silicon nitride film-based sidewall 712, are removed by wet etching.

Figure 106:
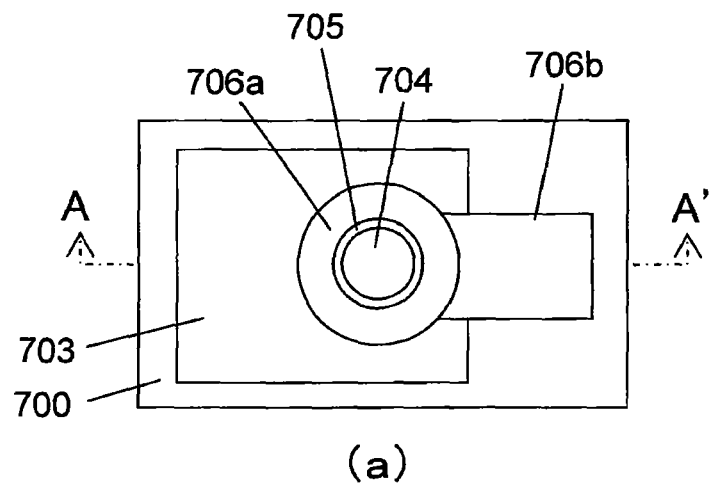
FIGS. 106(*a*) and 106(*b*) illustrate a part of the steps of the single-SGT production method according to the seventh embodiment.
Figure 106:
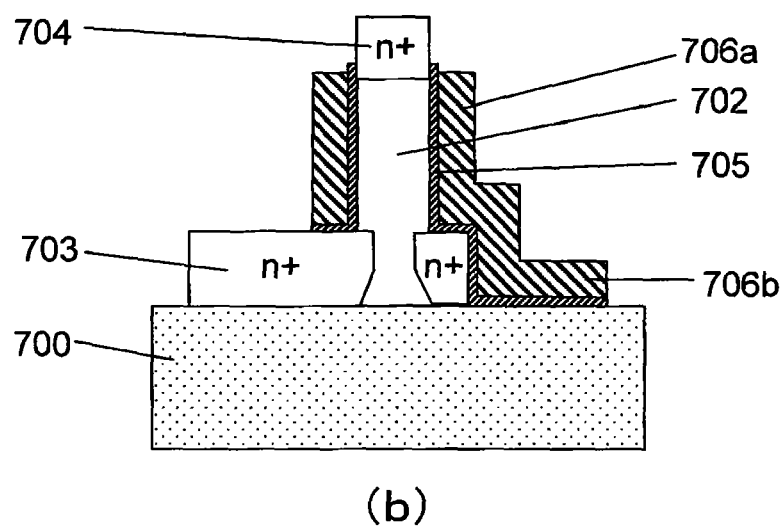

Referring to FIGS. 106(*a*) and 106(*b*), an impurity, such as P or As, is introduced into a top portion of the pillar-shaped silicon layer 702, for example, by ion implantation, to form an $N^+$ source diffusion layer 704 therein.

Figure 107:
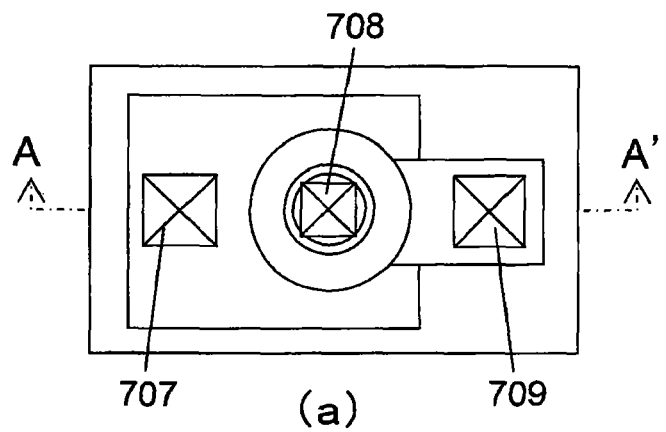
FIGS. 107(*a*) and 107(*b*) illustrate a part of the steps of the single-SGT production method according to the seventh embodiment.
Figure 107:
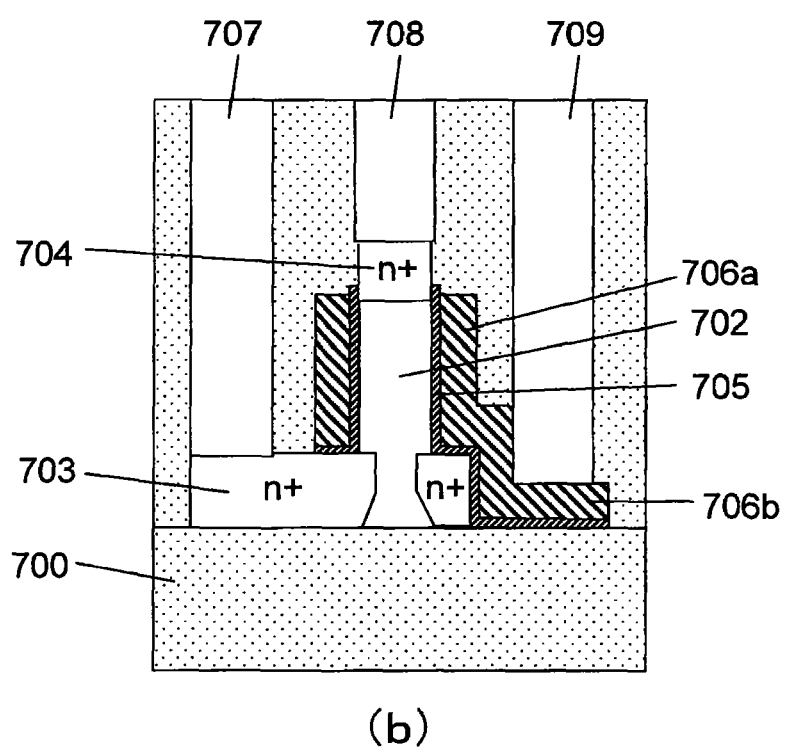

Referring to FIGS. 107(*a*) and 107(*b*), an interlayer dielectric film is formed, and a contact (707, 708, 709) is formed on each of the drain diffusion layer in the planar silicon layer, the source diffusion layer in the upper portion of the pillar-shaped silicon layer, and the gate line.

In the method according to the seventh embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the seventh embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening a top surface of a gate conductive film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the seventh embodiment makes it possible to simultaneously solve both the following problems: a disconnection or open of a gate line and a variation in gate length arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the seventh embodiment can form a gate electrode around a pillar-shaped silicon layer in a self-alignment manner and with a desired film thickness, and adjust a film thickness of the gate electrode to be formed around the pillar-shaped silicon layer, based on a formed film thickness of a gate conductive film. Thus, two pillar-shaped silicon layers each having a gate electrode to be applied with a different potential can be arranged side-by-side with a relatively small distance therebetween, to reduce a circuit area. In cases where the gate conductive film is formed to have a relatively small film thickness, a resistance value thereof becomes higher. Thus, in the seventh embodiment, the gate conductive film is preferably comprised of a metal film.

Eighth Embodiment

An eighth embodiment of the present invention shows a method of producing an NMOS SGT on an SOI substrate (SOI NMOS SGT), using the same gate forming process as that in the second embodiment.

The gate forming process in the eighth embodiment is capable of further reducing the number of steps and further increasing a process margin, as compared with the gate forming process in the seventh embodiment.

Figure 108:
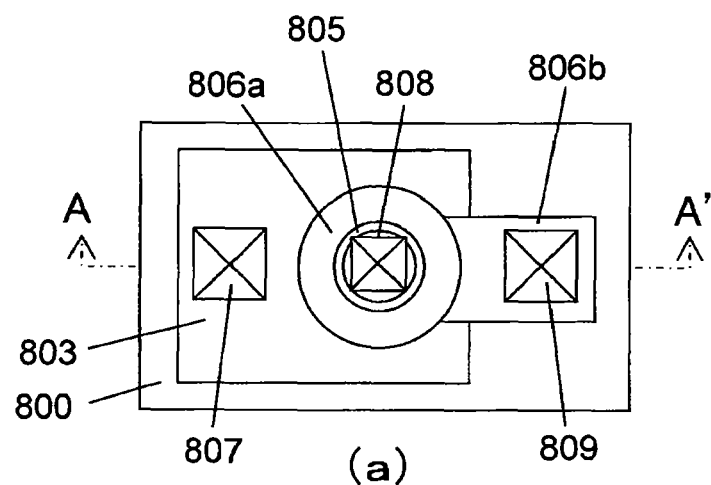
FIGS. 108(*a*) and 108(*b*) are, respectively, a top plan view and a sectional view of a single SGT formed by a production method according to an eighth embodiment of the present invention.
Figure 108:
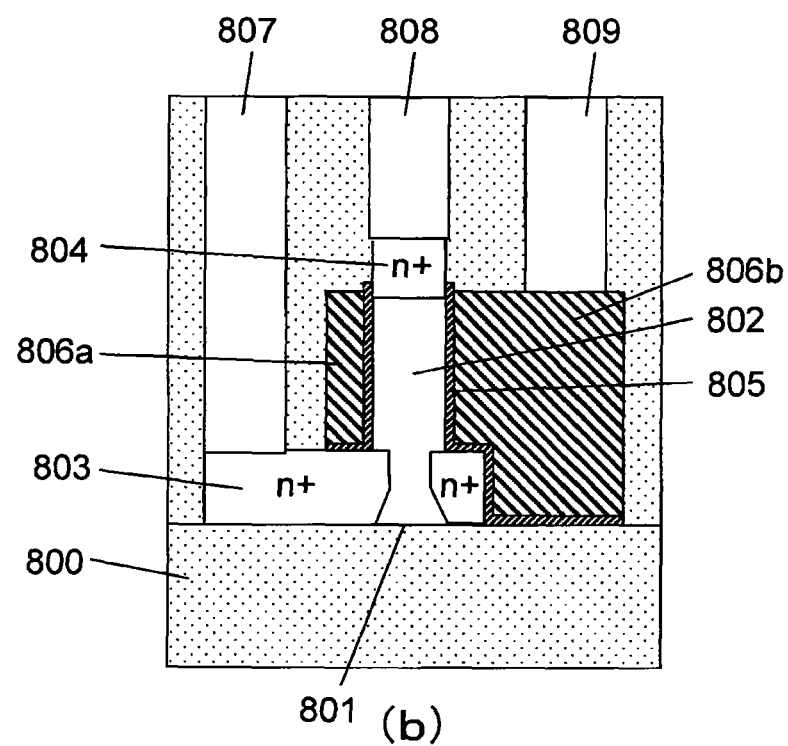
Figure 109:
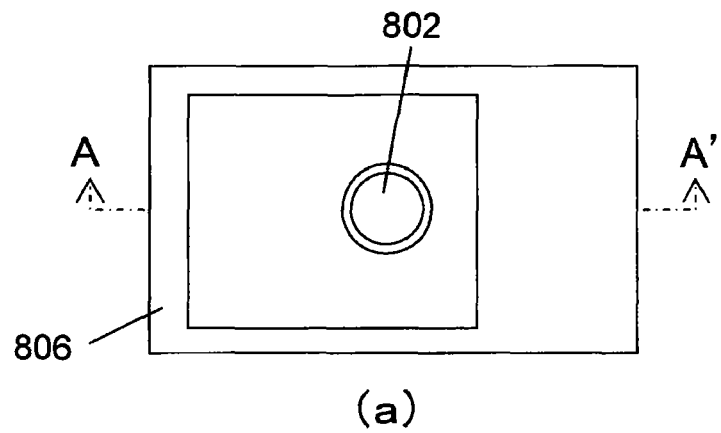
FIGS. 109(*a*) and 109(*b*) illustrate a part of a series of steps of the single-SGT production method according to the eighth embodiment.
Figure 109:
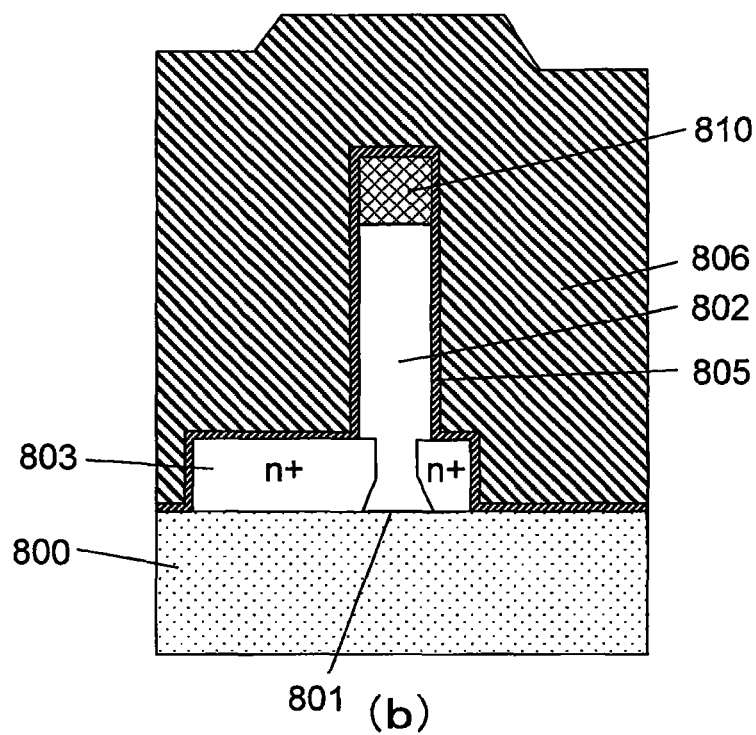
Figure 110:
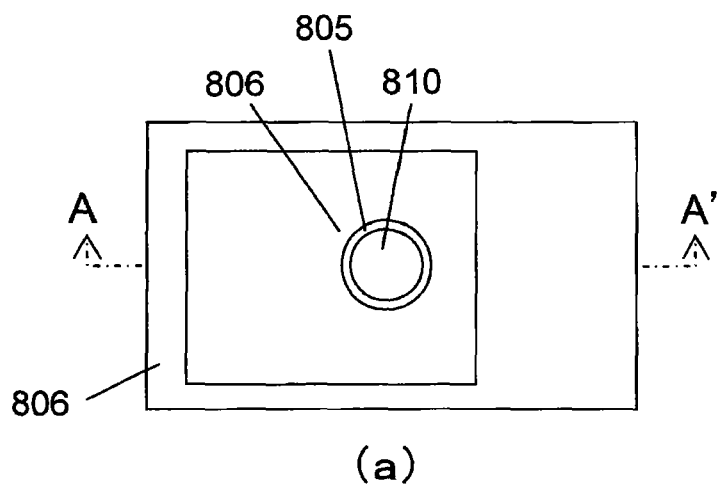
FIGS. 110(*a*) and 110(*b*) illustrate a part of the steps of the single-SGT production method according to the eighth embodiment.
Figure 110:
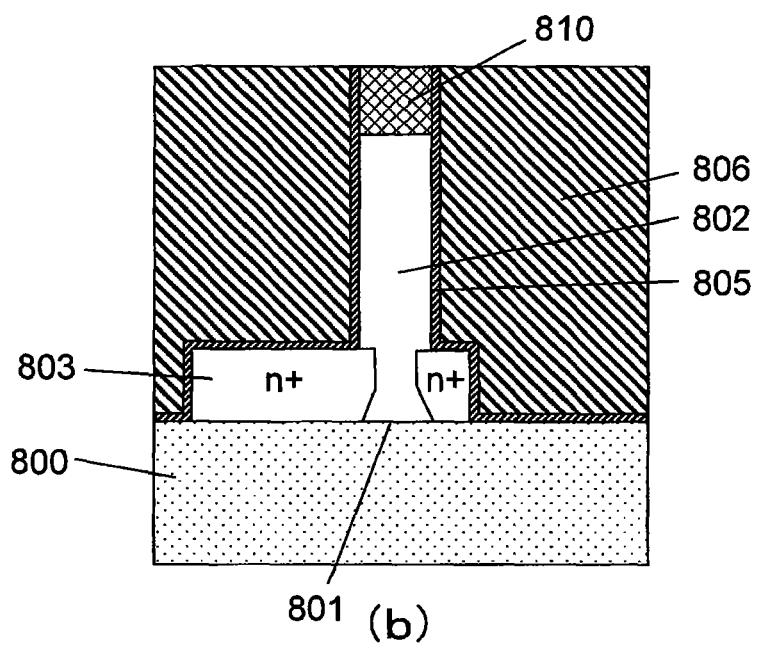
Figure 111:
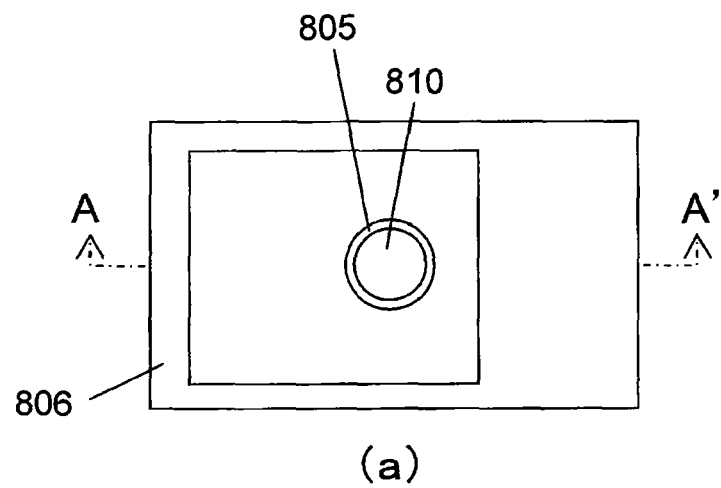
FIGS. 111(*a*) and 111(*b*) illustrate a part of the steps of the single-SGT production method according to the eighth embodiment.
Figure 111:
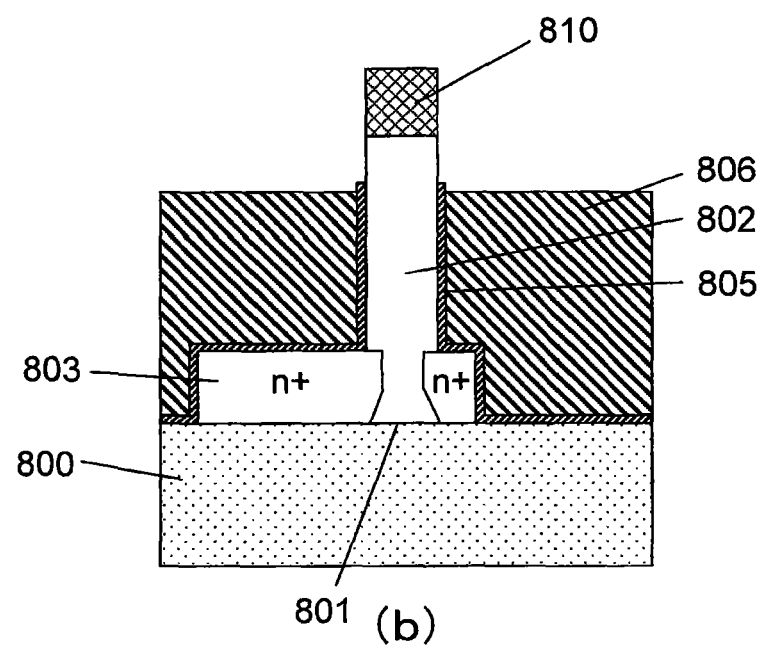
Figure 112:
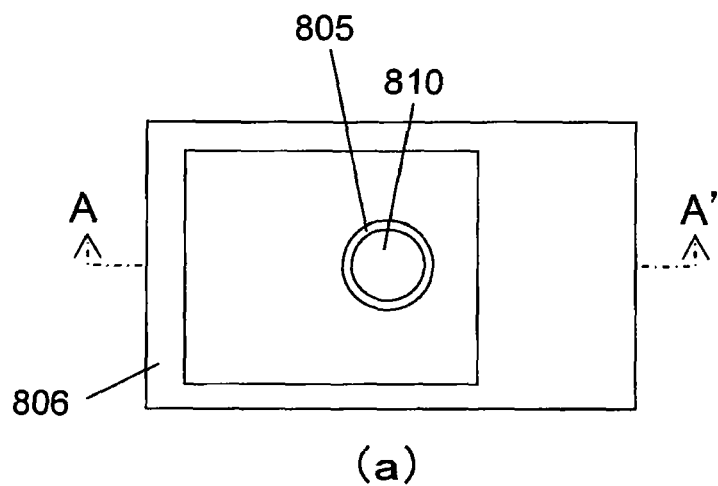
FIGS. 112(*a*) and 112(*b*) illustrate a part of the steps of the single-SGT production method according to the eighth embodiment.
Figure 112:
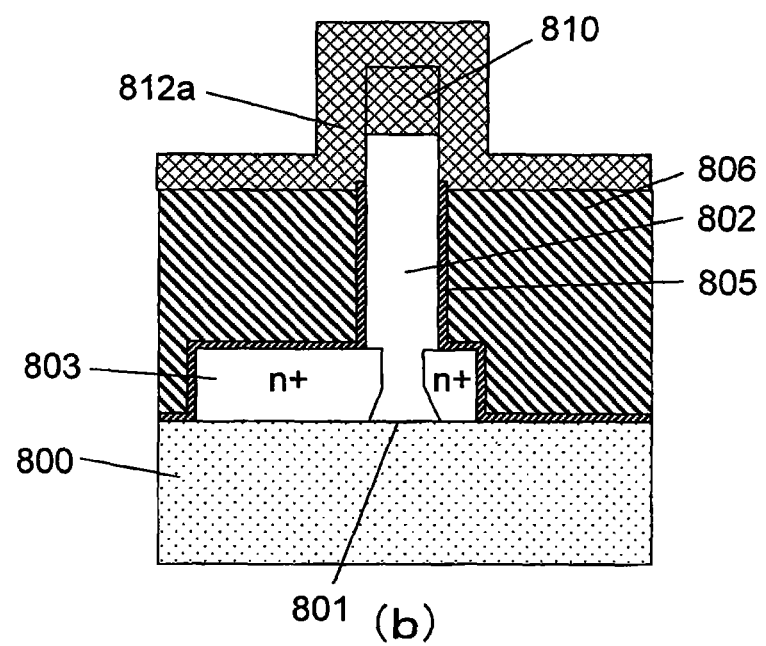
Figure 113:
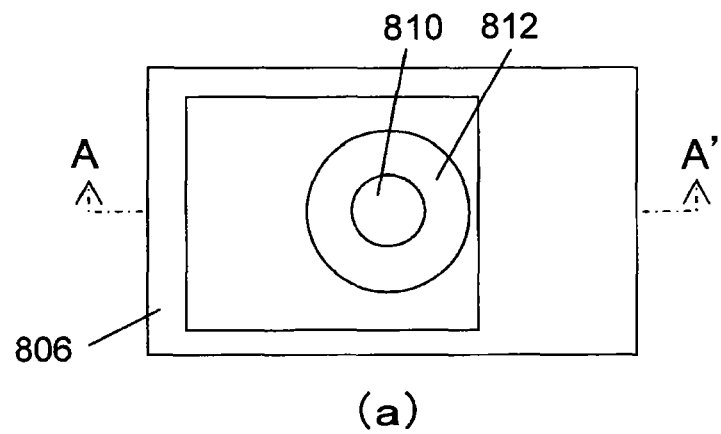
FIGS. 113(*a*) and 113(*b*) illustrate a part of the steps of the single-SGT production method according to the eighth embodiment.
Figure 113:
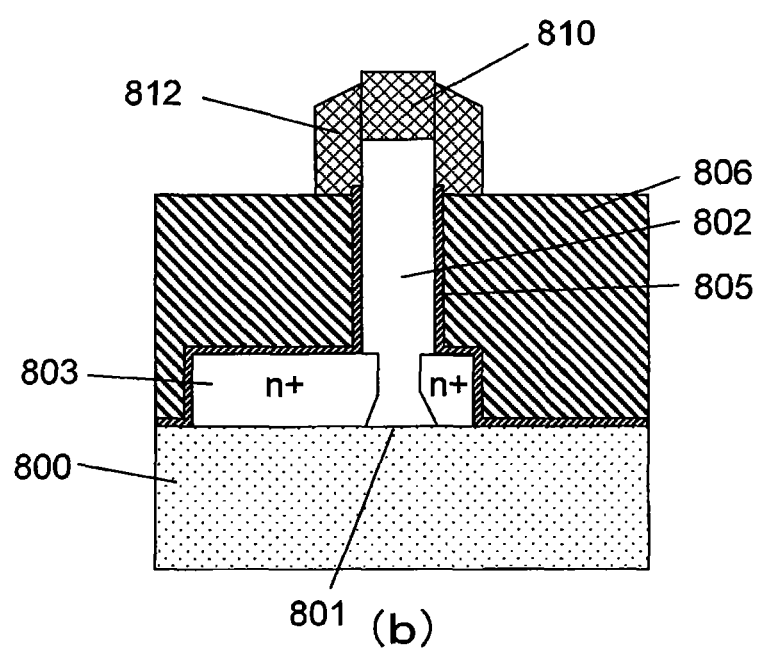
Figure 114:
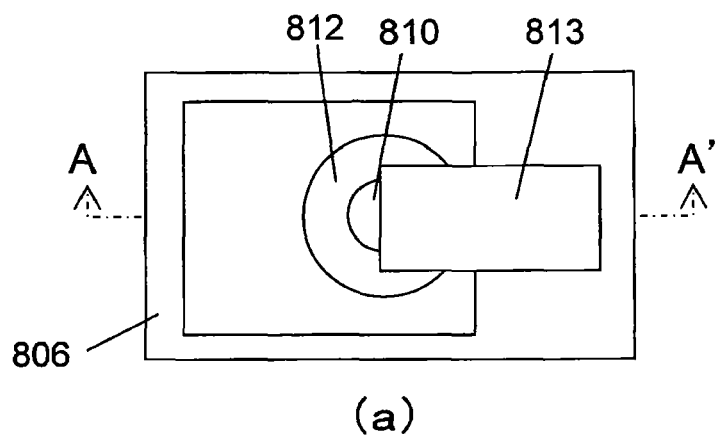
FIGS. 114(*a*) and 114(*b*) illustrate a part of the steps of the single-SGT production method according to the eighth embodiment.
Figure 114:
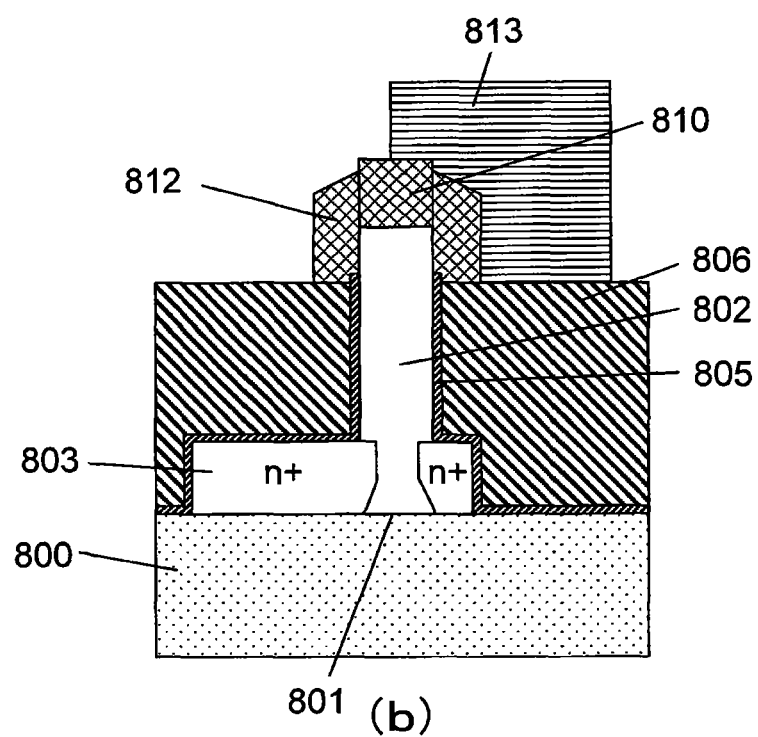
Figure 115:
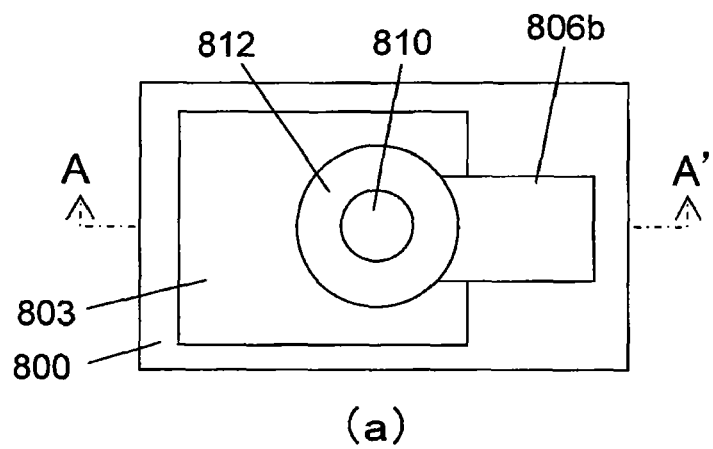
FIGS. 115(*a*) and 115(*b*) illustrate a part of the steps of the single-SGT production method according to the eighth embodiment.
Figure 115:
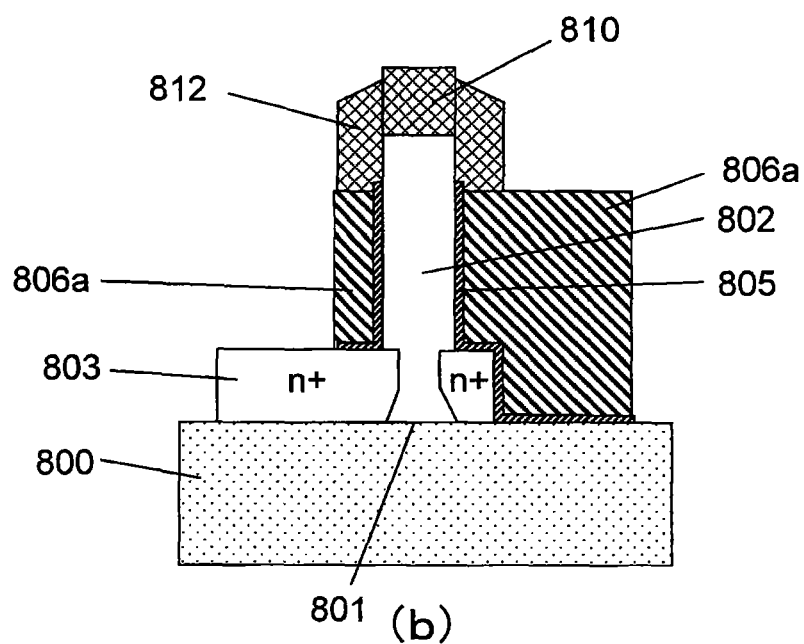
Figure 116:
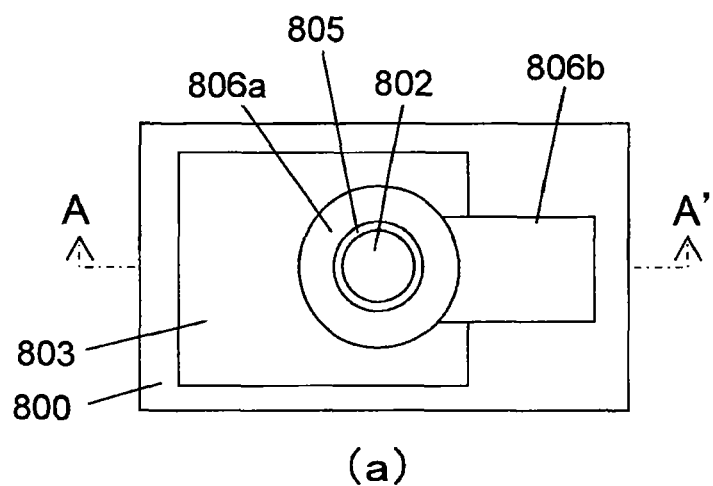
FIGS. 116(*a*) and 116(*b*) illustrate a part of the steps of the single-SGT production method according to the eighth embodiment.
Figure 116:
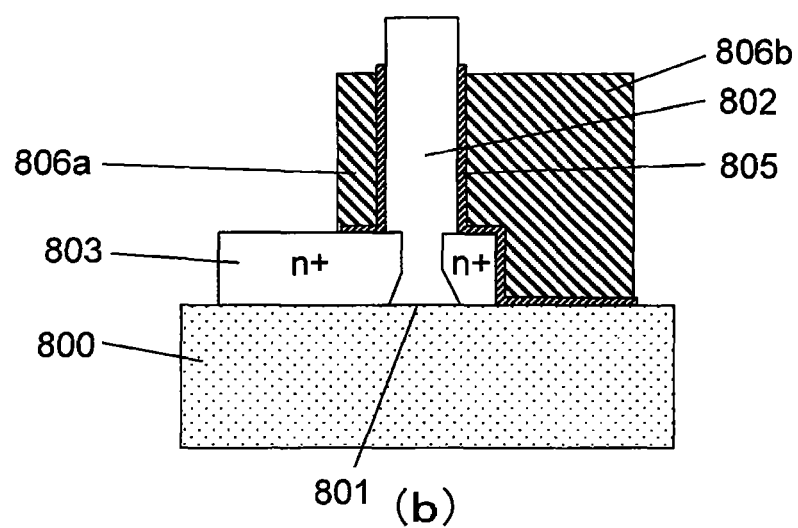
Figure 117:
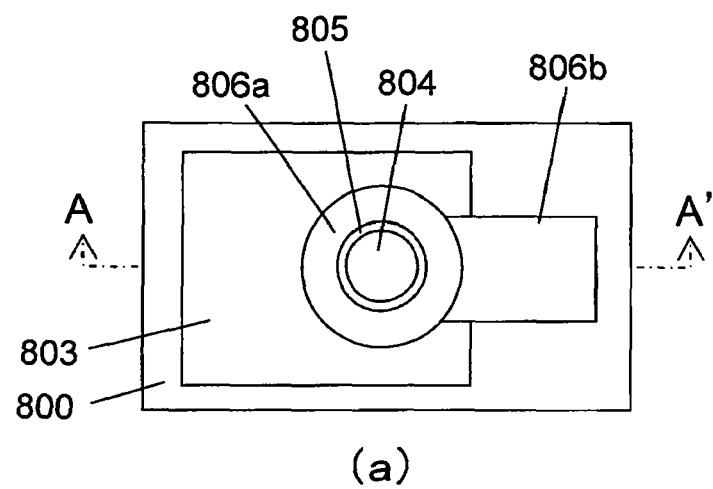
FIGS. 117(*a*) and 117(*b*) illustrate a part of the steps of the single-SGT production method according to the eighth embodiment.
Figure 117:
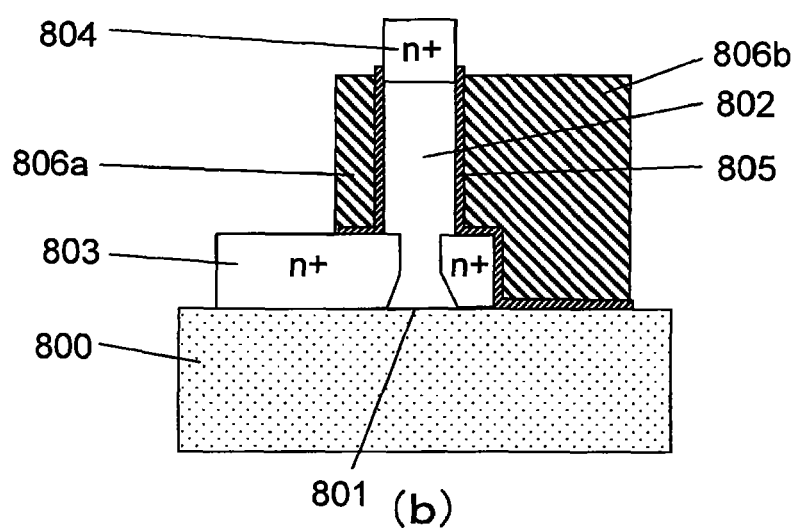
Figure 118:
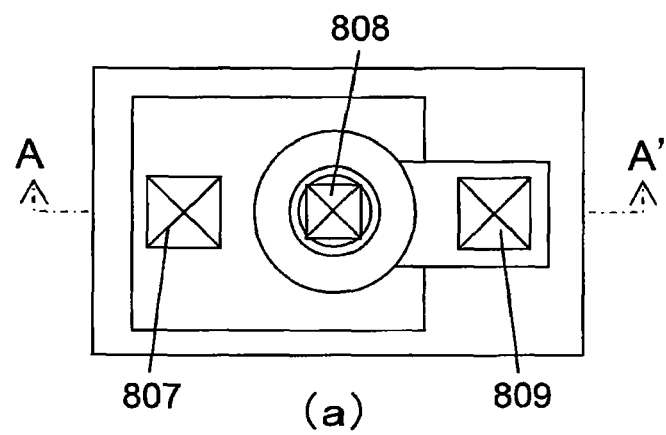
FIGS. 118(*a*) and 118(*b*) illustrate a part of the steps of the single-SGT production method according to the eighth embodiment.
Figure 118:
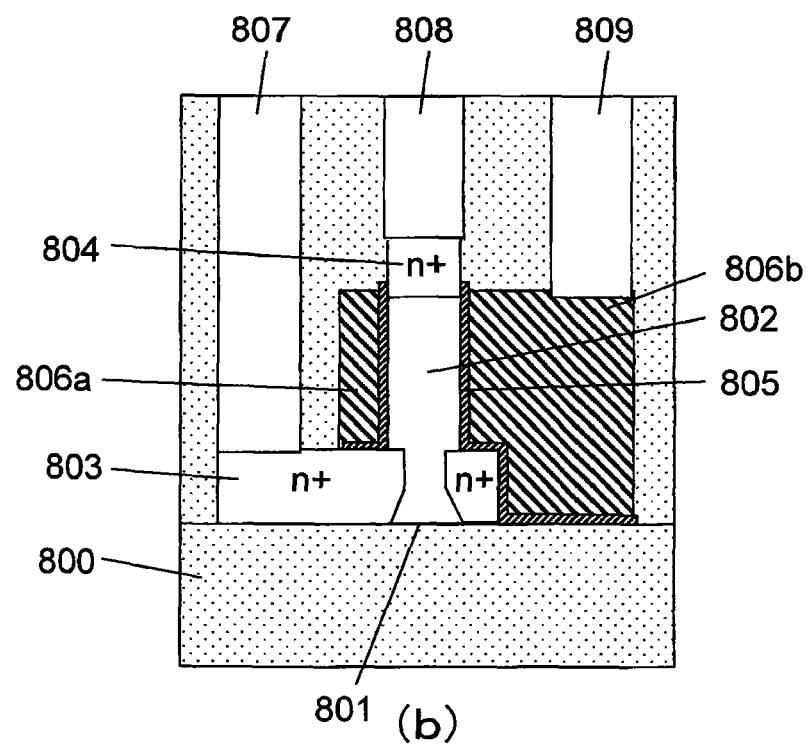

FIGS. 108(a) and 108(b) are, respectively, a top plan view and a sectional view of the SOI NMOS SGT formed by the SGT production method according to the eighth embodiment. With reference to FIGS. 108(a) and 108(b), the SOI NMOS SGT formed by the SGT production method according to the eighth embodiment will be described below.

A planar silicon layer 801 is formed on a buried oxide film layer 800. A pillar-shaped silicon layer 802 is formed on the planar silicon layer 801, and a gate dielectric film 805 and a gate electrode 806a are formed around the pillar-shaped silicon layer 802. An $N^+$ drain diffusion layer 803 is formed in the planar silicon layer 801 beneath the pillar-shaped silicon layer 802, and an $N^+$ source diffusion layer 804 is formed in an upper portion of the pillar-shaped silicon layer. A contact 807, a contact 808, and a contact 809, are formed on the $N^+$ drain diffusion layer 803, the $N^+$ source diffusion layer 804, and a gate line 806b extending from the gate electrode 806a, respectively. In the eighth embodiment, the gate electrode 806a and the gate line 806b are formed to be at the same height position.

Under conditions that the $N^+$ source diffusion layer is connected to a GND potential, and the $N^+$ drain diffusion layer is connected to a power supply potential Vcc, a potential ranging from zero to Vcc is applied to the gate electrode to allow the SGT to operate as a transistor.

With reference to FIGS. 109(a) to 118(b), one example of the SGT production method according to the eighth embodiment will be described below. In FIGS. 109(a) to 118(b), the figure suffixed by (a) is a top plan view, and the figure suffixed by (b) is a sectional view taken along the line A-A'.

In the eighth embodiment, the step of forming a gate dielectric film and any step therebefore are the same as those in the seventh embodiment. Thus, the following description will be started from the step of forming a gate conductive film.

Referring to FIGS. 109(a) and 109(b), a gate dielectric film 805 and a gate conductive film 806 is formed by CVD or ALD, wherein the gate conductive film 806 is formed to allow a pillar-shaped silicon layer 802 to be buried therein.

Referring to FIGS. 110(a) and 110(b), the gate conductive film 806 is polished by CMP, to flatten a top surface of the gate conductive film. Through the flattening of a top of the gate conductive film by CMP, a configuration of the gate conductive film is improved to facilitate control of a gate length. During the CMP, a silicon nitride film 810 on a top of a pillar-shaped silicon layer is used as a CMP stopper. The use of the silicon nitride film 810 as a CMP stopper makes it possible to control an amount of CMP with high repeatability.

Referring to FIGS. 111(a) and 111(b), the gate conductive film 806 is etched back to fix a gate length.

Referring to FIGS. 112(a) and 112(b), a silicon nitride film 812a is formed by a film thickness required for an aftermentioned gate electrode. Subsequently, as shown in FIGS. 113(a) and 113(b), the silicon nitride film 812a is etched back to form a silicon nitride film-based sidewall 812. In the eighth embodiment, a film thickness of the gate electrode is determined by a film thickness of the silicon nitride film-based sidewall 812. Thus, a final film thickness of the silicon nitride film-based sidewall 812 is controlled to become equal to a desired film thickness of the gate electrode, by adjusting a formed film thickness of the silicon nitride film 812a and then finely adjusting the formed film thickness based on an amount of the etch-back.

Referring to FIGS. 114(a) and 114(b), a resist or a multilayer resist is applied, and a gate line pattern is formed with a resist 813 by lithography.

Referring to FIGS. 115(a) and 115(b), the gate conductive film and the gate dielectric film are etched using the resist as a mask, to form a gate electrode 806a and a gate line 806b.

Referring to FIGS. 116(a) and 116(b), the silicon nitride film 810 on the top of the pillar-shaped silicon layer, and the silicon nitride film-based sidewall 812, are removed by wet etching.

Referring to FIGS. 117(a) and 117(b), an impurity, such as P or As, is introduced into a top portion of the pillar-shaped silicon layer 802, for example, by ion implantation, to form an $N^+$ source diffusion layer 804 therein.

Referring to FIGS. 118(a) and 118(b), an interlayer dielectric film is formed, and a contact (807, 808, 809) is formed on each of the drain diffusion layer in the planar silicon layer, the source diffusion layer in the upper portion of the pillar-shaped silicon layer, and the gate line.

In the method according to the eighth embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the eighth embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening a top surface of a gate conductive film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the eighth embodiment makes it possible to simultaneously solve both the following problems: a disconnection or open of a gate line and a variation in gate length arising from a lithography step of forming the gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the eighth embodiment can form a gate electrode around a pillar-shaped silicon layer in a self-alignment manner and with a desired film thickness. In the seventh embodiment, a film thickness of a gate electrode is controlled based on a formed film thickness of a gate conductive film. Differently, in the eighth embodiment, the film thickness of the gate electrode can be controlled based on a film thickness of the silicon nitride film-based sidewall 812. Further, in the eighth embodiment, the gate line 806b has a relatively large film thickness as compared with that of the gate line in the seventh embodiment.

Thus, the gate conductive film is not limited to a metal film, but may be made of a material having relatively high electrical resistance, such as polysilicon.

In the seventh embodiment, if the silicon nitride film-based sidewall has a film thickness largely different from that of the gate conductive film, the difference is likely to cause the problems as described in connection with the second embodiment. Differently, the gate forming process in the eighth embodiment can form a gate electrode to have a desired film thickness, in a self-alignment manner according to a film thickness of the silicon nitride film-based sidewall 812, as with the second embodiment. This makes it possible to eliminate a risk of occurrence of the above problems, and further increase a process margin in the gate forming process, as compared with that in the seventh embodiment.

Ninth Embodiment

A ninth embodiment of the present invention shows a method of producing an NMOS SGT on an SOI substrate (SOI NMOS SGT), using the same gate forming process as that in the third embodiment.

The gate forming process is different from that in the eighth embodiment, in that a gate electrode and a gate line extending from the gate electrode are formed in a layered structure which comprises a thin metal film and a polysilicon layer. In a gate forming process in the ninth embodiment, the thin metal film is formed to be in contact with a gate dielectric film so as to suppress depletion of the gate electrode, and the polysilicon layer is formed to define respective top surfaces of the gate electrode and the gate line, so as to allow the SGT to be produced in the same production line as that for a transistor having a conventional polysilicon gate.

Figure 119:
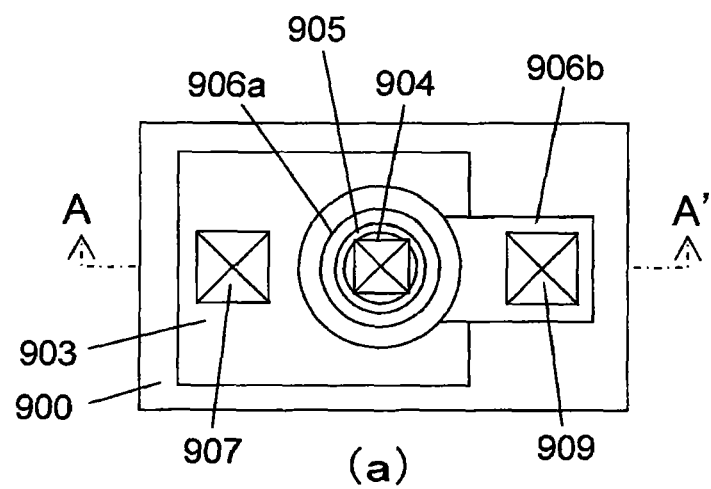
FIGS. 119(*a*) and 119(*b*) are, respectively, a top plan view and a sectional view of a single SGT formed by a production method according to a ninth embodiment of the present invention.
Figure 119:
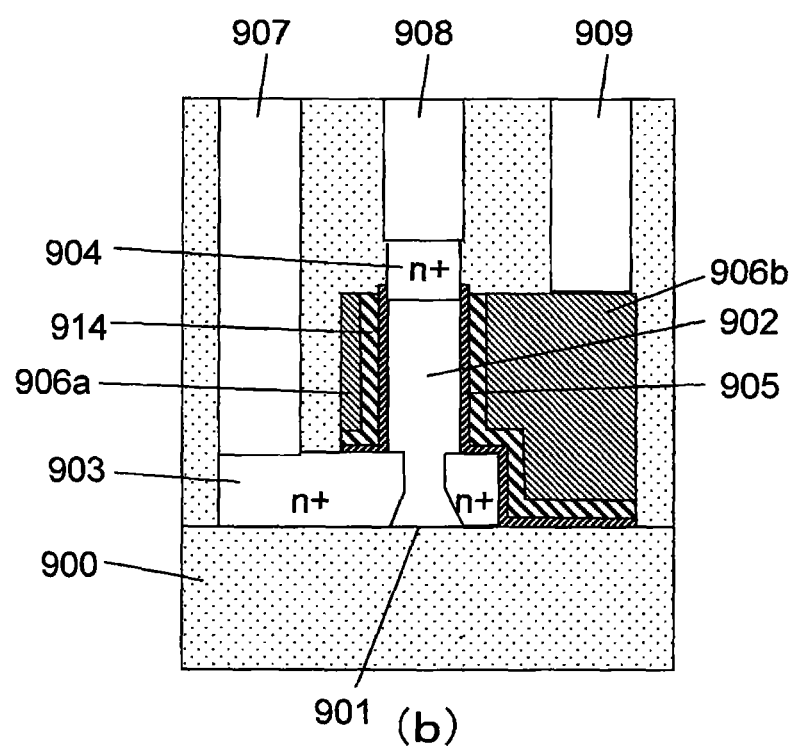

FIGS. 119(a) and 119(b) are, respectively, a top plan view and a sectional view of the SOI NMOS SGT formed by the SGT production method according to the ninth embodiment. With reference to FIGS. 119(a) and 119(b), the SOI NMOS SGT formed by the method according to the ninth embodiment will be described below.

A planar silicon layer 901 is formed on a buried oxide film layer 900. A pillar-shaped silicon layer 902 is formed on the planar silicon layer 901, and a gate dielectric film 905 and a gate electrode 906a are formed around the pillar-shaped silicon layer 902. The gate electrode has a layered structure which comprises a thin metal film 314 having a film thickness of about 1 to 10 nm, and a polysilicon layer 906a covering the metal film. An $N^+$ drain diffusion layer 903 is formed in the planar silicon layer 901 beneath the pillar-shaped silicon layer 902, and an $N^+$ source diffusion layer 804 is formed in an upper portion of the pillar-shaped silicon layer 902. A contact 907, a contact 908, and a contact 909, are formed on the $N^+$ drain diffusion layer 903, the $N^+$ source diffusion layer 904, and a gate line 906b extending from the gate electrode 906a, respectively. In the ninth embodiment, the gate electrode 906a and the gate line 906b are formed to be at the same height position.

Under conditions that the $N^+$ source diffusion layer is connected to a GND potential, and the $N^+$ drain diffusion layer is connected to a power supply potential Vcc, a potential ranging from zero to Vcc is applied to the gate electrode to allow the SGT to operate as a transistor.

With reference to FIGS. 120(a) to 130(b), one example of the SGT production method according to the ninth embodiment will be described below. In FIGS. 120(a) to 130(b), the figure suffixed by (a) is a top plan view, and the figure suffixed by (b) is a sectional view taken along the line A-A'.

In the ninth embodiment, the step of forming a gate dielectric film and any step therebefore are the same as those in the seventh embodiment. Thus, the following description will be started from the step of forming a thin metal film and a polysilicon layer.

Referring to FIGS. 120(a) and 120(b), after forming a gate dielectric film 905, a thin metal film 914 is formed to have a film thickness of about 1 to 10 nm, and then a polysilicon layer 906 is formed to allow a pillar-shaped silicon layer 902 to be buried therein.

Referring to FIGS. 121(a) and 121(b), the polysilicon layer 906, and respective portions of the thin metal film 914 and the gate dielectric film 905 above the pillar-shaped silicon layer, are polished by CMP, to flatten respective top surfaces of the polysilicon layer 906 and the thin metal film 914. Through the flattening of respective tops of the polysilicon layer 906 and the thin metal film 914 by CMP, respective configurations of the polysilicon layer 906 and the thin metal film 914 are improved to facilitate control of a gate length. During the CMP, a silicon nitride film 910 on a top of the pillar-shaped silicon layer is used as a CMP stopper. The use of the silicon nitride film 910 as a CMP stopper makes it possible to control an amount of CMP with high repeatability.

Referring to FIGS. 122(a) and 122(b), the polysilicon layer 906 and the thin metal film 914 are etched back to fix a gate length.

Referring to FIGS. 123(a) and 123(b), a silicon nitride film 912a is formed by a film thickness required for an after-mentioned gate electrode. Subsequently, as shown in FIGS. 124(a) and 124(b), the silicon nitride film 912a is etched back to form a silicon nitride film-based sidewall 912. In the ninth embodiment, a film thickness of the gate electrode is determined by a film thickness of the silicon nitride film-based sidewall 912. Thus, a final film thickness of the silicon nitride film-based sidewall is controlled to become equal to a desired film thickness of the gate electrode, by adjusting a formed film thickness of the silicon nitride film 912a and then finely adjusting the formed film thickness based on an amount of the etch-back.

Referring to FIGS. 125(a) and 125(b), a resist or a multilayer resist is applied, and a gate line pattern is formed with a resist 913 by lithography.

Referring to FIGS. 126(a) and 126(b), the polysilicon layer, the thin metal film and the gate dielectric film are etched using the resist as a mask, to form a gate electrode 906a and a gate line 906b.

Referring to FIGS. 127(a) and 127(b), the silicon nitride film 910 on the top of the pillar-shaped silicon layer, and the silicon nitride film-based sidewall 912, are removed by wet etching.

Referring to FIGS. 128(a) and 128(b), a silicon nitride film is formed and then etched back to form a silicon nitride film 915. The silicon nitride film 915 is formed to cover the thin metal film 914 of the gate electrode to keep a top surface of the thin metal film 914 from being exposed. This makes it possible to produce an intended SGT in the same production line as that for a transistor having a conventional polysilicon gate.

Referring to FIGS. 129(a) and 129(b), an impurity, such as P or As, is introduced into a top portion of the pillar-shaped silicon layer 902, for example, by ion implantation, to form an $N^+$ source diffusion layer 904 therein.

Referring to FIGS. 130(a) and 130(b), an interlayer dielectric film is formed, and a contact (907, 908, 909) is formed on each of the drain diffusion layer in the planar silicon layer, the source diffusion layer in the upper portion of the pillar-shaped silicon layer, and the gate line.

In the method according to the ninth embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the ninth embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening respective top surfaces of a polysilicon layer and a thin metal film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the ninth embodiment makes it possible to simultaneously solve both the following problems: a disconnection or open of a gate line and a variation in gate length arising from a lithography step of forming the gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the ninth embodiment can form a gate electrode around a pillar-shaped silicon layer in a self-alignment manner and with a desired film thickness, and control a film thickness of the gate electrode based on a film thickness of the silicon nitride film-based sidewall 912, as with the second embodiment.

In the ninth embodiment, a gate is formed in a layered structure which comprises the thin metal film and the polysilicon layer, which is capable of suppressing depletion of the gate electrode, and allowing an intended SGT to be produced in the same production line as that for a transistor having a conventional polysilicon gate.

In the seventh embodiment, if the silicon nitride film-based sidewall has a film thickness largely different from that of the gate conductive film, the difference is likely to cause the problems as described in connection with the second embodiment. Differently, the gate forming process in the ninth embodiment can form a gate electrode to have a desired film thickness, in a self-alignment manner according to a film thickness of the silicon nitride film-based sidewall 912, as with the second embodiment. This makes it possible to eliminate a risk of occurrence of the above problems, and further increase a process margin in the gate forming process, as compared with that in the seventh embodiment.

Tenth Embodiment

A tenth embodiment of the present invention shows a method of producing a CMOS SGT on an SOI substrate (SOI CMOS SGT), using the same gate forming process as that in the seventh embodiment. Thus, the method according to the tenth embodiment can be employed to obtain the same advantageous effects as those in the seventh embodiment.

FIG. 131 is an equivalent circuit diagram of a CMOS inverter formed by the method according to the tenth embodiment. A circuit operation of the CMOS inverter will be described below. An input signal Vin 4 is applied to a gate of an NMOS Qn 4 and a gate of a PMOS Qp 4. When the Vin 4 is "1", the NMOS Qn 4 is placed in an ON state, and the PMOS Qp 4 is placed in an OFF state, so that an output signal Vout 4 becomes "0". Reversely, when the Vin 4 is "0", the NMOS Qn 4 is placed in an OFF state, and the PMOS Qp 4 is placed in an ON state, so that the Vout 4 becomes "1". As above, the CMOS inverter is operable to allow the output signal Vout 4 to have a value opposite to that of the input signal Vin 4.

FIG. 132 is a top plan view of the CMOS inverter formed by the method according to the tenth embodiment. FIGS. 133(*a*) and 133(*b*) are sectional views taken along the cutting-plane line A-A' and the cutting-plane line B-B' in FIG. 132, respectively. With reference to FIGS. 132, 133(*a*) and 133(*b*), a structure of the CMOS inverter will be described.

A planar silicon layer (1002, 1003) is formed on a buried oxide film layer 1000. A pillar-shaped silicon layer 1007 is formed on the planar silicon layer 1002, and a pillar-shaped silicon layer 1008 is formed on the planar silicon layer 1003. A gate dielectric film 1009 and a gate electrode (1010*a*, 1010*b*) are formed around the pillar-shaped silicon layers. The gate electrodes 1010*a*, 1010*b* are connected to each other through a gate line 1010*c* extending therefrom. An $N^+$ drain diffusion layer 1004 is formed in the planar silicon layer 1002 beneath the pillar-shaped silicon layer 1007 forming an NMOS (NMOS-forming pillar-shaped silicon layer 1007), and an $N^+$ source diffusion layer 1011 is formed in an upper portion of the pillar-shaped silicon layer 1007. A $P^+$ drain diffusion layer 1005 is formed in the planar silicon layer 1003 beneath the pillar-shaped silicon layer 1008 forming a PMOS (PMOS-forming pillar-shaped silicon layer 1008), and a $P^+$ source diffusion layer 1012 is formed in an upper portion of the pillar-shaped silicon layer 1008.

Each of the $N^+$ drain diffusion layer 1004 and the $P^+$ drain diffusion layer 1005 formed beneath respective ones of the pillar-shaped silicon layers 1007, 1008 is connected to the output terminal Vout 4 via a contact (1016*a*, 1016*b*). The $N^+$ source diffusion layer 1011 formed in the upper portion of the NMOS-forming pillar-shaped silicon layer 1007 is connected to a ground potential Vss 4 via a contact 1014, and the $P^+$ source diffusion layer 1012 formed in the upper portion of the PMOS-forming pillar-shaped silicon layer 1008 is connected to a power supply potential Vcc 4 via a contact 1015. Further, the gate line 1010*c* connecting between the gate electrodes for the PMOS and the NMOS is connected to the input terminal Vin 4 via a contact 1013. In this manner, the CMOS inverter is formed.

With reference to FIGS. 134(*a*) to 149(*b*), one example of the SGT production method according to the tenth embodiment will be described below. In FIGS. 134(*a*) to 149(*b*), the figure suffixed by (a) is a top plan view, and the figure suffixed by (b) is a sectional view taken along the line A-A'.

Referring to FIGS. 134(*a*) and 134(*b*), a silicon nitride film 1017 serving as a hard mask is formed on a silicon layer 1001*a* on a buried oxide film layer 1000 in an SOI substrate, to have a film thickness of about 50 to 150 nm.

Referring to FIGS. 135(*a*) and 135(*b*), the hard mask 1017 and the silicon layer 1001*a* are etched to form a pillar-shaped silicon layer (1007, 1008). Through the etching, the pillar-shaped silicon layer is formed to have a height dimension of about 30 to 300 nm, and a diameter of about 5 to 100 nm. A continuous planar silicon layer 1001 is also formed beneath the pillar-shaped silicon layer (1007, 1008) to have a thickness of about 10 to 100 nm.

Referring to FIGS. 136(*a*) and 136(*b*), the continuous planar silicon layer 1001 is formed with two isolated planar silicon layers 1002, 1003, by etching.

Referring to FIGS. 137(*a*) and 137(*b*), impurities, such as P or As, are introduced into a top surface of respective top surfaces of the planar silicon sub-layers, for example, by ion implantation, to form an $N^+$ drain diffusion layer 1004 and a $P^+$ drain diffusion layer 1005 therein. During this step, the silicon nitride film 1017 on a top of the pillar-shaped silicon layer (1007, 1008) functions as a stopper for preventing the impurity from being injected into the top of the pillar-shaped silicon layer.

Referring to FIGS. 138(*a*) and 138(*b*), a gate dielectric film 1009 and a gate conductive film 1010 are formed by CVD or ALD. The gate conductive film 1010 is formed to have a film thickness of about 10 to 100 nm.

Referring to FIGS. 139(*a*) and 139(*b*), a silicon oxide film 1018 is formed to allow the pillar-shaped silicon layer (1007, 1008) to be buried therein.

Referring to FIGS. 140(*a*) and 140(*b*), the silicon oxide film 1018, and respective portions of the gate conductive film and the gate dielectric film above of the pillar-shaped silicon layer (1007, 1008), are polished by CMP, to flatten a top surface of the gate conductive film. Through the flattening of a top of the gate conductive film by CMP, a configuration of the gate conductive film is improved to facilitate control of a gate length. During the CMP, the silicon nitride film 1017 on the top of the pillar-shaped silicon layer (1007, 1008) is used as a CMP stopper. The use of the silicon nitride film 1017 as a CMP stopper makes it possible to control an amount of CMP with high repeatability.

Referring to FIGS. 141(*a*) and 141(*b*), the gate conductive film 1010 and the silicon oxide film 1018 are etched back, wherein the gate conductive film 1010 is etched to fix a gate length. Preferably, etching conditions to be used in this step are set to allow the gate conductive film 1010 and the silicon oxide film 1018 to be etched at the same rate, and at a higher selectivity ratio relative to the silicon nitride film 1017. The etching of the gate conductive film 1010 and the silicon oxide film 1018 at the same rate makes it possible to suppress occurrence of a step between respective top surfaces of the two films, which improves a configuration of a silicon nitride film-based sidewall 1019 to be formed in a next step.

Referring to FIGS. 142(*a*) and 142(*b*), a silicon nitride film 1019*a* is formed by a film thickness required for the gate conductive film 1010. Subsequently, as shown in FIGS. 143(*a*) and 143(*b*), the silicon nitride film 1019*a* is etched back to form a silicon nitride film-based sidewall 1019. In this step, a film thickness of the silicon nitride film-based sidewall 1019 is controlled to become equal to that of the gate conductive film 1010, by adjusting a formed film thickness of the silicon nitride film 1019*a*, and then finely adjusting the formed film thickness based on an amount of the etch-back. A portion of the gate conductive film 1010 covered by the silicon nitride film-based sidewall 1019 will be protected during etching for forming a gate line in a subsequent step. This makes it possible to form the gate electrode in a self-alignment manner and with a desired film thickness, so as to reduce an occupancy area.

Referring to FIGS. 144(*a*) and 144(*b*), the silicon oxide film 1018 remaining on the gate conductive film is removed by wet etching.

Referring to FIGS. 145(*a*) and 145(*b*), a resist or a multilayer resist is applied, and a gate line pattern is formed with a resist 1020 by lithography.

Referring to FIGS. 146(*a*) and 146(*b*), the gate conductive film and the gate dielectric film are etched using the resist as a mask, to form a gate electrode (1010*a*, 1010*b*) and a gate line 1010*c*.

Referring to FIGS. 147(*a*) and 147(*b*), the silicon nitride film 1017 on the top of the pillar-shaped silicon layer (1007, 1008), and the silicon nitride film-based sidewall 1019, are removed by wet etching.

Referring to FIGS. 148(*a*) and 148(*b*), an impurity, such as P or As, is introduced into a top portion of the pillar-shaped silicon layer 1007, for example, by ion implantation, to form an $N^+$ source diffusion layer 1011 therein. Further, an impurity, such as B or $BF_2$, is introduced into a top portion of the pillar-shaped silicon layer 1008, for example, by ion implantation, to form a $P^+$ source diffusion layer 1012 therein.

Referring to FIGS. 149(*a*) and 149(*b*), an interlayer dielectric film is formed, and a contact (1013, 1014, 1015, 1016*a*, 1016*b*) is formed on each of the gate line, the source diffusion layers in the upper portions of the pillar-shaped silicon layers, and the drain diffusion layers in the planar silicon sub-layers.

In the method according to the tenth embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the seventh embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening a top surface of a gate conductive film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the tenth embodiment makes it possible to simultaneously solve both the following problems: a disconnection or open of a gate line and a variation in gate length arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

Thus, the use of the method according to the tenth embodiment makes it possible to simultaneously solve both the following problems: a disconnection or open of a gate line and a variation in gate length arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the tenth embodiment can form a gate electrode around a pillar-shaped silicon layer in a self-alignment manner and with a desired film thickness, and adjust a film thickness of the gate electrode to be formed around the pillar-shaped silicon layer, based on a formed film thickness of a gate conductive film. Thus, two pillar-shaped silicon layers each having a gate electrode to be applied with a different potential can be arranged side-by-side with a relatively small distance therebetween, to reduce a circuit area. In cases where the gate conductive film is formed to have a relatively small film thickness, a resistance value thereof becomes higher. Thus, in the tenth embodiment, the gate conductive film is preferably comprised of a metal film.

Eleventh Embodiment

An eleventh embodiment of the present invention shows a method of producing a CMOS SGT on an SOI substrate (SOI CMOS SGT), using the same gate forming process as that in the eighth embodiment. Thus, the method according to the eleventh embodiment can be employed to obtain the same advantageous effects as those in the eighth embodiment.

FIG. 150 is an equivalent circuit diagram of a CMOS inverter formed by the method according to the eleventh embodiment. A circuit operation of the CMOS inverter will be described below. An input signal Vin 5 is applied to a gate of an NMOS Qn 5 and a gate of a PMOS Qp 5. When the Vin 5 is "1", the NMOS Qn 5 is placed in an ON state, and the PMOS Qp 5 is placed in an OFF state, so that an output signal Vout 5 becomes "0". Reversely, when the Vin 5 is "0", the NMOS Qn 5 is placed in an OFF state, and the PMOS Qp 5 is placed in an ON state, so that the Vout 5 becomes "1". As above, the CMOS inverter is operable to allow the output signal Vout 5 to have a value opposite to that of the input signal Vin 5.

FIG. 151 is a top plan view of the CMOS inverter formed by the method according to the eleventh embodiment. FIGS. 152(a) and 152(b) are sectional views taken along the cutting-plane line A-A' and the cutting-plane line B-B' in FIG. 151, respectively. With reference to FIGS. 151, 152(a) and 152(b), a structure of the CMOS inverter will be described.

A planar silicon layer (1102, 1103) is formed on a buried oxide film layer 1100. A pillar-shaped silicon layer 1107 is formed on the planar silicon layer 1102, and a pillar-shaped silicon layer 1108 is formed on the planar silicon layer 1103. A gate dielectric film 1109 and a gate electrode (1110a, 1110b) are formed around the pillar-shaped silicon layers. The gate electrodes 1110a, 1110b are connected to each other through a gate line 1110c extending therefrom. The gate electrode (1110a, 1110b) and the gate line 1106c are formed to be at the same height position. An N$^+$ drain diffusion layer 1104 is formed in the planar silicon layer 1102 beneath the pillar-shaped silicon layer 1107 forming an NMOS (NMOS-forming pillar-shaped silicon layer 1107), and an N$^+$ source diffusion layer 1111 is formed in an upper portion of the pillar-shaped silicon layer 1107. A P$^+$ drain diffusion layer 1105 is formed in the planar silicon layer 1103 beneath the pillar-shaped silicon layer 1108 forming a PMOS (PMOS-forming pillar-shaped silicon layer 1108), and a P$^+$ source diffusion layer 1112 is formed in an upper portion of the pillar-shaped silicon layer 1108.

Each of the N$^+$ drain diffusion layer 1104 and the P$^+$ drain diffusion layer 1105 formed beneath respective ones of the pillar-shaped silicon layers 1107, 1108 is connected to the output terminal Vout 5 via a contact (1116a, 1116b). The N$^+$ source diffusion layer 1111 formed in the upper portion of the NMOS-forming pillar-shaped silicon layer 1107 is connected to a ground potential Vss 5 via a contact 1114, and the P$^+$ source diffusion layer 1112 formed in the upper portion of the PMOS-forming pillar-shaped silicon layer 1108 is connected to a power supply potential Vcc 5 via a contact 1115. Further, the gate line 1110c connecting between the gate electrodes for the PMOS and the NMOS is connected to the input terminal Vin 5 via a contact 1113. In this manner, the CMOS inverter is formed.

With reference to FIGS. 153(a) to 162(b), one example of the SGT production method according to the eleventh embodiment will be described below. In FIGS. 153(a) to 162(b), the figure suffixed by (a) is a top plan view, and the figure suffixed by (b) is a sectional view taken along the line A-A'. In the eleventh embodiment, the step of forming a gate dielectric film and any step therebefore are the same as those in the tenth embodiment. Thus, the following description will be started from the step of forming a gate conductive film.

Referring to FIGS. 153(a) and 153(b), a gate dielectric film 1109 and a gate conductive film 1110 is formed by CVD or ALD, wherein the gate conductive film 1110 is formed to allow a pillar-shaped silicon layer (1107, 1108) to be buried therein.

Referring to FIGS. 154(a) and 154(b), the gate conductive film 1110 is polished by CMP, to flatten a top surface of the gate conductive film. Through the flattening of a top of the gate conductive film by CMP, a configuration of the gate conductive film is improved to facilitate control of a gate length. During the CMP, a silicon nitride film 1117 on a top of a pillar-shaped silicon layer (1107, 1108) is used as a CMP stopper. The use of the silicon nitride film 1117 as a CMP stopper makes it possible to control an amount of CMP with high repeatability.

Referring to FIGS. 155(a) and 155(b), the gate conductive film 1110 is etched back to fix a gate length.

Referring to FIGS. 156(a) and 156(b), a silicon nitride film 1119a is formed by a film thickness required for an after-mentioned gate electrode. Subsequently, as shown in FIGS. 157(a) and 157(b), the silicon nitride film 1119a is etched back to form a silicon nitride film-based sidewall 1119. In the eleventh embodiment, a film thickness of the gate electrode is determined by a film thickness of the silicon nitride film-based sidewall 1119. Thus, a final film thickness of the silicon nitride film-based sidewall is controlled to become equal to a desired film thickness of the gate electrode, by adjusting a formed film thickness of the silicon nitride film 1119a and then finely adjusting the formed film thickness based on an amount of the etch-back.

Referring to FIGS. 158(a) and 158(b), a resist or a multi-layer resist is applied, and a gate line pattern is formed with a resist 1120 by lithography.

Referring to FIGS. 159(a) and 159(b), the gate conductive film and the gate dielectric film are etched using the resist as a mask, to form a gate electrode (1110a, 1110b) and a gate line 1110c.

Referring to FIGS. 160(a) and 160(b), the silicon nitride film 1117 on the top of the pillar-shaped silicon layer (1107, 1108), and the silicon nitride film-based sidewall 1119, are removed by wet etching.

Referring to FIGS. 161(a) and 161(b), impurities are introduced into respective top portions of the pillar-shaped silicon layers 1107, 1108, for example, by ion implantation, to form an N⁺ source diffusion layer 1111 and a P⁺ source diffusion layer 1112 therein.

Referring to FIGS. 162(*a*) and 162(*b*), an interlayer dielectric film is formed, and a contact (1113, 1114, 1115, 1116*a*, 1116*b*) is formed on each of the gate line, the source diffusion layers in the upper portions of the pillar-shaped silicon layers, and the drain diffusion layers in the planar silicon layers.

In the method according to the eleventh embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the eleventh embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening a top surface of a gate conductive film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the eleventh embodiment makes it possible to simultaneously solve both the following problems: a disconnection or open of a gate line and a variation in gate length arising from a lithography step of forming the gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the eleventh embodiment can form a gate electrode around a pillar-shaped silicon layer in a self-alignment manner and with a desired film thickness. In the tenth embodiment, a film thickness of a gate electrode is controlled based on a formed film thickness of a gate conductive film. Differently, in the eleventh embodiment, the film thickness of the gate electrode can be controlled based on a film thickness of the silicon nitride film-based sidewall 1119. Further, in the eleventh embodiment, the gate line 1110*c* has a relatively large film thickness as compared with that of the gate line in the tenth embodiment. Thus, the gate conductive film is not limited to a metal film, but may be made of a material having relatively high electrical resistance, such as polysilicon.

In the tenth embodiment, if the silicon nitride film-based sidewall has a film thickness largely different from that of the gate conductive film, the difference is likely to cause the problems as described in connection with the second embodiment. Differently, the gate forming process in the eleventh embodiment can form a gate electrode to have a desired film thickness, in a self-alignment manner according to a film thickness of the silicon nitride film-based sidewall 1119, as with the second embodiment. This makes it possible to eliminate a risk of occurrence of the above problems, and further increase a process margin in the gate forming process, as compared with that in the tenth embodiment.

Although the SGT production method according to the eleventh embodiment has been described based on one example where it is applied to a CMOS inverter, it is understood that the present invention may be applied to any suitable circuit other than the CMOS inverter, in just the same manner.

Twelfth Embodiment

A twelfth embodiment of the present invention shows a method of producing a CMOS SGT on an SOI substrate (SOI CMOS SGT), using the same gate forming process as that in the ninth embodiment. Thus, the method according to the twelfth embodiment can be employed to obtain the same advantageous effects as those in the ninth embodiment.

FIG. 163 is an equivalent circuit diagram of a CMOS inverter formed by the method according to the twelfth embodiment. A circuit operation of the CMOS inverter will be described below. An input signal Vin 6 is applied to a gate of an NMOS Qn 6 and a gate of a PMOS Qp 6. When the Vin 6 is "1", the NMOS Qn 6 is placed in an ON state, and the PMOS Qp 6 is placed in an OFF state, so that an output signal Vout 6 becomes "0". Reversely, when the Vin 6 is "0", the NMOS Qn 6 is placed in an OFF state, and the PMOS Qp 6 is placed in an ON state, so that the Vout 6 becomes "1". As above, the CMOS inverter is operable to allow the output signal Vout 6 to have a value opposite to that of the input signal Vin 6.

FIG. 164 is a top plan view of the CMOS inverter formed by the method according to the twelfth embodiment. FIGS. 165(*a*) and 165(*b*) are sectional views taken along the cutting-plane line A-A' and the cutting-plane line B-B' in FIG. 164, respectively. With reference to FIGS. 164, 165(*a*) and 165(*b*), the CMOS inverter formed by the method according to the twelfth embodiment will be described.

A planar silicon layer (1202, 1203) is formed on a buried oxide film layer 1200. A pillar-shaped silicon layer 1207 is formed on the planar silicon layer 1202, and a pillar-shaped silicon layer 1208 is formed on the planar silicon layer 1203. A gate dielectric film 1209 and a gate electrode (1210*a*, 1210*b*) are formed around the pillar-shaped silicon layers. The gate electrode (1210*a*, 1210*b*) is formed in a layered structure which comprises a polysilicon layer defining a top surface thereof, and a thin metal film 1221 in contact with a gate dielectric film. The gate electrodes 1210*a*, 1210*b* are connected to each other through a gate line 1210*c* extending therefrom. The gate electrode (1210*a*, 1210*b*) and the gate line 1210*c* are formed to be at the same height position. An N⁺ drain diffusion layer 2104 is formed in the planar silicon layer 1202 beneath the pillar-shaped silicon layer 1207 forming an NMOS (NMOS-forming pillar-shaped silicon layer 1207), and an N⁺ source diffusion layer 1211 is formed in an upper portion of the pillar-shaped silicon layer 1207. A P⁺ drain diffusion layer 1205 is formed in the planar silicon layer 1203 beneath the pillar-shaped silicon layer 1208 forming a PMOS (PMOS-forming pillar-shaped silicon layer 1208), and a P⁺ source diffusion layer 1212 is formed in an upper portion of the pillar-shaped silicon layer 1208.

Each of the N⁺ drain diffusion layer 1204 and the P⁺ drain diffusion layer 1205 formed beneath respective ones of the pillar-shaped silicon layers 1207, 1208 is connected to the output terminal Vout 6 via a contact (1216*a*, 1216*b*). The N+ source diffusion layer 1211 formed in the upper portion of the NMOS-forming pillar-shaped silicon layer 1207 is connected to a ground potential Vss 6 via a contact 1214, and the P+ source diffusion layer 1212 formed in the upper portion of the PMOS-forming pillar-shaped silicon layer 1208 is connected to a power supply potential Vcc 6 via a contact 1215. Further, the gate line 1210*c* connecting between the gate electrodes for the PMOS and the NMOS is connected to the input terminal Vin 6 via a contact 1213. In this manner, the CMOS inverter is formed.

With reference to FIGS. 166(*a*) to 176(*b*), one example of the SGT production method according to the twelfth embodiment will be described below. In FIGS. 166(*a*) to 176(*b*), the figure suffixed by (a) is a top plan view, and the figure suffixed by (b) is a sectional view taken along the line A-A'. In the twelfth embodiment, the step of forming a gate dielectric film and any step therebefore are the same as those in the tenth embodiment. Thus, the following description will be started from the step of forming a thin metal film and a polysilicon layer.

Referring to FIGS. 166(*a*) and 166(*b*), after forming a gate dielectric film 1209, a thin metal film 1221 is formed to have a film thickness of about 1 to 10 nm, and then a polysilicon layer 1210 is formed to allow a pillar-shaped silicon layer (1207, 1208) to be buried therein.

Referring to FIGS. 167(*a*) and 167(*b*), the polysilicon layer 1210, and respective portions of the thin metal film 1221 and the gate dielectric film 1209 above the pillar-shaped silicon layer, (1207, 1208) are polished by CMP, to flatten respective top surfaces of the polysilicon layer 1210 and the thin metal film 1221. Through the flattening of respective tops of the polysilicon layer 1210 and the thin metal film 1221 by CMP, respective configurations of the polysilicon layer 1210 and the thin metal film 1221 are improved to facilitate control of a gate length. During the CMP, a silicon nitride film 1217 on a top of the pillar-shaped silicon layer (1207, 1208) is used as a CMP stopper. The use of the silicon nitride film 1217 as a CMP stopper makes it possible to control an amount of CMP with high repeatability.

Referring to FIGS. 168(*a*) and 168(*b*), the polysilicon layer 1210 and the thin metal film 1221 are etched back to fix a gate length.

Referring to FIGS. 169(*a*) and 169(*b*), a silicon nitride film 1219*a* is formed by a film thickness required for an after-mentioned gate electrode. Subsequently, as shown in FIGS. 170(*a*) and 170(*b*), the silicon nitride film 1219*a* is etched back to form a silicon nitride film-based sidewall 1219. In the twelfth embodiment, a film thickness of the gate electrode is determined by a film thickness of the silicon nitride film-based sidewall 1219. Thus, a final film thickness of the silicon nitride film-based sidewall is controlled to become equal to a desired film thickness of the gate electrode, by adjusting a formed film thickness of the silicon nitride film 1219*a* and then finely adjusting the formed film thickness based on an amount of the etch-back.

Referring to FIGS. 171(*a*) and 171(*b*), a resist or a multi-layer resist is applied, and a gate line pattern is formed with a resist 1220 by lithography.

Referring to FIGS. 172(*a*) and 172(*b*), the polysilicon layer, the thin metal film and the gate dielectric film? are etched using the resist as a mask, to form a gate electrode (1210*a*, 1210*b*) and a gate line 1210*c*.

Referring to FIGS. 173(*a*) and 173(*b*), the silicon nitride film 1217 on the top of the pillar-shaped silicon layer (1207, 1208), and the silicon nitride film-based sidewall 1219, are removed by wet etching.

Referring to FIGS. 174(*a*) and 174(*b*), a silicon nitride film is formed and then etched back to form a silicon nitride film 1222. The silicon nitride film 1222 is formed to cover the thin metal film 1221 of the gate electrode to keep a top surface of the thin metal film 1221 from being exposed. This makes it possible to produce an intended SGT in the same production line as that for a transistor having a conventional polysilicon gate.

Referring to FIGS. 175(*a*) and 175(*b*), impurities are introduced into respective top portions of the pillar-shaped silicon layers 1207, 1208, for example, by ion implantation, to form an N+ source diffusion layer 1211 and a P+ source diffusion layer 1212 therein.

Referring to FIGS. 176(*a*) and 176(*b*), an interlayer dielectric film is formed, and a contact (1213, 1214, 1215, 1216*a*, 1216*b*) is formed on each of the gate line, the source diffusion layers in the upper portions of the pillar-shaped silicon layers, and the drain diffusion layers in the planar silicon layers?.

In the method according to the twelfth embodiment, the step of performing etching to fix a gate length, the step of forming a gate electrode-protecting silicon nitride film-based sidewall, the step of forming a gate line pattern, and the step of performing etching to form a gate line, are sequentially performed in the above manner. This makes it possible to achieve a gate forming process having the following features.

A first feature is that the process is capable of forming a gate electrode around a pillar-shaped silicon layer in a self-alignment manner and with a desired film thickness. A second feature is that the process is less vulnerable to a deviation in exposure alignment during gate line formation. Thus, the use of the method according to the twelfth embodiment makes it possible to simultaneously solve both the following problems: a disconnection or open of a gate line arising from a lithography step of forming a gate line, as the problem in the method disclosed in the Patent Document 1; and an incapability to form a gate electrode around a pillar-shaped silicon layer in a self-alignment manner, as the problem in the method disclosed in the Non-Patent Document 1.

A third feature is that the step of flattening respective top surfaces of a polysilicon layer and a thin metal film by CMP, using a structure which has a silicon nitride film formed on a top of a pillar-shaped silicon layer to serve as a hard mask, is provided before the step of performing etching to fix a gate length, and, after these steps, the step of forming a gate electrode-protecting silicon nitride film-based sidewall, the step of forming a gate line pattern, and the step of performing etching to form a gate line, are sequentially performed, whereby the gate length can be accurately controlled to achieve a process capable of minimizing a variation in gate length and increasing a process margin. Thus, the use of the method according to the twelfth embodiment makes it possible to simultaneously solve both the following problems: a disconnection or open of a gate line and a variation in gate length arising from a lithography step of forming the gate line, as the problem in the method disclosed in the Patent Document 1; and an incapability to form a gate electrode around a pillar-shaped silicon layer in a self-alignment manner, as the problem in the method disclosed in the Non-Patent Document 1.

As described above, the method according to the twelfth embodiment can form a gate electrode around a pillar-shaped silicon layer in a self-alignment manner and with a desired film thickness, and control a film thickness of the gate electrode based on a film thickness of the silicon nitride film-based sidewall 1219, as with the third embodiment.

In the twelfth embodiment, a gate is formed in a layered structure which comprises the thin metal film and the polysilicon layer, which is capable of suppressing depletion of the gate electrode, and allowing an intended SGT to be produced in the same production line as that for a transistor having a conventional polysilicon gate.

In the tenth embodiment, if the silicon nitride film-based sidewall has a film thickness largely different from that of the gate conductive film, the difference is likely to cause the problems as described in connection with the second embodiment. Differently, the gate forming process in the twelfth embodiment can form a gate electrode to have a desired film thickness, in a self-alignment manner according to a film thickness of the silicon nitride film-based sidewall 1219, as with the second embodiment. This makes it possible to eliminate a risk of occurrence of the above problems, and further increase a process margin in the gate forming process, as compared with that in the tenth embodiment.

Although the SGT production method according to the twelfth embodiment has been described based on one example where it is applied to a CMOS inverter, it is understood that the present invention may be applied to any suitable circuit other than the CMOS inverter, in just the same manner.

What is claimed is:

1. A method of producing a semiconductor device, comprising the steps of:
    providing a substrate on one side of which at least one semiconductor pillar stands;
    forming a first dielectric film to at least partially cover a surface of the at least one semiconductor pillar;
    forming a conductive film on the first dielectric film;
    removing by etching a portion of the conductive film located on a top surface and along an upper portion of a side surface of the semiconductor pillar;
    forming a protective film on at least a part of the top surface and the upper portion of the side surface of the semiconductor pillar;
    etching back the protective film to form a protective film-based sidewall on respective top surfaces of the conductive film and the first dielectric film each located along the side surface of the semiconductor pillar;
    forming a resist pattern for forming a gate line in such a manner that at least a portion of the resist pattern is formed on the top surface of the semiconductor pillar by applying a resist and using lithography; and
    partially removing by etching the conductive film using the resist pattern as a mask while protecting, by the protective film-based sidewall, the portions of the conductive film and the first dielectric film each located along the side surface of the semiconductor pillar, to form a gate electrode and the gate line extending from the gate electrode.

2. The method as defined in claim 1, wherein the step of removing by etching a portion of the conductive film located on a top surface and along a upper portion of a side surface of the semiconductor pillar includes the sub-steps of:
    forming a second dielectric film on the conductive film to allow the semiconductor pillar to be buried therein;
    flattening a top surface of the second dielectric film; and
    removing by etching a portion of the conductive film and the second dielectric film each located along the side surface of the semiconductor pillar to form the conductive film and the second dielectric film to have substantially the same height.

3. The method as defined in claim 1, wherein the substrate further comprises a diffusion region formed in contact with a lower part of the semiconductor pillar.

4. The method as defined in claim 1, further comprising the step of forming, in an upper portion of the semiconductor pillar, a diffusion region having a same conductivity type as that of the diffusion region formed in contact with a lower part of the semiconductor pillar.

5. A method of producing a semiconductor device, comprising the steps of:
    providing a substrate on one side of which at least one semiconductor pillar stands, the semiconductor pillar having a stopper film formed on a top surface thereof;
    forming a first dielectric film to at least partially cover a surface of the at least one semiconductor pillar;
    forming a conductive film on the first dielectric film;
    forming a second dielectric film on the conductive film to allow the semiconductor pillar to be buried therein;
    flattening a top surface of the resulting product by chemical mechanical polishing (CMP), using the stopper film as a CMP stopper;
    removing by etching a portion of the second dielectric film and the conductive film each located along an upper portion of a side surface of the semiconductor pillar to form the conductive film and the second dielectric film to have substantially the same height;
    forming a protective film on at least a part of the top surface and the upper portion of the side surface of the semiconductor pillar;
    etching back the protective film to form a protective film-based sidewall on respective top surfaces of the conductive film and the first dielectric film each located along the side surface of the semiconductor pillar;
    removing the second dielectric film;
    forming a resist pattern for forming a gate line in such a manner that at least a portion of the resist pattern is formed on the top surface of the semiconductor pillar by applying a resist and using lithography; and
    partially removing by etching the conductive film using the resist pattern as a mask while protecting, by the protective film-based sidewall, the portions of the conductive film and the first dielectric film each located along the side surface of the semiconductor pillar, to form a gate electrode and the gate line extending from the gate electrode.

6. The method as defined in claim 5, wherein the substrate further comprises a diffusion region formed in contact with a lower part of the semiconductor pillar.

7. The method as defined in claim 5, further comprising the step of forming, in an upper portion of the semiconductor pillar, a diffusion region having a same conductivity type as that of the diffusion region formed in contact with a lower part of the semiconductor pillar.

8. A method of producing a semiconductor device, comprising the steps of:
    providing a substrate on one side of which at least one semiconductor pillar stands;
    forming a first dielectric film to at least partially cover a surface of the at least one semiconductor pillar;
    forming a conductive film on the first dielectric film to allow the semiconductor pillar to be buried therein;
    etching an upper portion of the conductive film to remove a portion of the conductive film located on a top surface and along an upper portion of a side surface of the semiconductor pillar;
    forming a protective film on at least a part of the top surface and the upper portion of the side surface of the semiconductor pillar;
    etching back the protective film to form a protective film-based sidewall on respective top surfaces of the conductive film and the first dielectric film each located along the side surface of the semiconductor pillar;

forming a resist pattern for forming a gate line in such a manner that at least a portion of the resist pattern is formed on the top surface of the semiconductor pillar by applying a resist and using lithography; and partially removing by etching, using the resist pattern as a mask, the conductive film to form at least a portion of the gate line, and partially removing by etching, using the protective film-based sidewall as a mask, the conductive film to form at least a portion of a gate electrode to have the desired film thickness, where the gate line extends from the gate electrode.

9. The method as defined in claim 8, further comprising, as a preprocessing for the etching an upper portion of the conductive film to remove a portion of the conductive film located on a top surface and along an upper portion of a side surface of the semiconductor pillar, the step of flattening a top surface of the conductive film.

10. The method as defined in claim 9, wherein the conductive film is a layered structure film comprising a thin metal film on the side of the first dielectric film, and a polysilicon film.

11. The method as defined in claim 8, wherein the conductive film is a layered structure film comprising a thin metal film on the side of the first dielectric film, and a polysilicon film.

12. The method as defined in claim 8, wherein the substrate further comprises a diffusion region formed in contact with a lower part of the semiconductor pillar.

13. The method as defined in claim 8, further comprising the step of forming, in an upper portion of the semiconductor pillar, a diffusion region having a same conductivity type as that of the diffusion region formed in contact with a lower part of the semiconductor pillar.

14. A method of producing a semiconductor device, comprising the steps of:

providing a substrate on one side of which at least one semiconductor pillar stands, the semiconductor pillar having a stopper film formed on a top surface thereof;

forming a first dielectric film to at least partially cover a surface of the at least one semiconductor pillar;

forming a conductive film on the first dielectric film to allow the semiconductor pillar to be buried therein;

flattening a top surface of the resulting product by chemical mechanical polishing (CMP), using the stopper film as a CMP stopper;

etching an upper portion of the conductive film to remove a portion of the conductive film located along an upper portion of a side surface of the semiconductor pillar;

forming a protective film on at least a part of the top surface and the upper portion of the side surface of the semiconductor pillar;

etching back the protective film to form a protective film-based sidewall on respective top surfaces of the conductive film and the first dielectric film each located along the side surface of the semiconductor pillar;

forming a resist pattern for forming a gate line in such a manner that at least a portion of the resist pattern is formed on the top surface of the semiconductor pillar by applying a resist and using lithography; and partially removing by etching, using the resist pattern as a mask, the conductive film to form at least a portion of the gate line, and partially removing by etching, using the protective film-based sidewall as a mask, the conductive film to form at least a portion of a gate electrode to have a desired film thickness, where the gate line extends from the gate electrode.

15. The method as defined in claim 14, wherein the conductive film is a layered structure film comprising a thin metal film on the side of the first dielectric film, and a polysilicon film.

16. The method as defined in claim 15, wherein the substrate further comprises a diffusion region formed in contact with a lower part of the semiconductor pillar.

17. The method as defined in claim 15, further comprising the step of forming, in an upper portion of the semiconductor pillar, a diffusion region having a same conductivity type as that of the diffusion region formed in contact with a lower part of the semiconductor pillar.

18. The method as defined in claim 14, wherein the substrate further comprises a diffusion region formed in contact with a lower part of the semiconductor pillar.

19. The method as defined in claim 14, further comprising the step of forming, in an upper portion of the semiconductor pillar, a diffusion region having a same conductivity type as that of the diffusion region formed in contact with a lower part of the semiconductor pillar.

* * * * *